(12) United States Patent
Yamazaki et al.

(10) Patent No.: US 12,063,770 B2
(45) Date of Patent: Aug. 13, 2024

(54) MEMORY DEVICE AND SEMICONDUCTOR DEVICE INCLUDING THE MEMORY DEVICE

(71) Applicant: SEMICONDUCTOR ENERGY LABORATORY CO., LTD., Atsugi (JP)

(72) Inventors: Shunpei Yamazaki, Tokyo (JP); Kiyoshi Kato, Kanagawa (JP); Tatsuya Onuki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 478 days.

(21) Appl. No.: 17/414,614

(22) PCT Filed: Nov. 15, 2019

(86) PCT No.: PCT/IB2019/059811
§ 371 (c)(1),
(2) Date: Jun. 16, 2021

(87) PCT Pub. No.: WO2020/136464
PCT Pub. Date: Jul. 2, 2020

(65) Prior Publication Data
US 2022/0139917 A1 May 5, 2022

(30) Foreign Application Priority Data
Dec. 28, 2018 (JP) .................. 2018-248460

(51) Int. Cl.
*H10B 12/00* (2023.01)
*H01L 29/786* (2006.01)

(52) U.S. Cl.
CPC ........ *H10B 12/30* (2023.02); *H01L 29/7869* (2013.01)

(58) Field of Classification Search
None
See application file for complete search history.

(56) References Cited

U.S. PATENT DOCUMENTS 9,691,772 B2   6/2017  Noda et al.
10,622,059 B2  4/2020  Onuki
(Continued)

FOREIGN PATENT DOCUMENTS

CN   110402497 A   11/2019
JP   11-040772 A    2/1999
(Continued)

OTHER PUBLICATIONS

International Search Report (Application No. PCT/IB2019/059811) Dated Feb. 25, 2020.
(Continued)

*Primary Examiner* — Michael Lebentritt
(74) *Attorney, Agent, or Firm* — Fish & Richardson P.C.

(57) ABSTRACT

A novel memory device is provided. The memory device includes a transistor and a capacitor device. The transistor includes a first oxide semiconductor; a first conductor and a second conductor provided over a top surface of the first oxide semiconductor; a second oxide semiconductor that is formed over the first oxide semiconductor and is provided between the first conductor and the second conductor; a first insulator provided in contact with the second oxide semiconductor; and a third conductor provided in contact with the first insulator. The capacitor device includes the second conductor; a second insulator over the second conductor; and a fourth conductor over the second insulator. The first oxide semiconductor has a groove deeper than a thickness of each of the first conductor and the second conductor.

8 Claims, 46 Drawing Sheets

(56) References Cited

U.S. PATENT DOCUMENTS

| | | | |
|---|---|---|---|
| 2017/0012139 A1* | 1/2017 | Sasagawa | H01L 29/78618 |
| 2017/0062619 A1* | 3/2017 | Sasagawa | H01L 27/1207 |
| 2017/0256547 A1 | 9/2017 | Noda et al. | |
| 2017/0317111 A1* | 11/2017 | Ando | H01L 27/124 |
| 2017/0373067 A1* | 12/2017 | Kimura | H01L 27/0688 |
| 2018/0033807 A1* | 2/2018 | Matsuda | H01L 29/78696 |
| 2018/0040641 A1* | 2/2018 | Yamazaki | H01L 21/467 |
| 2018/0114838 A1* | 4/2018 | Endo | H01L 29/78648 |
| 2019/0057734 A1 | 2/2019 | Onuki | |
| 2020/0342935 A1 | 10/2020 | Onuki | |
| 2021/0159342 A1 | 5/2021 | Asami | |

FOREIGN PATENT DOCUMENTS

| | | |
|---|---|---|
| JP | 2013-145875 A | 7/2013 |
| JP | 2016-131253 A | 7/2016 |
| WO | WO-2017/158465 | 9/2017 |
| WO | WO-2018/167601 | 9/2018 |
| WO | WO-2018/178793 | 10/2018 |

OTHER PUBLICATIONS

Written Opinion (Application No. PCT/IB2019/059811) Dated Feb. 25, 2020.

Kunitake.H et al., "High thermal tolerance of 25-nm c-axis aligned crystalline In-Ga-Zn oxide FET", IEDM 18: Technical Digest of International Electron Devices Meeting, Dec. 1, 2018, pp. 312-315.

\* cited by examiner

FIG. 11A
FIG. 11C
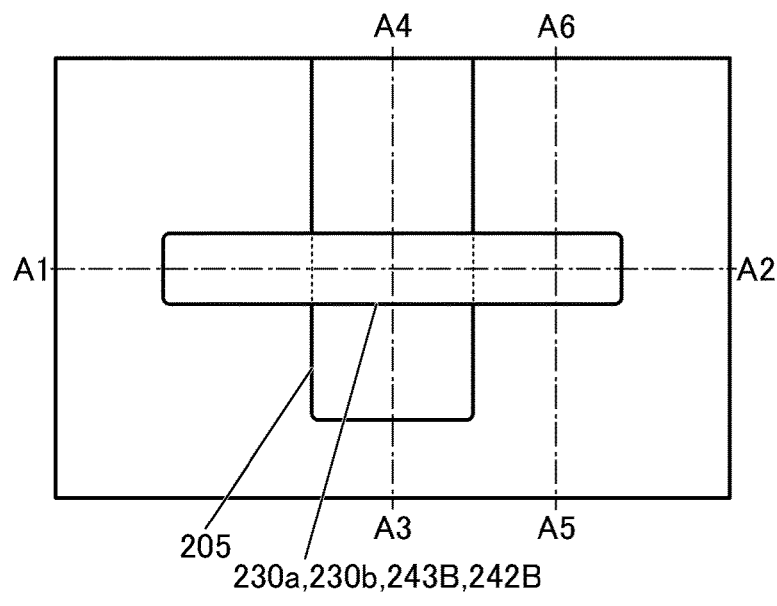
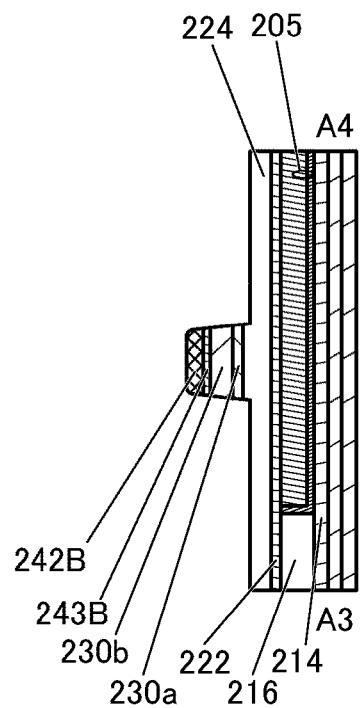
FIG. 11B
FIG. 11D
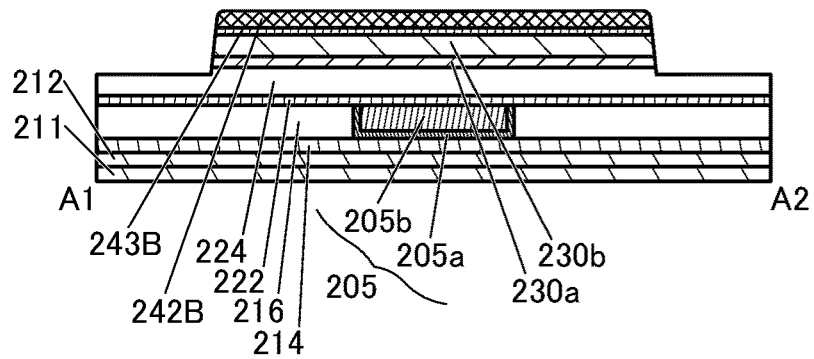
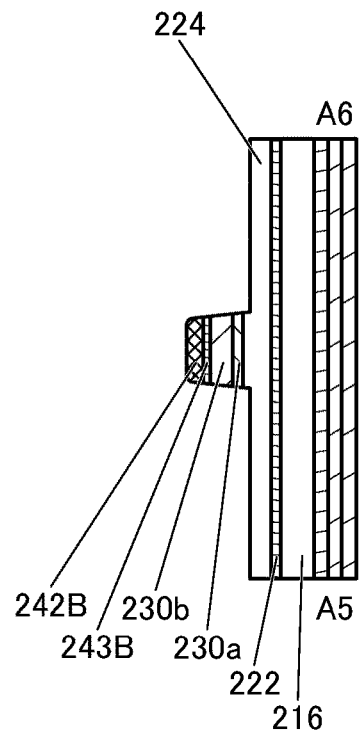

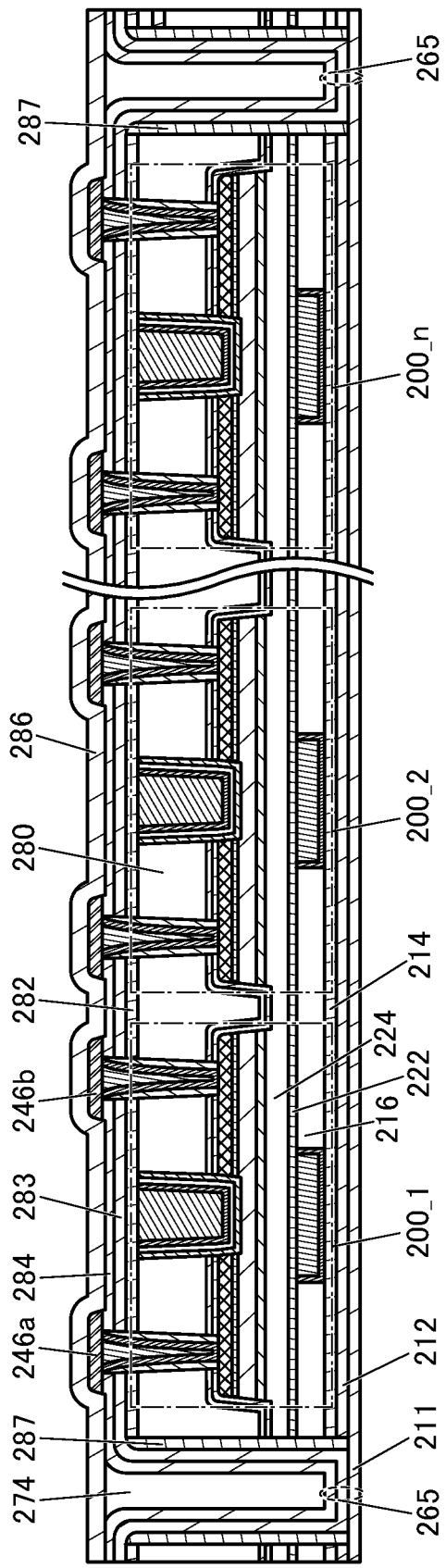
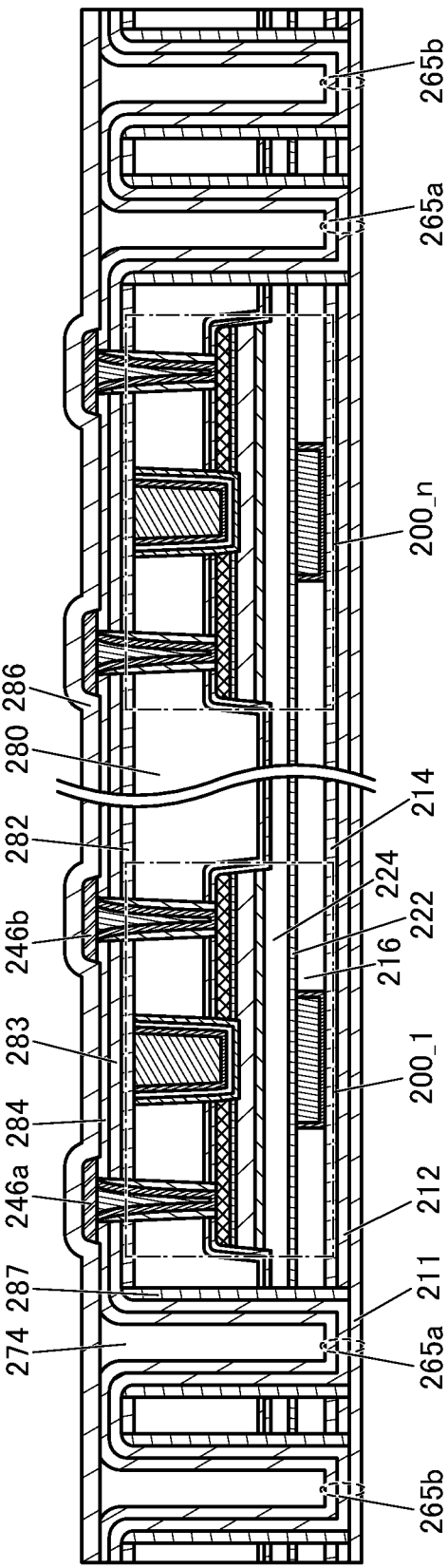

FIG. 46A
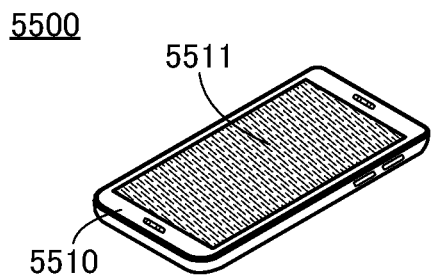
FIG. 46B
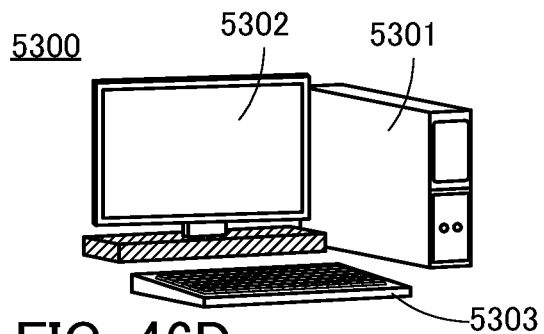
FIG. 46C
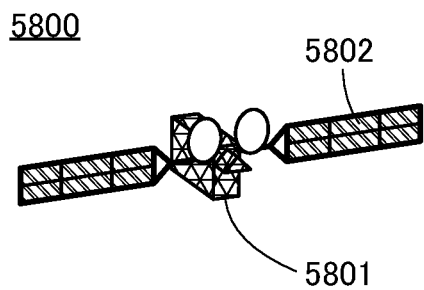
FIG. 46D
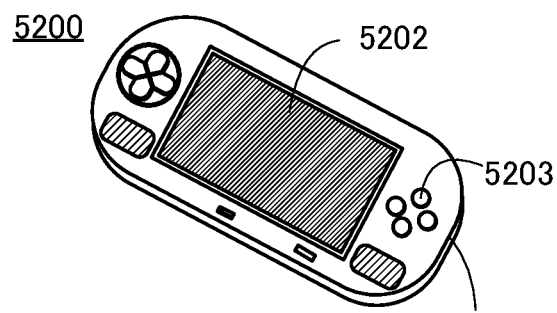
FIG. 46E1
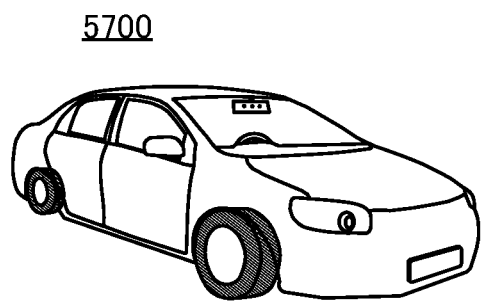
FIG. 46E2
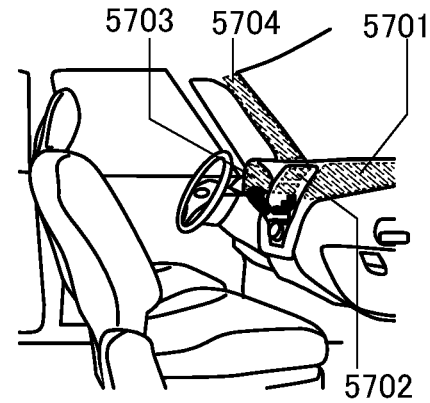
FIG. 46F
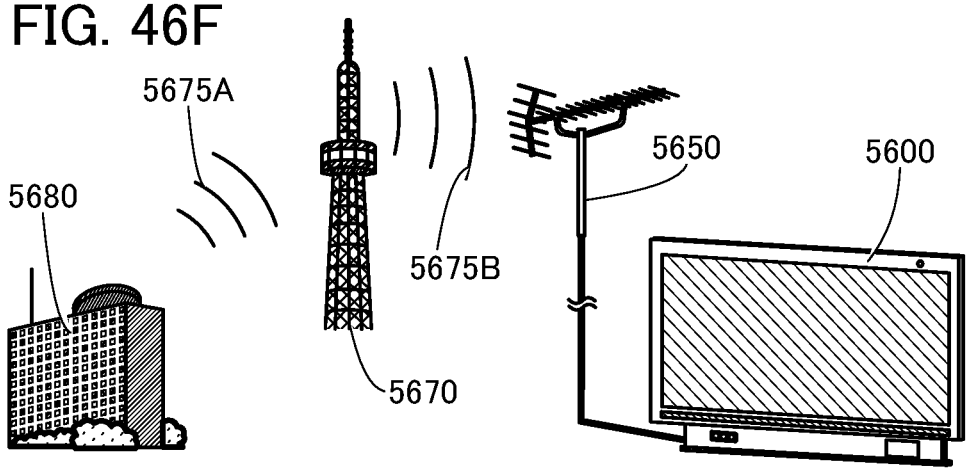

MEMORY DEVICE AND SEMICONDUCTOR DEVICE INCLUDING THE MEMORY DEVICE

CROSS REFERENCE TO RELATED APPLICATIONS

This application is a U.S. National Phase Application under 35 U.S.C. § 371 of International Application PCT/IB2019/059811, filed on Nov. 15, 2019, which is incorporated by reference and claims the benefit of a foreign priority application filed in Japan on Dec. 28, 2018, as Application No. 2018-248460.

TECHNICAL FIELD

The present invention relates to a structure of a memory device. In particular, the present invention relates to a structure of a dynamic RAM (Dynamic Random Access Memory: DRAM).

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power memory device, an imaging device, a memory device, a driving method thereof, and a manufacturing method thereof.

In this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

The cost for a DRAM that is a memory device has been lowering; to further lower the cost, an increase in capacity has been actively researched and developed. The increase in capacity can be achieved by, for example, changing the layout of the memory cell and miniaturizing the element, but such a scale down of the dimension of the memory cell or reduction in the size of the element is limited.

For a layout of a memory cell, a structure in which the dimension of the memory cell is reduced by stacking transistors each using silicon (Si) as a semiconductor layer three-dimensionally, a structure in which the dimension of the memory cell is reduced by stacking transistors each using an oxide semiconductor (OS) as a semiconductor layer (hereinafter, OS transistors), and the like are disclosed (see Patent Document 1 and Patent Document 2).

REFERENCE

Patent Document

[Patent Document 1] Japanese Published Patent Application No. H11-40772

[Patent Document 2] Japanese Published Patent Application No. 2013-145875

SUMMARY OF THE INVENTION

Problems to be Solved by the Invention

Although the research on the structure or the like for reducing the dimension of the memory cell has been carried out actively as shown in Patent Document 1 and Patent Document 2, there is still room for improvement.

Thus, one object of one embodiment of the present invention is to provide a novel memory device. Another object of one embodiment of the present invention is to provide a memory device with a novel structure, large memory capacity, and high reliability of data. Another object of one embodiment of the present invention is to provide a memory device with a novel structure capable of reducing the size by a reduction in the circuit area of a memory cell. Another object of one embodiment of the present invention is to provide a semiconductor device including the novel memory device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to solve at least one of the description listed above and/or the other objects.

Means for Solving the Problems

One embodiment of the present invention includes a transistor and a capacitor device. The transistor includes a first oxide semiconductor; a first conductor and a second conductor provided over a top surface of the first oxide semiconductor; a second oxide semiconductor that is formed over the first oxide semiconductor and is provided between the first conductor and the second conductor; a first insulator provided in contact with the second oxide semiconductor; and a third conductor provided in contact with the first insulator. The capacitor device includes the second conductor; a second insulator over the second conductor; and a fourth conductor over the second insulator. The first oxide semiconductor has a groove deeper than a thickness of each of the first conductor and the second conductor.

In the above embodiment, the second oxide semiconductor, the first insulator, and the third conductor are preferably embedded in the groove and the second oxide semiconductor preferably has a curvature.

In each of the above embodiments, the first oxide semiconductor and the second oxide semiconductor each preferably contain indium, an element M (M is gallium, yttrium, or tin), and zinc.

In each of the above embodiments, the first oxide semiconductor preferably includes a region having a higher atomic ratio of indium than the second oxide semiconductor.

In each of the above embodiments, the first oxide semiconductor and the second oxide semiconductor each preferably have crystallinity.

Another embodiment of the present invention is a semiconductor device including the memory device according to each of the above embodiments. In the case where the memory device is a first memory device, the semiconductor device includes the first memory device, an n-th (n is a natural number of two or more) memory device over the first memory device, and a device containing silicon and electrically connected to the first memory device and the n-th memory device. The device containing silicon, the first memory device, and the n-th memory device are stacked in this order.

In the above embodiment, the n-th memory device preferably includes an oxide semiconductor.

Effect of the Invention

According to one embodiment of the present invention, a novel memory device can be provided. According to another embodiment of the present invention, a memory device with a novel structure, large memory capacity, and high reliability of data can be provided. According to another embodiment of the present invention, a memory device with a novel structure, a small size of the circuit area of a memory cell, and a small size can be provided. According to another embodiment of the present invention, a semiconductor device including the novel memory device can be provided.

Note that the description of the effects does not preclude the existence of other effects. One embodiment of the present invention does not have to achieve all these effects. Note that effects other than these are apparent from the description of the specification, the drawings, the claims, and the like and effects other than these can be derived from the description of the specification, the drawings, the claims, and the like.

BRIEF DESCRIPTION OF THE DRAWINGS

FIG. 11A is a top view illustrating a manufacturing method of a semiconductor device of one embodiment of the present invention. FIG. 11B to FIG. 11D are cross-sectional views illustrating a manufacturing method of a semiconductor device of one embodiment of the present invention.

FIG. 27A and FIG. 27B are cross-sectional views of a semiconductor device of one embodiment of the present invention.

FIG. 46A to FIG. 46F are views illustrating electronic devices of one embodiment of the present invention.

MODE FOR CARRYING OUT THE INVENTION

Figure 1A:
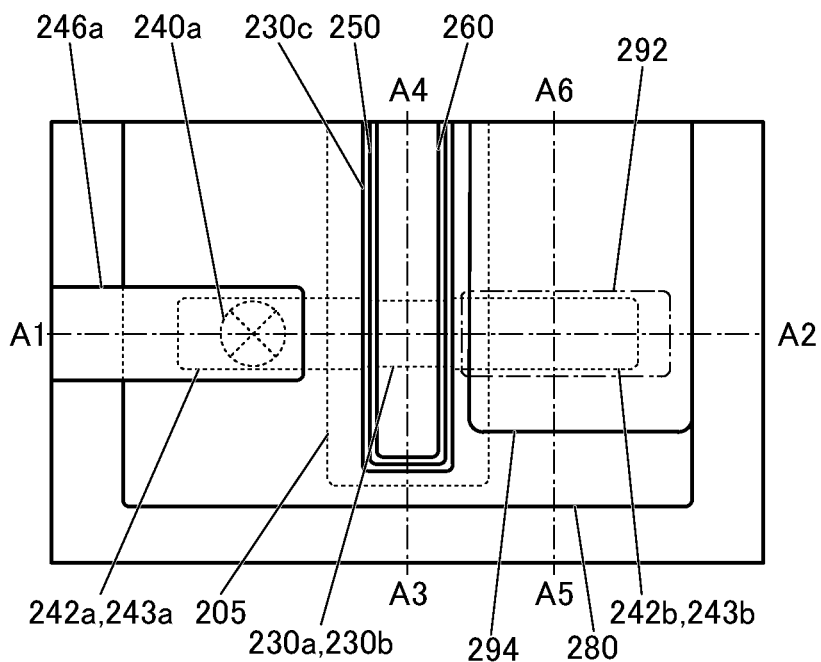
FIG. 1A is a top view of the semiconductor device of one embodiment of the present invention.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

Embodiment 1

In this embodiment, a memory device of one embodiment of the present invention and a semiconductor device including the memory device are described.

A memory device of one embodiment of the present invention includes a transistor and a capacitor device. The transistor includes a first oxide semiconductor; a first conductor and a second conductor provided over a top surface of the first oxide semiconductor; a second oxide semiconductor that is formed over the first oxide semiconductor and is provided between the first conductor and the second conductor; a first insulator provided in contact with the second oxide semiconductor; and a third conductor provided in contact with the first insulator. The capacitor device includes the second conductor; a second insulator over the second conductor; and a fourth conductor over the second insulator. The first oxide semiconductor has a groove deeper than a thickness of each of the first conductor and the second conductor.

When the groove deeper than the thickness of each of the first conductor and the second conductor is formed in the first oxide semiconductor, the second oxide semiconductor, the first insulator, and the third conductor can be embedded in the groove and the second oxide semiconductor can have a curvature. Note that a channel formation region of the transistor is provided at the interface between the first oxide semiconductor and the second oxide semiconductor or the vicinity thereof; thus, formation of the second oxide semiconductor having a curvature enables an effective L length longer than an L length in a plan view.

In the manufacture of a transistor using an oxide semiconductor, at the time of processing, specifically, etching the first conductor and the second conductor, a top portion of the first oxide semiconductor is slightly etched in some cases. However, in one embodiment of the present invention, to increase the effective L length, the first oxide semiconductor is processed using an insulator provided above the first conductor and the second conductor as a mask, so that the above-described groove is formed. The depth (length) of the groove is greater than the thickness (film thickness) of each of the first conductor and the second conductor; typically, the depth of the groove is preferably greater than or equal to 10 nm and less than or equal to 50 nm, preferably greater than or equal to 15 nm and less than or equal to 30 nm. Note that the depth of the groove is not limited to the above-described value because the depth depends on the thicknesses of the first conductor and the second conductor.

Moreover, each of the first oxide semiconductor and the second oxide semiconductor preferably contains indium, an element M (M is gallium, yttrium, or tin), and zinc. Furthermore, the first oxide semiconductor preferably has a region having a higher atomic ratio of indium than the second oxide semiconductor. When the first oxide semiconductor has a higher atomic ratio of indium than the second oxide semiconductor, the channel formation region can be formed on the first oxide semiconductor side.

When the first oxide semiconductor and the second oxide semiconductor each have crystallinity, a highly reliable memory device can be provided. An oxide semiconductor having crystallinity can have a reduced concentration of impurities (typically, hydrogen, water, or the like); thus, reliability can be improved.

The details of the above structure are described with reference to FIG. 1 to FIG. 6.

<Structure Example of Memory Device>

Figure 1B:
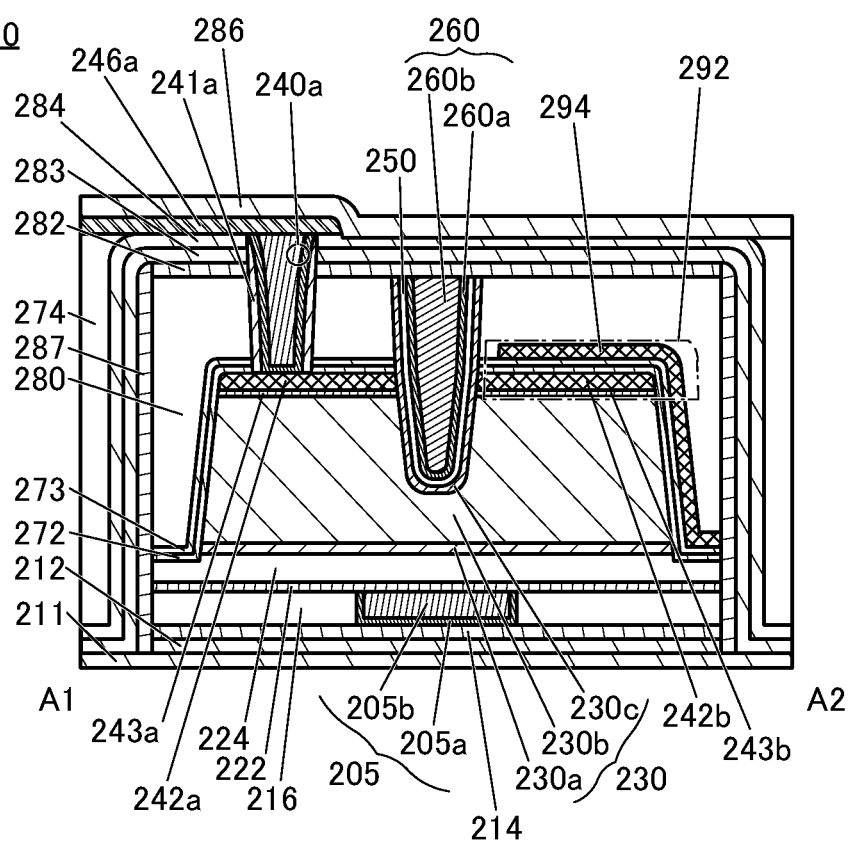
FIG. 1B is a cross-sectional view of a semiconductor device of one embodiment of the present invention.

FIG. 1A, FIG. 1B, FIG. 2A, and FIG. 2B illustrate a memory device 290. FIG. 1A is a top view of the memory device 290 and FIG. 1B is a cross-sectional view of a cut plane taken along dashed-dotted line A1-A2 in FIG. 1A. The cross-sectional view illustrated in FIG. 1B corresponds to a cross-sectional view of a transistor in the channel length direction.

Figure 2A:
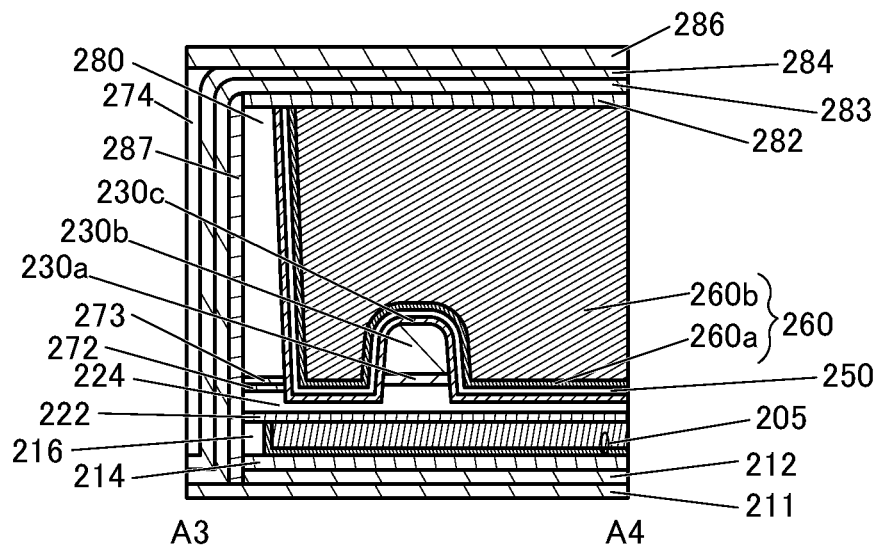
FIG. 2A and FIG. 2B are cross-sectional views of a semiconductor device of one embodiment of the present invention.
Figure 2B:
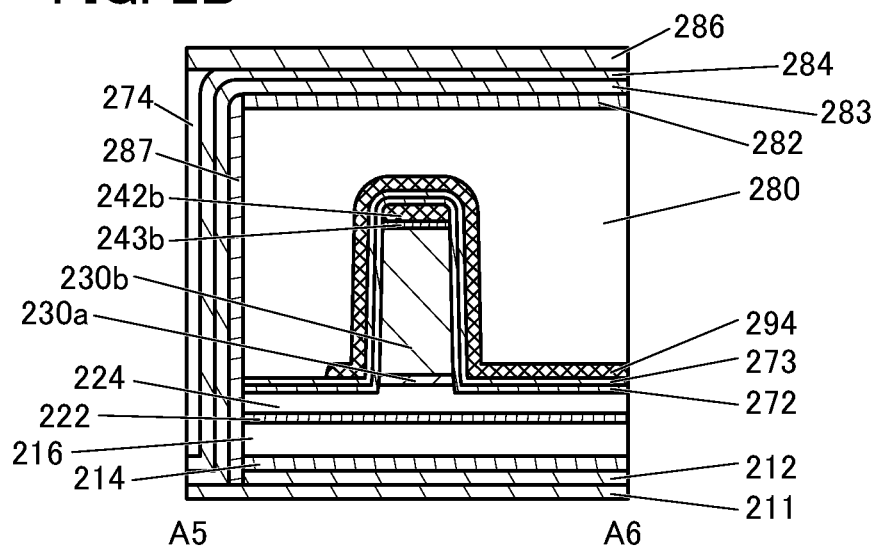
Figure 3A:
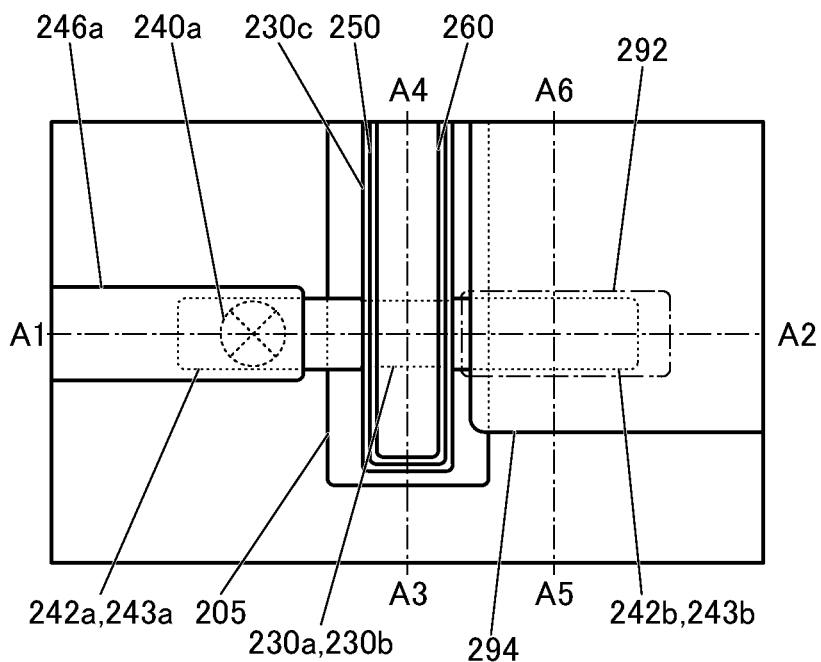
FIG. 3A is a top view of the semiconductor device of one embodiment of the present invention.
Figure 3B:
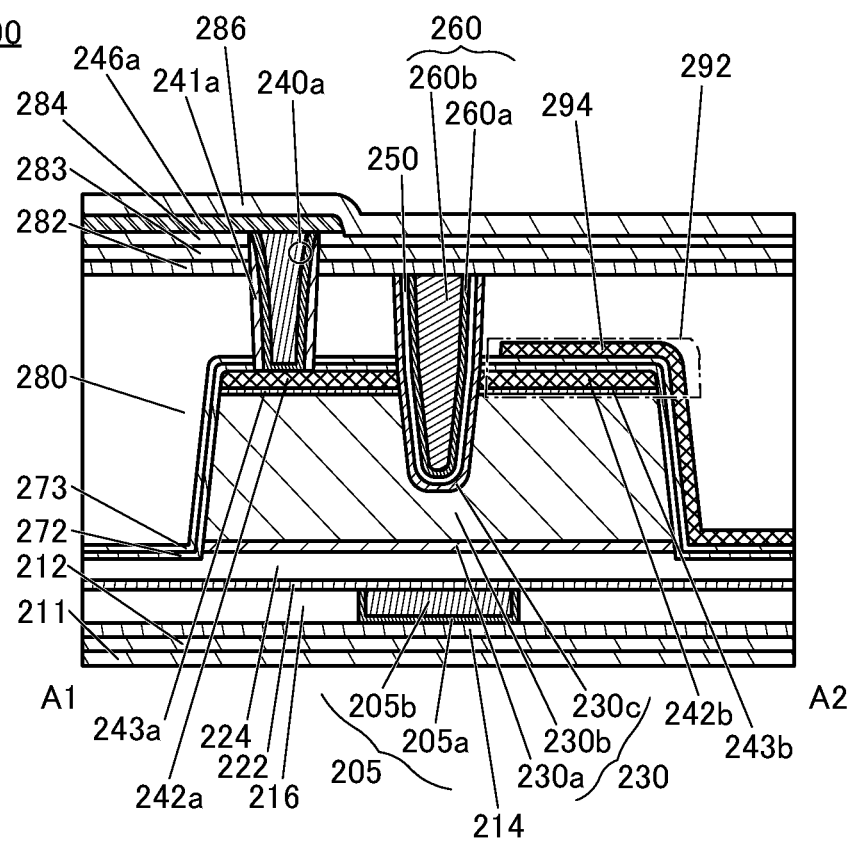
FIG. 3B is a cross-sectional view of a semiconductor device of one embodiment of the present invention.
Figure 4A:
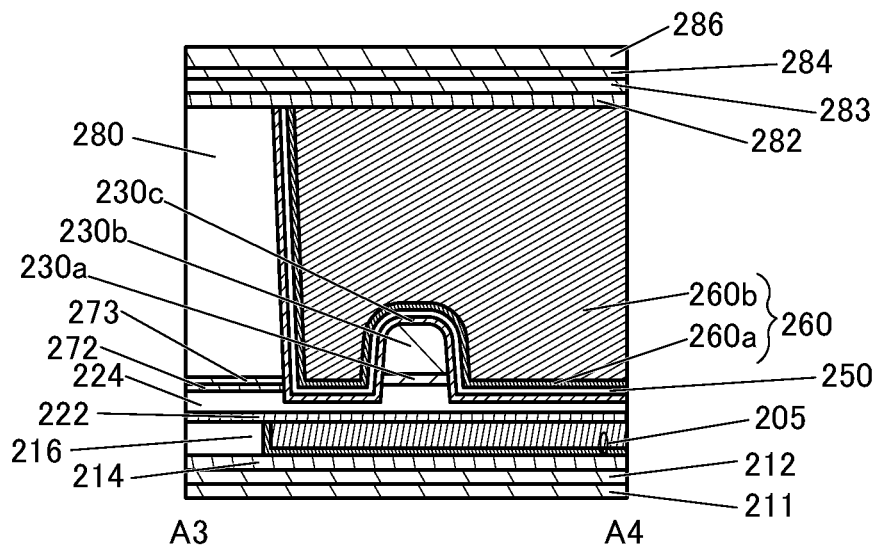
FIG. 4A and FIG. 4B are cross-sectional views of a semiconductor device of one embodiment of the present invention.
Figure 4B:
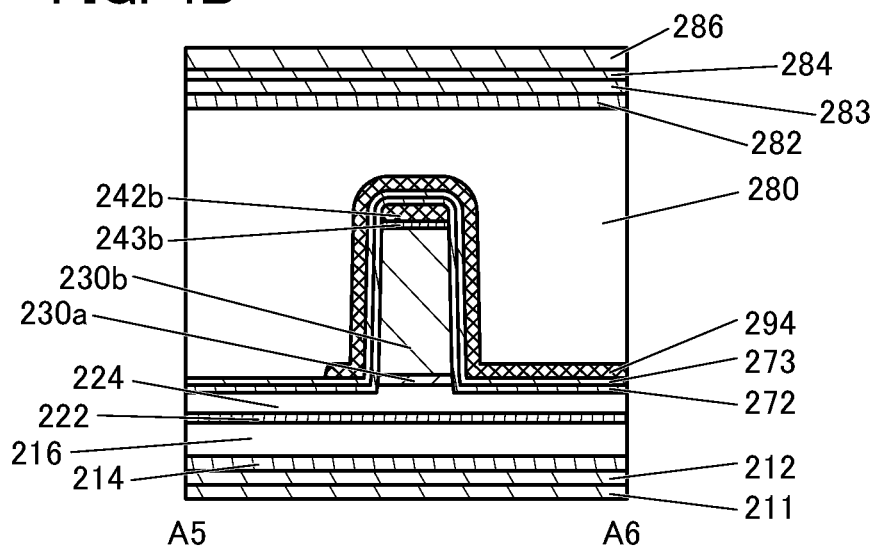

FIG. 2A is a cross-sectional view of a cut plane taken along dashed-dotted line A3-A4 in FIG. 1A. FIG. 2B is a cross-sectional view of a cut plane taken along dashed-dotted line A5-A6 in FIG. 1A. The cross-sectional view illustrated in FIG. 2A corresponds to a cross-sectional view of the transistor in the channel width direction.

The memory device 290 illustrated in FIG. 1A, FIG. 1B, FIG. 2A, and FIG. 2B includes the transistor, a capacitor device 292, and a wiring connected to the transistor. More specifically, the memory device 290 includes an insulator 211, an insulator 212 over the insulator 211, an insulator 214 over the insulator 212, a conductor 205 (a conductor 205a and a conductor 205b), an insulator 216 over the insulator 214, an insulator 222, an insulator 224, an oxide 230 (an oxide 230a, an oxide 230b, and an oxide 230c), a conductor 242 (a conductor 242a and a conductor 242b), an oxide 243 (an oxide 243a and an oxide 243b), an insulator 272, an insulator 273, an insulator 250, and a conductor 260 (a conductor 260a and a conductor 260b).

Furthermore, an insulator 280 and an insulator 282 over the insulator 280 are provided over the oxide 230. An insulator 287 is provided in contact with side surfaces of the insulator 212, the insulator 214, the insulator 216, the insulator 222, the insulator 224, the insulator 272, the insulator 273, the insulator 280, and the insulator 282. In addition, an insulator 283 and an insulator 284 over the insulator 283 are provided to cover the insulator 282.

The memory device 290 includes the conductor 240a electrically connected to the conductor 242a and functioning as the plug. Note that the insulator 241a is provided in contact with a side surface of the conductor 240a. A conductor 246a that is electrically connected to the conductor 240a and functions as a wiring is provided over the insulator 284 and the conductor 240a. The insulator 286 is provided over the conductor 246a and the insulator 274.

The memory device 290 includes the capacitor device 292. The capacitor device 292 includes the conductor 242b, the insulator 272 and the insulator 273 provided over the conductor 242b, and a conductor 294 provided over the insulator 273. In other words, the capacitor device 292 forms a MIM (Metal-Insulator-Metal) capacitor. Note that one of a pair of electrodes of the capacitor device 292, i.e., the conductor 242b, can double as the source electrode or the drain electrode of the transistor. The dielectric layer of the capacitor device 292 can double as a protective layer provided in the transistor, i.e., the insulator 272 and the insulator 273. Thus, the manufacturing process of the capacitor device 292 and that of the transistor can share some of the steps, improving the productivity of the semiconductor device. Since the one of the pair of electrodes of the capacitor device 292, i.e., the conductor 242b doubles as the source electrode or the drain electrode of the transistor, an area where the transistor and the capacitor device are arranged can be reduced.

As illustrated in FIG. 2B, in the cross section of the transistor in the channel width direction, the capacitor device 292 has a region in which the side surface of the conductor 242b also overlaps with the conductor 294. Since capacitance can be formed also in this region, the capacitance value can be high even with a small area.

The conductor 294 can be formed using, for example, any of the materials that can be used for the conductor 242 described later.

In the memory device 290, the conductor 260 functions as a first gate of the transistor and the conductor 205 functions as a second gate of the transistor. The conductor 242a and the conductor 242b function as the source electrode and the drain electrode of the transistor.

The oxide 230 functions as a semiconductor including the channel formation region of the transistor. The insulator 250 function as a first gate insulator, and the insulator 222 and the insulator 224 function as a second gate insulator.

The insulator 214, the insulator 272, and the insulator 273 function as interlayer films. The insulator 214, the insulator 272, and the insulator 273 are preferably formed using a material that has a barrier property against oxygen or a material that can occlude hydrogen. When a material that can occlude hydrogen is used for the insulator 214, the insulator 272, and the insulator 273, the amount of hydrogen in the memory device 290 can be constant. For the insulator 214, the insulator 272, and the insulator 273, an Al compound, or a compound containing Al and an element Ma (the element Ma is an element with low electronegativity (an element with high reactivity) such as Mg, Zr, Si, or B) can be used.

The transistor included in the memory device 290 has a structure in which the insulator 282 is in contact with the oxide 230c as illustrated in FIG. 1B, FIG. 2A, and FIG. 2B. With the structure, oxygen contained in the insulator 280 can be inhibited from being diffused into the conductor 260 side. Furthermore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor can be improved.

In the transistor of the memory device 290 illustrated in FIG. 1, the conductor 260 is formed in a self-aligned manner in an opening provided in the interlayer films such as the insulator 280 with the insulator 250 therebetween. That is, the conductor 260 is formed to fill the opening provided in the interlayer films including the insulator 280 with the insulator 250 therebetween. Thus, when the conductor 260 is arranged in a region between the conductor 242a and the conductor 242b, the position alignment of the conductor 260 is unnecessary.

The oxide 230c is preferably provided in the opening that is provided in the interlayer films including the insulator 280. Thus, the insulator 250 and the conductor 260 include a region that overlaps with a stacked-layer structure of the oxide 230b and the oxide 230a with the oxide 230c therebetween. When this structure is employed, the oxide 230c and the insulator 250 can be sequentially formed and thus, the interface between the oxide 230 and the insulator 250 can be kept clean. Thus, the influence of interface scattering on carrier conduction is small, and the transistor included in the memory device 290 can have high on-state current and excellent frequency characteristics.

In the transistor of the memory device 290 illustrated in FIG. 1, the channel formation region is provided mainly at the interface between the oxide 230c and the oxide 230b or the vicinity thereof. Note that the oxide 230c is formed to have a U-shape along an opening formed in the insulator 280, the insulator 272, the insulator 273, the conductor 242 (the conductor 242a and the conductor 242b), the oxide 243 (the oxide 243a and the oxide 243b), and the oxide 230b.

For example, in the case where the channel length of the transistor is reduced (typically greater than or equal to 5 nm and less than 60 nm, preferably greater than or equal to 10 nm and less than or equal to 30 nm), the structure of the transistor included in the memory device 290 in FIG. 1 can make the effective L length longer. For example, in the case where the distance between the conductor 242a and the conductor 242b is 20 nm, the effective L length can be greater than or equal to 40 nm and less than or equal to 60 nm, i.e., greater than or equal to two times or less than or equal to three times the distance between the conductor 242a and the conductor 242b or the minimum feature size. Accordingly, the memory device 290 illustrated in FIG. 1 employs structures of a transistor and a capacitor device that are suitable for miniaturization.

In the memory device 290 illustrated in FIG. 1, the insulator 211 is in contact with the insulator 283, and the insulator 212, the insulator 214, the insulator 287, and the insulator 282 are provided on the inner side of the insulator 283. The insulator 284 is provided on the outer side of the insulator 283. For example, the insulator 214, the insulator 287, and the insulator 282 are preferably formed using materials having a function of capturing and fixing hydrogen, and the insulator 211, the insulator 212, the insulator 283, and the insulator 284 are preferably formed using materials having a function of inhibiting diffusion of hydrogen and oxygen. Typically, aluminum oxide can be used for the insulator 214, the insulator 287, and the insulator 282. Moreover, typically, silicon nitride can be used for the insulator 211, the insulator 212, the insulator 283, and the insulator 284.

The above structure can also be called a two-layer sealing structure of a first sealing structure formed of an aluminum oxide film and a second sealing structure formed of an silicon nitride film and arranged on the outer side of the first sealing structure. Furthermore, one more silicon nitride film may be added to the second sealing structure to form a three-layer sealing structure. With the above structure, one or both of hydrogen concentration and oxygen concentration in the memory device 290 can be controlled; thus, a memory device having high reliability can be provided. Note that the memory device 290 of one embodiment of the present invention is not limited to the above structures. For example, a structure in which the sealing structure is not provided in the memory device 290 may be employed. An example of the structure in which the sealing structure is not provided is shown in FIG. 3A, FIG. 3B, FIG. 4A, and FIG. 4B. Here, FIG. 3A, FIG. 3B, FIG. 4A, and FIG. 4B correspond to FIG. 1A, FIG. 1B, FIG. 2A, and FIG. 2B, respectively. The memory device 290 illustrated in FIG. 3A, FIG. 3B, FIG. 4A, and FIG. 4B is similar to that illustrated in FIG. 1A, FIG. 1B, FIG. 2A, and FIG. 2B except that the sealing structure is not provided.

<Application Examples of Memory Device>

Next, application examples of the memory device 290 illustrated in FIG. 1A, FIG. 1B, FIG. 2A, and FIG. 2B are described with reference to FIG. 5 and FIG. 6.

Figure 5:
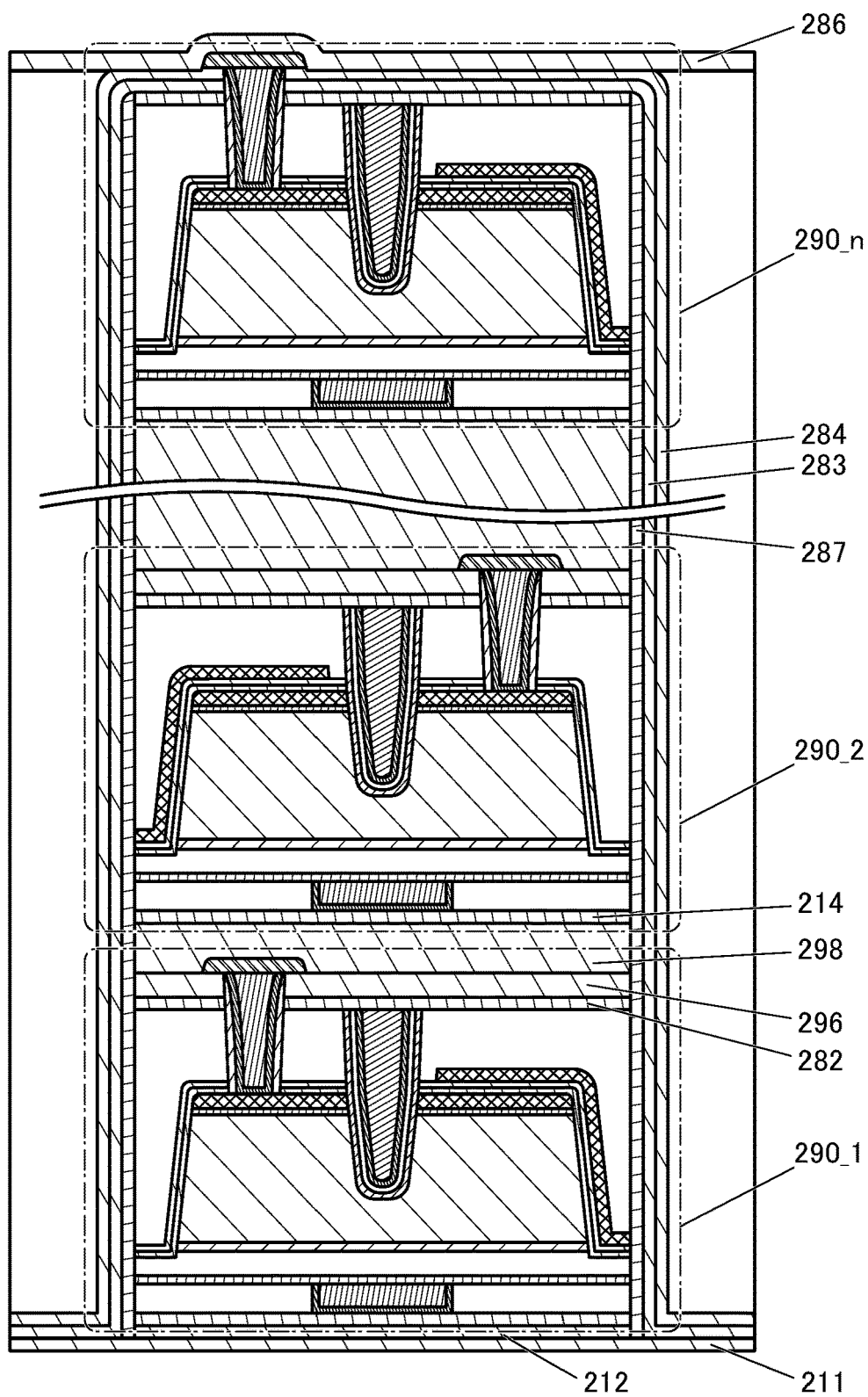
FIG. 5 is a cross-sectional view of a semiconductor device of one embodiment of the present invention.
Figure 6:
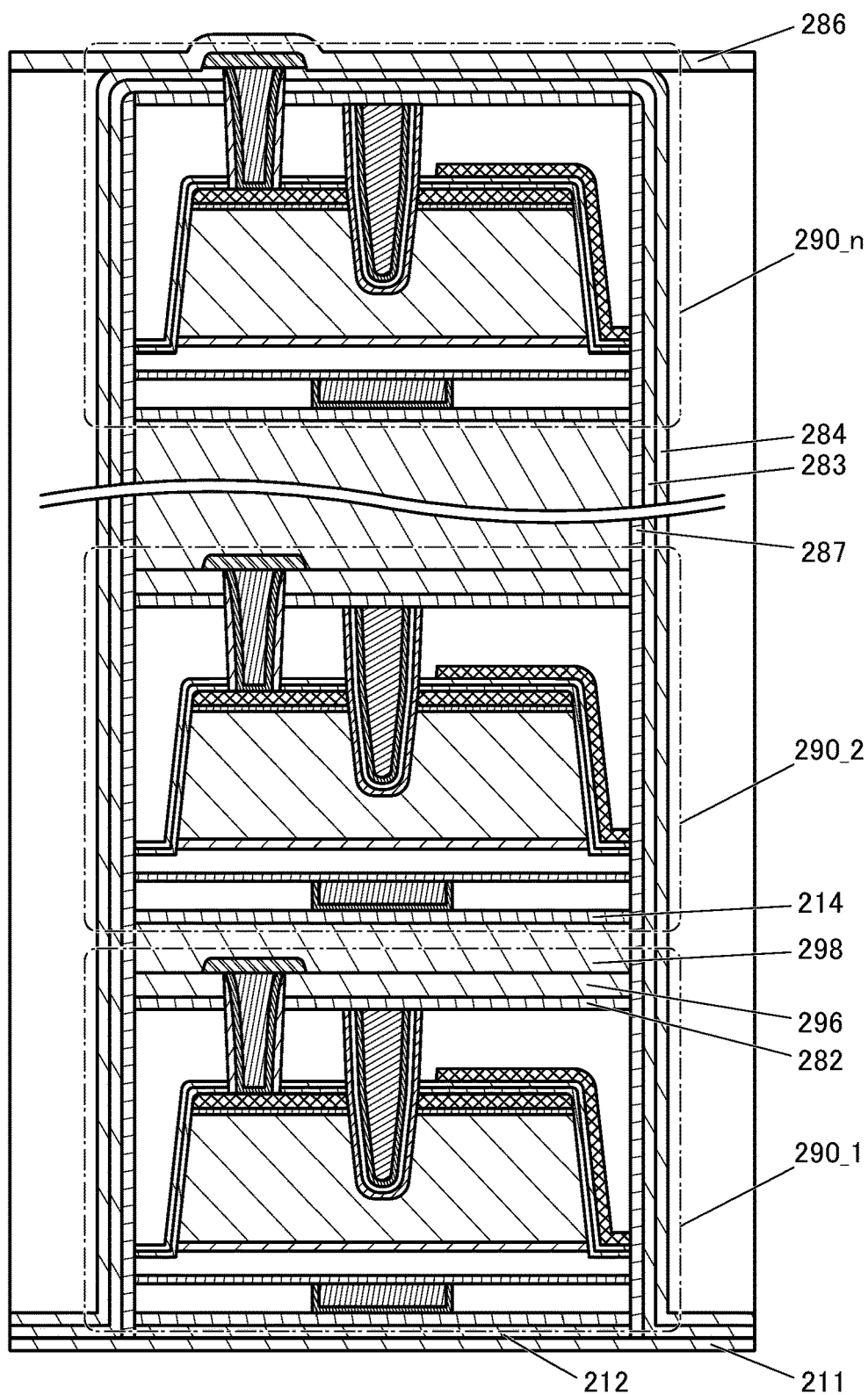
FIG. 6 is a cross-sectional view of a semiconductor device of one embodiment of the present invention.

FIG. 5 and FIG. 6 are examples of a cross-sectional view of a memory device having a structure in which a plurality of the memory devices 290 are stacked in the vertical direction.

In the example illustrated in FIG. 5, a memory device 290_1, a memory device 290_2, and a memory device 290_n (n is a natural number of three or more) are stacked. Note that as illustrated in FIG. 5, the position of the conductor 240a, which functions as the plug, in the memory device 290_2 is different from that in the memory device 290_1. This structure is advantageous in that parasitic capacitance between adjacent memory devices can be small or the design flexibility of a circuit can be increased. Note that although FIG. 5 illustrates the structure in which the conductors 240a functioning as the plugs are positioned in a staggered manner in an upper memory device and a lower memory device, the present invention is not limited thereto; for example, the conductors 240a functioning as the plugs and the capacitor devices 292 may be arranged so that they are rotated by 90° around the conductor 260 in the top view.

Alternatively, it is also possible to employ a structure in which the conductors 240a functioning as the plugs are arranged at the same position in a cross-sectional view in the channel width direction. FIG. 6 shows an example of the configuration. In the structure illustrated in FIG. 6, for example, adjacent memory devices can share a write bit line. In other words, a plurality of the memory devices 290 can share a bit line and the like and thus, the above structure is advantageous in miniaturization. Note that although adjacent memory devices share the conductor 240a electrically connected to the bit line and functioning as the plug in FIG. 6, the present invention is not limited thereto. For example, adjacent memory devices may share a back gate electrode of the transistor.

In FIG. 5 and FIG. 6, the memory device 290_1, the memory device 290_2, and the memory device 290_n are covered with the insulator 287, the insulator 283, and the insulator 284. The insulator 283 and the insulator 211 are in contact with each other at the periphery of the memory device 290_1. In addition, the insulator 284 and the insulator 286 are in contact with each other at the upper portion of the insulator 284.

The insulator 282, an insulator 296, an insulator 298, and the insulator 214 are provided between the memory device 290_1 and the memory device 290_2.

The insulator 296 and the insulator 298 can be formed using a material similar to that of the insulator 211, for example. The insulator 282 and the insulator 214 can be formed using aluminum oxide, and the insulator 296 and the insulator 298 can be formed using silicon nitride, for example.

While the three-layer structure of the insulator 211, the insulator 212, and the insulator 214 is formed below the conductor 205 in the transistor 200 illustrated in FIG. 1, one or two layers of the three-layer structure can be omitted in the transistors included in the memory device 290_2 to the memory device 290_n illustrated in FIG. 5 and FIG. 6 because some of the layers formed above the transistor of the underlying memory device can be shared. In other words, when the upper and lower memory devices share some insulators, the productivity of the semiconductor device can be increased.

Embodiment 2

An example of a semiconductor device including a transistor 200 of one embodiment of the present invention and a manufacturing method thereof are described below.

Note that although the memory device 290 is described in the above embodiment, a transistor that can be used for the memory device 290 or components and the like related to the transistor is described in this embodiment.

Structure Example 1 of Semiconductor Device

FIG. 7A, FIG. 7B, FIG. 7C, and FIG. 7D are a top view and cross-sectional views of the transistor 200 of one embodiment of the present invention and the periphery of the transistor 200.

Figure 7A:
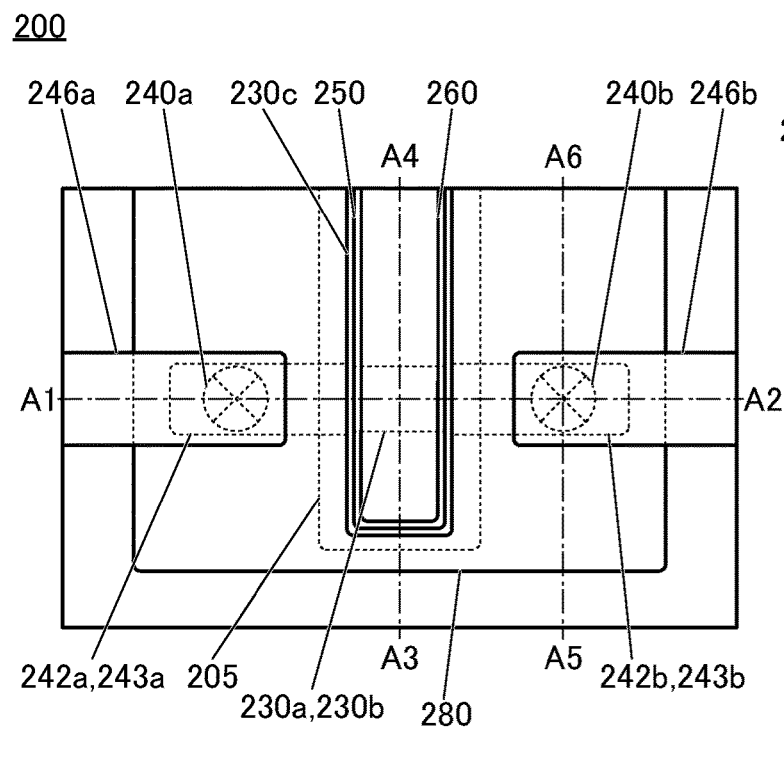
FIG. 7A is a top view of a semiconductor device of one embodiment of the present invention.
Figure 7C:
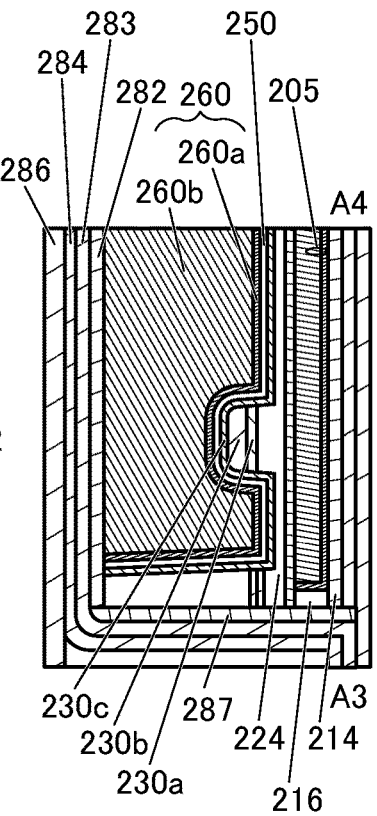
FIG. 7B to FIG. 7D are cross-sectional views of a semiconductor device of one embodiment of the present invention.
Figure 7B:
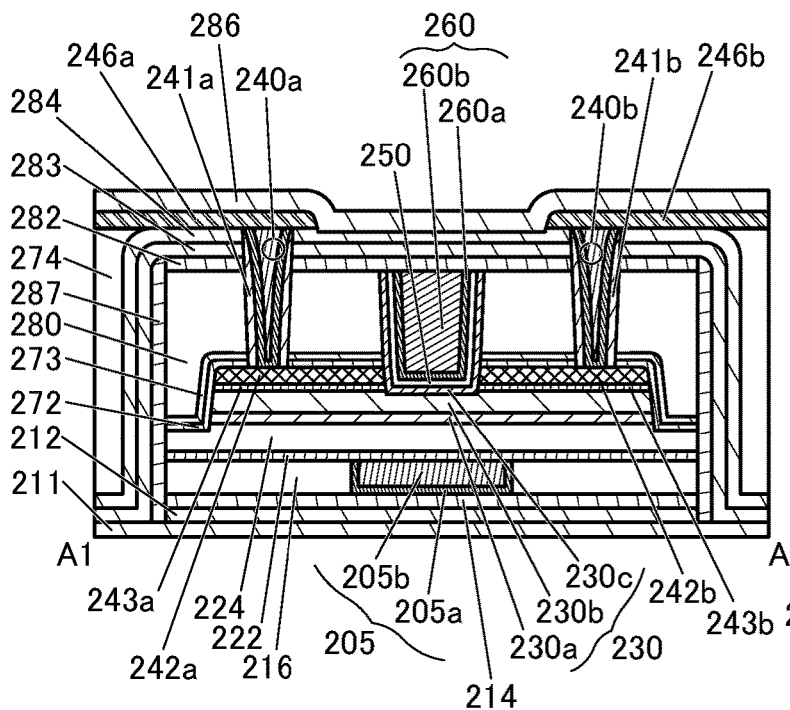
Figure 7D:
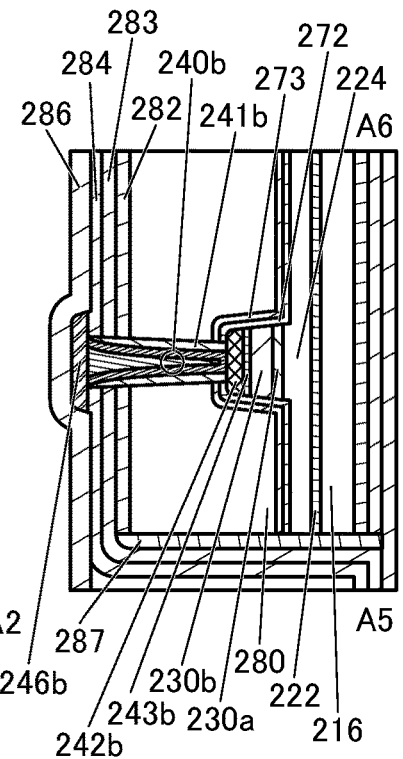

FIG. 7A is a top view of the semiconductor device including the transistor 200. FIG. 7B, FIG. 7C, and FIG. 7D are cross-sectional views of the semiconductor device. FIG. 7B is a cross-sectional view taken along dashed-dotted line A1-A2 in FIG. 7A, which corresponds to a cross-sectional view in the channel length direction of the transistor 200. FIG. 7C is a cross-sectional view taken along dashed-dotted line A3-A4 in FIG. 7A, which corresponds to a cross-sectional view in the channel width direction of the transistor 200. Furthermore, FIG. 7D is a cross-sectional view taken along dashed-dotted line A5-A6 in FIG. 7A. Note that for simplification of the drawing, some components are not illustrated in the top view in FIG. 7A.

Here, in the transistor 200, a semiconductor which includes a region where a channel is formed (hereinafter also referred to as a channel formation region) is preferably formed using a metal oxide functioning as an oxide semiconductor (hereinafter also referred to as an oxide semiconductor).

As the oxide semiconductor, for example, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, an In—Ga oxide or an In—Zn oxide may be used.

The transistor 200 including an oxide semiconductor in its channel formation region has an extremely low leakage current in the off state; thus, a semiconductor device with low power consumption can be provided. An oxide semiconductor can be deposited by a sputtering method or the like and thus can be used in the transistor 200 included in a highly integrated semiconductor device.

In contrast, a transistor including an oxide semiconductor easily has normally-on characteristics (characteristics such that a channel exists without voltage application to a gate electrode and a current flows in a transistor) owing to an impurity and an oxygen vacancy in the oxide semiconductor that affect the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Accordingly, the impurity concentration in the oxide semiconductor is preferably reduced as much as possible. Examples of impurities contained in the oxide semiconductor include hydrogen, nitrogen, alkali metal, alkaline earth metal, iron, nickel, and silicon.

Specifically, hydrogen as an impurity which is contained in the oxide semiconductor might form an oxygen vacancy (also referred to as $V_O$) in the oxide semiconductor. In some cases, a defect that is an oxygen vacancy into which hydrogen enters (hereinafter sometimes referred to as $V_OH$) generates an electron serving as a carrier. In other cases, reaction between part of hydrogen and oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Therefore, it is preferable that a transistor use a highly purified intrinsic oxide semiconductor in which oxygen vacancies and impurities such as hydrogen are reduced.

In view of the above, the transistor 200 is preferably sealed using a material that inhibits diffusion of impurities (hereinafter also referred to as an impurity barrier material) in order to inhibit entry of impurities from the outside.

Note that in this specification, a barrier property means a function of inhibiting diffusion of a targeted substance (or low permeability). Alternatively, a barrier property means a function of trapping and fixing (or gettering) a targeted substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

Here, a structure body for sealing the transistor 200 can be a single layer or a stacked-layer structure of two or more layers. In particular, the structure body for sealing the transistor 200 preferably has a stacked-layer structure or further preferably has a nested structure.

The case where the structure body for sealing the transistor 200 has a two-layer structure is specifically described. The structure body for sealing the transistor 200 includes a first structure body that is close to the transistor 200 and a second structure body that is provided outside the first structure body. In other words, the transistor 200 and the second structure body are provided with the first structure body therebetween.

In the above-described structure, the first structure body is preferably formed using a material having a function of trapping and fixing hydrogen. The second structure body is preferably formed using a material having a function of inhibiting diffusion of hydrogen and oxygen.

When a material having a function of trapping and fixing hydrogen is used on the side close to the transistor 200, hydrogen in the transistor 200 or hydrogen in an interlayer film provided between the first structure body and the transistor 200 is trapped and fixed in the first structure body and accordingly, the hydrogen concentration in the transistor 200 can be reduced.

Meanwhile, the second structure body seals the transistor 200 with the first structure body therebetween. Thus, the second structure body inhibits hydrogen that diffuses from the outside of the transistor 200, from diffusing to a portion located inward from the second structure body (to the transistor 200 side). That is, the first structure body can efficiently trap and fix hydrogen present in an internal structure of the second structure body.

In the above structure, specifically, a metal oxide such as aluminum oxide can be used for the first structure body and a nitride such as silicon nitride can be used for the second structure body. More specifically, an aluminum oxide film is preferably provided between the transistor 200 and a silicon nitride film.

Furthermore, by appropriately setting deposition conditions for the material used for the structure bodies, their hydrogen concentrations can be reduced.

In general, a film formed by a CVD method has more favorable coverage than a film formed by a sputtering method. On the other hand, many compound gases used for a CVD method contain hydrogen and a film formed by a CVD method has higher hydrogen content than a film formed by a sputtering method.

Accordingly, it is preferable to use a film with a reduced hydrogen concentration (specifically, a film formed by a sputtering method) as a film which is close to the transistor 200, for example. Meanwhile, in the case where a film that has favorable coverage as well as a relatively high hydrogen concentration (specifically, a film deposited by a CVD method) is used as a film for inhibiting impurity diffusion, it is preferable that a film having a function of trapping and fixing hydrogen and a reduced hydrogen concentration be provided between the transistor 200 and the film that has favorable coverage as well as a relatively high hydrogen concentration.

In other words, a film with a relatively low hydrogen concentration is preferably used as the film which is close to the transistor 200. In contrast, a film with a relatively high hydrogen concentration is preferably provided apart from the transistor 200.

When the above structure is employed and specifically, the transistor 200 is sealed with a silicon nitride film formed by a CVD method, an aluminum oxide film formed by a sputtering method is preferably provided between the transistor 200 and the silicon nitride film formed by a CVD method. It is further preferable that a silicon nitride film formed by a sputtering method be provided between the silicon nitride film formed by a CVD method and the aluminum oxide film formed by a sputtering method.

Note that in the case where a CVD method is employed for deposition, a compound gas containing no hydrogen atom or having a low hydrogen atom content may be used for the deposition to reduce the hydrogen concentration of the deposited film.

A specific structure for sealing the transistor 200 is described below with reference to FIG. 7.

The semiconductor device of one embodiment of the present invention includes the insulator 211 over a substrate (not shown), the insulator 212 over the insulator 211, the insulator 214 over the insulator 212, the transistor 200 over the insulator 214, the insulator 280 over the transistor 200, the insulator 282 over the insulator 280, the insulator 287 covering a side surface of the insulator 280, the insulator 283 covering the insulator 282 and the insulator 287, the insulator 284 over the insulator 283, and an insulator 274 provided in contact with the insulator 284.

Note that the insulator 211, the insulator 212, the insulator 216, the insulator 214, the insulator 280, the insulator 282, the insulator 287, the insulator 283, the insulator 284, and the insulator 274 function as interlayer films.

Here, in the case where a structure body including an excess oxygen region is provided in the vicinity of the oxide semiconductor, the excess oxygen of the structure body including the excess oxygen region can compensate for oxygen vacancies generated in the oxide semiconductor when diffusing thereto.

Thus, the insulator 280 in contact with the oxide 230*c* preferably releases oxygen by heating. In this specification, oxygen that is released by heating is referred to as excess oxygen in some cases. Oxygen in excess of that in the stoichiometric composition is referred to as excess oxygen in other cases. A region where oxygen exists in excess of that in the stoichiometric composition may be referred to as an excess oxygen region.

As the insulator including an excess oxygen region, specifically, an oxide material that releases part of oxygen by heating is preferably used. The oxide that releases oxygen by heating (hereinafter also referred to as an insulating material including an excess-oxygen region) is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

Specifically, for the insulator 280, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen, can be used. In particular, silicon oxide and silicon oxynitride, which have thermal stability, are preferable.

In particular, silicon oxide and silicon oxynitride, which have thermal stability, are preferably used for the insulator 280. A material such as silicon oxide, silicon oxynitride, or porous silicon oxide is preferably used, in which case a region including oxygen that is released by heating can be easily formed. The insulator 280 may have a stacked-layer structure of the above materials, such as a stacked-layer structure of silicon oxide deposited by a sputtering method and silicon oxynitride deposited thereover by a CVD method. Silicon nitride may be stacked thereover.

In order to provide the excess oxygen region in the insulator 280, oxygen (at least including any of oxygen radicals, oxygen atoms, and oxygen ions) is introduced into the insulator 280, so that a region containing excess oxygen is formed.

Specifically, a method for stacking metal oxides over the insulator 280 using a sputtering apparatus is given as an example of the oxygen introduction treatment. For example, by forming the insulator 282 in an oxygen gas atmosphere using a sputtering apparatus, oxygen can be introduced into the insulator 280 while the insulator 282 is formed.

It is particularly preferable that silicon oxynitride and aluminum oxide be used as the insulator 280 and the insulator 282, respectively. When an aluminum oxide film is formed over a silicon oxynitride film by a sputtering method, an excess oxygen region can be formed in silicon oxide, which is the object to be formed.

The concentration of impurities such as water or hydrogen in the insulator 280 is preferably lowered.

When the insulator 211, the insulator 212, the insulator 214, the insulator 282, the insulator 287, the insulator 283, and the insulator 284 are formed using a material with a barrier property against impurities, the oxide semiconductor of the transistor 200 can remain highly purified intrinsic.

Specifically, the insulator 214, the insulator 287, and the insulator 282 form a structure for sealing the transistor 200 and the insulator 280 (hereinafter also referred to as a sealing structure). For example, the insulator 214 is provided below the transistor 200, and the insulator 282 is provided above the transistor 200 as illustrated in FIG. 7. In addition, the insulator 287 like a sidewall is provided at a side surface of the transistor 200. A lower end portion of the insulator 287 like a sidewall is in contact with an end portion of the insulator 214, and an upper end portion of the insulator 287 is in contact with an end portion of the insulator 282.

It is preferable that the insulator 287 and the insulator 214 be reliably in contact with each other. Thus, to obtain a region where the insulator 214 and the insulator 287 are reliably in contact with each other, the insulator 287 is preferably provided to be in contact with a side surface of the insulator 212 which is provided below the insulator 214.

Accordingly, a structure in which the transistor 200 is surrounded by the insulator 214, the insulator 287, and the insulator 282 is formed.

Here, the insulator 214, the insulator 287, and the insulator 282 are formed using the same material. Preferably, the insulator 214, the insulator 287, and the insulator 282 are formed by a method using the same conditions. When the insulator 214, the insulator 287, and the insulator 282 having the same film property are in contact with each other, a sealing structure with high hermeticity can be formed.

In addition, the insulator 214, the insulator 287, and the insulator 282 are preferably formed using a material having a function of trapping and fixing hydrogen. Specifically, it is possible to use a metal oxide such as aluminum oxide, hafnium oxide, gallium oxide, or indium gallium zinc oxide.

The insulator 214, the insulator 287, and the insulator 282 that form the sealing structure are provided in contact with the transistor 200 or the insulator 280. Therefore, trapping and fixing of hydrogen that enters the transistor 200 or the insulator 280 can reduce the hydrogen concentration of the oxide semiconductor of the transistor 200.

The insulator 214, the insulator 287, and the insulator 282, which form the structure sealing the transistor 200, are surrounded by a sealing structure formed by the insulator 211, the insulator 212, and the insulator 283.

For example, as illustrated in FIG. 7, the insulator 211 and the insulator 212 are provided below the insulator 214, and the insulator 283 is provided to cover the insulator 287 and the insulator 282. Furthermore, the insulator 211 and the insulator 283 form the second sealing structure by being in contact with each other outside the structure for sealing the transistor 200 that is formed by the insulator 214, the insulator 287, and the insulator 282.

Here, the insulator 211, the insulator 212, and the insulator 283 are preferably formed using a material having a function of inhibiting diffusion of hydrogen and oxygen. It is particularly preferable to use silicon nitride or silicon nitride oxide as an insulator forming a sealing structure because they have a high barrier property against hydrogen.

It is preferable that the insulator 284 with high coverage be provided above the insulator 283 that covers the transistor 200. Note that the insulator 284 is preferably formed using the same material as those for the insulator 211, the insulator 212, and the insulator 283.

When the insulator 212 and the insulator 283 are formed by a sputtering method, for example, the sealing structure can be formed of the films having relatively low hydrogen concentrations.

On the other hand, films that are formed by a sputtering method have relatively low coverage. In view of this, the insulator 211 and the insulator 284 are formed by a CVD method or the like which enables high coverage, whereby higher hermeticity can be achieved.

Accordingly, the insulator 212 and the insulator 283 preferably have lower hydrogen concentration than the insulator 211 and the insulator 284.

Note that the insulator 211, the insulator 212, the insulator 214, the insulator 282, the insulator 287, the insulator 283, and the insulator 284 may be formed using a material with a barrier property against oxygen. When the above sealing structure has a barrier property against oxygen, excess oxygen of the insulator 280 can be inhibited from diffusing outward, and oxygen can be efficiently supplied to the transistor 200.

The semiconductor device of one embodiment of the present invention also includes a conductor 240 (a conductor 240$a$ and a conductor 240$b$) electrically connected to the transistor 200 and functioning as a plug. Note that an insulator 241 (an insulator 241$a$ and an insulator 241$b$) is provided in contact with a side surface of the conductor 240 functioning as a plug. A conductor 246 (a the conductor 246$a$ and a conductor 246$b$) electrically connected to the conductor 240 and functioning as a wiring is provided over the insulator 284 and the conductor 240. An insulator 286 is provided over the conductor 246 and the insulator 274.

Here, the insulator 241 (the insulator 241$a$ or the insulator 241$b$) is provided in contact with an inner wall of an opening that is provided in the insulator 272, the insulator 273, the insulator 280, the insulator 282, the insulator 283, and the insulator 284. A first conductor of the conductor 240 (the conductor 240$a$ or the conductor 240$b$) is provided in contact with a side surface of the insulator 241, and a second conductor of the conductor 240 is provided on the inner side.

Note that a top surface of the conductor 240 and a top surface of the insulator 284 can be substantially level with each other. Although the first conductor of the conductor 240 and the second conductor of the conductor 240 are stacked in FIG. 7, the present invention is not limited thereto. For example, the conductor 240 may have a single-layer structure or a stacked-layer structure of three or more layers.

The conductor 240$a$ and the conductor 240$b$ are each preferably formed using a conductive material containing tungsten, copper, or aluminum as its main component. The conductor 240$a$ and the conductor 240$b$ may have a stacked-layer structure. Note that the conductor 240$a$ and the conductor 240$b$ each have a circular shape in the top view in FIG. 7A;

however, the shapes of the conductors are not limited thereto. For example, in the top view, the conductor 240$a$ and the conductor 240$b$ may each have an almost circular shape such as an elliptical shape, a polygonal shape such as a quadrangular shape, or a polygonal shape such as a quadrangular shape with rounded corners.

The conductor 240 having a stacked-layer structure is preferably formed using a conductive material having a function of inhibiting penetration of oxygen and impurities such as water and hydrogen. For example, tantalum, tantalum nitride, titanium, titanium nitride, ruthenium, or ruthenium oxide is preferably used. The conductive material having a function of inhibiting penetration of oxygen and impurities such as water and hydrogen may have a single-layer structure or a stacked-layer structure. With the use of the conductive material, entry of impurities such as water and hydrogen diffused from the insulator 280 or the like into the oxide 230 through the conductor 240a and the conductor 240b can be further reduced. Furthermore, oxygen added to the insulator 280 can be prevented from being absorbed by the conductor 240a and the conductor 240b.

An insulator such as silicon nitride, aluminum oxide, or silicon nitride oxide may be used as the insulator 241a and the insulator 241b, for example. The insulator 241a and the insulator 241b are provided in contact with the insulator 284, the insulator 283, the insulator 282, the insulator 273, and the insulator 272 and thus can inhibit entry of impurities such as water and hydrogen from the insulator 274 or the like into the oxide 230 through the conductor 240a and the conductor 240b. In particular, silicon nitride is suitable because of its high hydrogen blocking property. Furthermore, oxygen contained in the insulator 280 can be prevented from being absorbed by the conductor 240a and the conductor 240b.

The conductor 246 (the conductor 246a and the conductor 246b) functioning as a wiring may be provided in contact with the top surface of the conductor 240a and the top surface of the conductor 240b. The conductor 246 is preferably formed using a conductive material containing tungsten, copper, or aluminum as its main component. The conductor may have a stacked-layer structure, such as a stacked layer of any of the above conductive materials and titanium or titanium nitride. Note that the conductor may be embedded in an opening provided in an insulator.

[Transistor 200]

As illustrated in FIG. 7, the transistor 200 includes the insulator 216, the conductor 205 (the conductor 205a and the conductor 205b), the insulator 222, the insulator 224, the oxide 230 (the oxide 230a, the oxide 230b, and the oxide 230c), the conductor 242 (the conductor 242a and the conductor 242b), the oxide 243 (the oxide 243a and the oxide 243b), the insulator 272, the insulator 273, the insulator 250, and the conductor 260 (the conductor 260a and the conductor 260b).

In the transistor 200, the conductor 260 functions as a first gate of the transistor and the conductor 205 functions as a second gate of the transistor. The conductor 242a and the conductor 242b serve as a source electrode and a drain electrode.

The oxide 230 functions as a semiconductor including a channel formation region.

The insulator 250 functions as a first gate insulator, and the insulator 222 and the insulator 224 function as a second gate insulator.

In the transistor 200 illustrated in FIG. 7, the conductor 260 is formed in a self-aligned manner in an opening portion provided in the interlayer films including the insulator 280, with the insulator 250 therebetween.

That is, the conductor 260 is formed to fill the opening provided in the interlayer films including the insulator 280 with the insulator 250 therebetween. Thus, when the conductor 260 is arranged in a region between the conductor 242a and the conductor 242b, the position alignment of the conductor 260 is unnecessary.

The oxide 230c is preferably provided in the opening that is provided in the interlayer films including the insulator 280. Thus, the insulator 250 and the conductor 260 include a region that overlaps with a stacked-layer structure of the oxide 230b and the oxide 230a with the oxide 230c therebetween. When this structure is employed, the oxide 230c and the insulator 250 can be sequentially formed and thus, the interface between the oxide 230 and the insulator 250 can be kept clean. Accordingly, the influence of interface scattering on carrier conduction is small, and the transistor 200 can have a high on-state current and high frequency characteristics.

In the transistor 200 illustrated in FIG. 7, a bottom surface and a side surface of the conductor 260 are in contact with the insulator 250. Furthermore, a bottom surface and a side surface of the insulator 250 are in contact with the oxide 230c.

In addition, the insulator 282 and the oxide 230c are in direct contact with each other in the transistor 200 as illustrated in FIG. 7B and FIG. 7C. Owing to this structure, diffusion of oxygen contained in the insulator 280 to the conductor 260 can be inhibited.

Therefore, oxygen contained in the insulator 280 can be efficiently supplied to the oxide 230a and the oxide 230b through the oxide 230c, which can reduce oxygen vacancies in the oxide 230a and the oxide 230b and improve the electrical characteristics and reliability of the transistor 200.

The structure of the semiconductor device including the transistor 200 of one embodiment of the present invention is described in detail below.

In the transistor 200, the oxide 230 (the oxide 230a, the oxide 230b, and the oxide 230c), which includes a channel formation region, is preferably formed using a metal oxide functioning as an oxide semiconductor (hereinafter also referred to as an oxide semiconductor).

For example, the metal oxide functioning as an oxide semiconductor preferably has an energy gap of 2 eV or more, further preferably 2.5 eV or more. With the use of a metal oxide having a wide energy gap, leakage current in a non-conduction state (off-state current) of the transistor 200 can be extremely small. With the use of such a transistor, a semiconductor device with low power consumption can be provided.

Specifically, as the oxide 230, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In-M oxide, an In—Zn oxide, or an M-Zn oxide may be used as the oxide 230.

As illustrated in FIG. 7, the oxide 230 preferably includes the oxide 230a over the insulator 224, the oxide 230b over the oxide 230a, and the oxide 230c that is over the oxide 230b and at least part of which is in contact with the top surface of the oxide 230b. Note that the side surface of the oxide 230c is preferably in contact with the oxide 243a, the oxide 243b, the conductor 242a, the conductor 242b, the insulator 272, the insulator 273, and the insulator 280.

That is, the oxide 230 includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

The transistor 200 has a structure in which the three layers of the oxide 230a, the oxide 230b, and the oxide 230c are stacked in a channel formation region and its vicinity; however, the present invention is not limited to this structure. For example, the transistor 200 may include a single layer of the oxide 230b, a two-layer stack of the oxide 230b and the oxide 230a, a two-layer stack of the oxide 230b and the oxide 230c, or a four or more-layer stack. For example, the transistor 200 may include a four-layer stack including the oxide 230c with a two-layer structure.

The oxide 230 preferably has a stacked-layer structure of oxide layers which differ in the atomic ratio of metal atoms. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide which can be used as the oxide 230a or the oxide 230b.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of Ga:Zn=2:1 [atomic ratio] and In:Ga:Zn=4:2:3 [atomic ratio], a stacked-layer structure of Ga:Zn=2:5 [atomic ratio] and In:Ga:Zn=4:2:3 [atomic ratio], and a stacked-layer structure of gallium oxide and In:Ga:Zn=4:2:3 [atomic ratio].

The oxide 230b may have crystallinity. For example, it is preferable to use a CAAC-OS (c-axis-aligned crystalline oxide semiconductor) described later. An oxide having crystallinity, such as a CAAC-OS, has a dense structure with small amounts of impurities and defects (e.g., oxygen vacancies) and high crystallinity. Accordingly, extraction of oxygen from the oxide 230b by the source electrode or the drain electrode can be suppressed. This inhibits extraction of oxygen from the oxide 230b even when heat treatment is performed; hence, the transistor 200 is stable with respect to high temperatures in the manufacturing process (i.e., thermal budget).

The conductor 205 is positioned to be overlapped by the oxide 230 and the conductor 260. The conductor 205 is preferably provided to be embedded in the insulator 216.

Here, the conductor 260 functions as a first gate (also referred to as a top gate) in some cases. The conductor 205 functions as a second gate (also referred to as a bottom gate) in some cases.

In the case where the conductor 205 functions as a gate electrode, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be smaller in the case where a negative potential is applied to the conductor 205 than in the case where the negative potential is not applied to the conductor 205.

As illustrated in FIG. 7A, the conductor 205 is preferably larger than the region of the oxide 230 not overlapping with the conductor 242a or the conductor 242b. It is particularly preferred that the conductor 205 extend beyond an end portion of the oxide 230 that intersects with the channel width direction, as illustrated in FIG. 7C. That is, the conductor 205 and the conductor 260 preferably overlap with each other with the insulator therebetween, in a region beyond the side surface of the oxide 230 in the channel width direction. The large-sized conductor 205 can sometimes relieve local charging (also referred to as charge up) in treatment using plasma after the formation of the conductor 205 in the manufacturing process. However, one embodiment of the present invention is not limited thereto. The conductor 205 overlaps with at least the oxide 230 positioned between the conductor 242a and the conductor 242b.

When the bottom surface of the insulator 224 is used as a reference, the bottom surface of the conductor 260 in a region not overlapping with the oxide 230a or the oxide 230b is preferably positioned below the bottom surface of the oxide 230b.

As illustrated in FIG. 7C, when the conductor 260 functioning as a gate covers a side surface and a top surface of the oxide 230b in the channel formation region with the oxide 230c and the insulator 250 therebetween, the electric field generated from the conductor 260 is likely to affect the entire channel formation region formed in the oxide 230b. Accordingly, the transistor 200 can have a higher on-state current and higher frequency characteristics. In this specification, such a transistor structure in which the channel formation region is electrically surrounded by the electric fields of a first gate and a second gate is referred to as surrounded channel (S-channel) structure.

The conductor 205a preferably inhibits penetration of oxygen and impurities such as water and hydrogen. For example, the conductor 205a can be formed using titanium, titanium nitride, tantalum, or tantalum nitride. The conductor 205b is preferably formed using a conductive material containing tungsten, copper, or aluminum as its main component. The conductor 205 has a two-layer structure in the drawing but may have a multilayer structure of three or more layers.

Note that the oxide semiconductor, the insulator or conductor positioned below the oxide semiconductor, and the insulator or conductor positioned over the oxide semiconductor are preferably successively formed without exposure to the air, in which case a substantially highly purified intrinsic oxide semiconductor film with a reduced concentration of impurities (in particular, hydrogen and water) can be formed.

At least one of the insulator 272 and the insulator 273 preferably functions as a barrier insulating film that inhibits entry of impurities such as water and hydrogen into the transistor 200 from the substrate side or from above the transistor 200. Therefore, at least one of the insulator 222, the insulator 272, and the insulator 273 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass.

Alternatively, it is preferable to use an insulating material having a function of inhibiting diffusion of oxygen (e.g., at least one of oxygen atoms, oxygen molecules, and the like), that is, an insulating material through which the above oxygen is less likely to pass.

For example, it is preferable that silicon nitride, silicon nitride oxide, or the like be used for the insulator 273 and aluminum oxide, hafnium oxide, or the like be used for the insulator 272.

Accordingly, it is possible to inhibit diffusion of impurities such as water and hydrogen to the transistor 200 side from the substrate side through the insulator 222. It is also possible to inhibit diffusion of oxygen contained in the insulator 224 and the like to the substrate side through the insulator 222.

Impurities such as water and hydrogen can be inhibited from diffusing to the transistor 200 side from the insulator 280 and the like, which are provided with the insulator 272 and the insulator 273 therebetween. In this manner, the transistor 200 is preferably surrounded by the insulator 272 and the insulator 273 that have a function of inhibiting diffusion of oxygen and impurities such as water and hydrogen.

The insulator 222 and the insulator 224 each function as a gate insulator.

Here, it is preferable that the insulator 224 in contact with the oxide 230 release oxygen by heating. In this specification, oxygen that is released by heating is referred to as excess oxygen in some cases. For example, silicon oxide, silicon oxynitride, or the like may be used for the insulator 224 as appropriate. When such an insulator containing oxygen is provided in contact with the oxide 230, oxygen vacancies in the oxide 230 can be reduced, leading to an improvement in reliability of the transistor 200.

Specifically, the insulator 224 is preferably formed using an oxide material that releases part of oxygen by heating. An oxide that releases oxygen by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy (TDS) analysis. In the TDS analysis, the film surface temperature is preferably higher than or equal to 100° C. and lower than or equal to 700° C., or higher than or equal to 100° C. and lower than or equal to 400° C.

The insulator 222 preferably functions as a barrier insulating film that inhibits entry of impurities such as water and hydrogen into the transistor 200 from the substrate side. For example, the insulator 222 preferably has a lower hydrogen permeability than the insulator 224. When the insulator 224, the oxide 230, and the like are surrounded by the insulator 222 and the insulator 283, entry of impurities such as water and hydrogen into the transistor 200 from the outside can be inhibited.

Furthermore, the insulator 222 preferably has a function of inhibiting diffusion of oxygen (e.g., at least one of oxygen atoms, oxygen molecules, and the like); that is, it is preferable that oxygen is less likely to pass through the insulator 222. For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen in the insulator 224 or the oxide 230.

As the insulator 222, an insulator containing an oxide of one or both of aluminum and hafnium that is an insulating material is preferably used. For the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST). With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

Note that the insulator 222 and the insulator 224 may each have a stacked-layer structure of two or more layers. In that case, the stacked layers are not necessarily formed of the same material and may be formed of different materials.

The oxide 243 (the oxide 243a and the oxide 243b) may be provided between the oxide 230b and the conductor 242 (the conductor 242a and the conductor 242b) functioning as a source electrode and a drain electrode. The conductor 242 and the oxide 230 are not in contact with each other, so that the conductor 242 can be inhibited from absorbing oxygen from the oxide 230. That is, preventing the oxidation of the conductor 242 can inhibit a decrease in the conductivity of the conductor 242. Accordingly, the oxide 243 preferably has a function of inhibiting the oxidation of the conductor 242.

Thus, the oxide 243 preferably has a function of inhibiting penetration of oxygen. The oxide 243 having a function of inhibiting penetration of oxygen is preferably provided between the oxide 230b and the conductor 242 functioning as the source electrode and the drain electrode, in which case the electric resistance between the conductor 242 and the oxide 230b can be reduced. Such a structure improves the electrical characteristics of the transistor 200 and reliability of the transistor 200.

A metal oxide including an element M may be used for the oxide 243. Specifically, the element M is preferably aluminum, gallium, yttrium, or tin. The concentration of the element M in the oxide 243 is preferably higher than that in the oxide 230b. Alternatively, gallium oxide may be used for the oxide 243. Further alternatively, a metal oxide such as an In-M-Zn oxide may be used for the oxide 243. Specifically, the atomic ratio of the element M to In in the metal oxide used for the oxide 243 is preferably higher than that in the metal oxide used for the oxide 230b. The thickness of the oxide 243 is preferably greater than or equal to 0.5 nm and less than or equal to 5 nm, further preferably greater than or equal to 1 nm and less than or equal to 3 nm. The oxide 243 preferably has crystallinity. With the oxide 243 having crystallinity, release of oxygen in the oxide 230 can be favorably inhibited. When the oxide 243 has a hexagonal crystal structure, for example, release of oxygen in the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly probable that oxidation of the conductor 242 lowers the conductivity of the conductor 242. Note that the expression "oxygen in the oxide 230 diffuses into the conductor 242" can be replaced with the expression "the conductor 242 absorbs oxygen in the oxide 230".

When oxygen in the oxide 230 is diffused into the conductor 242 (the conductor 242a and the conductor 242b), another layer is sometimes formed between the conductor 242a and the oxide 230b, and between the conductor 242b and the oxide 230b. The layer contains a larger amount of oxygen than the conductor 242 and thus presumably has an insulating property. In that case, a three-layer structure of the conductor 242, the layer, and the oxide 230b can be regarded as a three-layer structure of a metal, an insulator, and a semiconductor and is sometimes referred to as an MIS (Metal-Insulator-Semiconductor) structure or a diode-connected structure mainly with an MIS structure.

The above layer is not necessarily formed between the conductor 242 and the oxide 230b; for example, the layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that the insulator 272 be provided in contact with the top surface of the conductor 242 and function as a barrier layer. Such a structure can inhibit the conductor 242 from absorbing excess oxygen contained in the insulator 280. Furthermore, inhibiting the oxidation of the conductor 242 can suppress an increase in the contact resistance between the transistor 200 and the wiring. Accordingly, the transistor 200 can have excellent electrical characteristics and reliability.

Thus, the insulator 272 preferably has a function of inhibiting oxygen diffusion. For example, it is preferable that the insulator 272 be more likely to inhibit diffusion of oxygen than the insulator 280. For example, an insulator containing an oxide of one or both of aluminum and hafnium is preferably formed as the insulator 272. For another example, an insulator containing aluminum nitride may be used as the insulator 272.

As illustrated in FIG. 7D, the insulator 272 is in contact with part of the top surface of the conductor 242b and the side surface of the conductor 242b. In addition, although not illustrated, the insulator 272 is in contact with part of the top surface of the conductor 242a and the side surface the conductor 242a. The insulator 273 is provided over the insulator 272. Such a structure can inhibit the conductor 242 from absorbing oxygen added to the insulator 280, for example.

The insulator 250 functions as a gate insulator. The insulator 250 is preferably in contact with a top surface of the oxide 230c. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Silicon oxide and silicon oxynitride, which have thermal stability, are particularly preferable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b. Furthermore, as in the insulator 224, the concentration of impurities such as water and hydrogen in the insulator 250 is preferably lowered. The thickness of the insulator 250 is preferably greater than or equal to 1 nm and less than or equal to 20 nm.

A metal oxide may be provided between the insulator 250 and the conductor 260. The metal oxide preferably prevents oxygen diffusion from the insulator 250 into the conductor 260. Providing the metal oxide that inhibits oxygen diffusion inhibits diffusion of oxygen from the insulator 250 to the conductor 260. That is, the reduction in the amount of oxygen supplied to the oxide 230 can be inhibited. Moreover, oxidation of the conductor 260 due to oxygen in the insulator 250 can be inhibited.

The metal oxide functions as part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide functions as part of the gate in some cases. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide in which a channel is formed. A conductive material containing any of the above metal elements and nitrogen may also be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the metal oxide in which a channel is formed can be captured in some cases. Alternatively, hydrogen entering from an external insulator or the like can be captured in some cases.

Although FIG. 7 shows that the conductor 260 has a two-layer structure, the conductor 260 may have a single-layer structure or a stacked-layer structure of three or more layers.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 260a is preferably formed using a conductive material having a function of inhibiting diffusion of oxygen (e.g., at least one of oxygen atoms, oxygen molecules, and the like).

When the conductor 260a has a function of inhibiting diffusion of oxygen, the conductivity can be prevented from being lowered because of oxidization of the conductor 260b due to oxygen in the insulator 250. As a conductive material having a function of inhibiting oxygen diffusion, tantalum, tantalum nitride, ruthenium, or ruthenium oxide is preferably used, for example.

Furthermore, the conductor 260b is preferably formed using a conductive material including tungsten, copper, or aluminum as its main component. The conductor 260 also functions as a wiring and thus is preferably a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

<<Modification Example 1 of Semiconductor Device>>

An example of a semiconductor device including the transistor 200 of one embodiment of the present invention is described below with reference to FIG. 8.

Figure 8A:
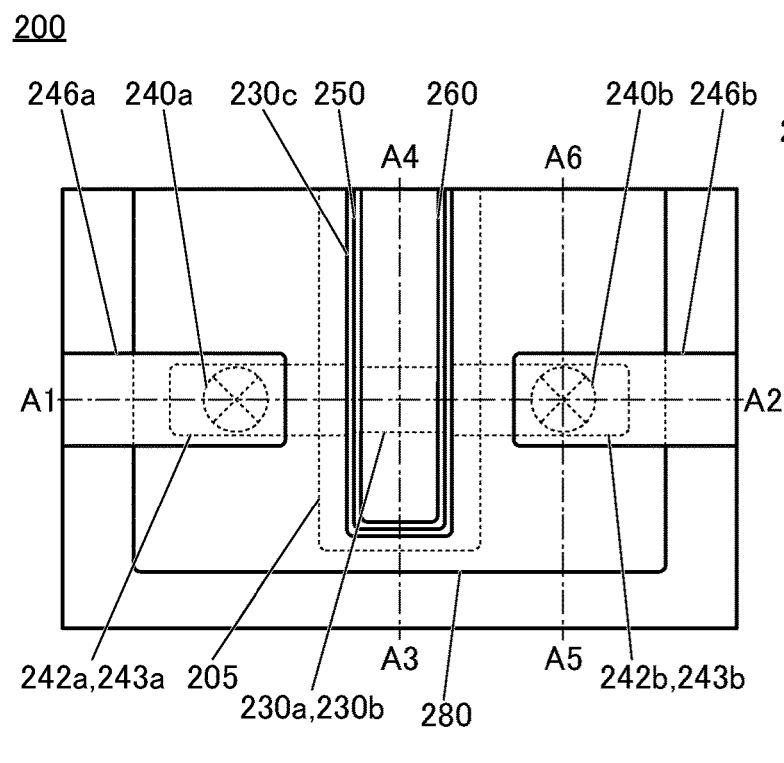
FIG. 8A is a top view of the semiconductor device of one embodiment of the present invention.
Figure 8C:
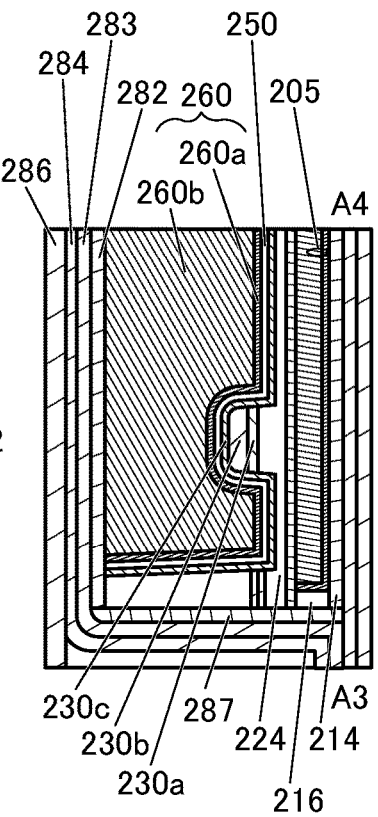
FIG. 8B to FIG. 8D are cross-sectional views of a semiconductor device of one embodiment of the present invention.
Figure 8B:
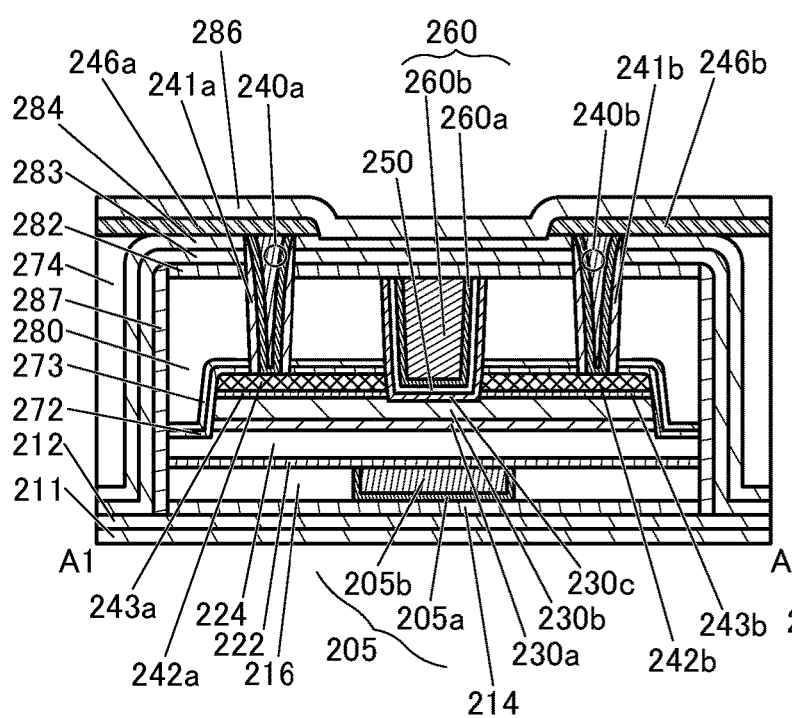
Figure 8D:
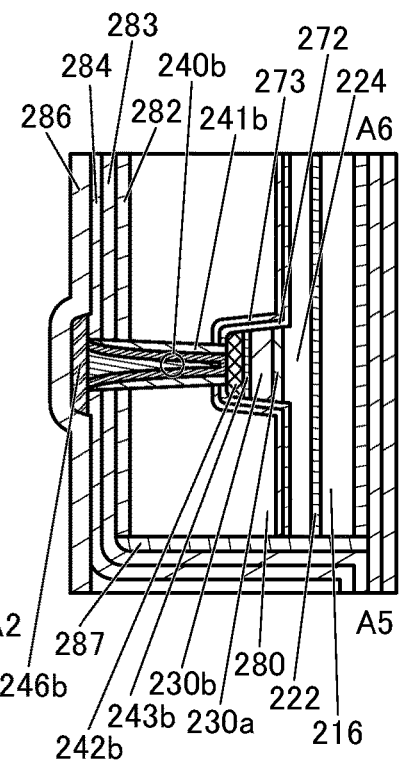

Here, FIG. 8A is a top view. FIG. 8B is a cross-sectional view taken along dashed-dotted line A1-A2 in FIG. 8A. FIG. 8C is a cross-sectional view taken along dashed-dotted line A3-A4 in FIG. 8A. FIG. 8D is a cross-sectional view taken along dashed-dotted line A5-A6 in FIG. 8A. Note that in the top view in FIG. 8A, some components are not illustrated for simplification of the drawing.

The semiconductor device illustrated in FIG. 8 is different from the semiconductor device illustrated in FIG. 7 in that a top surface of the insulator 212 and the insulator 283 are in contact with each other. Specifically, the insulator 212 is preferably provided to extend below the insulator 283. The thickness of the insulator 212 in a region overlapping with the transistor 200 is sometimes larger than the thickness of the insulator 212 in a region in contact with the insulator 283.

<<Modification Example 2 of Semiconductor Device>>

An example of a semiconductor device including the transistor 200 of one embodiment of the present invention is described below with reference to FIG. 9.

Figure 9A:
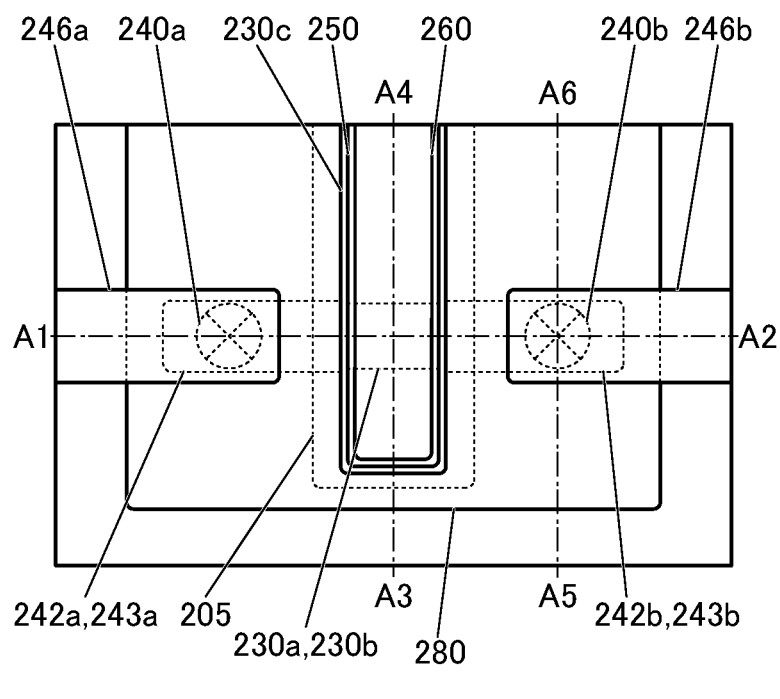
FIG. 9A is a top view of the semiconductor device of one embodiment of the present invention.
Figure 9C:
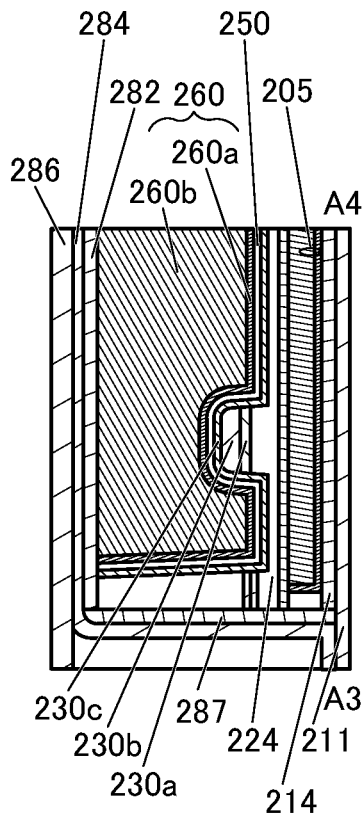
FIG. 9B to FIG. 9D are cross-sectional views of a semiconductor device of one embodiment of the present invention.
Figure 9B:
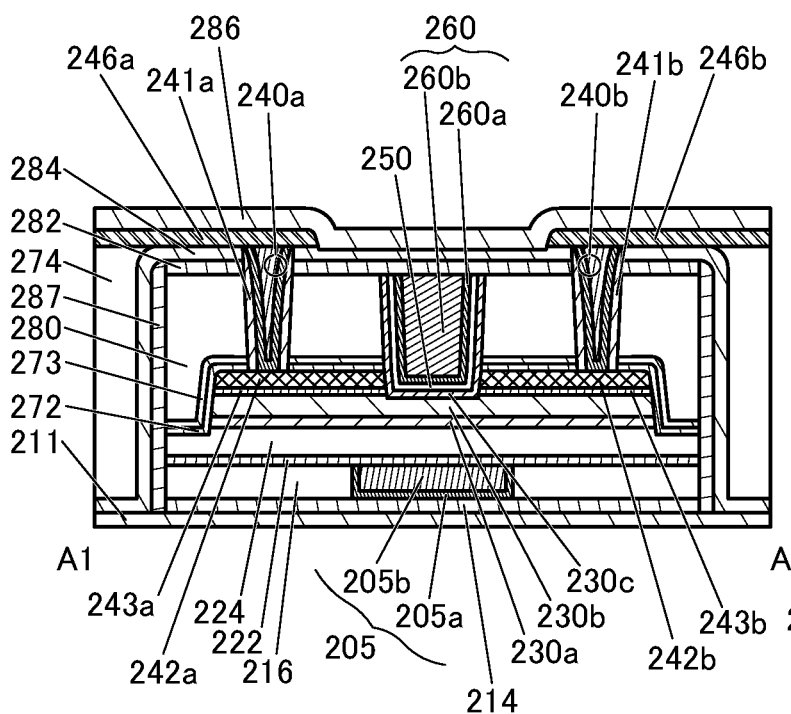
Figure 9D:
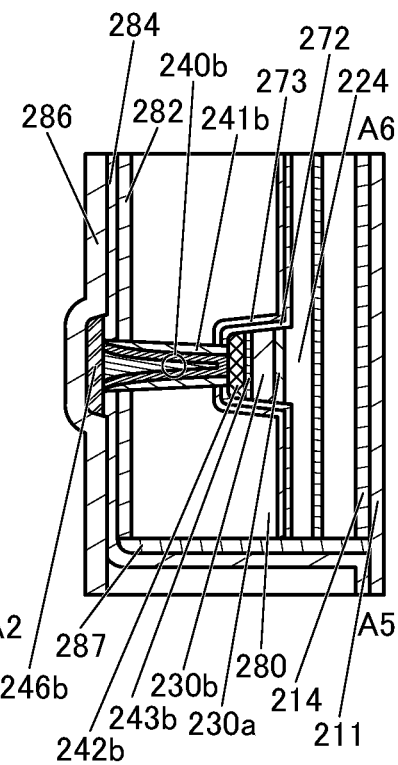
Figure 10A:
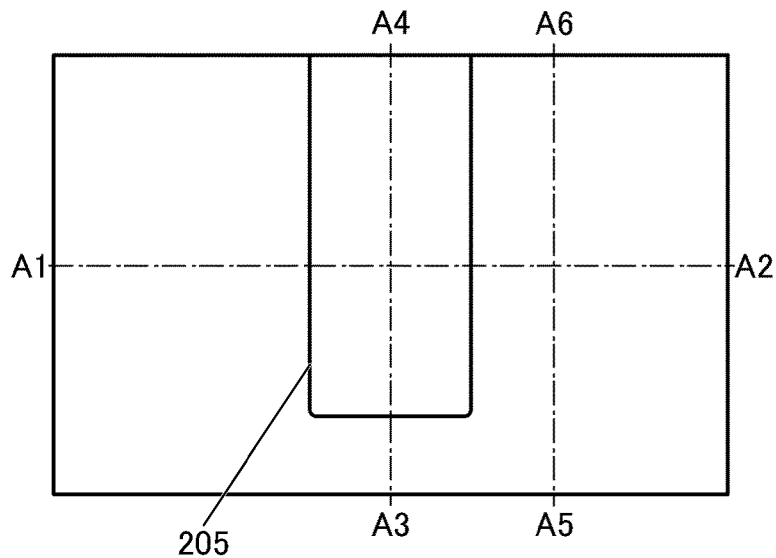
FIG. 10A is a top view illustrating a manufacturing method of a semiconductor device of one embodiment of the present invention.
Figure 10C:
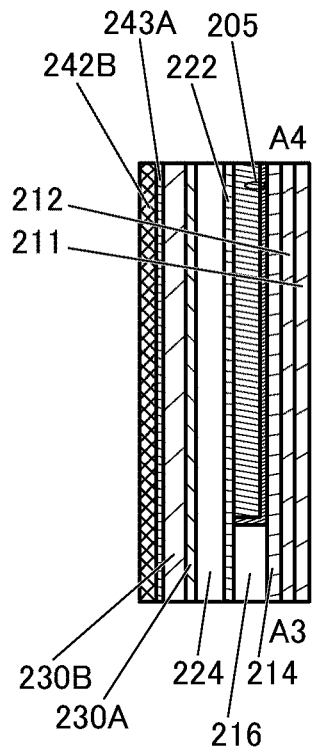
FIG. 10B to FIG. 10D are cross-sectional views illustrating a manufacturing method of a semiconductor device of one embodiment of the present invention.
Figure 10B:
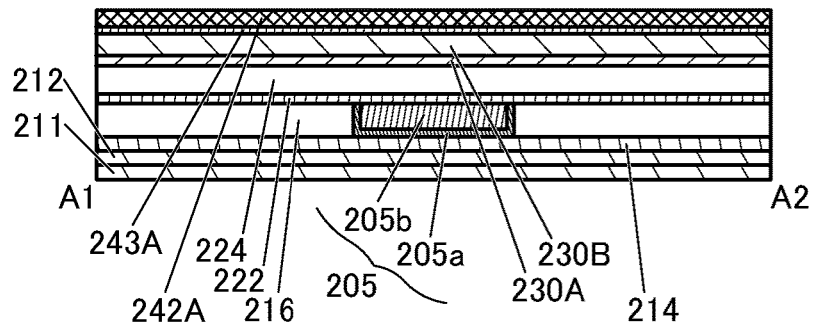
Figure 10D:
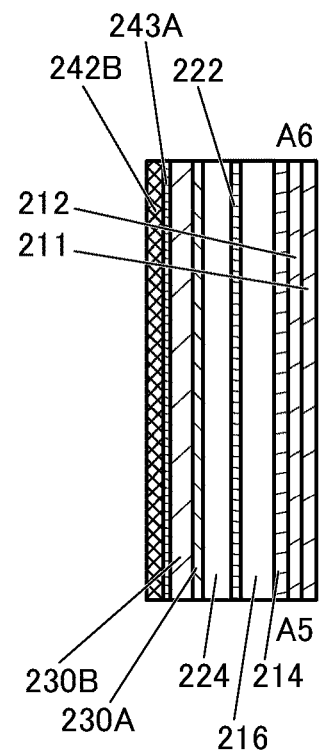
Figure 12A:
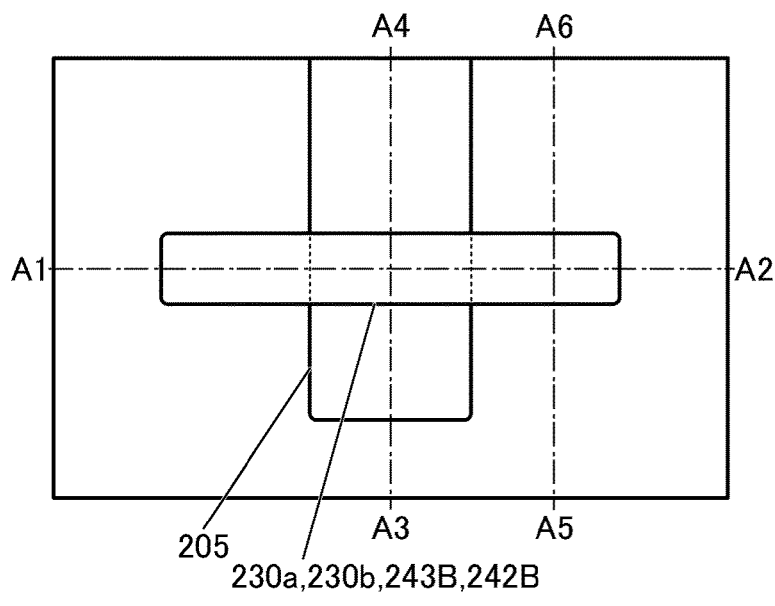
FIG. 12A is a top view illustrating a manufacturing method of a semiconductor device of one embodiment of the present invention.
Figure 12C:
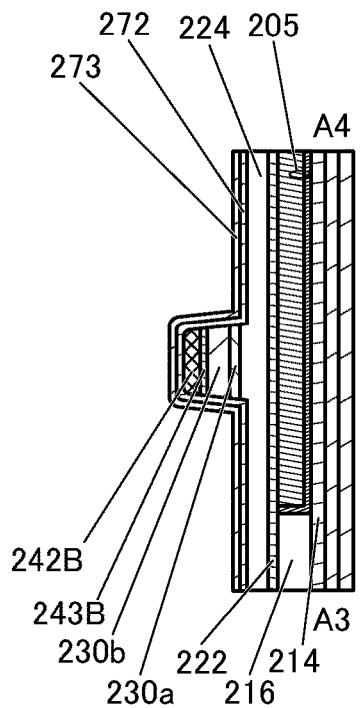
FIG. 12B to FIG. 12D are cross-sectional views illustrating a manufacturing method of a semiconductor device of one embodiment of the present invention.
Figure 12B:
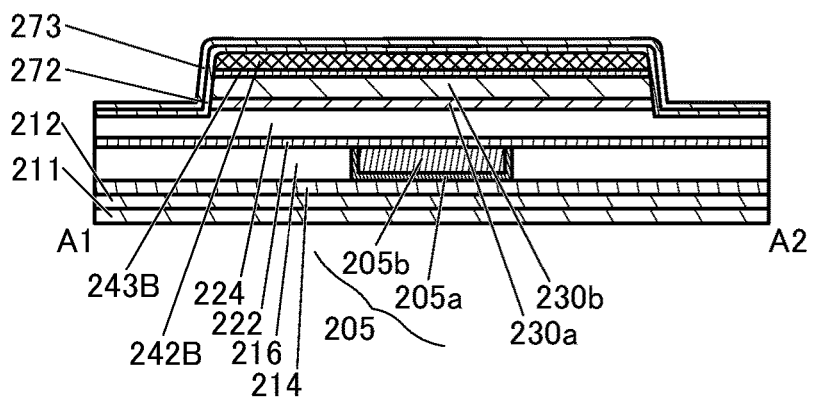
Figure 12D:
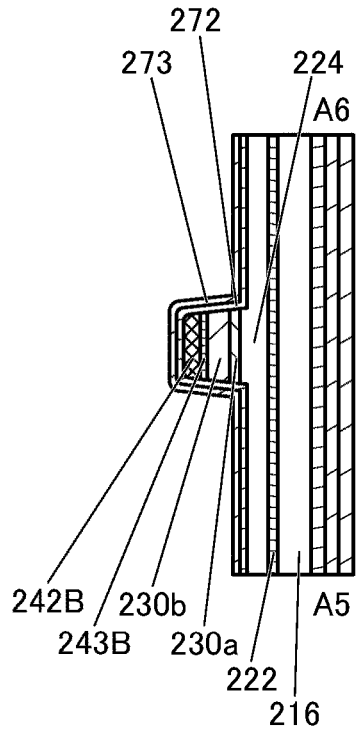
Figure 13A:
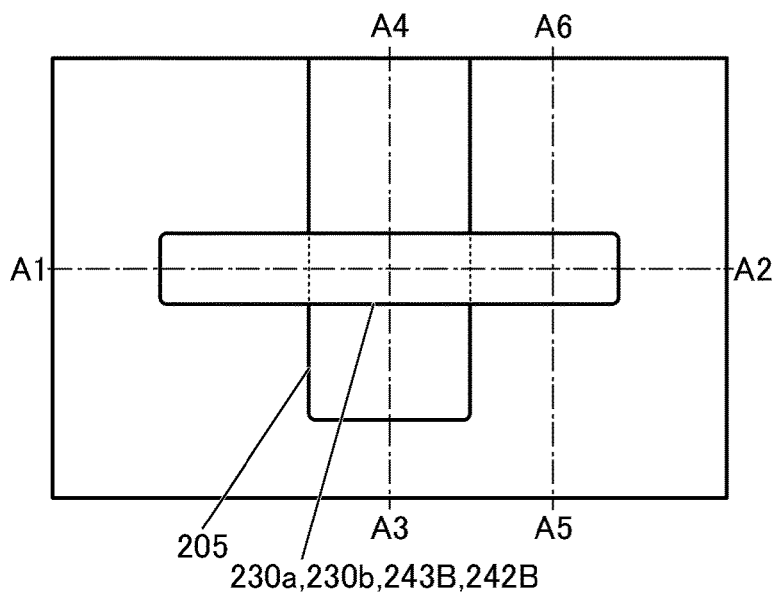
FIG. 13A is a top view illustrating a manufacturing method of a semiconductor device of one embodiment of the present invention.
Figure 13C:
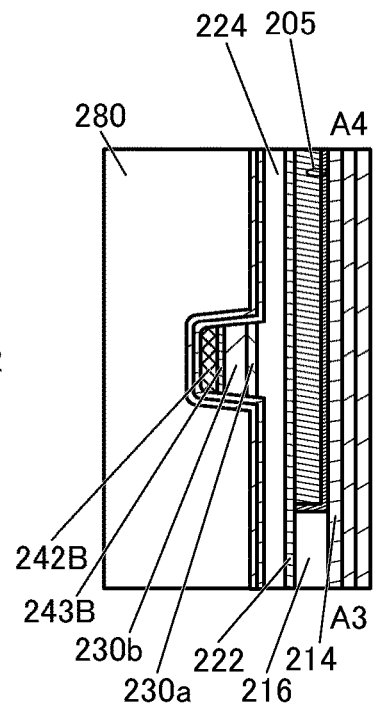
FIG. 13B to FIG. 13D are cross-sectional views illustrating a manufacturing method of a semiconductor device of one embodiment of the present invention.
Figure 13B:
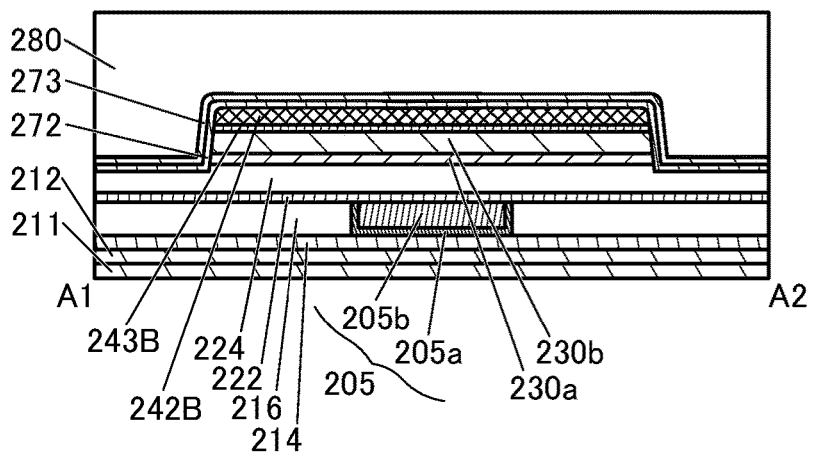
Figure 13D:
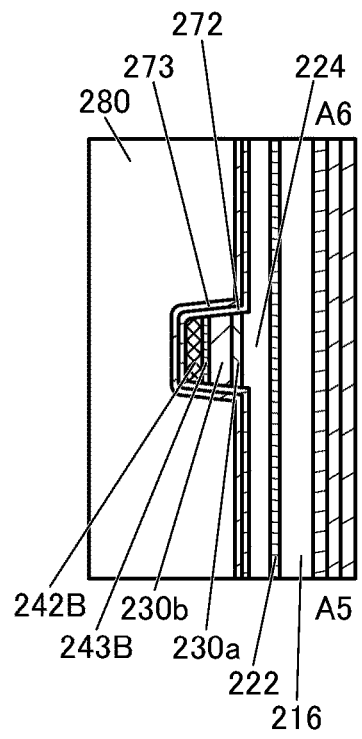
Figure 14A:
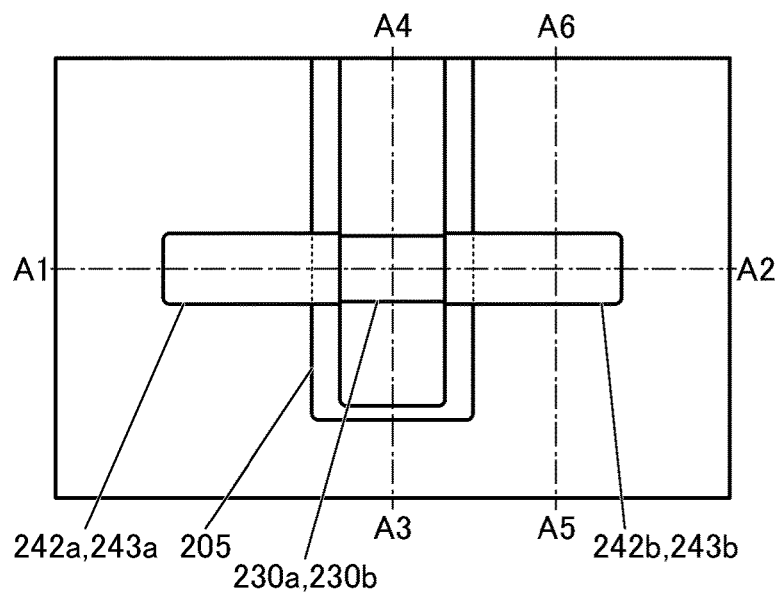
FIG. 14A is a top view illustrating a manufacturing method of a semiconductor device of one embodiment of the present invention.
Figure 14C:
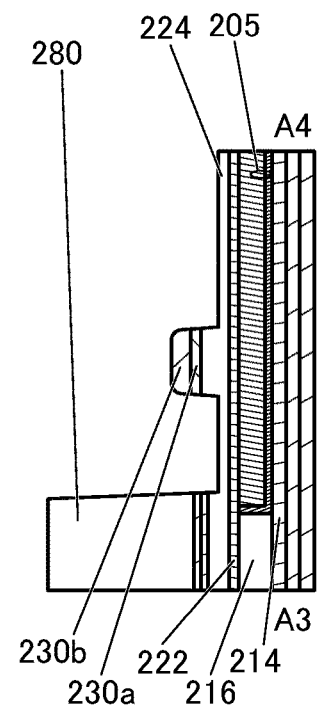
FIG. 14B to FIG. 14D are cross-sectional views illustrating a manufacturing method of a semiconductor device of one embodiment of the present invention.
Figure 14B:
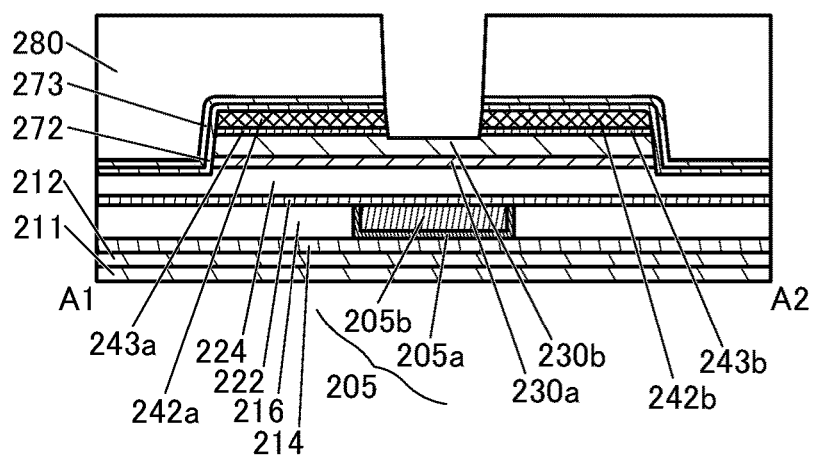
Figure 14D:
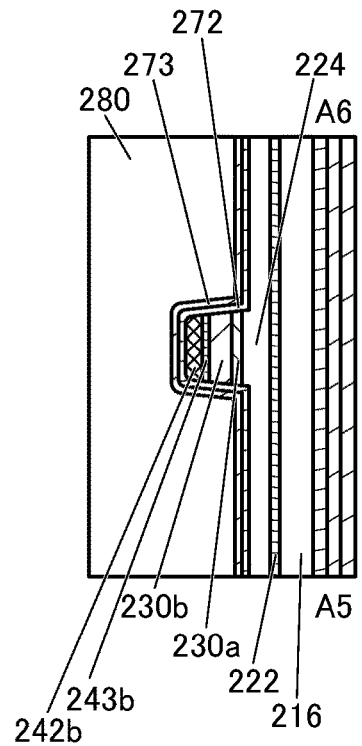
Figure 15A:
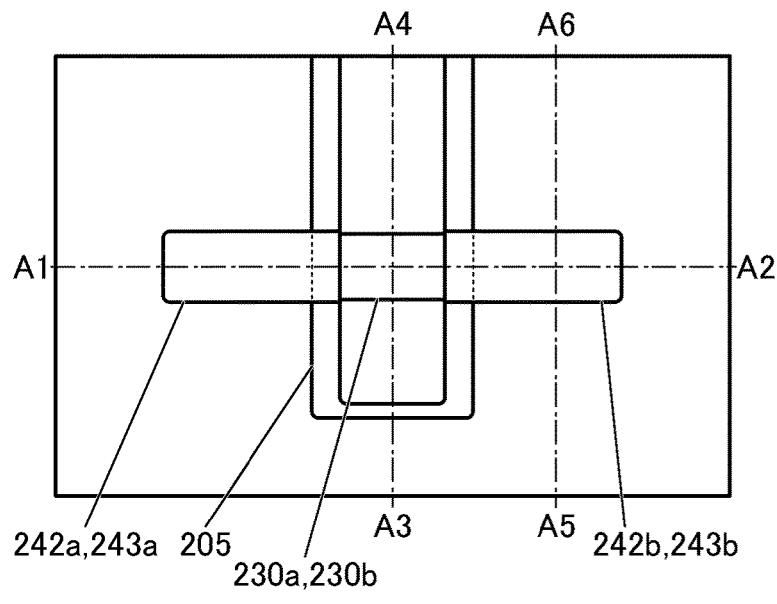
FIG. 15A is a top view illustrating a manufacturing method of a semiconductor device of one embodiment of the present invention.
Figure 15C:
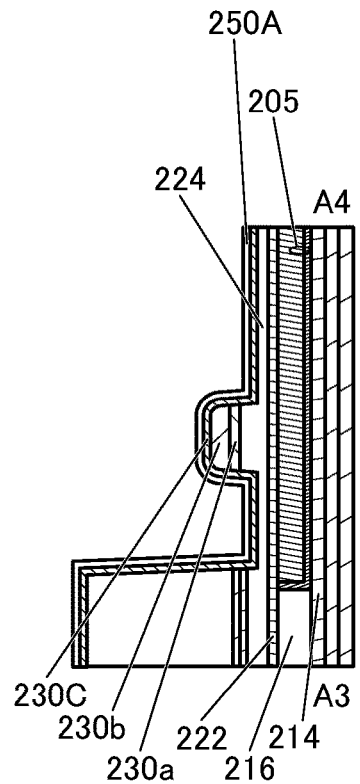
FIG. 15B to FIG. 15D are cross-sectional views illustrating a manufacturing method of a semiconductor device of one embodiment of the present invention.
Figure 15B:
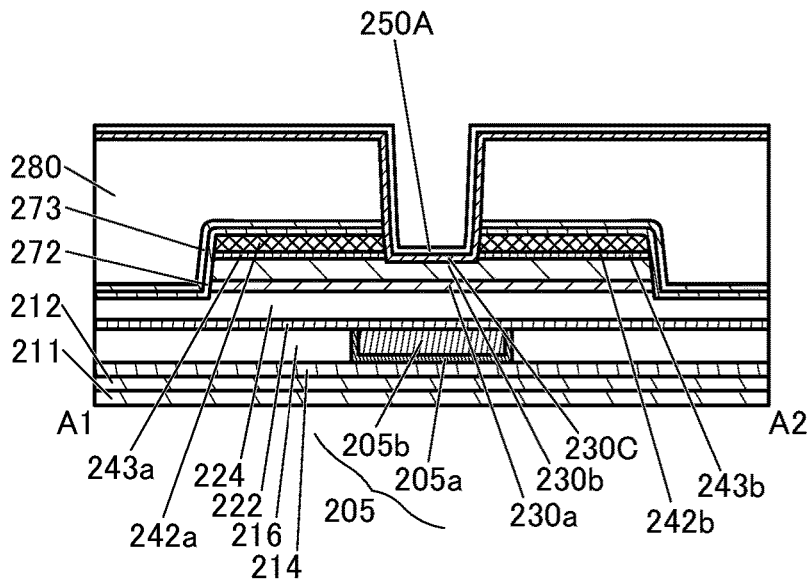
Figure 15D:
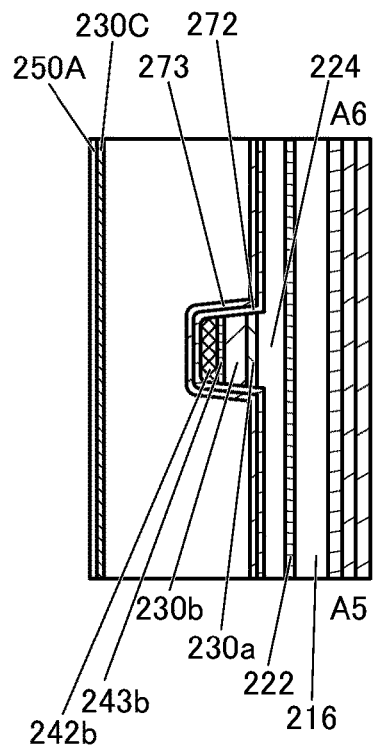
Figure 16A:
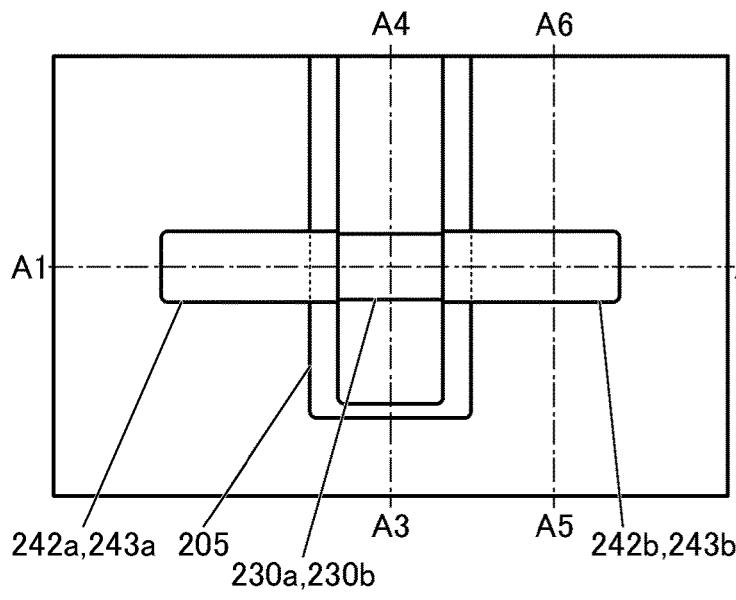
FIG. 16A is a top view illustrating a manufacturing method of a semiconductor device of one embodiment of the present invention.
Figure 16C:
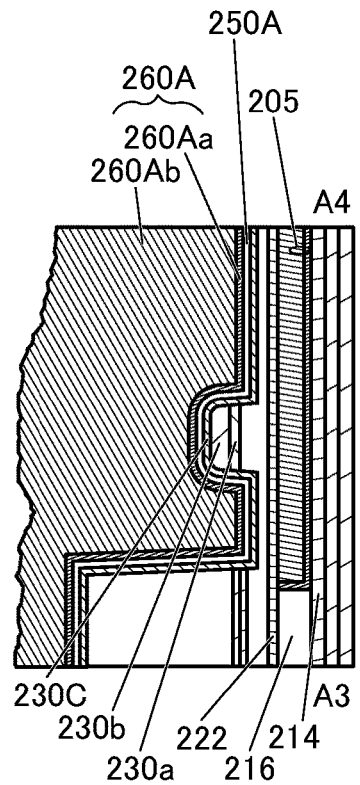
FIG. 16B to FIG. 16D are cross-sectional views illustrating a manufacturing method of a semiconductor device of one embodiment of the present invention.
Figure 16B:
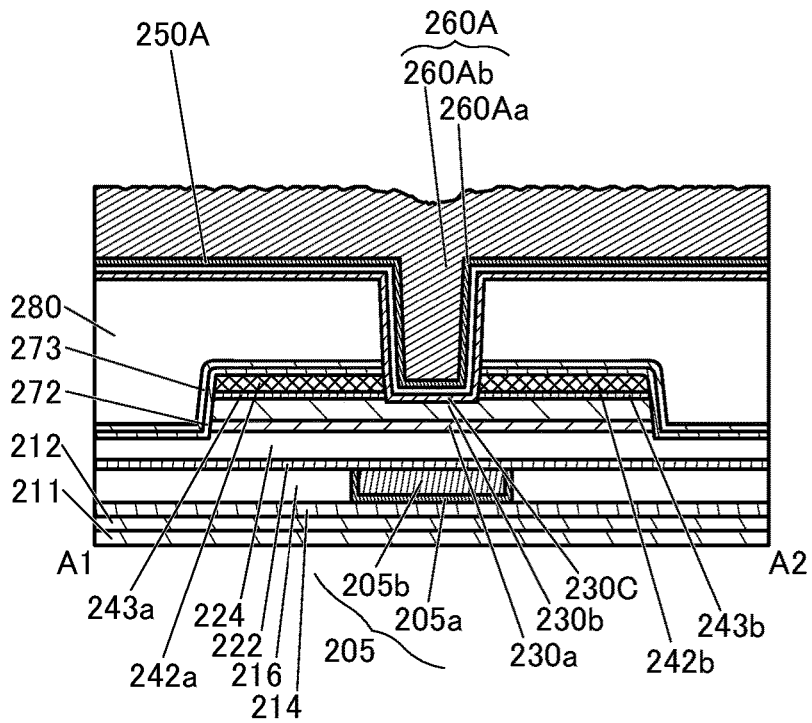
Figure 16D:
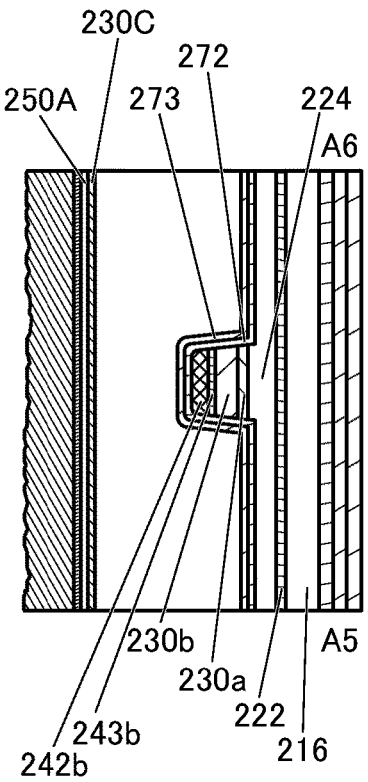
Figure 17A:
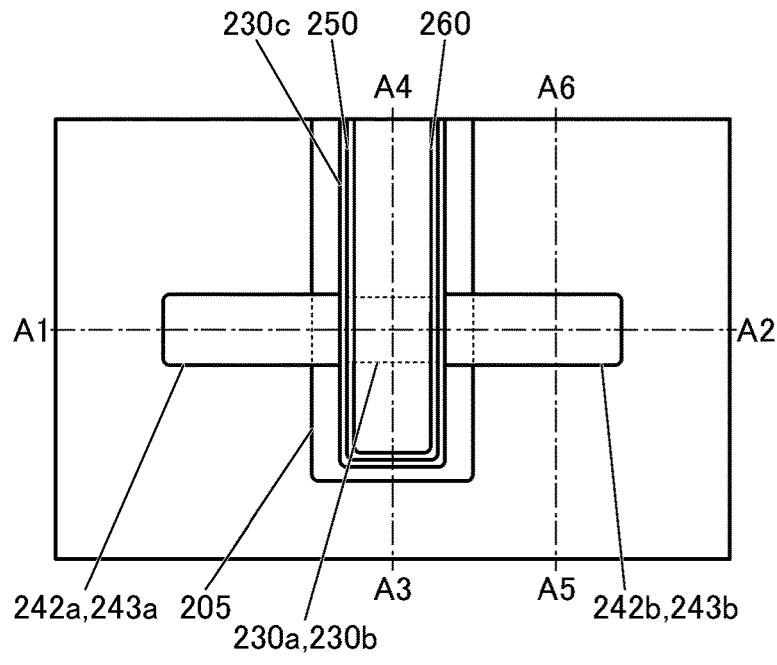
FIG. 17A is a top view illustrating a manufacturing method of a semiconductor device of one embodiment of the present invention.
Figure 17C:
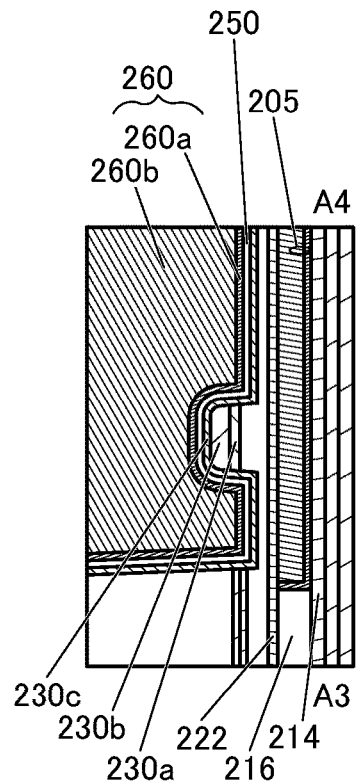
FIG. 17B to FIG. 17D are cross-sectional views illustrating a manufacturing method of a semiconductor device of one embodiment of the present invention.
Figure 17B:
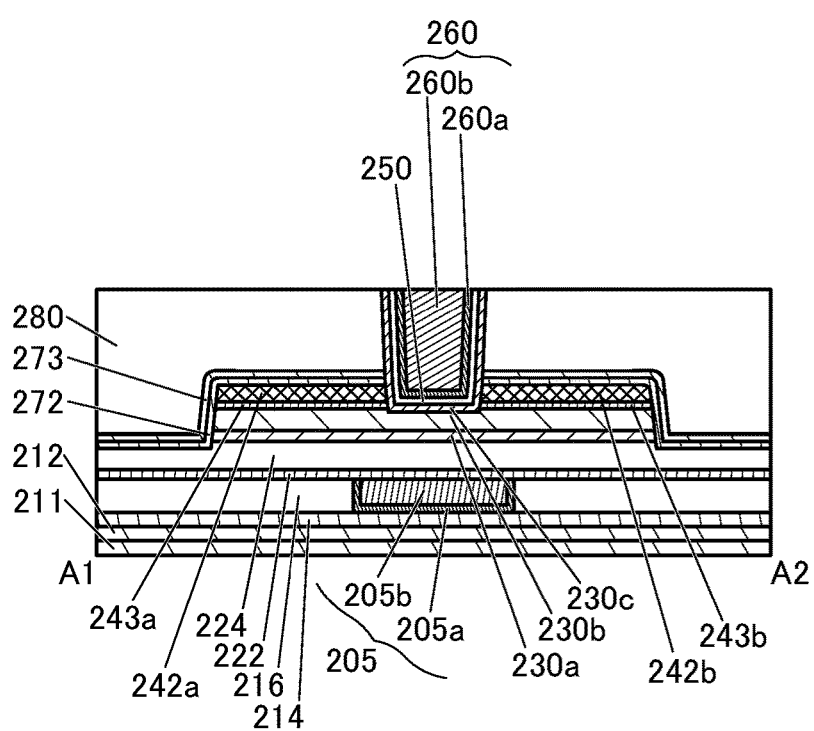
Figure 17D:
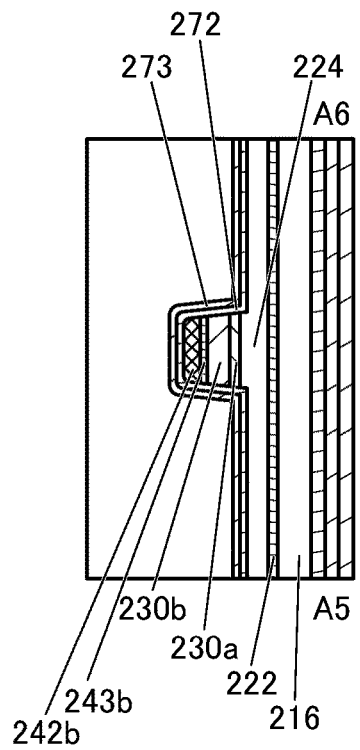
Figure 18A:
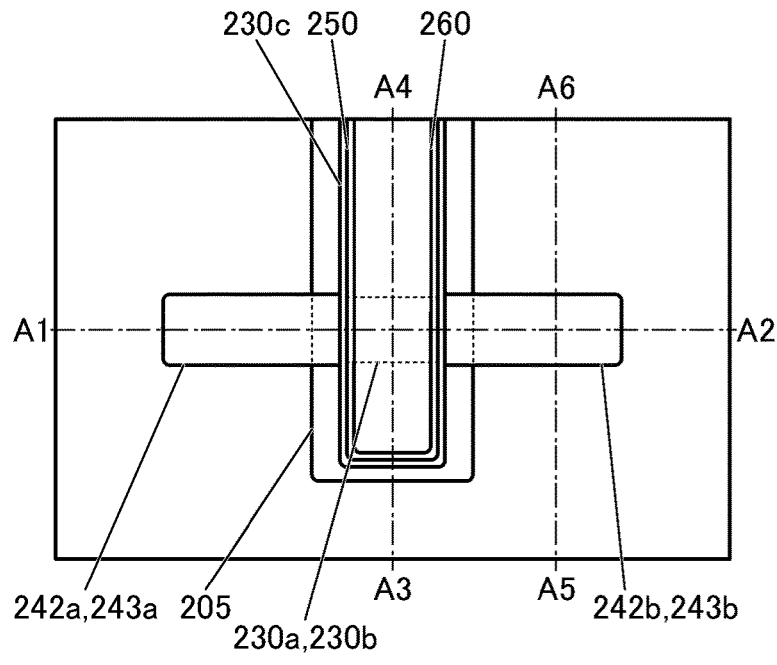
FIG. 18A is a top view illustrating a manufacturing method of a semiconductor device of one embodiment of the present invention.
Figure 18C:
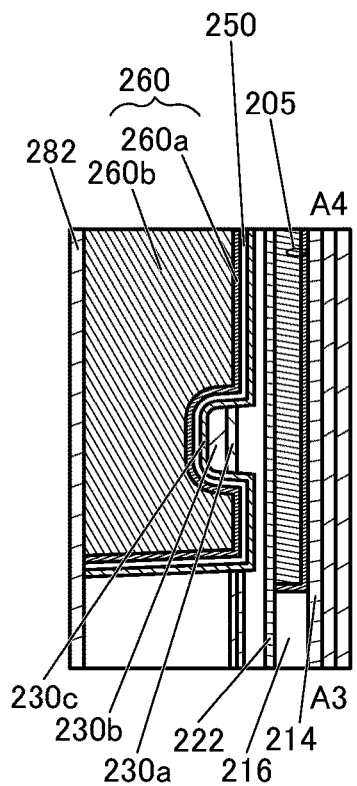
FIG. 18B to FIG. 18D are cross-sectional views illustrating a manufacturing method of a semiconductor device of one embodiment of the present invention.
Figure 18B:
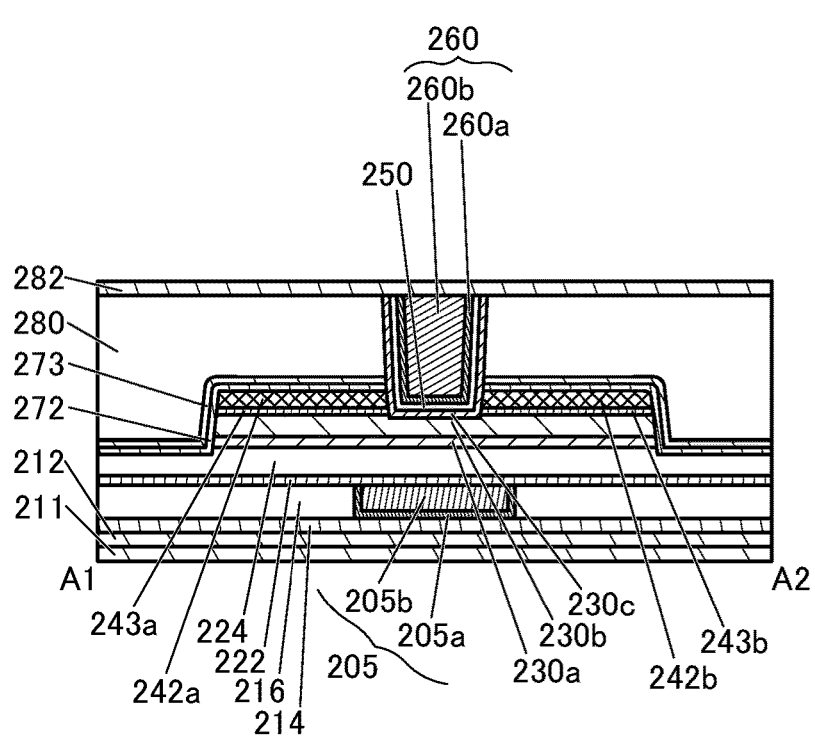
Figure 18D:
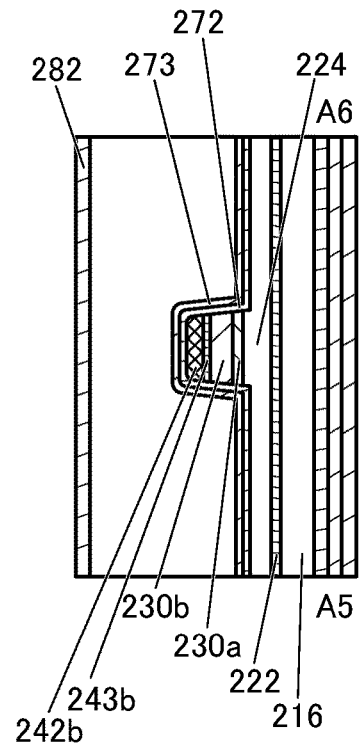
Figure 19A:
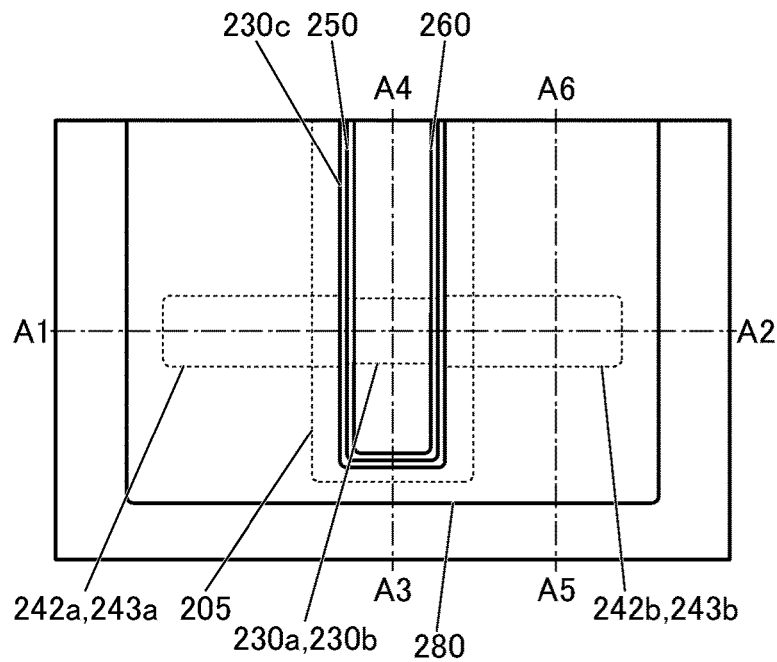
FIG. 19A is a top view illustrating a manufacturing method of a semiconductor device of one embodiment of the present invention.
Figure 19C:
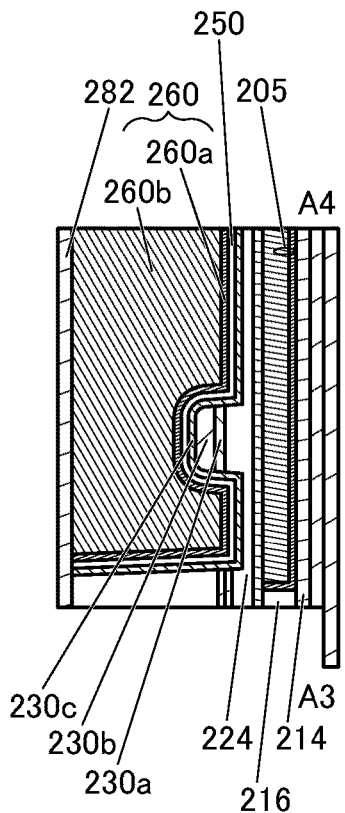
FIG. 19B to FIG. 19D are cross-sectional views illustrating a manufacturing method of a semiconductor device of one embodiment of the present invention.
Figure 19B:
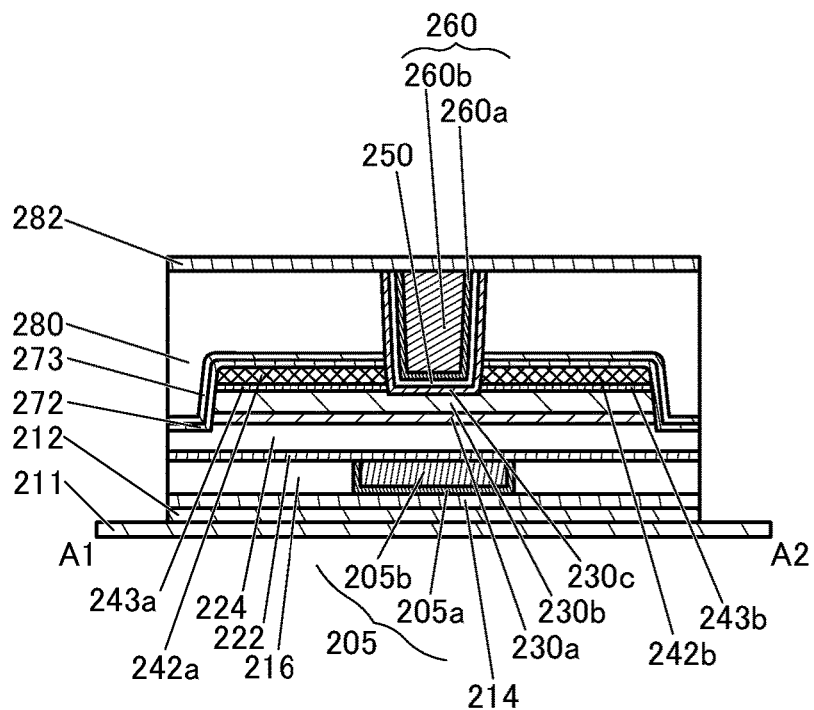
Figure 19D:
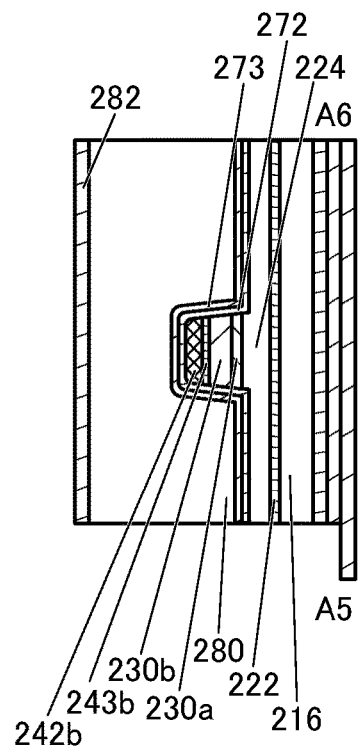
Figure 20A:
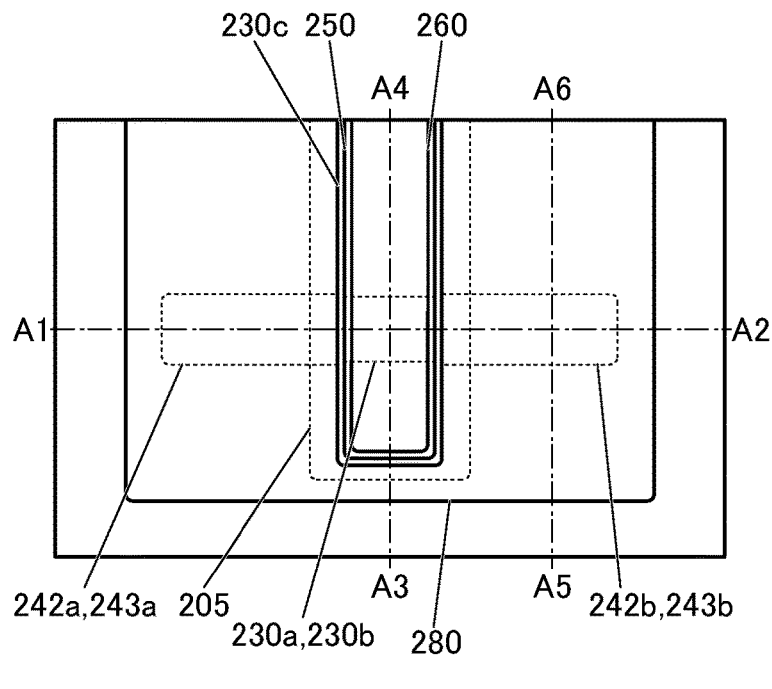
FIG. 20A is a top view illustrating a manufacturing method of a semiconductor device of one embodiment of the present invention.
Figure 20C:
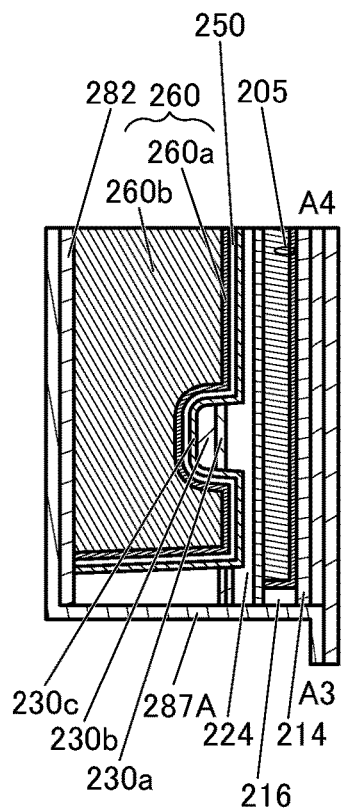
FIG. 20B to FIG. 20D are cross-sectional views illustrating a manufacturing method of a semiconductor device of one embodiment of the present invention.
Figure 20B:
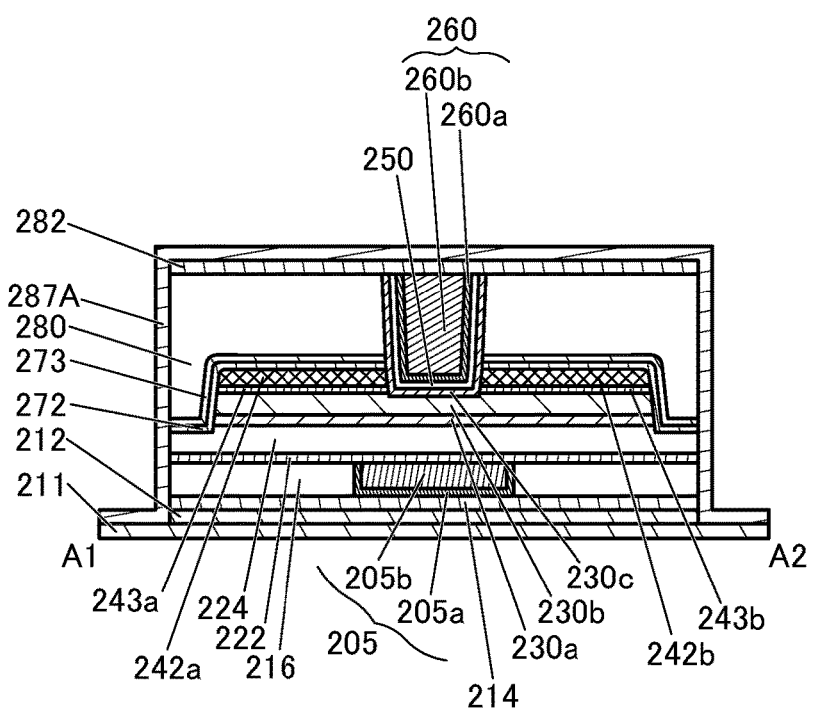
Figure 20D:
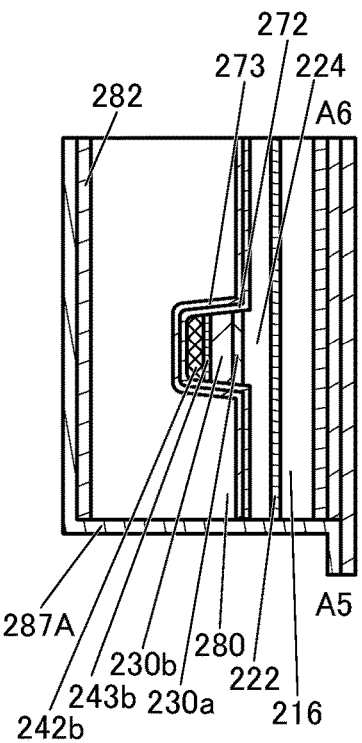
Figure 21A:
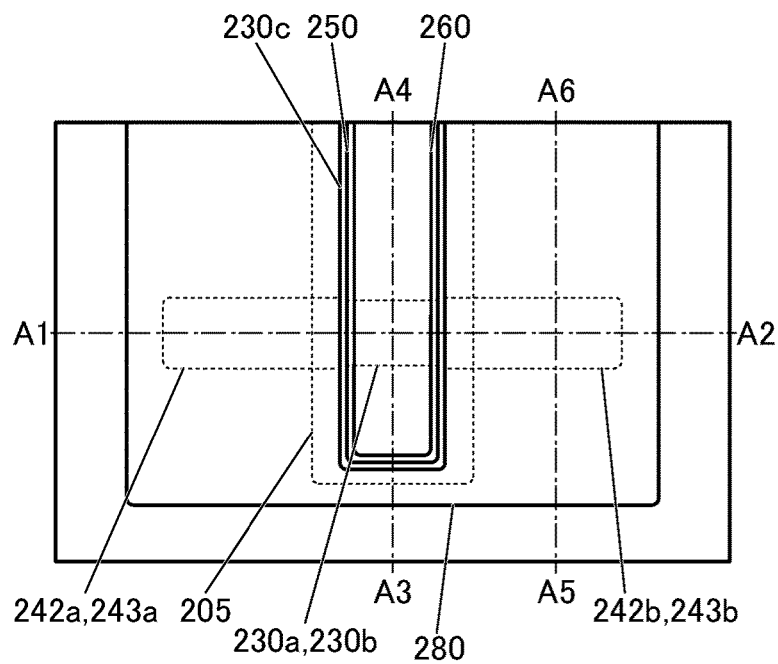
FIG. 21A is a top view illustrating a manufacturing method of a semiconductor device of one embodiment of the present invention.
Figure 21C:
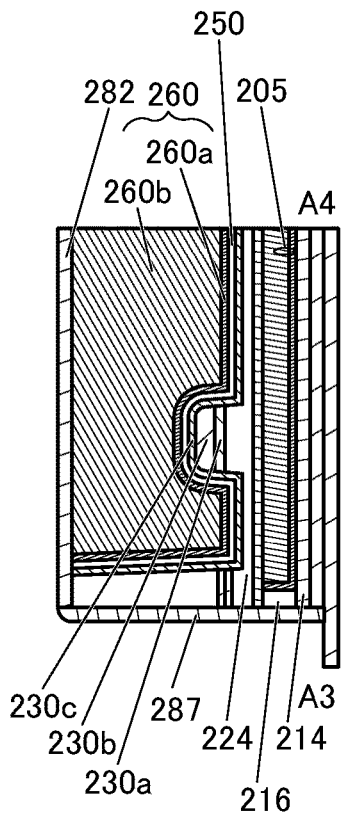
FIG. 21B to FIG. 21D are cross-sectional views illustrating a manufacturing method of a semiconductor device of one embodiment of the present invention.
Figure 21B:
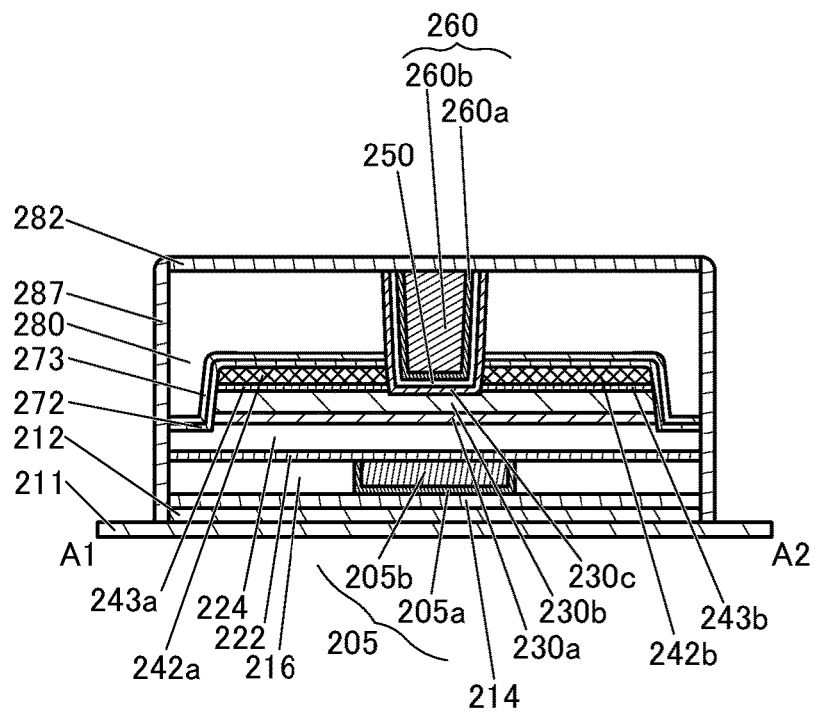
Figure 21D:
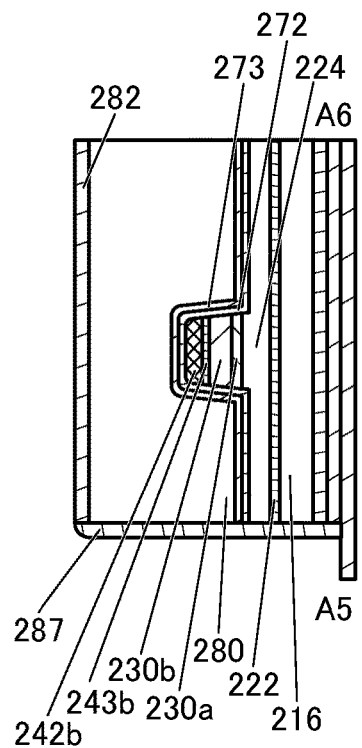
Figure 22A:
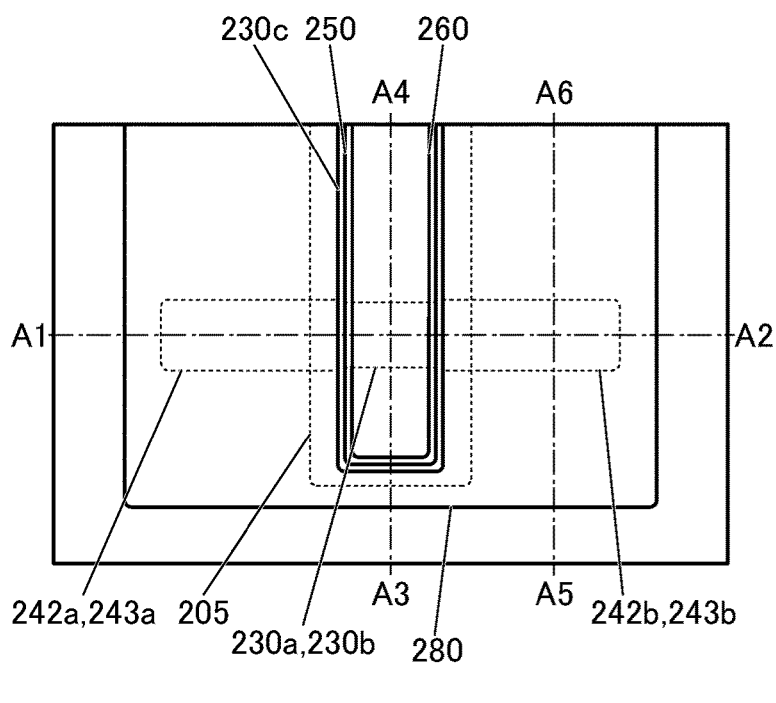
FIG. 22A is a top view illustrating a manufacturing method of a semiconductor device of one embodiment of the present invention.
Figure 22C:
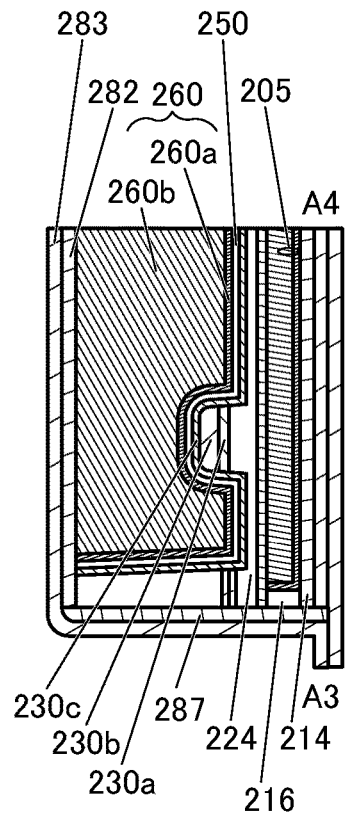
FIG. 22B to FIG. 22D are cross-sectional views illustrating a manufacturing method of a semiconductor device of one embodiment of the present invention.
Figure 22B:
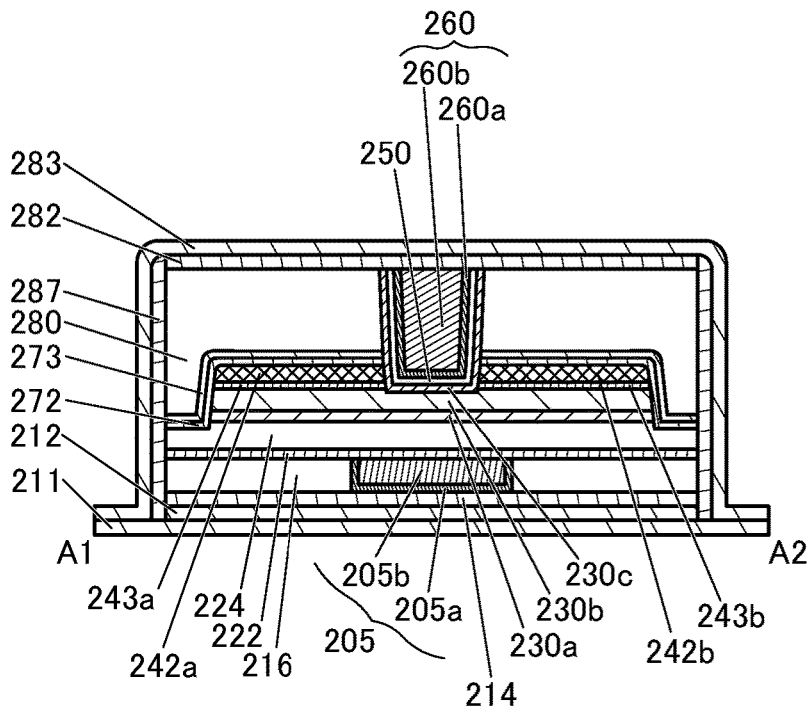
Figure 22D:
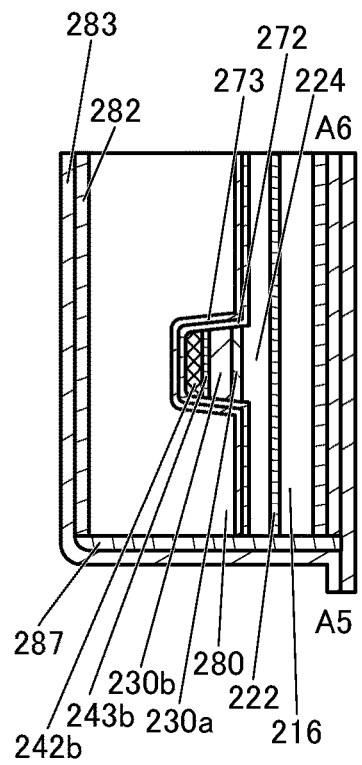
Figure 23A:
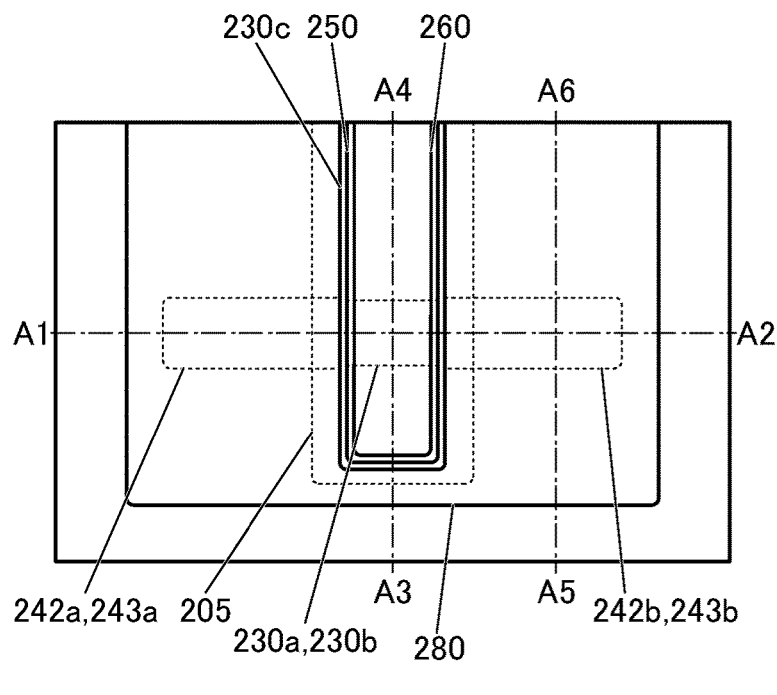
FIG. 23A is a top view illustrating a manufacturing method of a semiconductor device of one embodiment of the present invention.
Figure 23C:
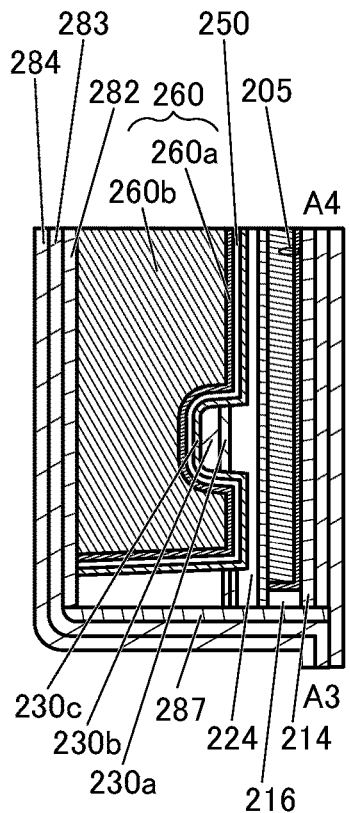
FIG. 23B to FIG. 23D are cross-sectional views illustrating a manufacturing method of a semiconductor device of one embodiment of the present invention.
Figure 23B:
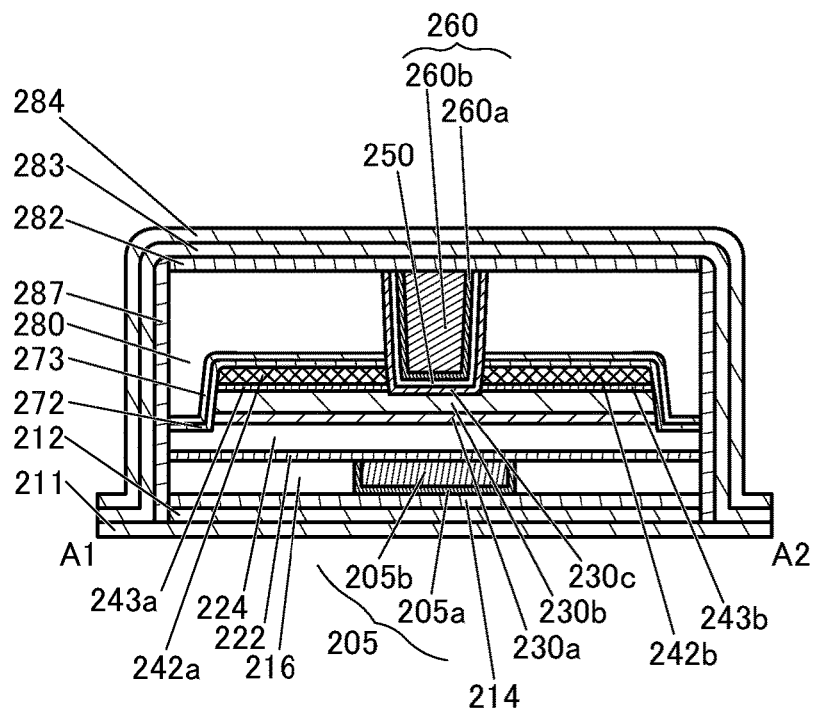
Figure 23D:
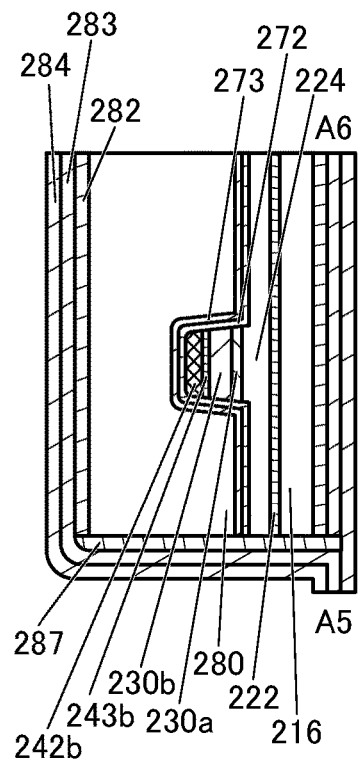
Figure 24A:
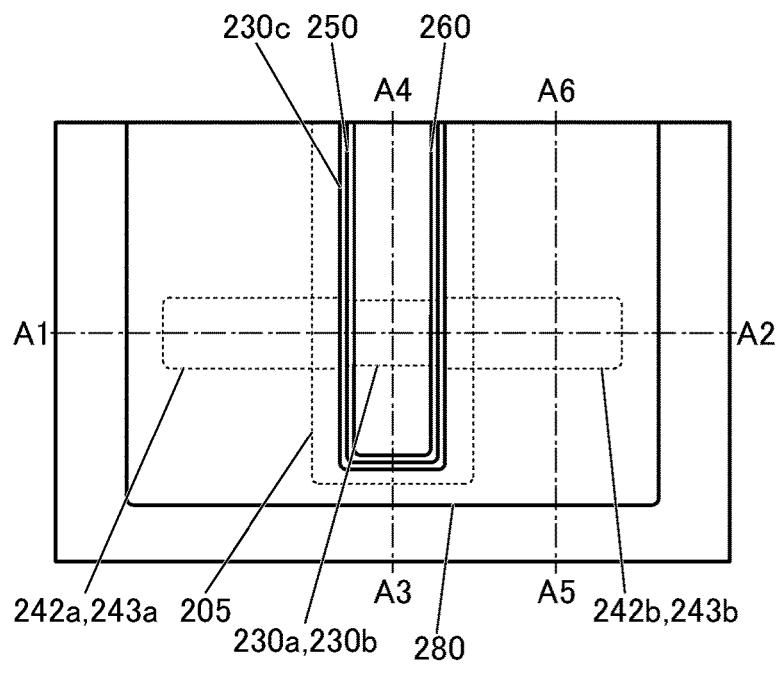
FIG. 24A is a top view illustrating a manufacturing method of a semiconductor device of one embodiment of the present invention.
Figure 24C:
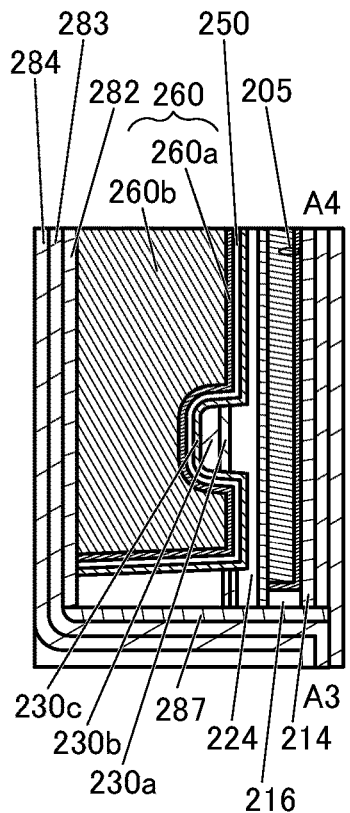
FIG. 24B to FIG. 24D are cross-sectional views illustrating a manufacturing method of a semiconductor device of one embodiment of the present invention.
Figure 24B:
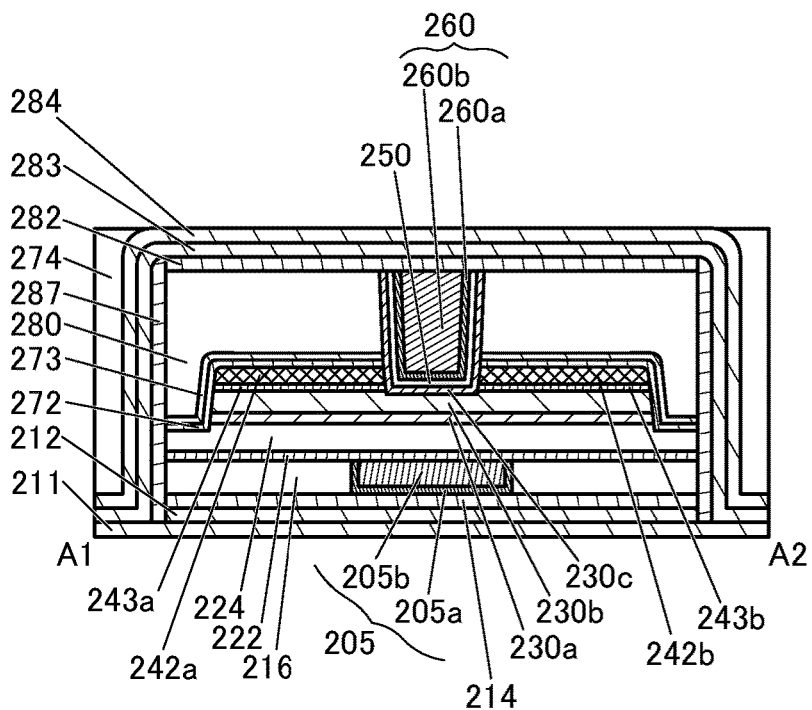
Figure 24D:
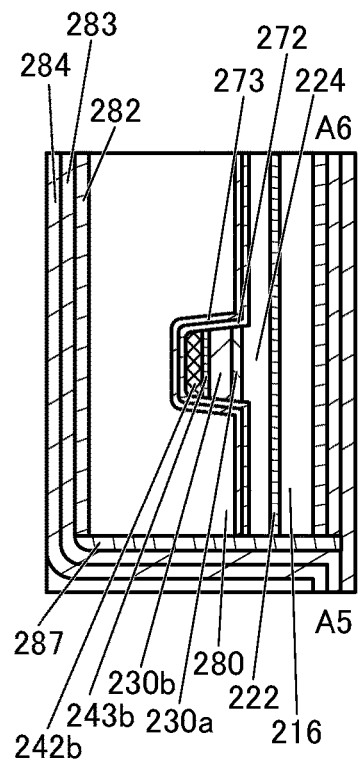
Figure 25A:
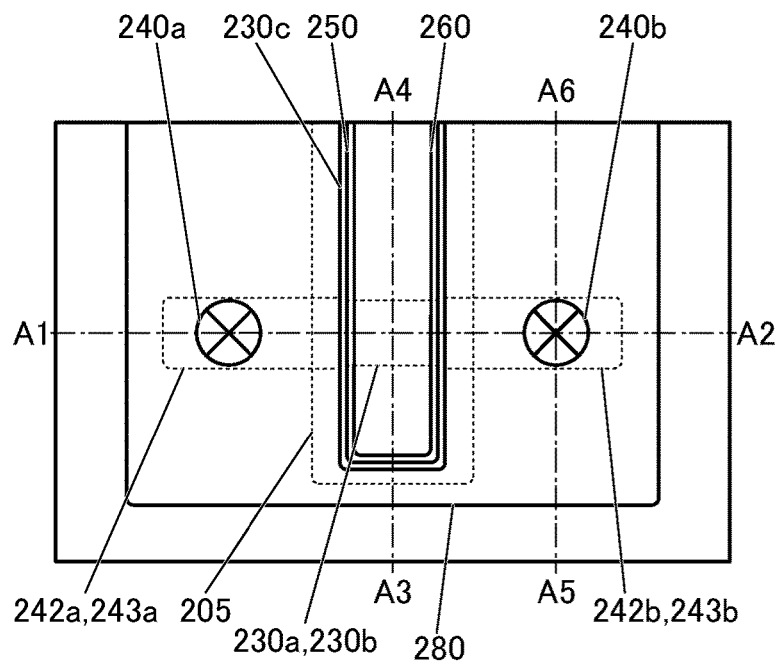
FIG. 25A is a top view illustrating a manufacturing method of a semiconductor device of one embodiment of the present invention.
Figure 25C:
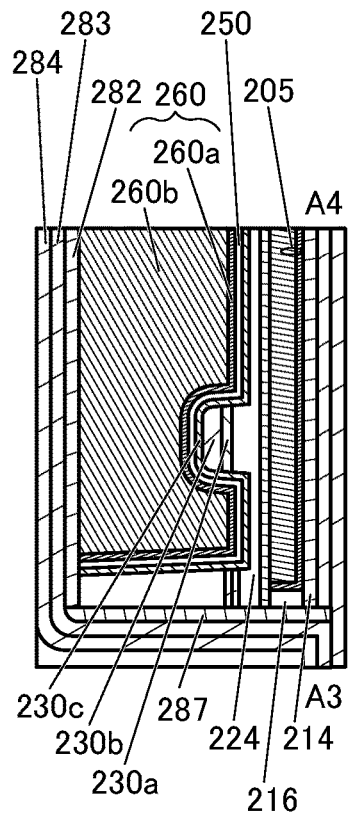
FIG. 25B to FIG. 25D are cross-sectional views illustrating a manufacturing method of a semiconductor device of one embodiment of the present invention.
Figure 25B:
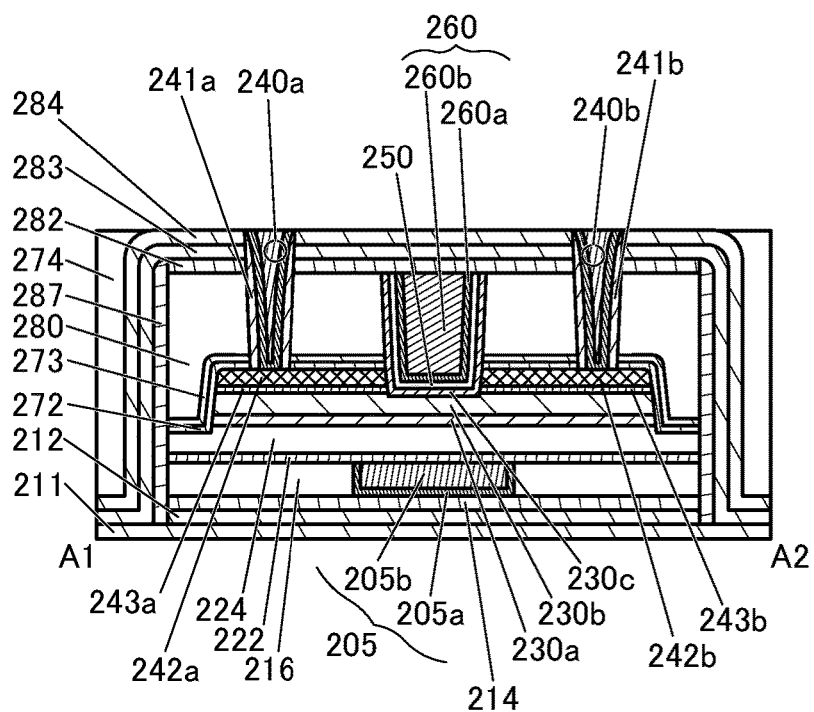
Figure 25D:
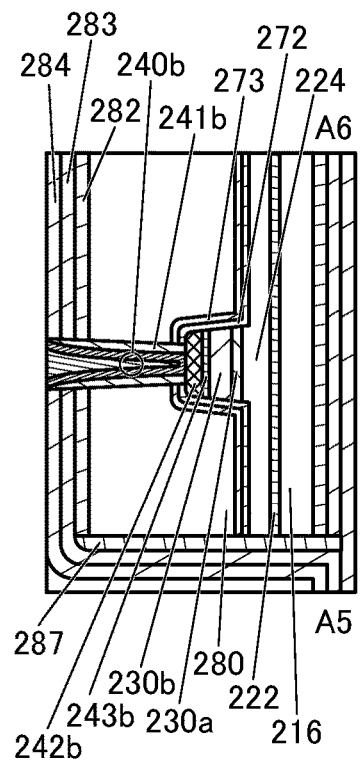
Figure 26A:
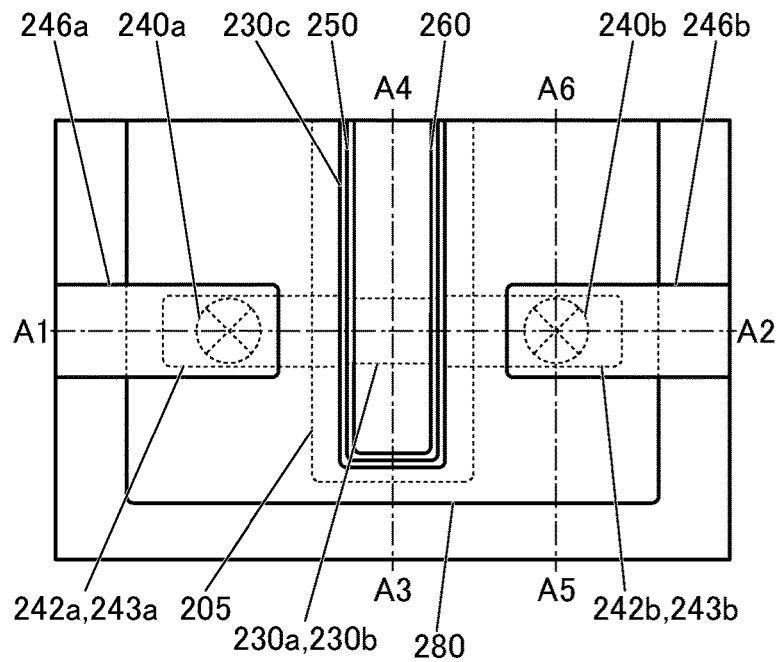
FIG. 26A is a top view illustrating a manufacturing method of a semiconductor device of one embodiment of the present invention.
Figure 26C:
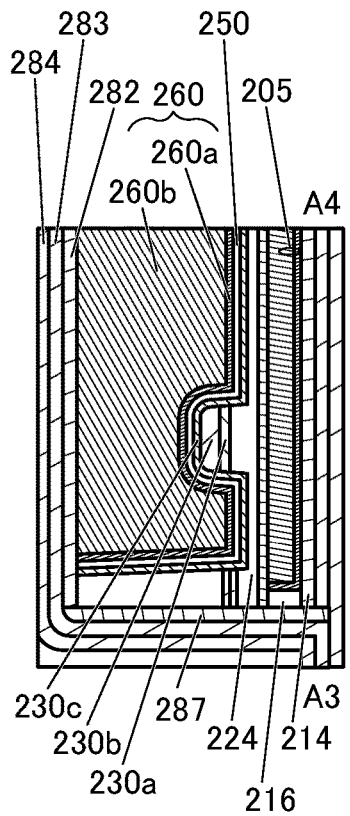
FIG. 26B to FIG. 26D are cross-sectional views illustrating a manufacturing method of a semiconductor device of one embodiment of the present invention.
Figure 26B:
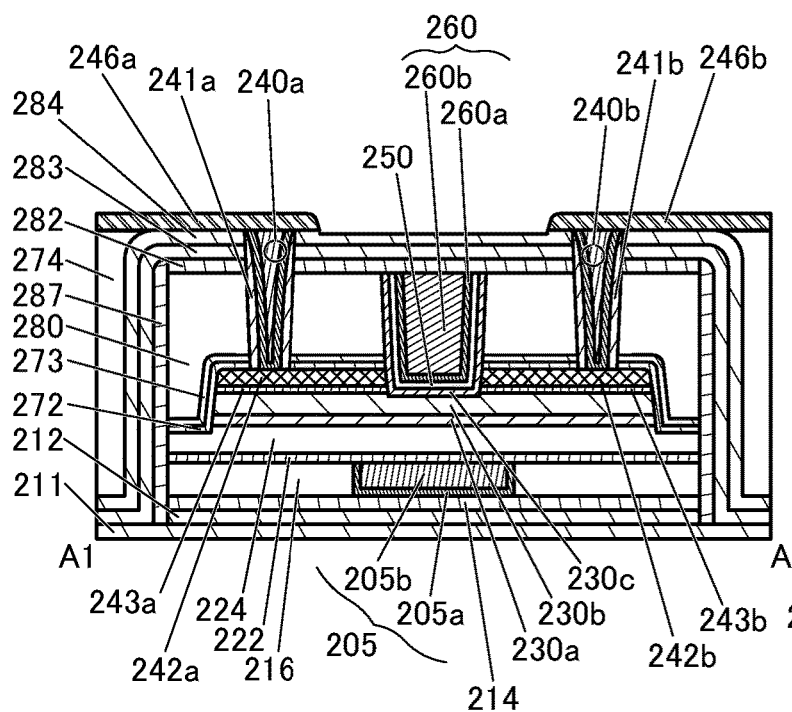
Figure 26D:
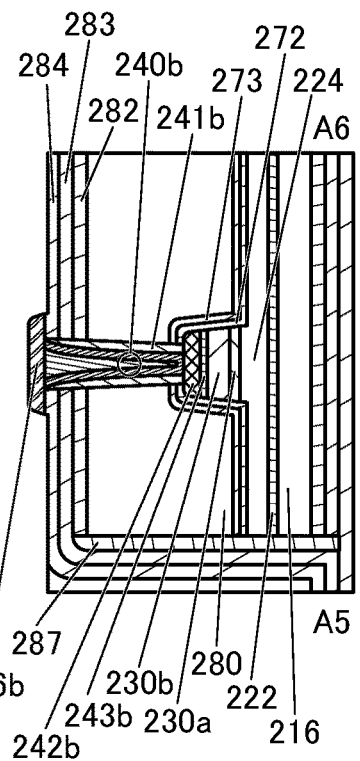

Here, FIG. 9A is a top view. FIG. 9B is a cross-sectional view taken along dashed-dotted line A1-A2 in FIG. 9A. FIG. 9C is a cross-sectional view taken along dashed-dotted line A3-A4 in FIG. 9A. FIG. 9D is a cross-sectional view taken along dashed-dotted line A5-A6 in FIG. 9A. Note that in the top view in FIG. 9A, some components are not illustrated for simplification of the drawing.

For example, as illustrated in FIG. 9, the insulator 212 and the insulator 283 are not necessarily provided in the case where the insulator 211 and the insulator 284 are formed by a CVD method using a compound gas containing no hydrogen atom or having a low hydrogen atom content.

For example, the insulator 211, the insulator 212, the insulator 283, and the insulator 284 can be formed by a CVD method using a compound gas containing no hydrogen atom or having a low hydrogen atom content. In other words, hydrogen that enters the channel formation region of the oxide semiconductor may be reduced by reducing the hydrogen concentration in the insulator 211, the insulator 212, the insulator 283, and the insulator 284.

For example, a gas containing a molecule including a silicon atom is mainly used as a deposition gas in deposition of a film containing a silicon atom such as silicon nitride. In order to reduce hydrogen of the film to be formed, the molecule containing a silicon atom preferably contains as few hydrogen atoms as possible; further preferably, the molecule containing a silicon atom contains no hydrogen atom. Needless to say, a deposition gas other than the gas that contains a molecule containing a silicon atom also preferably contains as few hydrogen atoms as possible; further preferably, the deposition gas contains no hydrogen atom.

In the case where the molecule containing a silicon atom is expressed as $Si_x$—$R_y$, a functional group R can be at least one of an isocyanate group (—N═C═O), a cyanate group (—O—CN), a cyano group (—CN), a diazo group (═$N_2$), an azide group (—$N_3$), a nitroso group (—NO), and a nitro group (—$NO_2$). For example, $1 \leq x \leq 3$ and $1 \leq y \leq 8$ are satisfied. Examples of such a molecule containing a silicon atom include tetraisocyanatosilane, tetracyanatosilane, tetracyanosilane, hexaisocyanatosilane, and octaisocyanatosilane. The examples here each show the molecule in which functional groups of the same kind are bonded to the silicon atom; however, this embodiment is not limited to these examples. Different kinds of functional groups may be bonded to the silicon atom.

Alternatively, the functional group R may be, for example, halogen (Cl, Br, I, or F). For example, $1 \leq x \leq 2$ and $1 \leq y \leq 6$ are satisfied. Examples of such a molecule containing a silicon atom include tetrachlorosilane ($SiCl_4$) and hexachlorodisilane ($Si_2Cl_6$). Although an example of using chlorine as the functional group is described here, halogen other than chlorine, such as bromine, iodine, or fluorine, may be used as the functional group. In addition, different kinds of halogen may be bonded to the silicon atom.

The insulator 211, the insulator 212, the insulator 283, and the insulator 284 are formed by a chemical vapor deposition (CVD) method using a gas that contains the molecule containing a silicon atom. A CVD method, with a relatively high deposition rate, is suitable for forming an insulator having a large thickness.

As the CVD method, a plasma CVD (PECVD: Plasma Enhanced CVD) method using plasma or a thermal CVD (TCVD) method using heat is preferably used. In the case of a thermal CVD method, an atmospheric pressure CVD (APCVD) method, in which deposition is performed under the atmospheric pressure, or a low pressure CVD (LPCVD) method, in which deposition is performed under pressure lower than the atmospheric pressure, may be used.

When the insulator 211, the insulator 212, the insulator 283, and the insulator 284 are deposited by a CVD method, an oxidizer is preferably used. As an oxidizer, it is preferable to use a gas that does not contain a hydrogen atom, such as $O_2$, $O_3$, NO, $NO_2$, $N_2O$, $N_2O_3$, $N_2O_4$, $N_2O_5$, CO, or $CO_2$.

The insulator 211, the insulator 212, the insulator 283, and the insulator 284 may be deposited by an ALD (Atomic Layer Deposition) method. In an ALD method, a first source gas for reaction (hereinafter, referred to as a precursor or a metal precursor) and a second source gas for reaction (hereinafter, referred to as a reactant or a non-metal precursor) are alternately introduced into a chamber, and then the source gas introduction is repeated.

In an ALD method, deposition is performed while the source gases are switched, so that one atomic layer can be deposited at a time using self-controllability of atoms. Thus, an ALD method enables deposition of an extremely thin film, deposition on a component with a high aspect ratio, deposition of a film with few defects such as pinholes, deposition with excellent coverage, and the like. For this reason, an ALD method is suitable for not only formation of the insulator 211, the insulator 212, the insulator 283, and the insulator 284 but also formation of the insulator 250 and the insulator 224 of the transistor 200.

As an ALD method, a thermal ALD method, in which reaction between a precursor and a reactant is performed using only thermal energy, or a PEALD (Plasma Enhanced ALD) method, in which a plasma-enhanced reactant is used, may be employed.

In the case of an ALD method, the gas that contains the molecule containing a silicon atom is used as a precursor, and the oxidizer is used as a reactant. Thus, the amount of hydrogen that enters the insulator 216, the insulator 274, the insulator 280, the insulator 224, and the insulator 250 can be significantly reduced.

Note that examples of the molecule containing a silicon atom and not containing a hydrogen atom are described above; however, this embodiment is not limited to these examples. In the molecule containing a silicon atom, some of the functional groups bonded to a silicon atom may be replaced with hydrogen atoms. Note that the number of hydrogen atoms in the molecule containing a silicon atom is preferably smaller than that of hydrogen atoms in silane ($SiH_4$). That is, the molecule containing a silicon atom preferably contains three or less hydrogen atoms per silicon atom. It is further preferable that the gas that contains the molecule containing a silicon atom contain three or less hydrogen atoms per silicon atom.

As described above, at least one of the insulator 211, the insulator 212, the insulator 283, and the insulator 284 is formed by a deposition method using a gas in which the number of hydrogen atoms is reduced or hydrogen atoms are removed, whereby the amount of hydrogen in the insulators can be reduced.

Thus, the transistor 200 and the insulator 280 are sealed doubly by a first sealing structure that uses a material trapping or fixing an impurity such as hydrogen and a second sealing structure that uses a material inhibiting diffusion of an impurity such as hydrogen, whereby the hydrogen concentration in the sealed region can be reduced and moreover, entry of hydrogen from the outside can be reduced.

<<Metal Oxide>>

As the oxide 230, a metal oxide functioning as an oxide semiconductor is preferably used. A metal oxide that can be used as the oxide 230 according to the present invention is described below.

The metal oxide contains preferably at least indium or zinc and particularly preferably indium and zinc. In addition, aluminum, gallium, yttrium, tin, or the like is preferably contained. Furthermore, one or more elements selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also referred to as a metal oxide in some cases. Moreover, a metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear crystal grain boundary (also referred to as grain boundary) even in the vicinity of distortion in the CAAC-OS. That is, a lattice arrangement is distorted and thus formation of a crystal grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is a metal oxide with high crystallinity. By contrast, in the CAAC-OS, a reduction in electron mobility due to a crystal grain boundary is less likely to occur because it is difficult to observe a clear crystal grain boundary. Entry of impurities, formation of defects, or the like might decrease the crystallinity of a metal oxide. This means that the CAAC-OS is a metal oxide having small amounts of impurities and defects (e.g., oxygen vacancies). Thus, a metal oxide including the CAAC-OS is physically stable. Accordingly, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an In—Ga—Zn oxide (hereinafter IGZO) that is a metal oxide containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is a metal oxide having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor (metal oxide) can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of impurities in the metal oxide is described.

Entry of impurities into the oxide semiconductor forms defect states or oxygen vacancies in some cases. Thus, when impurities enter a channel formation region of the oxide semiconductor, the electrical characteristics of a transistor using the oxide semiconductor tend to vary and its reliability is degraded in some cases. Moreover, if the channel formation region includes oxygen vacancies, the transistor tends to have normally-on characteristics.

The above-described defect states may include a trap state. Charge trapped by a trap state in the metal oxide takes a long time to be released and may behave like fixed charge. Thus, a transistor including the metal oxide having a high density of trap states in the channel formation region has unstable electrical characteristics in some cases.

If impurities exist in the channel formation region of the oxide semiconductor, the crystallinity of the channel formation region may decrease, and the crystallinity of an oxide in contact with the channel formation region may decrease. Low crystallinity of the channel formation region tends to result in deterioration in stability or reliability of the transistor. Moreover, if the crystallinity of the oxide in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, alkali metal, alkaline earth metal, iron, nickel, and silicon.

Specifically, the concentration of the above impurities obtained by SIMS is lower than or equal to $1\times10^{18}$ atoms/cm$^3$, preferably lower than or equal to $2\times10^{16}$ atoms/cm$^3$ in and around the channel formation region of the oxide semiconductor. Alternatively, the concentration of the above impurities obtained by element analysis using EDX is lower than or equal to 1.0 at. % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region that is the same as the region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Accordingly, the amount of VoH in the metal oxide is preferably reduced as much as possible so that the oxide semiconductor becomes a highly purified intrinsic or substantially highly purified intrinsic oxide semiconductor. In order to obtain such an oxide semiconductor with a sufficiently small amount of VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently small amounts of impurities such as VoH is used for a channel formation region of a transistor, the transistor can have stable electrical characteristics.

An oxide semiconductor with a low carrier concentration is preferably used for the transistor. In order to reduce the carrier concentration of the oxide semiconductor, the concentration of impurities in the oxide semiconductor is reduced so that the density of defect states can be reduced. In this specification and the like, a state with a low concentration of impurities and a low density of defect states is referred to as a highly purified intrinsic or substantially highly purified intrinsic state. Examples of impurities contained in the oxide semiconductor include hydrogen, nitrogen, alkali metal, alkaline earth metal, iron, nickel, and silicon.

Specifically, hydrogen contained in an oxide semiconductor reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates an electron serving as a carrier. Thus, a transistor including an oxide semiconductor that contains a large amount of hydrogen is likely to have normally-on characteristics.

Note that a defect that is an oxygen vacancy into which hydrogen enters (VoH) serves as donors of the oxide semiconductor in some cases; however, it is difficult to quantitatively evaluate the defects. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^3$.

One embodiment of the present invention can provide a highly reliable semiconductor device. One embodiment of the present invention can provide a semiconductor device with favorable electrical characteristics. One embodiment of the present invention can provide a semiconductor device with a high on-state current. One embodiment of the present invention can provide a miniaturized or highly integrated semiconductor device. One object of one embodiment of the present invention is to provide a semiconductor device with low power consumption.

<<Other Semiconductor Materials>>

A semiconductor material that can be used for the oxide 230 is not limited to the above metal oxides. A semiconductor material having a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material, a two-dimensional material, or the like) is preferably used as the semiconductor material. The layered material functioning as a semiconductor is particularly suitable as the semiconductor material.

Here, in this specification and the like, the layered material generally refers to a group of materials having a layered crystal structure. The layered crystal structure refers to a structure in which layers formed by a covalent bond or an ionic bond are stacked with a bond that is weaker than the covalent bond or the ionic bond, such as a van der Waals force. The layered material has high electrical conductivity in a monolayer, that is, high two-dimensional electrical conductivity. With the use of a material functioning as a semiconductor and having high two-dimensional electrical conductivity in a channel formation region, a transistor with a high on-state current can be provided.

Examples of the layered material include graphene, silicene, and chalcogenide. Chalcogenide is a compound containing chalcogen. Chalcogen is a general term of Group 16 elements such as oxygen, sulfur, selenium, tellurium, polonium, and livermorium. Examples of chalcogenide include chalcogenide of transition metals and chalcogenide of Group 13 elements.

Chalcogenide of transition metals that functions as a semiconductor is preferably used as the oxide 230, for example. Specific examples of chalcogenide of transition metals that can be used as the oxide 230 include molybdenum sulfide (typically, $MoS_2$), molybdenum selenide (typically, $MoSe_2$), molybdenum telluride (typically, $MoTe_2$), tungsten sulfide (typically, $WS_2$), tungsten selenide (typically, $WSe_2$), tungsten telluride (typically, $WTe_2$), hafnium sulfide (typically, $HfS_2$), hafnium selenide (typically, $HfSe_2$), zirconium sulfide (typically, $ZrS_2$), and zirconium selenide (typically, $ZrSe_2$).

<Method for Manufacturing Semiconductor Device>

Next, a method for manufacturing a semiconductor device including the transistor 200 of the present invention that is illustrated in FIG. 7 is described with reference to FIG. 10 to FIG. 26. In FIG. 10 to FIG. 26, A of each drawing is a top view. Moreover, B of each drawing is a cross-sectional view corresponding to a portion indicated by dashed-dotted line A1-A2 in A, and is also a cross-sectional view of the transistor 200 in the channel length direction. Furthermore, C of each drawing is a cross-sectional view corresponding to a portion indicated by dashed-dotted line A3-A4 in A, and is also a cross-sectional view of the transistor 200 in the channel width direction. Furthermore, D of each drawing is a cross-sectional view corresponding to a portion indicated by the dashed-dotted line A5-A6 in A. Note that for simplification of the drawing, some components are not illustrated in the top view of A of each drawing.

First, a substrate (not illustrated) is prepared, and the insulator 211 is formed over the substrate. The insulator 211 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD method using heat, a photo CVD method using light, and the like. Moreover, the CVD methods can be classified into a metal CVD method and a metal organic CVD method according to a source gas. In addition, according to the pressure in deposition, CVD methods can be classified into an atmospheric pressure CVD method, in which deposition is performed under the atmospheric pressure, and a low pressure CVD method, in which deposition is performed under pressure lower than the atmospheric pressure.

A plasma CVD method enables a high-quality film to be obtained at a relatively low temperature. A thermal CVD method does not use plasma and thus causes less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. Furthermore, a film with few defects can be obtained by a thermal CVD method because plasma damage during deposition is not caused.

As an ALD method, a thermal ALD method, in which reaction between a precursor and a reactant is performed using only thermal energy, a PEALD (Plasma Enhanced ALD) method, in which a plasma-enhanced reactant is used, or the like can be used.

In an ALD method, one atomic layer can be deposited at a time using self-controllability of atoms. Hence, an ALD method has various advantages such as deposition of an extremely thin film, deposition on a component with a large aspect ratio, deposition of a film with a small number of defects such as pinholes, deposition with excellent coverage, and low-temperature deposition. The use of plasma in a PEALD method is sometimes preferable because deposition at a lower temperature is possible. Note that a precursor used in an ALD method sometimes contains impurities such as carbon. Thus, a film formed by an ALD method may contain impurities such as carbon in a larger amount than a film formed by another deposition method. Note that impurities can be quantified by X-ray photoelectron spectroscopy (XPS).

Unlike in the deposition method in which particles ejected from a target or the like are deposited, a film is formed by reaction at a surface of an object in a CVD method and an ALD method. Thus, a CVD method and an ALD method can provide good step coverage, almost regardless of the shape of an object. In particular, an ALD method enables excellent step coverage and excellent thickness uniformity and can be suitably used to cover a surface of an opening portion with a high aspect ratio, for example. Note that an ALD method has a relatively low deposition rate; hence, in some cases, an ALD method is preferably combined with another deposition method with a high deposition rate, such as a CVD method.

When a CVD method or an ALD method is employed, the composition of a film to be deposited can be controlled with the flow rate ratio of the source gases. For example, in a CVD method or an ALD method, a film with a certain composition can be formed by adjusting the flow rate ratio of the source gases. Moreover, in a CVD method or an ALD method, by changing the flow rate ratio of the source gases during the deposition, a film whose composition is continuously changed can be deposited. In the case where a film is deposited while the flow rate ratio of the source gases is changed, as compared to the case where a film is deposited using a plurality of deposition chambers, the time taken for the deposition can be shortened because the time taken for transfer and pressure adjustment is omitted. Consequently, semiconductor devices can be manufactured with high productivity in some cases.

In this embodiment, as the insulator 211, silicon nitride is deposited by a CVD method. Next, the insulator 212 is deposited over the insulator 211. The insulator 212 can be deposited by a sputtering method, a CVD method, an MBE method, a PLD method, an ALD method, or the like. In this embodiment, silicon nitride is deposited as the insulator 212 by a sputtering method.

Then, the insulator 214 is deposited over the insulator 212. The insulator 214 can be deposited by a sputtering method, a CVD method, an MBE method, a PLD method, an ALD method, or the like. In this embodiment, aluminum oxide is used as the insulator 214.

Even when a metal that is easily diffused, such as copper, is used for a conductor (not illustrated) under the insulator 211, the use of an insulator through which copper is less likely to pass, such as silicon nitride, as the insulator 211 and the insulator 212 and the provision of the insulator 214 over the insulator 212 can inhibit diffusion of the metal into a layer over the insulator 212 through the insulator 211 and the insulator 212. The use of an insulator through which impurities such as water and hydrogen are less likely to pass, such as silicon nitride, can inhibit diffusion of impurities such as water and hydrogen from a layer under the insulator 211.

It is preferable that the hydrogen concentration of the insulator 212 be lower than that of the insulator 211, and the hydrogen concentration of the insulator 214 be lower than that of the insulator 212. The insulator 212 deposited using silicon nitride by a sputtering method can have lower hydrogen concentration than the insulator 211 formed using silicon nitride by a CVD method. The insulator 214 formed using aluminum oxide can have lower hydrogen concentration than the insulator 212.

The transistor 200 is formed over the insulator 214 in a later step. It is preferable that a film near the transistor 200 have a relatively low hydrogen concentration and a film with a relatively high hydrogen concentration be away from the transistor 200.

Next, the insulator 216 is formed over the insulator 214. The insulator 216 can be deposited by a sputtering method, a CVD method, an MBE method, a PLD method, an ALD method, or the like. In this embodiment, silicon oxide or silicon oxynitride is used as the insulator 216. The insulator 216 is preferably formed by a deposition method using the gas in which the number of hydrogen atoms is reduced or hydrogen atoms are removed. Thus, the hydrogen concentration of the insulator 216 can be reduced.

Then, an opening reaching the insulator 214 is formed in the insulator 216. Examples of the opening include a groove and a slit. A region where an opening is formed may be referred to as an opening portion. The opening may be formed by wet etching; however, dry etching is preferable for microfabrication. The insulator 214 is preferably an insulator that functions as an etching stopper film when a groove is formed by etching of the insulator 216. For example, in the case where a silicon oxide film or a silicon oxynitride film is used as the insulator 216 in which the groove is to be formed, the insulator 214 is preferably a silicon nitride film, an aluminum oxide film, or a hafnium oxide film.

After the formation of the opening, a conductive film to be the conductor 205a is formed. The conductive film preferably contains a conductor that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductor 205a can be formed by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. Even when a metal that is easily diffused, such as copper, is used for a conductive film to be the conductor 205b described later, the use of such metal nitride for a layer under the conductor 205b can inhibit diffusion of the metal to the outside from the conductor 205a.

Next, the conductive film to be the conductor 205b is formed. This conductive film can be formed by a plating method, a sputtering method, a CVD method, an MBE method, a PLD method, an ALD method, or the like. In this embodiment, as the conductive film to be the conductor 205b, a low-resistant conductive material such as copper is deposited.

Next, by chemical mechanical polishing (CMP) treatment, the conductive film to be the conductor 205a and the conductive film to be the conductor 205b are partly removed so that the insulator 216 is exposed. As a result, the conductor 205a and the conductor 205b remain only in the opening portion. In this way, the conductor 205 with a flat top surface can be formed. Note that the insulator 216 is partly removed by the CMP treatment in some cases (see FIG. 10).

Although the conductor 205 is embedded in the opening of the insulator 216 in the above description, this embodiment is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Then, the insulator 222 is deposited over the insulator 216 and the conductor 205. An insulator containing an oxide of one or both of aluminum and hafnium is preferably formed as the insulator 222. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, diffusion of hydrogen and water contained in a structure body provided around the transistor 200 into the transistor 200 through the insulator 222 is inhibited, and accordingly oxygen vacancies are less likely to be generated in the oxide 230.

The insulator 222 can be deposited by a sputtering method, a CVD method, an MBE method, a PLD method, an ALD method, or the like.

Then, the insulator 224 is deposited over the insulator 222. The insulator 224 can be deposited by a sputtering method, a CVD method, an MBE method, a PLD method, an ALD method, or the like. In this embodiment, silicon oxide or silicon oxynitride is used for the insulator 224. The insulator 224 is preferably deposited by a deposition method using the gas in which the number of hydrogen atoms is reduced or hydrogen atoms removed. Thus, the hydrogen concentration of the insulator 224 can be reduced. The hydrogen concentration of the insulator 224 is preferably reduced because the insulator 224 is in contact with the oxide 230a in a later step.

Subsequently, heat treatment is preferably performed. The heat treatment is performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The heat treatment is performed in a nitrogen atmosphere, an inert gas atmosphere, or an atmosphere containing an oxidizing gas at higher than or equal to 10 ppm, higher than or equal to 1%, or higher than or equal to 10%. The heat treatment may be performed under a reduced pressure. Alternatively, the heat treatment may be performed in such a manner that heat treatment is performed in nitrogen or an inert gas atmosphere, and then another heat treatment is performed in an atmosphere containing an oxidizing gas at higher than or equal to 10 ppm, higher than or equal to 1%, or higher than or equal to 10% in order to compensate for released oxygen.

In this embodiment, treatment is performed at 400° C. in a nitrogen atmosphere for one hour, and another treatment is successively performed at 400° C. in an oxygen atmosphere for one hour. By the heat treatment, impurities such as water and hydrogen included in the insulator 224 can be removed.

The heat treatment may be performed after the insulator 222 is deposited. For the heat treatment, the above-described heat treatment conditions can be employed.

Here, in order to form an excess-oxygen region in the insulator 224, plasma treatment using oxygen may be performed under a reduced pressure. The plasma treatment using oxygen is preferably performed with an apparatus including a power source for generating high-density plasma using microwaves, for example. Alternatively, the apparatus may include a power source for applying a high-frequency wave such as RF to the substrate side. The use of high-density plasma enables high-density oxygen radicals to be generated, and application of the RF to the substrate side allows oxygen radicals generated by the high-density plasma to be efficiently introduced into the insulator 224. Furthermore, after plasma treatment using an inert gas with the apparatus, plasma treatment using oxygen may be performed in order to compensate for released oxygen. Note that impurities such as water and hydrogen contained in the insulator 224 can be removed by selecting the conditions of the plasma treatment appropriately. In that case, the heat treatment is not always necessary.

Here, aluminum oxide may be deposited over the insulator 224 by a sputtering method, for example, and then subjected to CMP treatment until the insulator 224 is exposed. The CMP treatment can planarize and smooth the surface of the insulator 224. When the CMP treatment is performed while the aluminum oxide is placed over the insulator 224, the endpoint of the CMP treatment can be easily detected. Part of the insulator 224 may be polished by the CMP treatment so that the thickness of the insulator 224 may be reduced; the thickness of the insulator 224 is adjusted at the time of the formation of the insulator 224. Planarizing and smoothing the surface of the insulator 224 can sometimes prevent deterioration of the coverage with an oxide deposited later and a decrease in yield of the semiconductor device. Moreover, it is preferable to deposit aluminum oxide over the insulator 224 by a sputtering method, in which case oxygen can be added to the insulator 224.

Next, an oxide film 230A and an oxide film 230B are deposited in this order over the insulator 224 (see FIG. 10). It is preferable to deposit the above oxide films successively without exposure to the air. When the oxide film 230A and the oxide film 230B are deposited without exposure to the air, impurities or moisture from the air can be prevented from being attached to the oxide film 230A and the oxide film 230B, so that the interface between the oxide film 230A and the oxide film 230B and the vicinity of the interface can be kept clean.

The oxide film 230A and the oxide film 230B can be deposited by a sputtering method, a CVD method, an MBE method, a PLD method, an ALD method, or the like.

When the oxide film 230A and the oxide film 230B are deposited by a sputtering method, for example, oxygen or a mixed gas of oxygen and a rare gas is used as a sputtering gas. An increase in the proportion of oxygen in the sputtering gas can increase the amount of excess oxygen contained in the oxide film to be deposited. Moreover, when the oxide films are deposited by a sputtering method, a target of an In-M-Zn oxide mentioned above can be used.

In particular, in the formation of the oxide film 230A, part of oxygen contained in the sputtering gas is supplied to the insulator 224 in some cases. Therefore, the proportion of oxygen in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility.

Furthermore, when the deposition is performed while the substrate is being heated, the crystallinity of the oxide film can be improved. However, one embodiment of the present invention is not limited thereto. In the case where the oxide film 230B is formed by a sputtering method and the proportion of oxygen contained in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability.

In this embodiment, the oxide film 230A is formed by a sputtering method using a target with an atomic ratio of In:Ga:Zn=1:1:0.5 (2:2:1) or In:Ga:Zn=1:3:4. The oxide film 230B is formed by a sputtering method using a target with an atomic ratio of In:Ga:Zn=4:2:4.1 or In:Ga:Zn=1:1:1. Note that each of the oxide films is preferably formed by appropriate selection of deposition conditions and the atomic ratio to have characteristics required for the oxide 230.

Next, heat treatment may be performed. For the heat treatment, the above-described heat treatment conditions can be employed. By the heat treatment, impurities such as water and hydrogen in the oxide film 230A and the oxide film 230B can be removed, for example. In this embodiment, treatment is performed at 400° C. in a nitrogen atmosphere for one hour, and another treatment is successively performed at 400° C. in an oxygen atmosphere for one hour.

Next, an oxide film 243A is formed over the oxide film 230B (see FIG. 10). The oxide film 243A can be formed by a sputtering method, a CVD method, an MBE method, a PLD method, an ALD method, or the like. The atomic ratio of Ga to In in the oxide film 243A is preferably greater than that in the oxide film 230B. In this embodiment, the oxide film 243A is formed by a sputtering method using a target with an atomic ratio of In:Ga:Zn=1:3:4.

Next, a conductive film 242A is deposited over the oxide film 243A (see FIG. 10). The conductive film 242A can be deposited by a sputtering method, a CVD method, an MBE method, a PLD method, an ALD method, or the like.

Next, the oxide film 230A, the oxide film 230B, the oxide film 243A, and the conductive film 242A are processed into an island shape by a lithography method, so that the oxide 230a, the oxide 230b, an oxide layer 243B, and a conductor layer 242B are formed (see FIG. 11). Here, the oxide 230a, the oxide 230b, the oxide layer 243B, and the conductor layer 242B are formed to at least partly overlap with the conductor 205. The processing can be performed by a dry etching method or a wet etching method. A dry etching method is suitable for microfabrication. Note that in this step, the thickness of the insulator 224 in a region not overlapping with the oxide 230a is reduced in some cases.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask is formed, for example, by exposing the resist to KrF excimer laser light, ArF excimer laser light, or EUV (Extreme Ultraviolet) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used instead of the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after or without removal of the resist mask. In the latter case, the resist mask sometimes disappears during the etching. The hard mask may be removed by etching after the etching of the conductive film 242A and the like. The hard mask does not need to be removed when the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers may be applied to one of the parallel plate electrodes. Further alternatively, high-frequency powers with the same frequency may be applied to the parallel plate electrodes. Still further alternatively, high-frequency powers with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

It is preferable that the side surfaces of the oxide 230a, the oxide 230b, the oxide layer 243B, and the conductor layer 242B be substantially perpendicular to the top surface of the insulator 222. When the side surfaces of the oxide 230a, the oxide 230b, the oxide layer 243B, and the conductor layer 242B are substantially perpendicular to the top surface of the insulator 222, a plurality of the transistors 200 can be provided in a smaller area and at a higher density. However, without being limited thereto, the angle formed between the side surfaces of the oxide 230a, the oxide 230b, the oxide layer 243B, and the conductor layer 242B and the top surface of the insulator 222 may be an acute angle.

Then, the insulator 272 is deposited over the insulator 224, the oxide 230a, the oxide 230b, the oxide layer 243B, and the conductor layer 242B (see FIG. 12). The insulator 272 can be deposited by a sputtering method, a CVD method, an MBE method, a PLD method, an ALD method, or the like. In this embodiment, aluminum oxide is deposited as the insulator 272 by a sputtering method. When aluminum oxide is deposited by a sputtering method, oxygen can be supplied to the insulator 224.

Then, the insulator 273 is deposited over the insulator 272 (see FIG. 12). The insulator 273 can be deposited by a sputtering method, a CVD method, an MBE method, a PLD method, an ALD method, or the like. In this embodiment, silicon nitride is deposited as the insulator 273 by a sputtering method.

Next, the insulator 280 is deposited. The insulator 280 can be deposited by a sputtering method, a CVD method, an MBE method, a PLD method, an ALD method, or the like. For example, as the insulator 280, a silicon oxide film is deposited by a sputtering method and another silicon oxide film is deposited thereover by a PEALD method or a thermal ALD method. The insulator 280 is preferably deposited by a deposition method using the gas in which the number of hydrogen atoms is reduced or hydrogen atoms are removed. Thus, the hydrogen concentration of the insulator 280 can be reduced.

Next, the insulator 280 is subjected to CMP treatment, so that the insulator 280 having a flat top surface is formed (see FIG. 13). Note that as in the insulator 224, aluminum oxide may be deposited over the insulator 280 by a sputtering method, for example, and then subjected to CMP treatment until the insulator 280 is exposed.

Next, part of the insulator 280, part of the insulator 273, part of the insulator 272, part of the conductor layer 242B, and part of the oxide layer 243B are processed to form an opening reaching the oxide 230b (see FIG. 14). The opening is preferably formed to overlap with the conductor 205. The conductor 242a, the conductor 242b, the oxide 243a, and the oxide 243b are formed by the formation of the opening.

The part of the insulator 280, the part of the insulator 273, the part of the insulator 272, the part of the oxide layer 243B, and the part of the conductor layer 242B can be processed by a dry etching method or a wet etching method. A dry etching method is suitable for microfabrication. The processing may be performed under different conditions. For example, the part of the insulator 280 may be processed by a dry etching method, the part of the insulator 273 may be processed by a wet etching method, the insulator 272 may be processed by a dry etching method, and the part of the oxide layer 243B and the part of the conductor layer 242B may be processed by a dry etching method.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the impurities, cleaning is performed. Examples of the cleaning method include wet cleaning using a cleaning solution or the like, plasma treatment using plasma, cleaning by heat treatment, and any of these cleaning methods may be used in an appropriate combination.

The wet cleaning may be performed using an aqueous solution in which oxalic acid, phosphoric acid, ammonia water, hydrofluoric acid, or the like is diluted with carbonated water or pure water. Alternatively, ultrasonic cleaning using pure water or carbonated water may be performed.

Through the processing such as dry etching or the cleaning treatment, a region of the oxide 230b that does not overlap with the oxide 243a or the oxide 243b is sometimes thinner than regions of the oxide 230b that overlap with the oxide 243a and the oxide 243b (see FIG. 14).

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C., for example. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce the amount of oxygen vacancies $V_O$. The heat treatment may be performed under a reduced pressure. Alternatively, the heat treatment may be performed in an oxygen atmosphere, and then another heat treatment may be successively performed in a nitrogen atmosphere without exposure to the air.

Next, an oxide film 230C is deposited (see FIG. 15). The heat treatment may be performed before the oxide film 230C is deposited. It is preferable that the heat treatment be performed under a reduced pressure and the oxide film 230C be successively deposited without exposure to the air. The heat treatment is preferably performed in an oxygen-containing atmosphere. Such treatment can remove moisture and hydrogen adsorbed on the surface of the oxide 230b or the like and can reduce the moisture concentration and the hydrogen concentration of the oxide 230a and the oxide 230b. The temperature of the heat treatment is preferably higher than or equal to 100° C. and lower than or equal to 400° C., further preferably higher than or equal to 150° C. and lower than or equal to 350° C. In this embodiment, the heat treatment is performed at 200° C. under a reduced pressure.

Note that the oxide film 230C is preferably provided in contact with at least part of the top surface of the oxide 230b, part of the side surface of the oxide 243, part of the side surface of the conductor 242, part of the side surface of the insulator 272, part of the side surface of the insulator 273, and part of the side surface of the insulator 280. When the conductor 242 is surrounded by the oxide 243, the insulator 272, the insulator 273, and the oxide film 230C, a decrease in the conductivity of the conductor 242 due to oxidation in a later step can be inhibited.

The oxide film 230C can be deposited by a sputtering method, a CVD method, an MBE method, a PLD method, an ALD method, or the like. The atomic ratio of Ga to In in the oxide film 230C is preferably greater than that in the oxide film 230B. In this embodiment, the oxide film 230C is deposited using a target having an atomic ratio of In:Ga:Zn=1:3:4 by a sputtering method.

Note that the oxide film 230C may have a stacked-layer structure. For example, the oxide film 230C may be formed by a sputtering method using a target with an atomic ratio of In:Ga:Zn=4:2:4.1 and successively using a target with an atomic ratio of In:Ga:Zn=1:3:4.

Part of oxygen contained in the sputtering gas is sometimes supplied to the oxide 230a and the oxide 230b during the deposition of the oxide film 230C. Alternatively, in the deposition of the oxide film 230C, part of oxygen contained in the sputtering gas is supplied to the insulator 280 in some cases. Therefore, the proportion of oxygen in the sputtering gas for formation of the oxide film 230C is preferably 70% or higher, further preferably 80% or higher, still further preferably 100%.

Next, heat treatment may be performed. The heat treatment may be performed under a reduced pressure, and an insulating film 250A may be successively formed without exposure to the air. By such treatment, moisture and hydrogen adsorbed on the surface of the oxide film 230C and the like can be removed, and the moisture concentration and the hydrogen concentration in the oxide 230a, the oxide 230b, and the oxide film 230C can be reduced. The temperature of the heat treatment is preferably higher than or equal to 100° C. and lower than or equal to 400° C. In this embodiment, the temperature of the heat treatment is 200° C.

Next, the insulating film 250A is formed over the oxide film 230C (see FIG. 15). The insulating film 250A can be formed by a sputtering method, a CVD method, an MBE method, a PLD method, an ALD method, or the like. The insulating film 250A is preferably deposited by a deposition method using the gas in which the number of hydrogen atoms is reduced or hydrogen atoms are removed. Thus, the hydrogen concentration of the insulating film 250A can be reduced. The hydrogen concentration is preferably reduced because the insulating film 250A becomes the insulator 250 that is in contact with the oxide 230c in a later step.

Next, irradiation with a microwave or a high-frequency wave such as RF may be performed. The irradiated microwave or high-frequency wave such as RF enters the insulator 280, the oxide 230b, and the oxide 230a and removes hydrogen therein. In particular, in the oxide 230a and the oxide 230b, a reaction in which a bond of VoH is cut and the oxide 230a and the oxide 230b are dehydrogenated. Part of hydrogen generated at this time is removed from the oxide 230 and the insulator 280 in some cases. In other cases, part of hydrogen is gettered by the conductor 242. In this manner, irradiation with a microwave or a high-frequency wave such as RF can reduce the hydrogen concentration of the insulator 280, the oxide 230b, and the oxide 230a.

Alternatively, an oxygen gas may be made into plasma with a microwave or a high-frequency wave such as RF to form oxygen radicals. That is, the insulator 280, the oxide 230b, and the oxide 230a may be subjected to plasma treatment in an oxygen-containing atmosphere. Hereinafter, such treatment is sometimes referred to as oxygen plasma treatment. The formed oxygen radicals can supply oxygen to the insulator 280, the oxide 230b, and the oxide 230a. In the case where the insulator 280, the oxide 230b, and the oxide 230a are subjected to plasma treatment in an oxygen-containing atmosphere, the oxide 230 may be less likely to be irradiated with a microwave or a high-frequency wave such as RF.

Note that oxygen plasma treatment is preferably performed with a microwave processing apparatus including a power source for generating high-density plasma using microwaves, for example. The microwave processing apparatus may include a power source for applying RF to the substrate side. The use of high-density plasma enables high-density oxygen radicals to be generated. Furthermore, application of RF to the substrate side allows oxygen ions generated by the high-density plasma to be efficiently introduced into the insulator 280 and the oxide 230. The oxygen plasma treatment is preferably performed under a reduced pressure, and the pressure is set to 60 Pa or higher, preferably 133 Pa or higher, further preferably 200 Pa or higher, still further preferably 400 Pa or higher. The oxygen flow rate ($O_2/O_2+Ar$) is lower than or equal to 50%, preferably higher than or equal to 10% and lower than or equal to 30%. The treatment is performed at approximately 400° C., for example. After the oxygen plasma treatment, heat treatment may be successively performed without exposure to the air.

Next, a conductive film 260A (a conductive film 260Aa and a conductive film 260Ab) is deposited (see FIG. 16). The conductive films 260Aa and 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method.

Then, the oxide film 230C, the insulating film 250A, the conductive film 260Aa, and the conductive film 260Ab are polished by CMP treatment until the insulator 280 is exposed, whereby the oxide 230c, the insulator 250, and the conductor 260 (the conductor 260a and the conductor 260b) are formed (see FIG. 17).

Subsequently, heat treatment may be performed. In this embodiment, the heat treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively formed without exposure to the air.

Next, the insulator 282 is formed over the conductor 260, the oxide 230c, the insulator 250, and the insulator 280 (see FIG. 18). The insulator 282 can be deposited by a sputtering method, a CVD method, an MBE method, a PLD method, an ALD method, or the like. Aluminum oxide is preferably deposited as the insulator 282 by a sputtering method, for example. The insulator 282 is deposited by a sputtering method in an oxygen-containing atmosphere, whereby oxygen can be added to the insulator 280 during the deposition. At this time, the insulator 282 is preferably deposited while the substrate is being heated. It is preferable to form the insulator 282 in contact with the top surface of the conductor 260 because oxygen contained in the insulator 280 can be inhibited from being absorbed into the conductor 260 in later heat treatment.

Next, part of the insulator 282, part of the insulator 280, part of the insulator 273, part of the insulator 272, part of the insulator 224, part of the insulator 222, part of the insulator 216, part of the insulator 214, and part of the insulator 212 are processed, and an opening reaching the insulator 211 is formed (see FIG. 19). The opening is formed to surround the transistor 200 in some cases. In other cases, the opening is formed to surround the plurality of the transistors 200. Accordingly, part of the side surface of the insulator 282, part of the side surface of the insulator 280, part of the side surface of the insulator 273, part of the side surface of the insulator 272, part of the side surface of the insulator 224, part of the side surface of the insulator 222, part of the side surface of the insulator 216, part of the side surface of the insulator 214, and part of the side surface of the insulator 212 are exposed in the opening.

The part of the insulator 282, the part of the insulator 280, the part of the insulator 273, the part of the insulator 272, the part of the insulator 224, the part of the insulator 222, the part of the insulator 216, the part of the insulator 214, and the part of the insulator 212 can be processed by a dry etching method or a wet etching method. A dry etching method is suitable for microfabrication. The processing may be performed under different conditions.

In that case, the insulator 280 or the like may be irradiated with a microwave or a high-frequency wave such as RE. The irradiated microwave or high-frequency wave such as RF enters the insulator 280, the oxide 230b, the oxide 230a, and the like and can sometimes remove hydrogen therein. For example, in the oxide 230a and the oxide 230b, a reaction in which a bond of VoH is cut and the oxide 230a and the oxide 230b are dehydrogenated. Part of hydrogen generated at this time is removed from the oxide 230 and the insulator 280 in some cases. In other cases, part of hydrogen is gettered by the conductor 242.

Next, an insulating film 287A is formed to cover the insulator 282, the insulator 280, the insulator 273, the insulator 272, the insulator 224, the insulator 222, the insulator 216, the insulator 214, and the insulator 212 (see FIG. 20). The insulating film 287A is preferably formed under conditions similar to those for the insulator 282. For example, the insulating film 287A can be formed by a sputtering method, a CVD method, an MBE method, a PLD method, an ALD method, or the like.

Specifically, as the insulating film 287A, aluminum oxide is preferably deposited by a sputtering method, for example. When the insulating film 287A is formed in an atmosphere containing oxygen by a sputtering method, oxygen can be added to the insulator 280 during the deposition. At this time, the insulating film 287A is preferably deposited while the substrate is being heated. Since the insulator 282 is formed in contact with the top surface of the conductor 260, oxygen of the insulator 280 can be inhibited from being absorbed by the conductor 260 during the treatment for the formation of the insulating film 287A.

Subsequently, anisotropic etching treatment is performed on the insulating film 287A, whereby the insulator 287 is formed at side surfaces of the insulator 282, the insulator 280, the insulator 273, the insulator 272, the insulator 224, the insulator 222, the insulator 216, the insulator 214, and the insulator 212 (see FIG. 21).

Here, a side end portion of the insulator 282 and the upper end portion of the insulator 287 are in contact with each other, and a side end portion of the insulator 214 and the lower end portion of the insulator 287 are in contact with each other, whereby the structure for sealing the transistor 200 and the insulator 280 can be formed.

Dry etching is preferably performed as the anisotropic etching. In this manner, the insulating film deposited on a plane substantially parallel to the substrate surface can be removed, so that the insulator 272 can be formed in a self-aligned manner.

Next, the insulator 283 is formed to cover the insulator 282, the insulator 287, and the insulator 211 (see FIG. 22). The insulator 283 can be deposited by a sputtering method, a CVD method, an MBE method, a PLD method, an ALD method, or the like. The insulator 283 may be a multilayer. For example, silicon nitride may be deposited by a sputtering method, and silicon nitride may be deposited thereover by a CVD method. As illustrated in FIG. 22, the insulator 283 is in contact with the insulator 211 at the bottom surface of the opening. That is, the top surface and the side surface of the transistor 200 are surrounded by the insulator 283 and the bottom surface of the transistor 200 is surrounded by the insulator 211. Surrounding the transistor 200 by the insulator 283 and the insulator 211 having high barrier properties inhibits entry of moisture and hydrogen from the outside.

Next, heat treatment may be performed. In this embodiment, the heat treatment is performed in a nitrogen atmosphere at 400° C. for one hour. Through the heat treatment, oxygen added at the time of the formation of the insulator 282 can be diffused into the insulator 280 and then can be supplied to the oxide 230a and the oxide 230b through the oxide 230c. The oxygen adding treatment performed in this manner on the oxide 230 allows oxygen vacancies in the oxide 230 (the oxide 230b) to be filled with oxygen.

Furthermore, hydrogen remaining in the oxide 230 diffuses to the insulator 282 and the insulator 287 through the insulator 280 and is trapped or fixed in the insulator 287. That is, recombination of hydrogen remaining in the oxide 230 with oxygen vacancies and formation of VoH can be inhibited. Note that the heat treatment is not necessarily performed after the deposition of the insulator 283 and may be performed after the deposition of the insulator 282.

Furthermore, the insulator 284 may be formed over the insulator 283 (see FIG. 23). Note that the insulator 284 is preferably deposited by a deposition method that enables high coverage. For example, the insulator 284 can be deposited by a sputtering method, a CVD method, an MBE method, a PLD method, an ALD method, or the like. The insulator 284 is preferably deposited using the same material as those for the insulator 211, the insulator 212, and the insulator 283.

Specifically, silicon nitride is preferably deposited by a CVD method. It is particularly preferable that the insulator 284 be deposited by a CVD method using a compound gas containing no hydrogen atom or having a low hydrogen atom content.

The insulator 284 is deposited by a deposition method using a gas in which the number of hydrogen atoms is reduced or hydrogen atoms are removed, whereby the amount of hydrogen in the insulator 284 can be reduced. In other words, the hydrogen concentration of the insulator 284 can be reduced and thus entry of hydrogen into the channel formation region of the oxide semiconductor can be inhibited.

Then, an insulating film to be the insulator 274 is deposited over the insulator 284. The insulating film to be the insulator 274 can be deposited by a sputtering method, a CVD method, an MBE method, a PLD method, an ALD method, or the like. The insulating film to be the insulator 274 is preferably deposited by a deposition method using the gas in which the number of hydrogen atoms is reduced or hydrogen atoms are removed. Thus, the hydrogen concentration of the insulating film to be the insulator 274 can be reduced.

Next, the insulating film to be the insulator 274 is subjected to CMP treatment, whereby the insulator 274 having a flat top surface is formed (see FIG. 24).

Subsequently, openings reaching the conductor 242 are formed in the insulator 272, the insulator 273, the insulator 280, the insulator 282, the insulator 283, and the insulator 284 (see FIG. 25). The openings are formed by a lithography method. Note that the openings in the top view in FIG. 25A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Next, an insulating film to be the insulator 241 is formed and subjected to anisotropic etching, so that the insulator 241 is formed (see FIG. 25). The insulating film to be the insulator 241 can be formed by a sputtering method, a CVD method, an MBE method, a PLD method, an ALD method, or the like. The insulating film to be the insulator 241 preferably has a function of inhibiting the penetration of oxygen. For example, aluminum oxide is preferably deposited by a PEALD method. Alternatively, as in the insulator 283, silicon nitride is preferably deposited by a PEALD method. Silicon nitride is preferable because of its high hydrogen blocking property.

For the anisotropic etching of the insulating film to be the insulator 241, a dry etching method may be employed, for example. Providing the insulator 241 on the sidewall portions of the openings can inhibit penetration of oxygen from the outside and oxidation of the conductor 240a and the conductor 240b formed in the next step. Furthermore, impurities such as water and hydrogen can be prevented from diffusing from the conductor 240a and the conductor 240b to the outside.

Next, a conductive film to be the conductor 240a and the conductor 240b is deposited. The conductive film to be the conductor 240a and the conductor 240b preferably has a stacked-layer structure including a conductor with a function of inhibiting transmission of impurities such as water and hydrogen. For example, a stacked-layer structure of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Then, part of the conductive film to be the conductor 240a and the conductor 240b is removed by CMP treatment to expose top surfaces of the insulator 284 and the insulator 274. As a result, the conductive film remains only in the openings, whereby the conductor 240a and the conductor 240b having flat top surfaces can be formed (see FIG. 25). Note that the top surfaces of the insulator 284 and the insulator 274 are partly removed by the CMP treatment in some cases.

Next, a conductive film to be the conductor 246 is formed. The conductive film to be the conductor 246 can be formed by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b (see FIG. 26). At this time, the insulator 284 in a region not overlapping with the conductor 246a or the conductor 246b is sometimes partly removed.

Next, the insulator 286 is formed over the conductor 246 and the insulator 284 (see FIG. 7). The insulator 286 can be formed by a sputtering method, a CVD method, an MBE method, a PLD method, an ALD method, or the like. The insulator 286 may be a multilayer. For example, silicon nitride may be deposited by a sputtering method, and another silicon nitride may be deposited thereover by a CVD method. When the insulator 286 is formed over the conductor 246 and the insulator 284, the top surface of the conductor 246 and the side surface of the conductor 246 are in contact with the insulator 286, and the bottom surface of the conductor 246 is in contact with the insulator 284. In other words, the conductor 246 can be surrounded by the insulator 284 and the insulator 286. Such a structure can inhibit penetration of oxygen from the outside and oxidation of the conductor 246. Furthermore, such a structure is preferable because impurities such as water and hydrogen can be prevented from diffusing from the conductor 246 to the outside.

Through the above process, the semiconductor device including the transistor 200 illustrated in FIG. 7 can be manufactured. By the manufacturing method of a semiconductor device which is described in this embodiment and illustrated in FIG. 10 to FIG. 26, the transistor 200 can be formed.

<Application Example of Semiconductor Device>

An example of a semiconductor device including the transistor 200 of one embodiment of the present invention which is different from the semiconductor device described in <Structure example of semiconductor device> is described below with reference to FIG. 27 and FIG. 28. Note that in the semiconductor device illustrated in FIG. 27 and FIG. 28, components having the same functions as the components in the semiconductor device described in <Structure example 1 of semiconductor device> (see FIG. 7) are denoted by the same reference numerals. Note that in this section, the materials described in detail in <Structure example 1 of semiconductor device> can be used as materials for the transistor 200.

<<Application Example 1 of Semiconductor Device>>

FIG. 27A and FIG. 27B each illustrate a structure in which a plurality of transistors 200_1 to 200_n are collectively sealed by the insulator 283 and the insulator 211. Note that although a plurality of transistors 200_1 to 200_n appear to be arranged in the channel length direction in FIG. 27A and FIG. 27B, the present invention is not limited to this structure. The plurality of transistors 200_1 to 200_n may be arranged in the channel width direction or in a matrix. Depending on the design, the transistors may be arranged without regularity.

As illustrated in FIG. 27A, a portion where the insulator 283 and the insulator 211 are in contact with each other (hereinafter referred to as a sealing portion 265 in some cases) is formed outside the plurality of transistors 200_1 to 200_n. The sealing portion 265 is formed to surround the plurality of transistors 200_1 to 200_n. When such a structure is employed, the transistors 200_1 to 200_n can be surrounded by the insulator 283 and the insulator 211. As a result, a plurality of transistor groups surrounded by the sealing portion 265 are provided over a substrate.

A dicing line (also referred to as a scribe line, a dividing line, or a cutting line) may be provided to overlap with the sealing portion 265. The above substrate is divided at the dicing line, so that the transistor groups surrounded by the sealing portion 265 are taken out as one chip.

Although the plurality of transistors 200_1 to 200_n are surrounded by one sealing portion 265 in the example illustrated in FIG. 27A, the present invention is not limited to this example. As illustrated in FIG. 27B, the plurality of transistors 200_1 to 200_n may be surrounded by a plurality of sealing portions. In FIG. 27B, the plurality of transistors 200_1 to 200_n are surrounded by a sealing portion 265a and are further surrounded by an outer sealing portion 265b.

When a plurality of sealing portions surround the plurality of transistors 200_1 to 200_n in this manner, the insulator 283 and the insulator 211 are in contact with each other in more portions, improving the adhesion between the insulator 283 and the insulator 211. As a result, the plurality of transistors 200_1 to 200_n can be more reliably sealed.

In that case, a dicing line may be provided to overlap with the sealing portion 265a or the sealing portion 265b, or may be provided between the sealing portion 265a and the sealing portion 265b.

<<Application Example 2 of Semiconductor Device>>

Figure 28:
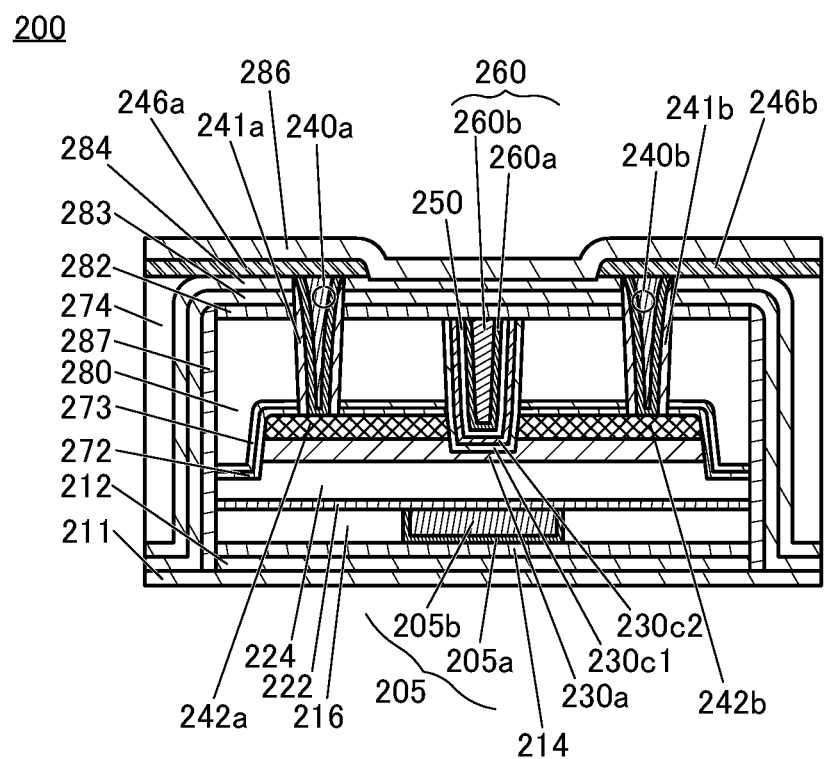
FIG. 28 is a cross-sectional view of a semiconductor device of one embodiment of the present invention.

FIG. 28 is a cross-sectional view of the transistor 200. The transistor 200 illustrated in FIG. 28 is different from the transistor 200 illustrated in FIG. 7 in that the oxide 230b is not provided. That is, the oxide 230 of the transistor 200 in FIG. 28 includes the oxide 230a, an oxide 230c1, and an oxide 230c2. A bottom surface of the conductor 242a and a bottom surface of the conductor 242b are in contact with the oxide 230a.

When the oxide 230 has a stacked-layer structure of the oxide 230a, the oxide 230c1, and the oxide 230c2, the following excellent effects can be achieved.

For example, when the oxide 230a has an atomic ratio of In:Ga:Zn=1:3:4, the oxide 230c1 has an atomic ratio of In:Ga:Zn=4:2:3, and the oxide 230c2 has an atomic ratio of In:Ga:Zn=1:3:4, a channel formation region can be provided in the oxide 230c1. In the case where this structure is employed, the oxide 230c1 and the oxide 230c2 are formed to have a U-shape along an opening formed in the insulator 280, the insulator 272, the insulator 273, the conductor 242 (the conductor 242a and the conductor 242b), and the oxide 230a. Furthermore, side surfaces of the conductor 242a and the conductor 242b can be in contact with side surfaces of the oxide 230c1. The oxide 230c2 is in contact with a top surface of the oxide 230c1, whereby the insulator 250 can be prevented from being in contact with the oxide 230c1.

In the above-described structure, the contact area between the conductor 242 (the conductor 242a and the conductor 242b) and the oxide 230c1 can be small. This small contact area between the conductor 242 and the oxide 230c1 leads to a reduced junction leakage current that might be generated between the conductor 242 and the oxide 230c1. The contact area between the conductor 242 and the oxide 230c1 can be arbitrarily adjusted by adjusting the thickness of the conductor 242.

A semiconductor device including the transistor 200 illustrated in FIG. 28 can be suitably used, for example, for a space shuttle, an artificial satellite, or the like, which are used in space. In space, cosmic radiation, or electrons and protons ejected from the sun might enter the semiconductor device to affect the semiconductor characteristics. Since the junction leakage current in the transistor 200 illustrated in FIG. 28 is reduced, the transistor 200 is resistant to cosmic radiation and the like and can be deemed to have a highly reliable structure.

According to one embodiment of the present invention, a semiconductor device having favorable electrical characteristics can be provided. According to one embodiment of the present invention, a semiconductor device having normally-off electrical characteristics can be provided. According to one embodiment of the present invention, a semiconductor device having favorable reliability can be provided. According to one embodiment of the present invention, a semiconductor device having a high on-state current can be provided. According to one embodiment of the present invention, a semiconductor device having excellent frequency characteristics can be provided. According to one embodiment of the present invention, a semiconductor device that can be miniaturized or highly integrated can be provided. According to one embodiment of the present invention, a semiconductor device having a low off-state current can be provided. According to one embodiment of the present invention, a semiconductor device with reduced power consumption can be provided. According to one embodiment of the present invention, a semiconductor device with high productivity can be provided.

At least part of this embodiment can be implemented in combination with the other embodiments and the like described in this specification as appropriate.

Embodiment 3

In this embodiment, a mode of a semiconductor device that can be applied to another embodiment of the present invention is described. Structure examples of the semiconductor device are described below.

Structure Example 2 of Semiconductor Device

Figure 29A:
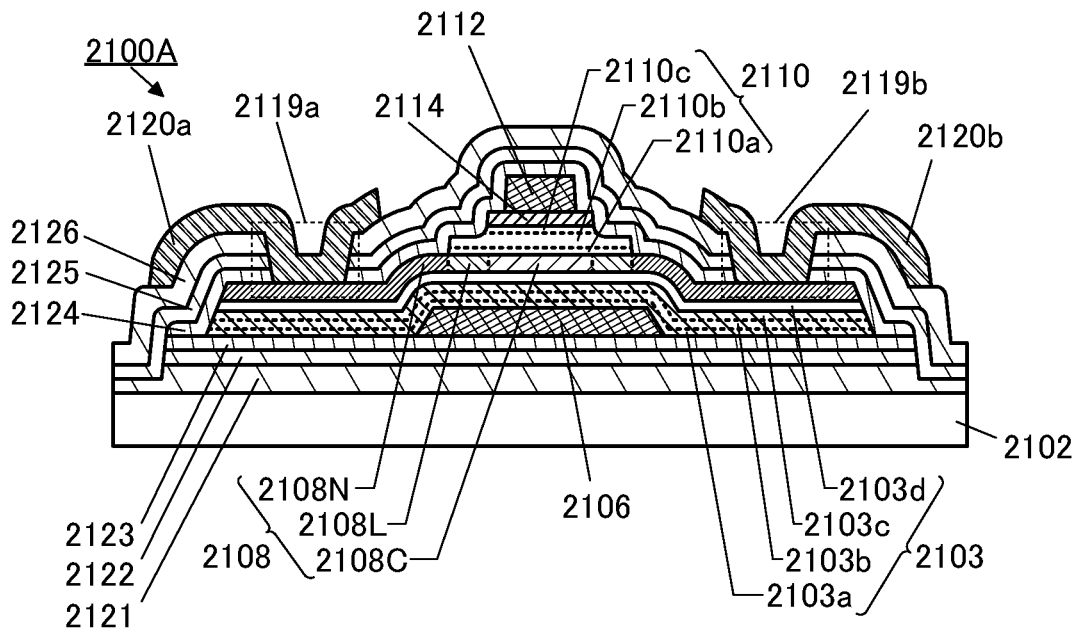
FIG. 29A and FIG. 29B are cross-sectional views of a semiconductor device of one embodiment of the present invention.

FIG. 29A is a cross-sectional view of a transistor 2100A in the channel length direction.

The transistor 2100A is provided over a substrate 2102 and includes an insulating layer 2121, an insulating layer 2122, an insulating layer 2123, a conductive layer 2106, an insulating layer 2103, a semiconductor layer 2108, an insulating layer 2110, a metal oxide layer 2114, a conductive layer 2112, an insulating layer 2124, an insulating layer 2125, an insulating layer 2126, and the like. The insulating layer 2121, the insulating layer 2122, and the insulating layer 2123 are sequentially provided over the substrate 2102, the conductive layer 2106 is provided over the insulating layer 2123, and the insulating layer 2103 is provided over the insulating layer 2123 and the conductive layer 2106. The semiconductor layer 2108 having an island-like shape is provided over the insulating layer 2103 and includes a region overlapping with part of the conductive layer 2106. The insulating layer 2110 is provided over the semiconductor layer 2108. The metal oxide layer 2114 and the conductive layer 2112 are stacked in this order over the insulating layer 2110 and include regions overlapping with part of the semiconductor layer 2108 and part of the conductive layer 2106.

The insulating layer 2124 includes a region in contact with part of the insulating layer 2123 and is provided over the conductive layer 2106, the insulating layer 2103, the semiconductor layer 2108, the insulating layer 2110, the metal oxide layer 2114, and the conductive layer 2112. The insulating layer 2125 includes a region in contact with part of the insulating layer 2122 and part of the insulating layer 2121 and is provided over the insulating layer 2124. The insulating layer 2126 is provided over the insulating layer 2125.

It is preferable that in the transistor 2100A, at least the semiconductor layer 2108 be provided between the insulating layer 2123 and the insulating layer 2124 and the insulating layer 2123 be in contact with the insulating layer 2124 outside the semiconductor layer 2108. The insulating layer 2123 and the insulating layer 2124 are provided between the insulating layer 2121 and the insulating layer 2122 and the insulating layer 2125 and the insulating layer 2126. Here, it is preferable that the insulating layer 2125 be in contact with at least the insulating layer 2122 and be further in contact with the insulating layer 2121.

In other words, in the transistor 2100A, the semiconductor layer 2108 is surrounded by the insulating layer 2123 and the insulating layer 2124, and the semiconductor layer 2108, the insulating layer 2123, and the insulating layer 2124 are surrounded by the insulating layer 2122 and the insulating layer 2125. Furthermore, the semiconductor layer 2108, the insulating layer 2123, the insulating layer 2124, the insulating layer 2122, and the insulating layer 2125 are provided to be sandwiched between the insulating layer 2121 and the insulating layer 2126, or in other words surrounded by the insulating layer 2121 and the insulating layer 2126.

That is, the sealing structure formed by the insulating layer 2123 and the insulating layer 2124 corresponds to the sealing structure formed by the insulator 214, the insulator 287, and the insulator 282 in the above embodiment. Thus, for the insulating layer 2123 and the insulating layer 2124, the description of the insulator 214, the insulator 287, and the insulator 282 can be referred to.

The sealing structure formed by the insulating layer 2121, the insulating layer 2122, and the insulating layer 2125 corresponds to the sealing structure formed by the insulator 211, the insulator 212, and the insulator 283 in the above embodiment. Thus, for the insulating layer 2122 and the insulating layer 2125, the description of the insulator 211, the insulator 212, and the insulator 283 can be referred to.

The insulating layer 2126 corresponds to the insulator 284 described in the above embodiment. Thus, the description of the insulator 284 can be referred to for the insulating layer 2126.

End portions of the conductive layer 2112 and the metal oxide layer 2114 are located inward from an end portion of the insulating layer 2110. In other words, the insulating layer 2110 includes a portion extending outward from the end portions of the conductive layer 2112 and the metal oxide layer 2114 over at least the semiconductor layer 2108.

The end portion of the conductive layer 2112 is preferably located inward from the end portion of the metal oxide layer 2114. The insulating layer 2124 is provided in contact with part of a top surface of the metal oxide layer 2114 and a side surface thereof.

In the transistor 2100A, the end portion of the conductive layer 2112 is located inward from the end portion of the metal oxide layer 2114. In other words, the metal oxide layer 2114 includes a portion extending outward from the end portion of the conductive layer 2112 over at least the insulating layer 2110.

Since the end portion of the conductive layer 2112 is located inward from the end portion of the metal oxide layer 2114, a step formed by the conductive layer 2112 and the metal oxide layer 2114 is small, which can improve step coverage with the layers formed over the conductive layer 2112 and the metal oxide layer 2114 (e.g., the insulating layer 2124, the insulating layer 2125, and the insulating layer 2126) and inhibit defects such as breakage of the layers or voids therein.

A wet etching method can be suitably used for formation of the conductive layer 2112 and the metal oxide layer 2114. When a material having a lower etching rate than the conductive layer 2112 is used for the metal oxide layer 2114, the end portion of the conductive layer 2112 can be formed inward from the end portion of the metal oxide layer 2114. In addition, the metal oxide layer 2114 and the conductive layer 2112 can be formed in the same step, which can increase the productivity.

Note that this embodiment is not limited by the above description. The end portion of the conductive layer 2112 may be aligned with the end portion of the metal oxide layer 2114. Alternatively, a side surface of the conductive layer 2112 and a side surface of the metal oxide layer 2114 may be on the same plane.

The semiconductor layer 2108 includes a pair of regions 2108L between which a channel formation region is sandwiched and a pair of regions 2108N outside the pair of regions 2108L. The region 2108L is a region of the semiconductor layer 2108 that overlaps with the insulating layer 2110 and does not overlap with the metal oxide layer 2114 or the conductive layer 2112.

A region 2108C functions as the channel formation region. Here, the metal oxide layer 2114 functions as part of a gate electrode when having conductivity; thus, an electric field is applied from the gate electrode to the region 2108C through the insulating layer 2110 functioning as a gate insulating layer to form a channel. However, this embodiment is not limited thereto. A channel might be formed in a portion that does not overlap with the metal oxide layer 2114 but overlaps with the conductive layer 2106 (a portion including the region 2108L and the region 2108N).

The region 2108L functions as a buffer region that relieves a drain electric field. The region 2108L does not overlap with the conductive layer 2112 or the metal oxide layer 2114 and is thus a region where a channel is hardly formed by application of gate voltage to the conductive layer 2112. The region 2108L preferably has a higher carrier concentration than the region 2108C. In that case, the region 2108L can function as an LDD region.

The region 2108L can be referred to as a region whose resistance is substantially equal to or lower than the resistance of the region 2108C, a region whose carrier concentration is substantially equal to or higher than the carrier concentration of the region 2108C, a region whose oxygen vacancy density is substantially equal to or higher than the oxygen vacancy density of the region 2108C, or a region whose impurity concentration is substantially equal to or higher than the impurity concentration of the region 2108C.

The region 2108L can be referred to as a region whose resistance is substantially equal to or higher than the resistance of the region 2108N, a region whose carrier concentration is substantially equal to or lower than the carrier concentration of the region 2108N, a region whose oxygen vacancy density is substantially equal to or lower than the oxygen vacancy density of the region 2108N, or a region whose impurity concentration is substantially equal to or lower than the impurity concentration of the region 2108N.

In this manner, the region 2108L functioning as the LDD region is provided between the region 2108C that is the channel formation region and the region 2108N that is a source region or a drain region, whereby a highly reliable transistor having both high drain withstand voltage and a high on-state current can be provided.

The region 2108N functions as the source region or the drain region and has lower resistance than any of the other regions of the semiconductor layer 2108. In other words, the region 2108N has higher carrier concentration, higher oxygen vacancy density, and higher impurity concentration than any of the other regions of the semiconductor layer 2108.

The electric resistance of the region 2108N is preferably as low as possible. For example, the sheet resistance of the region 2108N is preferably higher than or equal to 1 $\Omega$/square and less than $1\times10^3$ $\Omega$/square, further preferably higher than or equal to 1 $\Omega$/square and lower than or equal to $8\times10^2$ $\Omega$/square.

The electric resistance of the region 2108C when a channel is not formed is preferably as high as possible. For example, the sheet resistance of the region 2108C is preferably higher than or equal to $1\times10^9$ $\Omega$/square, further preferably higher than or equal to $5\times10^9$ $\Omega$/square, still further preferably higher than or equal to $1\times10^{10}$ $\Omega$/square.

The electric resistance of the region 2108C when a channel is not formed is preferably as high as possible and thus, its upper limit is not particularly set. If the upper limit is set, the sheet resistance of the region 2108C is preferably higher than or equal to $1\times10^9$ $\Omega$/square and lower than or equal to $1\times10^{12}$ $\Omega$/square, further preferably higher than or equal to $5\times10^9$ $\Omega$/square and lower than or equal to $1\times10^{12}$ $\Omega$/square, still further preferably higher than or equal to $1\times10^{10}$ $\Omega$/square and lower than or equal to $1\times10^{12}$ $\Omega$/square, for example.

The sheet resistance of the region 2108L can be, for example, higher than or equal to $1\times10^3$ $\Omega$/square and lower than or equal to $1\times10^9$ $\Omega$/square, preferably higher than or equal to $1\times10^3$ $\Omega$/square and lower than or equal to $1\times10^8$ $\Omega$/square, further preferably higher than or equal to $1\times10^3$ Ω/square and lower than or equal to $1\times10^7$ Ω/square. When the resistance is within the above range, a transistor that has favorable electrical characteristics and high reliability can be provided. Note that the sheet resistance can be calculated from a resistance value. Providing the region 2108L between the region 2108N and the region 2108C can increase the source-drain withstand voltage of the transistor 2100A.

The electric resistance of the region 2108C when a channel is not formed can be more than or equal to $1\times10^6$ times and less than or equal to $1\times10^{12}$ times that of the region 2108N, preferably more than or equal to $1\times10^6$ times and less than or equal to $1\times10^{11}$ times that of the region 2108N, further preferably more than or equal to $1\times10^6$ times and less than or equal to $1\times10^{10}$ times that of the region 2108N.

The electric resistance of the region 2108C when a channel is not formed can be more than or equal to $1\times10^0$ times and less than or equal to $1\times10^9$ times that of the region 2108L, preferably more than or equal to $1\times10^1$ times and less than or equal to $1\times10^8$ times that of the region 2108L, further preferably more than or equal to $1\times10^2$ times and less than or equal to $1\times10^7$ times that of the region 2108L.

The electric resistance of the region 2108L can be more than or equal to $1\times10^0$ times and less than or equal to $1\times10^9$ times that of the region 2108N, preferably more than or equal to $1\times10^1$ times and less than or equal to $1\times10^8$ times that of the region 2108N, further preferably more than or equal to $1\times10^1$ times and less than or equal to $1\times10^7$ times that of the region 2108N.

Providing the region 2108L having the resistance described above between the region 2108N and the channel formation region can increase the source-drain withstand voltage of the transistor 2100A.

The carrier concentration in the semiconductor layer 2108 preferably has a distribution such that the carrier concentration is increased in the following order: the region 2108C, the region 2108L, and the region 2108N. Providing the region 2108L between the region 2108C and the region 2108N can keep the carrier concentration of the region 2108C extremely low even when impurities such as hydrogen diffuse from the region 2108N during the manufacturing process.

The carrier concentration in the region 2108C functioning as the channel formation region is preferably as low as possible and preferably lower than or equal to $1\times10^{18}$ cm$^{-3}$, further preferably lower than or equal to $1\times10^{17}$ cm$^{-3}$, still further preferably lower than or equal to $1\times10^{16}$ cm$^{-3}$, yet still further preferably lower than or equal to $1\times10^{13}$ cm$^{-3}$, yet still further preferably lower than or equal to $1\times10^{12}$ cm$^{-3}$. Note that the lower limit of the carrier concentration of the region 2108C is not particularly limited and can be, for example, $1\times10^{-9}$ cm$^{-3}$.

Meanwhile, the carrier concentration in the region 2108N can be higher than or equal to $5\times10^{18}$ cm$^{-3}$, preferably higher than or equal to $1\times10^{19}$ cm$^{-3}$, further preferably higher than or equal to $5\times10^{19}$ cm$^{-3}$, for example. The upper limit of the carrier concentration of the region 2108N is not particularly limited and can be, for example, $5\times10^{21}$ cm$^{-3}$ or $1\times10^{22}$ cm$^{-3}$.

The carrier concentration of the region 2108L can lie halfway between that of the region 2108C and that of the region 2108N. For example, the carrier concentration of the region 2108L is higher than or equal to $1\times10^{14}$ cm$^{-3}$ and lower than $1\times10^{20}$ cm$^{-3}$.

Note that the carrier concentration is not necessarily uniform in the region 2108L; the region 2108L sometimes has a carrier concentration gradient that decreases from the region 2108N side to the channel formation region side. For example, one or both of the hydrogen concentration and the oxygen vacancy concentration of the region 2108L may have a gradient that decreases from the region 2108N side to the channel formation region side.

The semiconductor layer 2108 preferably contains a metal oxide. For the metal oxide that can be used for the semiconductor layer 2108, the description of the oxide 230 or the like shown in other embodiments, or other structure examples can be referred to. The insulating layer 2103 and the gate insulating layer 2110 that are in contact with the channel formation region of the semiconductor layer 2108 are preferably formed using oxide films. For example, an oxide film such as a silicon oxide film, a silicon oxynitride film, or an aluminum oxide film can be used. In this manner, oxygen released from the insulating layer 2103 or the insulating layer 2110 can be supplied to the channel formation region in the semiconductor layer 2108 to reduce oxygen vacancies in the semiconductor layer 2108.

Part of the end portion of the insulating layer 2110 is positioned over the semiconductor layer 2108. The insulating layer 2110 includes a portion overlapping with the conductive layer 2112 and functioning as the gate insulating layer and a portion not overlapping with the conductive layer 2112 or the metal oxide layer 2114 (i.e., a portion overlapping with the region 2108L).

The insulating layer 2110 may have a stacked-layer structure of two or more layers. FIG. 29A illustrates an example in which the insulating layer 2110 has a three-layer structure of an insulating layer 2110a, an insulating layer 2110b over the insulating layer 2110a, and an insulating layer 2110c over the insulating layer 2110b. Note that the insulating layer 2110a, the insulating layer 2110b, and the insulating layer 2110c can be formed using insulating films of the same kind of material and thus, the interfaces between the insulating layer 2110a, the insulating layer 2110b, and the insulating layer 2110c cannot be clearly observed in some cases. Therefore, in this embodiment, the interfaces between the insulating layer 2110a, the insulating layer 2110b, and the insulating layer 2110c are denoted by dashed lines in the drawing.

The insulating layer 2110a includes a region in contact with the channel formation region of the semiconductor layer 2108. The insulating layer 2110c includes a region in contact with the metal oxide layer 2114. The insulating layer 2110b is positioned between the insulating layer 2110a and the insulating layer 2110c.

Each of the insulating layer 2110a, the insulating layer 2110b, and the insulating layer 2110c is preferably an insulating film containing an oxide. In this case, it is preferable that the insulating layer 2110a, the insulating layer 2110b, and the insulating layer 2110c be successively formed in one deposition apparatus.

As each of the insulating layer 2110a, the insulating layer 2110b, and the insulating layer 2110c, for example, an insulating layer including at least one of the following films can be used: a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 2110 in contact with the semiconductor layer 2108 preferably has a stacked-layer structure of oxide insulating films. The insulating layer 2110 further preferably includes a region containing oxygen in excess of the stoichiometric composition. In other words, the insulating layer 2110 includes an insulating film capable of releasing oxygen. For example, the insulating layer 2110 is formed in an oxygen atmosphere, the deposited insulating layer 2110 is subjected to heat treatment, plasma treatment, or the like in an oxygen atmosphere, or an oxide film is deposited over the insulating layer 2110 in an oxygen atmosphere, so that oxygen can be supplied to the insulating layer 2110. Specifically, the insulating layer 2110*a* that is in contact with the semiconductor layer 2108 preferably contains excess oxygen in a manner similar to that of the insulator 280 described in the above embodiment.

For example, each of the insulating layer 2110*a*, the insulating layer 2110*b*, and the insulating layer 2110*c* can be formed by any of a sputtering method, a chemical vapor deposition (CVD) method, a vacuum evaporation method, a pulsed laser deposition (PLD) method, an atomic layer deposition (ALD) method, and the like. As a CVD method, a plasma-enhanced chemical vapor deposition (PECVD) method, a thermal CVD method, or the like can be used.

In particular, the insulating layer 2110*a*, the insulating layer 2110*b*, and the insulating layer 2110*c* are preferably formed by a plasma CVD method.

Like the insulator 250, the insulating layer 2110*c* is preferably an extremely dense film in which defects in its surface are reduced and on which impurities included in the air, such as water, are hardly adsorbed as compared to the insulating layer 2110*b*.

The insulating layer 2110*b* is preferably formed to be thicker than the insulating layer 2110*a* and the insulating layer 2110*c*. For example, the insulating layer 2110*b* may be formed to be thick with the use of a deposition rate higher than that for the insulating layer 2110*a* and the insulating layer 2110*c*. In that case, the time taken for forming the insulating layer 2110 can be shortened.

Here, a boundary between the insulating layer 2110*a* and the insulating layer 2110*b* and a boundary between the insulating layer 2110*b* and the insulating layer 2110*c* are unclear in some cases; thus, the boundaries are denoted by dashed lines in FIG. 29A. Note that when the insulating layer 2110*a* and the insulating layer 2110*b* have different film densities, the boundary between the insulating layer 2110*a* and the insulating layer 2110*b* can be sometimes observed from difference in contrast in a cross-sectional image of the insulating layer 2110 obtained with a transmission electron microscope (TEM). Similarly, the boundary between the insulating layer 2110*b* and the insulating layer 2110*c* can be observed in some cases.

At the time of formation of the conductive layer 2112 and the metal oxide layer 2114, the thickness of the insulating layer 2110 might be reduced in a region not overlapping with the conductive layer 2112. In the structure illustrated in FIG. 29A, the insulating layer 2110*c* is removed and the insulating layer 2110*a* and the insulating layer 2110*b* remain in a region not overlapping with the metal oxide layer 2114. The insulating layer 2110*b* might be thinner in the region not overlapping with the metal oxide layer 2114 than in the region overlapping with the metal oxide layer 2114.

When the insulating layer 2110 has a smaller thickness in the region not overlapping with the metal oxide layer 2114, a step at the end portion of the insulating layer 2110 is small, which can improve step coverage with the layers formed over the insulating layer 2110 (e.g., the insulating layer 2124, the insulating layer 2125, and the insulating layer 2126) and inhibit defects such as breakage of the layers or voids therein.

The insulating layer 2110 may have a structure different from that illustrated in FIG. 29A; the insulating layer 2110*a*, the insulating layer 2110*b*, and the insulating layer 2110*c* may remain in the region not overlapping with the metal oxide layer 2114. Furthermore, the insulating layer 2110*c* may be thinner in the region not overlapping with the metal oxide layer 2114 than in the region overlapping with the metal oxide layer 2114. When the insulating layer 2110*c* remains in the region not overlapping with the metal oxide layer 2114, adsorption of water on the insulating layer 2110 can be inhibited. The thickness of the insulating layer 2110*c* in the region overlapping with the metal oxide layer 2114 is greater than or equal to 1 nm and less than or equal to 50 nm, preferably greater than or equal to 2 nm and less than or equal to 40 nm, further preferably greater than or equal to 3 nm and less than or equal to 30 nm.

Note that the insulating layer 2110 may have a two-layer structure of the insulating layer 2110*a* and the insulating layer 2110*c* over the insulating layer 2110*a*. Alternatively, the insulating layer 2110 may be a single layer. Any of the above insulating layer 2110*a*, the above insulating layer 2110*b*, and the above insulating layer 2110*c* can be selected as the insulating layer 2110 appropriately in accordance with the purpose.

The insulating layer 2103 can have a stacked-layer structure. The insulating layer 2103 has a structure in which an insulating layer 2103*a*, an insulating layer 2103*b*, an insulating layer 2103*c*, and an insulating layer 2103*d* are stacked in this order from the conductive layer 2106 side in the example illustrated in FIG. 29A. The insulating layer 2103*a* is in contact with the conductive layer 2106. The insulating layer 2103*d* is in contact with the semiconductor layer 2108.

The insulating layer 2103 preferably satisfies at least one of the following characteristics, further preferably satisfies all of the following characteristics: high withstand voltage, low stress, unlikeliness of releasing hydrogen and water, a small number of defects, and prevention of diffusion of metal elements contained in the conductive layer 2106.

Among the four insulating layers included in the insulating layer 2103, the insulating layer 2103*a*, the insulating layer 2103*b*, and the insulating layer 2103*c* positioned on the conductive layer 2106 side are each preferably formed using an insulating film containing nitrogen. In contrast, the insulating layer 2103*d* in contact with the semiconductor layer 2108 is preferably formed using an insulating film containing oxygen. The four insulating layers included in the insulating layer 2103 are preferably formed successively without exposure to the air with a plasma CVD apparatus.

As each of the insulating layer 2103*a*, the insulating layer 2103*b*, and the insulating layer 2103*c*, an insulating film containing nitrogen, such as a silicon nitride film, a silicon nitride oxide film, an aluminum nitride film, or a hafnium nitride film can be favorably used, for example. Furthermore, as the insulating layer 2103*d*, an insulating film that can be used as the insulating layer 2110 can also be used.

The insulating layer 2103*a* and the insulating layer 2103*c* are preferably dense films that can prevent diffusion of impurities from the layers therebelow. It is preferable that the insulating layer 2103*a* be able to block a metal element contained in the conductive layer 2106 and that the insulating layer 2103*c* be able to block hydrogen and water contained in the insulating layer 2103*b*. Thus, an insulating film that is deposited at a lower deposition rate than the insulating layer 2103*b* can be used as each of the insulating layer 2103*a* and the insulating layer 2103*c*.

In contrast, it is preferable that the insulating layer 2103*b* be formed using an insulating film having low stress and being formed at a high deposition rate. The insulating layer 2103*b* is preferably thicker than the insulating layer 2103*a* and the insulating layer 2103*c*.

For example, even in the case where silicon nitride films deposited by a plasma CVD method are used as the insulating layer 2103*a*, the insulating layer 2103*b*, and the insulating layer 2103*c*, the film density of the insulating layer 2103*b* is smaller than the film densities of the other two insulating layers. Thus, in a transmission electron microscope image of a cross section of the insulating layer 2103, difference in contrast can be observed in some cases. Since a boundary between the insulating layer 2103*a* and the insulating layer 2103*b* and a boundary between the insulating layer 2103*b* and the insulating layer 2103*c* are unclear in some cases, the boundaries are denoted by dashed lines in FIG. 29A.

As the insulating layer 2103*d* in contact with the semiconductor layer 2108, it is preferable to use a dense insulating film on a surface of which an impurity such as water is less likely to be adsorbed. In addition, it is preferable to use an insulating film which includes as few defects as possible and in which impurities such as water and hydrogen are reduced. For example, an insulating film similar to the insulating layer 2110*c* included in the insulating layer 2110 can be used as the insulating layer 2103*d*.

In the case where a metal film or an alloy film whose constituent element is less likely to be diffused into the insulating layer 2103 is used as the conductive layer 2106, for example, a structure may be employed in which the insulating layer 2103*a* is not provided and the three insulating layers of the insulating layer 2103*b*, the insulating layer 2103*c*, and the insulating layer 2103*d* are stacked.

With the insulating layer 2103 having such a stacked-layer structure, the transistor can have extremely high reliability.

For the insulating layer 2123 and the insulating layer 2124, a material that absorbs impurities such as hydrogen contained in the semiconductor layer 2108, the insulating layer 2103, the insulating layer 2110, and the like is preferably used. For example, a material containing aluminum oxide can be used for the insulating layer 2123 and the insulating layer 2124. In that case, the insulating layer 2123 and the insulating layer 2124 function as gettering layers for impurities such as hydrogen. Note that hydrogen here can refer to, for example, a hydrogen atom, a hydrogen molecule, hydrogen bonded to oxygen or the like, or any of these that is ionized.

It is further preferable that the material used for the insulating layer 2123 and the insulating layer 2124 have an effect of inhibiting passage of oxygen.

As illustrated in FIG. 29A, in the channel length direction, the insulating layer 2124 is provided to cover a top surface and the side surface of the conductive layer 2112, a top surface and the side surface of the metal oxide layer 2114, a top surface and a side surface of the insulating layer 2110, a top surface and a side surface of the semiconductor layer 2108, and a side surface of the insulating layer 2103. The insulating layer 2124 is in contact with the insulating layer 2123 outside the insulating layer 2103. Here, an end portion of the insulating layer 2103 is substantially aligned with an end portion of the semiconductor layer 2108. Alternatively, a side surface of the insulating layer 2103 and a side surface of the semiconductor layer 2108 may be on the same plane.

Although not illustrated, in the channel width direction, the insulating layer 2123 is preferably provided in contact with the insulating layer 2124 in the region not overlapping with the insulating layer 2110.

With the above-described structure, impurities such as hydrogen contained in the semiconductor layer 2108, the insulating layer 2103, the insulating layer 2110, and the like can be efficiently absorbed in the insulating layer 2123 and the insulating layer 2124, which enables gettering of impurities such as hydrogen. In addition, oxygen contained in the semiconductor layer 2108, the insulating layer 2103, the insulating layer 2110, and the like can be inhibited from diffusing to the outside of the insulating layer 2123 and the insulating layer 2124.

The insulating layer 2121, the insulating layer 2122, the insulating layer 2125, and the insulating layer 2126 are preferably formed using a material inhibiting passage of hydrogen. The insulating layer 2121, the insulating layer 2122, the insulating layer 2125, and the insulating layer 2126 can be formed using, for example, a material that contains a nitride of silicon or silicon oxide containing nitrogen. As such a material, silicon nitride is preferably used. Here, the insulating layer 2121, the insulating layer 2122, the insulating layer 2125, and the insulating layer 2126 function as protective layers against impurities such as hydrogen. Note that hydrogen here can refer to, for example, a hydrogen atom, a hydrogen molecule, hydrogen bonded to oxygen or the like, or any of these that is ionized.

The insulating layer 2125 is provided to cover the insulating layer 2124. The insulating layer 2125 is preferably in contact with the insulating layer 2122 to surround the insulating layer 2123 and the insulating layer 2124. Furthermore, the insulating layer 2125 is preferably in contact with the insulating layer 2121 outside the insulating layer 2123 and the insulating layer 2124. The insulating layer 2126 is provided over the insulating layer 2125.

The above structure can inhibit impurities such as hydrogen from entering the semiconductor layer 2108 from the outside of the insulating layer 2121, the insulating layer 2122, the insulating layer 2125, and the insulating layer 2126. In other words, entry of impurity elements such as hydrogen from the outside can be inhibited when at least the semiconductor layer 2108 is surrounded by the insulating layer 2121, the insulating layer 2122, the insulating layer 2125, and the insulating layer 2126 in the transistor 2100A.

Note that although the case where a stacked-layer structure of the insulating layer 2125 and the insulating layer 2126 is provided as the protective layer is described here, one of the insulating layer 2125 and the insulating layer 2126 may be omitted if not needed. Furthermore, the insulating layer 2125 may have a stacked-layer structure of two or more layers. In a similar manner, although the case where a stacked-layer structure of the insulating layer 2121 and the insulating layer 2122 is provided as the protective layer is described, one of the insulating layer 2121 and the insulating layer 2122 may be omitted if not needed. Furthermore, the insulating layer 2122 may have a stacked-layer structure of two or more layers.

The end portion of the insulating layer 2110, that of the metal oxide layer 2114, and that of the conductive layer 2112 each preferably have a tapered shape. In addition, the end portion of the metal oxide layer 2114 preferably has a smaller taper angle than that of the insulating layer 2110, and the end portion of the conductive layer 2112 preferably has a smaller taper angle than that of the metal oxide layer 2114. This structure can improve the coverage with the layers formed over the insulating layer 2110, the metal oxide layer 2114, and the conductive layer 2112 (e.g., the insulating layer 2124, the insulating layer 2125, and the insulating layer 2126) and inhibit defects such as breakage of the layers or voids therein.

In this specification and the like, the taper angle refers to an inclination angle formed by a side surface and a bottom surface of a specific layer when the layer is observed from the direction perpendicular to the cross section of the layer (e.g., the plane perpendicular to the surface of the substrate).

Part of the conductive layer 2106 serves as a first gate electrode (also referred to as bottom gate electrode), and part of the conductive layer 2112 serves as a second gate electrode (also referred to as top gate electrode). Part of the insulating layer 2103 functions as a first gate insulating layer, and part of the insulating layer 2110 functions as a second gate insulating layer.

The conductive layer 2106 may be electrically connected to the conductive layer 2112. In that case, the conductive layer 2106 and the conductive layer 2112 can be supplied with the same potential.

Although not shown, the conductive layer 2112 and the conductive layer 2106 preferably extend beyond an end portion of the semiconductor layer 2108 in the channel width direction. In that case, the semiconductor layer 2108 in the channel width direction is wholly covered with the conductive layer 2112 and the conductive layer 2106 with the insulating layer 2110 and the insulating layer 2103 therebetween.

In such a structure, the semiconductor layer 2108 can be electrically surrounded by electric fields generated by the pair of gate electrodes. At this time, it is particularly preferable to supply the same potential to the conductive layer 2106 and the conductive layer 2112. In that case, electric fields for inducing a channel can be effectively applied to the semiconductor layer 2108, whereby the on-state current of the transistor 2100A can be increased. Thus, the transistor 2100A can be miniaturized.

Note that the conductive layer 2112 is not necessarily connected to the conductive layer 2106. In that case, a constant potential may be supplied to one of the pair of gate electrodes, and a signal for driving the transistor 2100A may be supplied to the other. At this time, the potential supplied to the one of the electrodes can control the threshold voltage at the time of driving the transistor 2100A with the other electrode.

As illustrated in FIG. 29A, the transistor 2100A may include a conductive layer 2120a and a conductive layer 2120b over the insulating layer 2126. The conductive layer 2120a and the conductive layer 2120b function as a source electrode and a drain electrode. The conductive layer 2120a and the conductive layer 2120b are electrically connected to the regions 2108N to be described later through an opening portion 2119a and an opening portion 2119b provided in the insulating layer 2124, the insulating layer 2125, and the insulating layer 2126.

The semiconductor layer 2108 can be formed using an oxide such as the metal oxide that can be used for the oxide 230 or the like described in other embodiments or other structure examples. For example, the semiconductor layer 2108 preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. Specifically, M is preferably one or more of aluminum, gallium, yttrium, and tin.

It is particularly preferable to use an oxide containing indium, gallium, and zin for the semiconductor layer 2108.

The semiconductor layer 2108 may have a structure in which layers with different compositions are stacked, a structure in which layers with different crystallinities are stacked, or a structure in which layers with different impurity concentrations are stacked.

The conductive layer 2112 is preferably formed using a low-resistance material. The use of a low-resistance material for the conductive layer 2112 can reduce parasitic resistance and enable the transistor to have a high on-state current, whereby a semiconductor device with a high on-state current can be provided. In addition, in a large-sized or high-resolution display device, wiring resistance can be reduced, which inhibits signal delay and enables high-speed operation. Since the conductive layer 2112 has a function of the gate electrode, the conductive layer 2112 can be formed using any of the conductive materials that can be used for the gate electrodes such as the conductor 260 and the conductor 205 in other embodiments or other structure examples. For example, the conductive layer 2112 can be formed using copper, silver, gold, aluminum, or the like. Copper is particularly preferable since it has low resistance and allows for excellent mass productivity.

The conductive layer 2112 may have a stacked-layer structure. In the case where the conductive layer 2112 has a stacked-layer structure, a second conductive layer is provided over and/or under a first conductive layer having low resistance. For the second conductive layer, a conductive material that is less likely to be oxidized (that has higher oxidation resistance) than the first conductive layer is preferably used. For the second conductive layer, a material that inhibits diffusion of components of the first conductive layer is preferably used. For the second conductive layer, for example, a metal oxide such as indium oxide, indium zinc oxide, indium tin oxide (ITO), indium tin oxide containing silicon (ITSO), or zinc oxide, or a metal nitride such as titanium nitride, tantalum nitride, molybdenum nitride, or tungsten nitride can be suitably used.

The metal oxide layer 2114 positioned between the insulating layer 2110 and the conductive layer 2112 functions as a barrier film that prevents diffusion of oxygen contained in the insulating layer 2110 into the conductive layer 2112 side. Furthermore, the metal oxide layer 2114 also functions as a barrier film that prevents diffusion of hydrogen and water contained in the conductive layer 2112 into the insulating layer 2110 side. The metal oxide layer 2114 can be formed using a material that is less permeable to oxygen and hydrogen than at least the insulating layer 2110, for example.

Even in the case where a metal material that is likely to absorb oxygen, such as aluminum or copper, is used for the conductive layer 2112, the metal oxide layer 2114 can prevent diffusion of oxygen from the insulating layer 2110 to the conductive layer 2112. Furthermore, even in the case where the conductive layer 2112 contains hydrogen, diffusion of hydrogen from the conductive layer 2112 to the semiconductor layer 2108 through the insulating layer 2110 can be prevented. Consequently, the carrier concentration of the channel formation region of the semiconductor layer 2108 can be extremely low.

The metal oxide layer 2114 can be formed using an insulating material or a conductive material. When the metal oxide layer 2114 has an insulating property, the metal oxide layer 2114 functions as part of the gate insulating layer. In contrast, when the metal oxide layer 2114 has conductivity, the metal oxide layer 2114 functions as part of the gate electrode.

The metal oxide layer 2114 is preferably formed using an insulating material having a higher dielectric constant than silicon oxide. It is particularly preferable to use an aluminum oxide film, a hafnium oxide film, a hafnium aluminate film, or the like, in which case the driving voltage can be reduced.

A metal oxide can be used for the metal oxide layer 2114. For example, an oxide containing indium, such as indium oxide, indium zinc oxide, indium tin oxide (ITO), or indium tin oxide containing silicon (ITSO), can be used. A conductive oxide containing indium is preferable because of its high conductivity. ITSO is not easily crystallized since it contains silicon, and it has high planarity; thus, adhesion with a film formed over ITSO is high. The metal oxide layer 2114 can be formed using a metal oxide such as zinc oxide or zinc oxide containing gallium. Alternatively, the metal oxide layer 2114 may have a structure in which any of these materials are stacked.

An oxide material containing one or more kinds of elements contained in the semiconductor layer 2108 is preferably used for the metal oxide layer 2114. In particular, an oxide semiconductor material that can be used for the semiconductor layer 2108 is preferably used. At this time, a metal oxide film formed using the same sputtering target as the semiconductor layer 2108 is preferably used as the metal oxide layer 2114, in which case the same apparatus can be used.

Alternatively, when both the semiconductor layer 2108 and the metal oxide layer 2114 are formed using a metal oxide material containing indium and gallium, a material whose proportion (content ratio) of gallium is higher than that in the semiconductor layer 2108 is preferably used, in which case the blocking property against oxygen can be further increased. Here, when the semiconductor layer 2108 is formed using a material whose proportion of indium is higher than that in the metal oxide layer 2114, the field-effect mobility of the transistor 2100A can be increased.

The metal oxide layer 2114 is preferably formed using a sputtering apparatus. For example, when an oxide film is formed using a sputtering apparatus, film formation in an atmosphere containing an oxygen gas enables oxygen to be added into the insulating layer 2110 and the semiconductor layer 2108 in a favorable manner.

The conductive layer 2106 can be formed using a material similar to that used for the conductive layer 2112, the conductive layer 2120a, or the conductive layer 2120b. It is particularly preferable to use a material containing copper for the conductive layer 2106 because wiring resistance can be reduced. When the conductive layer 2106 is formed using a material containing a high-melting-point metal such as tungsten or molybdenum, treatment in a later step can be performed at high temperatures.

The regions 2108N contain an impurity element (a first element). Examples of the impurity element include hydrogen, boron, carbon, nitrogen, fluorine, phosphorus, sulfur, arsenic, aluminum, magnesium, and a rare gas. Typical examples of the rare gas include helium, neon, argon, krypton, and xenon. In particular, boron, phosphorus, magnesium, or aluminum is preferably contained. Two or more of these elements may be contained.

An ion implantation method, an ion doping method, or the like can be used for the addition of the above-described impurity element. The impurity element may be added to the regions 2108N by formation of the insulating layer 2124 that is in contact with the regions 2108N.

Treatment for adding the impurity element to the regions 2108N can be performed with the use of the insulating layer 2110 as a mask. In that case, the regions 2108N can be formed in a self-aligned manner.

It is preferable that the regions 2108N each include a region having an impurity concentration of higher than or equal to $1\times10^{19}$ atoms/cm$^3$ and lower than or equal to $1\times10^{23}$ atoms/cm$^3$, preferably higher than or equal to $5\times10^{19}$ atoms/cm$^3$ and lower than or equal to $5\times10^{22}$ atoms/cm$^3$, further preferably higher than or equal to $1\times10^{20}$ atoms/cm$^3$ and lower than or equal to $1\times10^{22}$ atoms/cm$^3$.

The concentration of an impurity contained in the regions 2108N can be analyzed by an analysis method such as secondary ion mass spectrometry (SIMS) or X-ray photoelectron spectroscopy (XPS). In the case of using XPS analysis, ion sputtering from the top surface side or the back surface side is combined with XPS analysis, whereby the concentration distribution in the depth direction can be found.

Furthermore, an impurity element is preferably oxidized in the regions 2108N. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 2108 to be oxidized, the element can be inhibited from being released even when a high temperature (e.g., higher than or equal to 400° C., higher than or equal to 600° C., or higher than or equal to 800° C.) is applied in a later step. Furthermore, the impurity element deprives the semiconductor layer 2108 of oxygen, whereby many oxygen vacancies are generated in the regions 2108N. The oxygen vacancies are bonded to hydrogen in the film to serve as carrier supply sources; thus, the low-resistance regions 2108N are in an extremely low-resistance state.

Note that an increase in resistance might be caused if much oxygen is supplied from the outside or a film near the regions 2108N to the regions 2108N at the time of high-temperature treatment in a later step. Thus, in the case where high-temperature treatment is performed, it is preferably performed with the semiconductor layer 2108 covered with the insulating layer 2124 that has a high barrier property against oxygen.

The insulating layer 2124 is provided in contact with the regions 2108N of the semiconductor layer 2108.

As the insulating layer 2124, an insulating film containing aluminum oxide can be used, for example.

The regions 2108N include many oxygen vacancies since the impurity element is added thereto, as described above.

With such a structure, the transistor 2100A that has excellent electrical characteristics and high reliability can be provided.

Structure Example 3 of Semiconductor Device

Figure 29B:
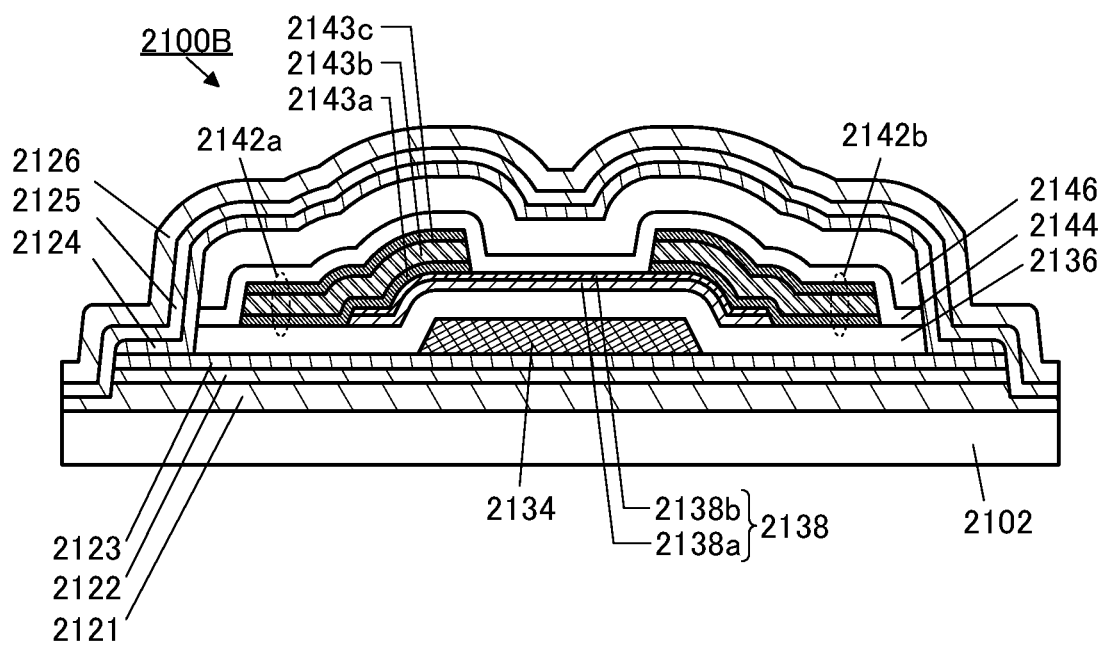

FIG. 29B is a cross-sectional view of a transistor 2100B in the channel length direction.

The transistor 2100B is provided over the substrate 2102 and includes the insulating layer 2121, the insulating layer 2122, the insulating layer 2123, a conductive layer 2134, an insulating layer 2136, a semiconductor layer 2138, a conductive layer 2142a, a conductive layer 2142b, an insulating layer 2144, an insulating layer 2146, the insulating layer 2124, the insulating layer 2125, the insulating layer 2126, and the like. The insulating layer 2121, the insulating layer 2122, and the insulating layer 2123 are sequentially provided over the substrate 2102, and the conductive layer 2134 is provided over the insulating layer 2123. The insulating layer 2136 is provided to cover the conductive layer 2134. The semiconductor layer 2138 has an island-like shape and is provided over the insulating layer 2136. The conductive layer 2142a and the conductive layer 2142b are in contact with a top surface of the semiconductor layer 2138 and are apart from each other over the semiconductor layer 2138. The insulating layer 2144 is provided to cover the insulating layer 2136, the conductive layer 2142a, the conductive layer 2142b, and the semiconductor layer 2138, and the insulating layer 2146 is provided over the insulating layer 2144. The insulating layer 2124 is provided over the insulating layer 2146 and includes a region in contact with part of the insulating layer 2123. The insulating layer 2125 includes a region in contact with part of the insulating layer 2122 and the insulating layer 2121 and is provided over the insulating layer 2124. The insulating layer 2126 is provided over the insulating layer 2125.

It is preferable that in the transistor 2100B, at least the semiconductor layer 2138 be provided between the insulating layer 2123 and the insulating layer 2124 and the insulating layer 2123 be in contact with the insulating layer 2124 outside the semiconductor layer 2108. The insulating layer 2123 and the insulating layer 2124 are provided between the insulating layer 2121 and the insulating layer 2122 and the insulating layer 2125 and the insulating layer 2126. Here, it is preferable that the insulating layer 2125 be in contact with at least the insulating layer 2122 and be further in contact with the insulating layer 2121. In other words, in the transistor 2100B, the semiconductor layer 2138 is surrounded by the insulating layer 2123 and the insulating layer 2124, and the semiconductor layer 2108, the insulating layer 2123, and the insulating layer 2124 are surrounded by the insulating layer 2122 and the insulating layer 2125. Furthermore, the semiconductor layer 2138, the insulating layer 2123, the insulating layer 2124, the insulating layer 2122, and the insulating layer 2125 are provided to be sandwiched between the insulating layer 2121 and the insulating layer 2126, or in other words surrounded by the insulating layer 2121 and the insulating layer 2126.

The conductive layer 2134 serves as a gate electrode. Part of the insulating layer 2136 serves as a gate insulating layer. The conductive layer 2142a serves as one of a source electrode and a drain electrode, and the conductive layer 2142b serves as the other. A region of the semiconductor layer 2138 overlapping with the conductive layer 2134 functions as a channel formation region. The transistor 2100B is what is called a bottom-gate transistor, in which the gate electrode is provided closer to a formation surface side (the substrate 2102 side) than the semiconductor layer 2138 is. Here, a side of the semiconductor layer 2138 opposite to the conductive layer 2134 side is sometimes referred to as a back channel side. The transistor 2100B has what is called a channel-etched structure in which no protective layer is provided between the back channel side of the semiconductor layer 2138 and the source and drain electrodes.

The semiconductor layer 2138 has a structure in which a semiconductor layer 2138a and a semiconductor layer 2138b are stacked in this order from the formation surface side. Each of the semiconductor layer 2138a and the semiconductor layer 2138b preferably contains a metal oxide. The semiconductor layer 2138b, which is positioned on the back channel side, preferably has higher crystallinity than the semiconductor layer 2138a, which is positioned on the conductive layer 2134 side. With this structure, the semiconductor layer 2138 can be inhibited from being partly etched and lost at the time of processing of the conductive layer 2142a and the conductive layer 2142b.

The semiconductor layer 2138 can be formed using an oxide such as the metal oxide of the oxide 230 or the like in other embodiments or other structure examples. For example, the semiconductor layer 2138 preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc. Specifically, M is preferably one or more of aluminum, gallium, yttrium, and tin.

It is particularly preferable to use an oxide containing indium, gallium, and zin for the semiconductor layer 2138.

For the semiconductor layer 2138a and the semiconductor layer 2138b, layers with different compositions, layers with different crystallinities, or layers with different impurity concentrations may be used. A stacked-layer structure of three or more layers may be employed.

The conductive layer 2142a and the conductive layer 2142b each have a stacked-layer structure in which a conductive layer 2143a, a conductive layer 2143b, and a conductive layer 2143c are stacked in this order from the formation surface side.

The conductive layer 2143b is preferably formed using a low-resistance conductive material containing copper, silver, gold, aluminum, or the like. It is particularly preferable that the conductive layer 2143b contain copper or aluminum. For the conductive layer 2143b, a conductive material having lower resistance than the conductive layer 2143a and the conductive layer 2143c is preferably used. In that case, the conductive layer 2142a and the conductive layer 2142b can have extremely low resistance.

The conductive layer 2143a and the conductive layer 2143c can be independently formed using any of conductive materials different from that of the conductive layer 2143b. For example, the conductive layer 2143a and the conductive layer 2143c can be independently formed using any of conductive materials containing titanium, tungsten, molybdenum, chromium, tantalum, zinc, indium, platinum, ruthenium, or the like.

When the conductive layer 2143b containing copper, aluminum, or the like is interposed between the conductive layer 2143a and the conductive layer 2143c as described above, it is possible to inhibit oxidation of a surface of the conductive layer 2143b and diffusion of an element contained in the conductive layer 2143b to neighboring layers. Specifically, providing the conductive layer 2143a between the semiconductor layer 2138 and the conductive layer 2143b can prevent diffusion of a metal element contained in the conductive layer 2143b into the semiconductor layer 2138, thereby enabling the transistor 2100B to have high reliability.

The insulating layer 2144 is provided in contact with an end portion of the conductive layer 2143b.

Note that the conductive layer 2142a and the conductive layer 2142b do not necessarily have a three-layer structure and may have a two-layer structure or a four-layer structure including a conductive layer containing copper, silver, gold, or aluminum. For example, the conductive layer 2142a and the conductive layer 2142b may each have a two-layer structure in which the conductive layer 2143a and the conductive layer 2143b are stacked or a two-layer structure in which the conductive layer 2143b and the conductive layer 2143c are stacked.

For the conductive layer 2134, any of the above conductive materials that can be used for the conductive layer 2143a, the conductive layer 2143b, and the conductive layer 2143c can be appropriately used. It is particularly preferable to use a conductive material containing copper.

The insulating layer 2136 and the insulating layer 2144 that are in contact with the semiconductor layer 2138 are preferably formed using an insulating material containing an oxide. In the case where the insulating layer 2136 or the insulating layer 2144 has a stacked-layer structure, a layer in contact with the semiconductor layer 2138 is formed using an insulating material containing an oxide.

For the insulating layer 2136, a nitride insulating film of silicon nitride, aluminum nitride, or the like may be used. In the case of using an insulating material containing no oxide, treatment for adding oxygen to an upper portion of the insulating layer 2136 is preferably performed to form an oxygen-containing region. Examples of the treatment for adding oxygen include heat treatment, plasma treatment, and ion doping treatment in an oxygen-containing atmosphere.

The insulating layer 2146 functions as a protective layer protecting the transistor 2100B. For the insulating layer 2146, an inorganic insulating material such as silicon nitride, silicon nitride oxide, silicon oxide, silicon oxynitride, aluminum oxide, or aluminum nitride can be used. It is particularly preferable that the insulating layer 2146 be formed using a material less likely to diffuse oxygen, such as silicon nitride or aluminum oxide, to prevent release of oxygen from the semiconductor layer 2138 or the insulating layer 2144 to the outside through the insulating layer 2146 due to heat applied during the manufacturing process or the like.

For the insulating layer 2146, an organic insulating material functioning as a planarization film may be used. Alternatively, a stacked-layer film that includes a film containing an inorganic insulating material and a film containing an organic insulating material may be used for the insulating layer 2146.

In the semiconductor layer 2138, a pair of low-resistance regions that are positioned in portions in contact with the conductive layer 2142a and the conductive layer 2142b and the vicinity of the portions and that function as source and drain regions may be formed. The regions are parts of the semiconductor layer 2138 and have resistance lower than that of the channel formation region. The low-resistance regions can also be referred to as regions with high carrier density or n-type regions, for example. Furthermore, in the semiconductor layer 2138, a region which is sandwiched between the pair of low-resistance regions and which overlaps with the conductive layer 2134 functions as the channel formation region.

For the insulating layer 2123 and the insulating layer 2124, any of the materials described in the above structure examples can be used.

As illustrated in FIG. 29B, in the channel length direction, the insulating layer 2136, the insulating layer 2144, and the insulating layer 2146 are partly removed outside the conductive layer 2134, the semiconductor layer 2138, the conductive layer 2142a, and the conductive layer 2142b. Here, an end portion of the insulating layer 2136, an end portion of the insulating layer 2144, and an end portion of the insulating layer 2146 may be substantially aligned with each other. A side surface of the insulating layer 2136, a side surface of the insulating layer 2144, and a side surface of the insulating layer 2146 may be on the same plane. Thus, the insulating layer 2123 has a region not overlapping with the insulating layer 2136, the insulating layer 2144, or the insulating layer 2146.

The insulating layer 2124 is provided to cover the top surface and the side surface of the insulating layer 2146, the side surface of the insulating layer 2144, and the side surface of the insulating layer 2136, and includes a region that is in contact with part of the insulating layer 2123.

Although not illustrated, also in the channel width direction, the insulating layer 2123 is preferably provided in contact with the insulating layer 2124 in the region not overlapping with the insulating layer 2136, the insulating layer 2144, or the insulating layer 2146.

With the above-described structure, impurities such as hydrogen contained in the semiconductor layer 2138, the insulating layer 2136, the insulating layer 2144, the insulating layer 2146, and the like can be efficiently absorbed in the insulating layer 2123 and the insulating layer 2124, which enables gettering of impurities such as hydrogen. In addition, oxygen contained in the semiconductor layer 2138, the insulating layer 2136, the insulating layer 2144, the insulating layer 2146, and the like can be inhibited from diffusing to the outside of the insulating layer 2123 and the insulating layer 2124.

For the insulating layer 2121, the insulating layer 2122, the insulating layer 2125, and the insulating layer 2126, any of the materials described in the above structure examples can be used.

The insulating layer 2125 is provided to cover the insulating layer 2124. The insulating layer 2125 is preferably in contact with the insulating layer 2122 to surround the insulating layer 2123 and the insulating layer 2124. Furthermore, the insulating layer 2125 is preferably in contact with the insulating layer 2121 outside the insulating layer 2123 and the insulating layer 2124. The insulating layer 2126 is provided over the insulating layer 2125.

The above structure can inhibit impurities such as hydrogen from entering the semiconductor layer 2138 from the outside of the insulating layer 2121, the insulating layer 2122, the insulating layer 2125, and the insulating layer 2126. In other words, entry of impurity elements such as hydrogen from the outside can be inhibited when at least the semiconductor layer 2138 is surrounded by the insulating layer 2121, the insulating layer 2122, the insulating layer 2125, and the insulating layer 2126 in the transistor 2100B.

Note that although the case where a stacked-layer structure of the insulating layer 2125 and the insulating layer 2126 is provided as the protective layer is described here, one of the insulating layer 2125 and the insulating layer 2126 may be omitted if not needed. Furthermore, the insulating layer 2125 may have a stacked-layer structure of two or more layers. In a similar manner, although the case where a stacked-layer structure of the insulating layer 2121 and the insulating layer 2122 is provided as the protective layer is described, one of the insulating layer 2121 and the insulating layer 2122 may be omitted if not needed. Furthermore, the insulating layer 2122 may have a stacked-layer structure of two or more layers.

With such a structure, the transistor 2100B that has excellent electrical characteristics and high reliability can be provided.

At least part of this embodiment can be implemented in combination with any of the other embodiments and the like described in this specification as appropriate.

Embodiment 4

Figure 30:
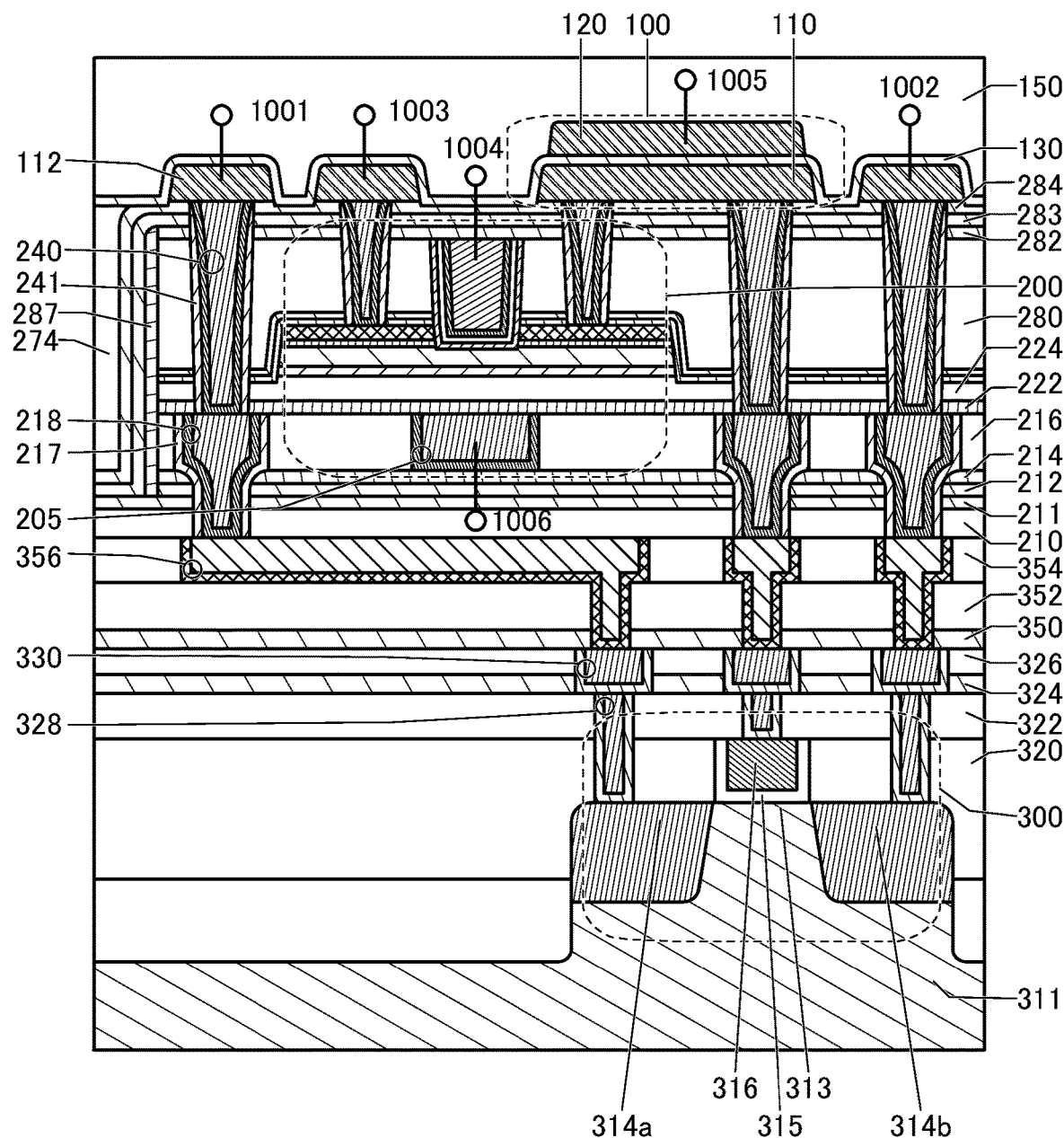
FIG. 30 is a cross-sectional view of a semiconductor device of one embodiment of the present invention.

In this embodiment, one embodiment of a semiconductor device is described with reference to FIG. 30 to FIG. 37.
[Memory Device 1]
FIG. 30 illustrates an example of a semiconductor device (memory device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200. The transistor 2100A or the transistor 2100B described in the above embodiment may be used as the transistor 200. As described in the above embodiment with reference to FIG. 1 and FIG. 2, the transistor of the memory device 290 may be used as the transistor 200, and the capacitor device 292 may be provided as the capacitor 100.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 30, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 30 in a matrix, a memory cell array can be formed.

<Transistor 300>

The transistor 300 is provided in and on a substrate 311 and includes a conductor 316 functioning as a gate, an insulator 315 functioning as a gate insulator, a semiconductor region 313 that is a part of the substrate 311, and a low-resistance region 314a and a low-resistance region 314b functioning as a source region and a drain region. The transistor 300 may be a p-channel transistor or an n-channel transistor.

In the transistor 300 illustrated in FIG. 30, the semiconductor region 313 (part of the substrate 311) in which a channel is formed has a projecting portion. Furthermore, the conductor 316 is provided to cover the top and side surfaces of the semiconductor region 313 with the insulator 315 therebetween. Note that the conductor 316 may be formed using a material for adjusting the work function. The transistor 300 having such a structure is also referred to as a FIN transistor because the projecting portion of the semiconductor substrate is utilized. An insulator functioning as a mask for forming the projecting portion may be provided in contact with the top surface of the projecting portion. Although the case where the projecting portion is formed by processing part of the semiconductor substrate is described here, a semiconductor film having a projecting shape may be formed by processing an SOI substrate.

Note that the transistor 300 illustrated in FIG. 30 is just an example and the structure of the transistor 300 is not limited to that illustrated therein; an appropriate transistor may be used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, the insulator 130 is preferably formed using the insulator that can be used for the insulator 286 described in the above embodiment.

For example, a conductor 112 and the conductor 110 over the conductor 246 can be formed at the same time. Note that the conductor 112 functions as a plug or a wiring that is electrically connected to the capacitor 100, the transistor 200, or the transistor 300.

The conductor 112 and the conductor 110 each have a single-layer structure in FIG. 30; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

The insulator 130 can be formed to have a stacked-layer structure or a single-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, the insulator 130 preferably has a stacked-layer structure using a material with high dielectric strength such as silicon oxynitride and a high dielectric constant (high-k) material. In the capacitor 100 having such a structure, a sufficient capacitance can be provided owing to the high dielectric constant (high-k) insulator, and the dielectric strength can be increased owing to the insulator with high dielectric strength, so that the electrostatic breakdown of the capacitor 100 can be prevented.

As the insulator using a high dielectric constant (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low dielectric constant), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layer>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are stacked over the transistor 300 in this order as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring.

The insulator functioning as an interlayer film may function as a planarization film that covers a roughness thereunder. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 30, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are provided in an insulator 210, the insulator 211, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of the opening formed in the insulator 210, the insulator 211, the insulator 212, the insulator 214, and the insulator 216. That is, the insulator 217 is provided between the conductor 218 and the insulator 210, the insulator 211, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, for example, an insulator such as silicon nitride, aluminum oxide, or silicon nitride oxide can be used. The insulator 217 is provided in contact with the insulator 211, the insulator 212, the insulator 214, and the insulator 222; thus, impurities such as water and hydrogen can be inhibited from entering the oxide 230 from the insulator 210, the insulator 216, or the like through the conductor 218. Silicon nitride is particularly preferable because of its high hydrogen blocking property. Furthermore, oxygen contained in the insulator 210 or the insulator 216 can be prevented from being absorbed by the conductor 218.

The insulator 217 can be formed in a manner similar to that of the insulator 241. For example, silicon nitride is deposited by a PEALD method and an opening reaching the conductor 356 is formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, the parasitic capacitance between wirings can be reduced. Accordingly, a material is preferably selected in accordance with the function of an insulator.

For example, the insulator 150, the insulator 210, the insulator 352, and the insulator 354 and the like preferably include an insulator having a low dielectric constant. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

Note that when the transistor including an oxide semiconductor is surrounded by an insulator having a function of inhibiting the passage of oxygen and impurities such as hydrogen, the electrical characteristics of the transistor can be stabilized. Thus, the insulator having a function of inhibiting the passage of oxygen and impurities such as hydrogen is preferably used for the insulator 214, the insulator 211, the insulator 212, the insulator 350, and the like.

The insulator having a function of inhibiting the passage of oxygen and impurities such as hydrogen can have, for example, a single-layer structure or a stacked-layer structure of an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

The conductors that can be used for wirings or plugs can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon containing an impurity element such as phosphorus, or silicide such as nickel silicide may be used.

For example, the conductor 328, the conductor 330, the conductor 356, the conductor 218, and the conductor 112 and the like may have a single-layer structure or a stacked-layer structure using a conductive material such as a metal material, an alloy material, a metal nitride material, or a metal oxide material which is formed using the above materials. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Including Oxide Semiconductor>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, in FIG. 30, the insulator 241 is preferably provided between the conductor 240 and the insulator 224 and the insulator 280 that contain excess oxygen. Since the insulator 241 is provided in contact with the insulator 222, the insulator 272, the insulator 273, the insulator 282, the insulator 283, and the insulator 284, the insulator 224 and the transistor 200 can be sealed by the insulators having a barrier property.

That is, the insulator 241 can inhibit excess oxygen contained in the insulator 224 and the insulator 280 from being absorbed by the conductor 240. In addition, the insulator 241 can inhibit diffusion of hydrogen, which is an impurity, into the transistor 200 through the conductor 240.

Note that the insulator 241 is preferably formed using an insulating material having a function of inhibiting diffusion of oxygen and impurities such as water or hydrogen. For example, silicon nitride, silicon nitride oxide, aluminum oxide, hafnium oxide, or the like is preferably used. Silicon nitride is particularly preferable because of its high hydrogen blocking property. Alternatively, for example, a metal oxide such as magnesium oxide, gallium oxide, germanium oxide, yttrium oxide, zirconium oxide, lanthanum oxide, neodymium oxide, or tantalum oxide can be used.

As in the above embodiment, the transistor 200 is preferably sealed with the insulator 211, the insulator 212, the insulator 214, the insulator 287, the insulator 282, the insulator 283, and the insulator 284. Such a structure can inhibit entry of hydrogen contained in the insulator 274, the insulator 150, or the like into the insulator 280 or the like.

Note that the conductor 240 penetrates the insulator 284, the insulator 283, and the insulator 282, and the conductor 218 penetrates the insulator 214, the insulator 212, and the insulator 211; however, as described above, the insulator 241 is provided in contact with the conductor 240, and the insulator 217 is provided in contact with the conductor 218. This can reduce the amount of hydrogen entering the inside of the insulator 211, the insulator 212, the insulator 214, the insulator 287, the insulator 282, the insulator 283, and the insulator 284 through the conductor 240 and the conductor 218. In this manner, the transistor 200 is sealed more surely with the insulator 211, the insulator 212, the insulator 214, the insulator 287, the insulator 282, the insulator 283, the insulator 284, the insulator 241, and the insulator 217, so that impurities such as hydrogen contained in the insulator 274 or the like can be inhibited from entering from the outside.

As described in the above embodiment, the insulator 216, the insulator 224, the insulator 280, the insulator 250, and the insulator 274 are preferably formed by a deposition method using the gas in which the number of hydrogen atoms is reduced or hydrogen atoms are removed. This can reduce the hydrogen concentration of the insulator 216, the insulator 224, the insulator 280, the insulator 250, and the insulator 274.

In this manner, the hydrogen concentration of silicon-based insulating films near the transistor 200 can be reduced; thus, the hydrogen concentration of the oxide 230 can be reduced.

<Dicing Line>

Here, a dicing line (also referred to as a scribe line, a dividing line, or a cutting line in some cases) that is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 30, a region where the insulator 283 is in contact with the insulator 211 preferably overlaps with the dicing line. That is, an opening is formed in the insulator 282, the insulator 280, the insulator 273, the insulator 272, the insulator 224, the insulator 222, the insulator 216, the insulator 214, and the insulator 212 in the vicinity of a region to be the dicing line that is provided on the outer edge of a memory cell including the plurality of transistors 200.

That is, in the opening provided in the insulator 282, the insulator 280, the insulator 273, the insulator 272, the insulator 224, the insulator 222, the insulator 216, the insulator 214, and the insulator 212, the insulator 211 is in contact with the insulator 283. Alternatively, an opening may be provided in the insulator 282, the insulator 280, the insulator 273, the insulator 272, the insulator 224, the insulator 222, the insulator 216, and the insulator 214, and the insulator 212 and the insulator 283 may be in contact with each other in the opening. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistor 200 can be enclosed with the insulator 211, the insulator 212, the insulator 214, the insulator 287, the insulator 282, the insulator 283, and the insulator 284. At least one of the insulator 211, the insulator 212, the insulator 214, the insulator 287, the insulator 282, the insulator 283, and the insulator 284 has a function of inhibiting diffusion of oxygen, hydrogen, and water; thus, even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 can be inhibited.

Furthermore, in the structure, excess oxygen in the insulator 280 and the insulator 224 can be inhibited from being diffused to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 31:
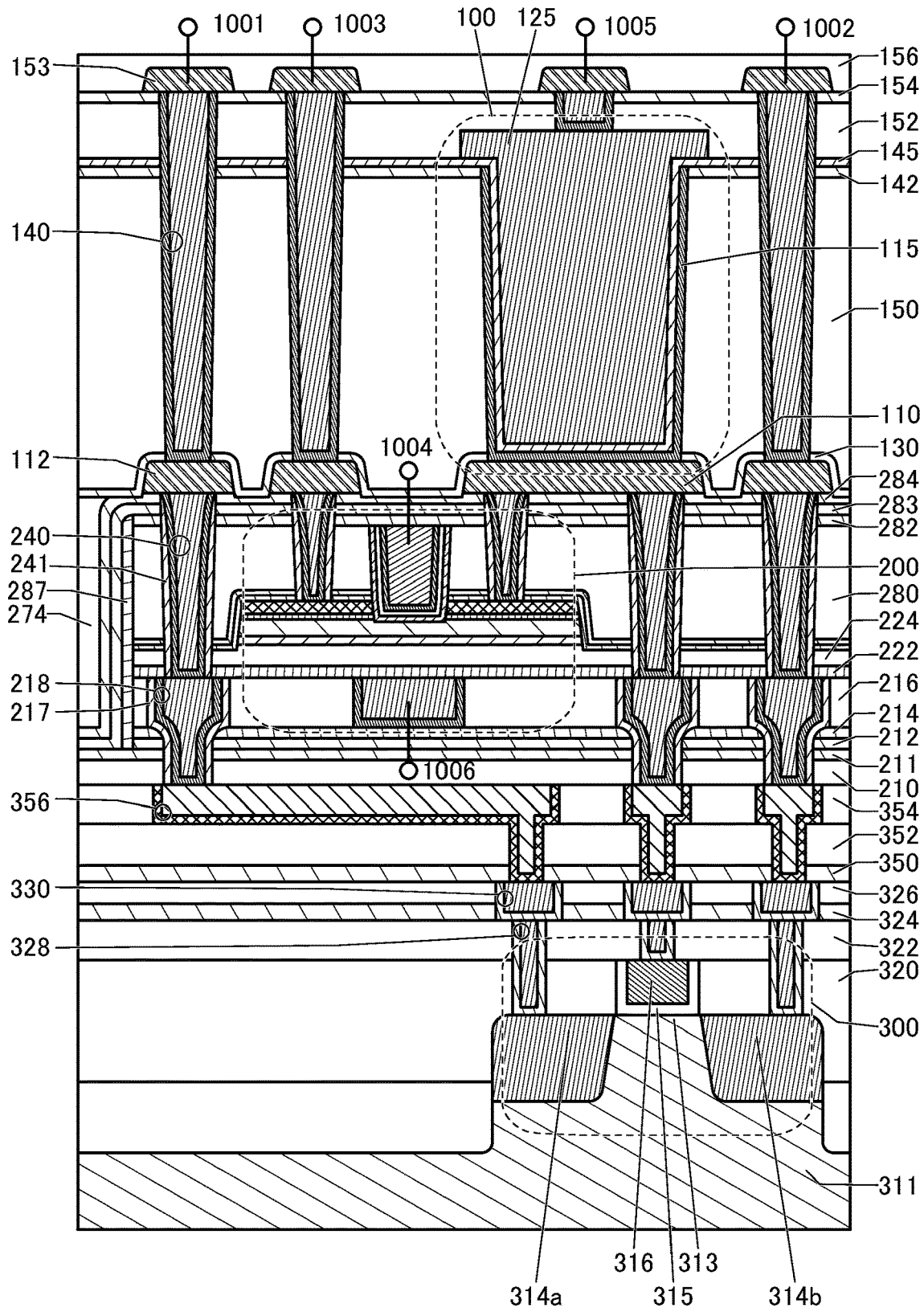
FIG. 31 is a cross-sectional view illustrating a structure of a memory device of one embodiment of the present invention.

Note that although the capacitor 100 of the memory device illustrated in FIG. 30 is a planar capacitor, the capacitor 100 of the memory device described in this embodiment is not limited thereto. For example, the capacitor 100 may be a cylindrical capacitor as illustrated in FIG. 31. Note that the structure below and including the insulator 150 of a memory device illustrated in FIG. 31 is similar to that of the semiconductor device illustrated in FIG. 30.

The capacitor 100 illustrated in FIG. 31 includes the insulator 150 over the insulator 130, an insulator 142 over the insulator 150, a conductor 115 in an opening formed in the insulator 150 and the insulator 142, an insulator 145 over the conductor 115 and the insulator 142, a conductor 125 over the insulator 145, and an insulator 152 over the conductor 125 and the insulator 145. Here, at least part of the conductor 115, the insulator 145, and the conductor 125 is provided in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The upper electrode and the lower electrode of the capacitor 100 face each other with the dielectric therebetween, along the side surface as well as the bottom surface of the opening in the insulator 150 and the insulator 142; thus, the capacitance per unit area can be increased. Accordingly, the deeper the opening is, the larger the capacitance of the capacitor 100 can be. Increasing the capacitance per unit area of the capacitor 100 in this manner enhances miniaturization and integration of the semiconductor device.

An insulator that can be used as the insulator 280 may be used as the insulator 152. The insulator 142 preferably functions as an etching stopper at the time of forming the opening in the insulator 150 and is formed using an insulator that can be used for the insulator 214.

The shape of the opening formed in the insulator 150 and the insulator 142 when seen from above may be a quadrangular shape, a polygonal shape other than a quadrangular shape, a polygonal shape with rounded corners, or a circular shape such as an elliptical shape. Here, the area where the opening and the transistor 200 overlap with each other is preferably larger in the top view. Such a structure can reduce the area occupied by the semiconductor device including the capacitor 100 and the transistor 200.

The conductor 115 is provided in contact with the opening formed in the insulator 142 and the insulator 150. It is preferable that a top surface of the conductor 115 be substantially aligned with a top surface of the insulator 142. Furthermore, a bottom surface of the conductor 115 is in contact with the conductor 110 in an opening formed in the insulator 130. The conductor 115 is preferably deposited by an ALD method, a CVD method, or the like and is deposited using a conductor that can be used for the conductor 205, for example.

The insulator 145 is positioned to cover the conductor 115 and the insulator 142. The insulator 145 is preferably deposited by an ALD method or a CVD method, for example. The insulator 145 can be formed to have a stacked-layer structure or a single-layer structure using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, hafnium nitride, or the like. As the insulator 145, an insulating film in which zirconium oxide, aluminum oxide, and zirconium oxide are stacked in this order can be used, for instance.

The insulator 145 is preferably formed using a material with high dielectric strength, such as silicon oxynitride, or a high dielectric constant (high-k) material. The insulator 145 may have a stacked-layer structure using a material with high dielectric strength and a high dielectric (high-k) material.

As the insulator using a high dielectric constant (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given. The use of such a high-k material enables sufficient capacitance of the capacitor 100 to be ensured even if the insulator 145 has a large thickness. The insulator 145 having a large thickness can inhibit leakage current generated between the conductor 115 and the conductor 125.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator having high dielectric strength can increase the dielectric strength and inhibit electrostatic breakdown of the capacitor 100.

The conductor 125 is provided to fill the opening formed in the insulator 142 and the insulator 150. The conductor 125 is electrically connected to the wiring 1005 through a conductor 140 and a conductor 153. The conductor 125 is preferably formed by an ALD method, a CVD method, or the like and is formed using a conductor that can be used as the conductor 205, for example.

The conductor 153 is provided over an insulator 154 and is covered with an insulator 156. The conductor 153 is formed using a conductor that can be used for the conductor 112, and the insulator 156 is formed using an insulator that can be used for the insulator 152. Here, the conductor 153 is in contact with a top surface of the conductor 140 and functions as a terminal of the capacitor 100, the transistor 200, or the transistor 300.

Although one layer of the transistor 200 is stacked over the transistor 300 in the structures illustrated in FIG. 30 and FIG. 31, this embodiment is not limited thereto. For example, the memory device 290 as illustrated in FIG. 1 and FIG. 2 or a plurality of the memory devices 290 stacked in the vertical direction as illustrated in FIG. 5 and FIG. 6 may be provided over the transistor 300.

Figure 32A:
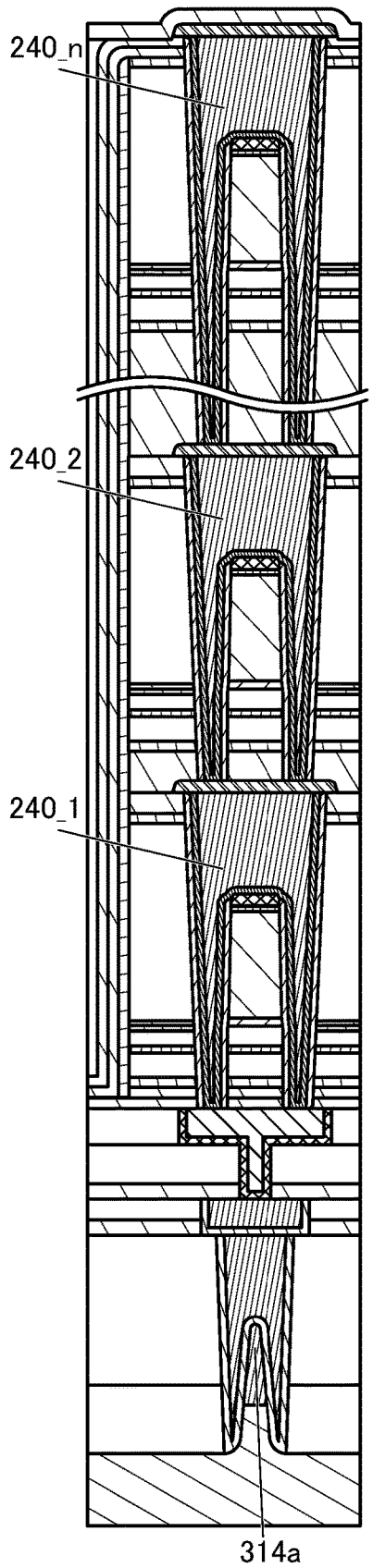
FIG. 32A and FIG. 32B are cross-sectional views illustrating a structure of a memory device of one embodiment of the present invention.
Figure 32B:
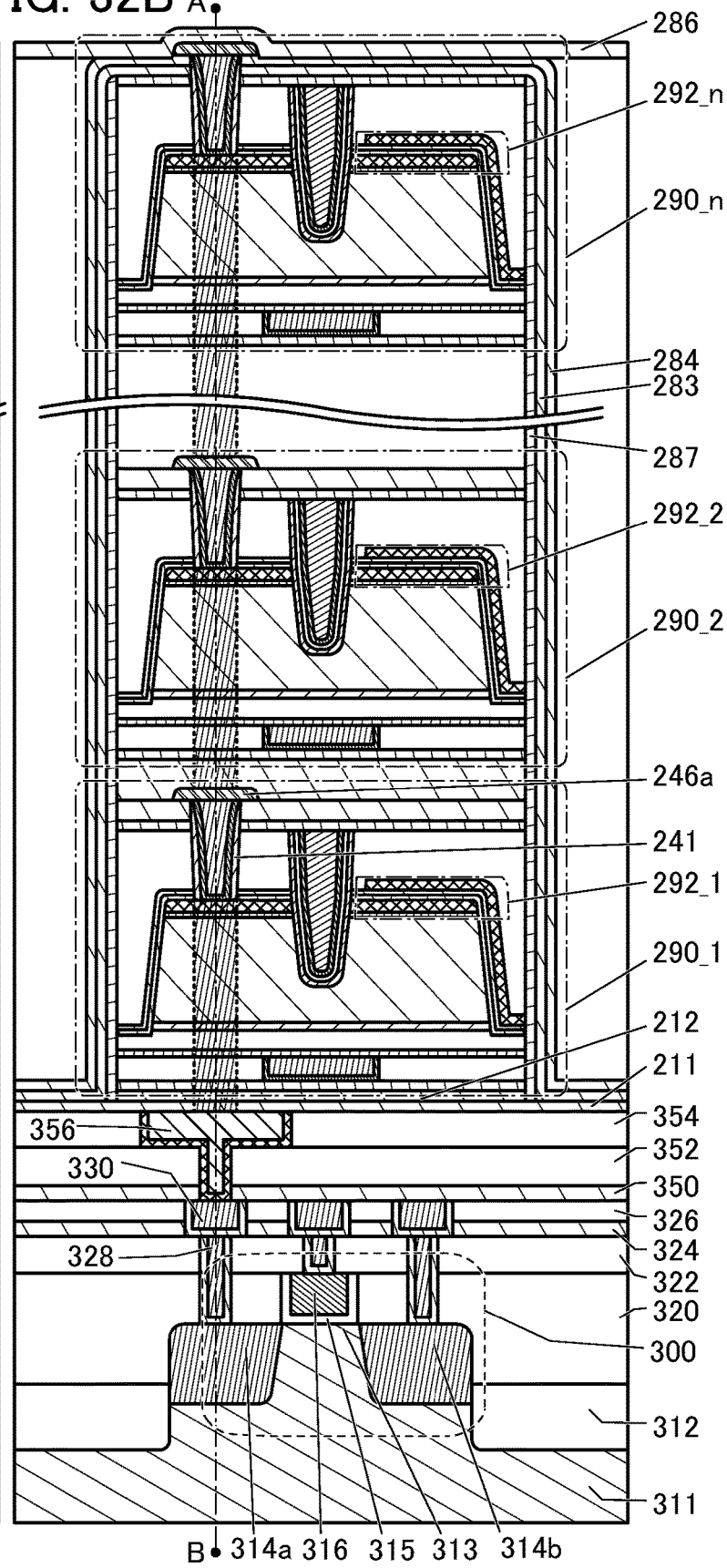

FIG. 32 illustrates the memory devices 290_1 to 290_n (n is a natural number of two or more) are stacked. Note that although the memory device 290_n is provided in this embodiment, one embodiment of the present invention is not limited thereto. For example, a structure without the memory device 290_n may be employed. Although not particularly limited, n can be greater than or equal to 2 and less than or equal to 200, preferably greater than or equal to 2 and less than or equal to 100, further preferably greater than or equal to 2 and less than or equal to 10. FIG. 32B is a cross-sectional view of the transistors included in the memory device 290 in the channel length direction. FIG. 32A is a cross-sectional view of the transistors in the channel width direction which is taken along dashed-dotted line A-B in FIG. 32B. The structure below and including the insulator 354 of the memory device illustrated in FIG. 32 is similar to that of the memory device illustrated in FIG. 30.

As illustrated in FIG. 32, the memory device 290_1 to the memory device 290_n are stacked over the insulator 354. In each layer including the memory device 290, the capacitor device 292 and the conductor 240 are provided. The memory device 290 in each layer is electrically connected to, through the conductor 240 in that layer, the conductor 240 in the adjacent layer, and is also electrically connected to the transistor 300. Note that portions of a conductor 240_1 to a conductor 240_n that cannot be seen from the channel width direction in FIG. 32B are denoted with dotted lines.

The memory device 290 illustrated in FIG. 32 has a structure different from that of the memory device 290 illustrated in FIG. 1. In the memory device 290 illustrated in FIG. 32, the conductor 240 is formed to be astride the oxide 230b and the like, and the insulator 241 is formed on the side surface of the conductor 240. Since the insulator 241 is not formed at a bottom surface of the conductor 240, the bottom surface of the conductor 240 in each layer is in contact with the conductor 242a in that layer and the conductor 246a in one layer below. In this manner, the memory device 290 in each layer can be electrically connected to the conductor 246a in one layer below.

Note that the structure of the memory device in this embodiment is not limited to the structure illustrated in FIG. 32. For example, the conductor 240 may be provided to penetrate the oxide 230b or the like between the conductor 246a in an upper layer and the conductor 246a in a lower layer. Alternatively, one through electrode may be formed as the conductor 240_1 to the conductor 240_n, for example.

Since the capacitor device 292 in each layer is formed as a planar-type capacitor device, the height of each layer can be inhibited from being excessively large. Accordingly, the number of layers of the memory device 290 can be increased relatively easily. For example, the number of layers of the memory device 290 may be approximately 100.

The above is the description of the structure example. With the use of the structure, a semiconductor device using a transistor including an oxide semiconductor can have a small variation in electrical characteristics and higher reliability. Alternatively, a transistor including an oxide semiconductor with a high on-state current can be provided. Alternatively, a transistor including an oxide semiconductor with a low off-state current can be provided. Alternatively, a semiconductor device with low power consumption can be provided.

[Memory Device 2]

Figure 33:
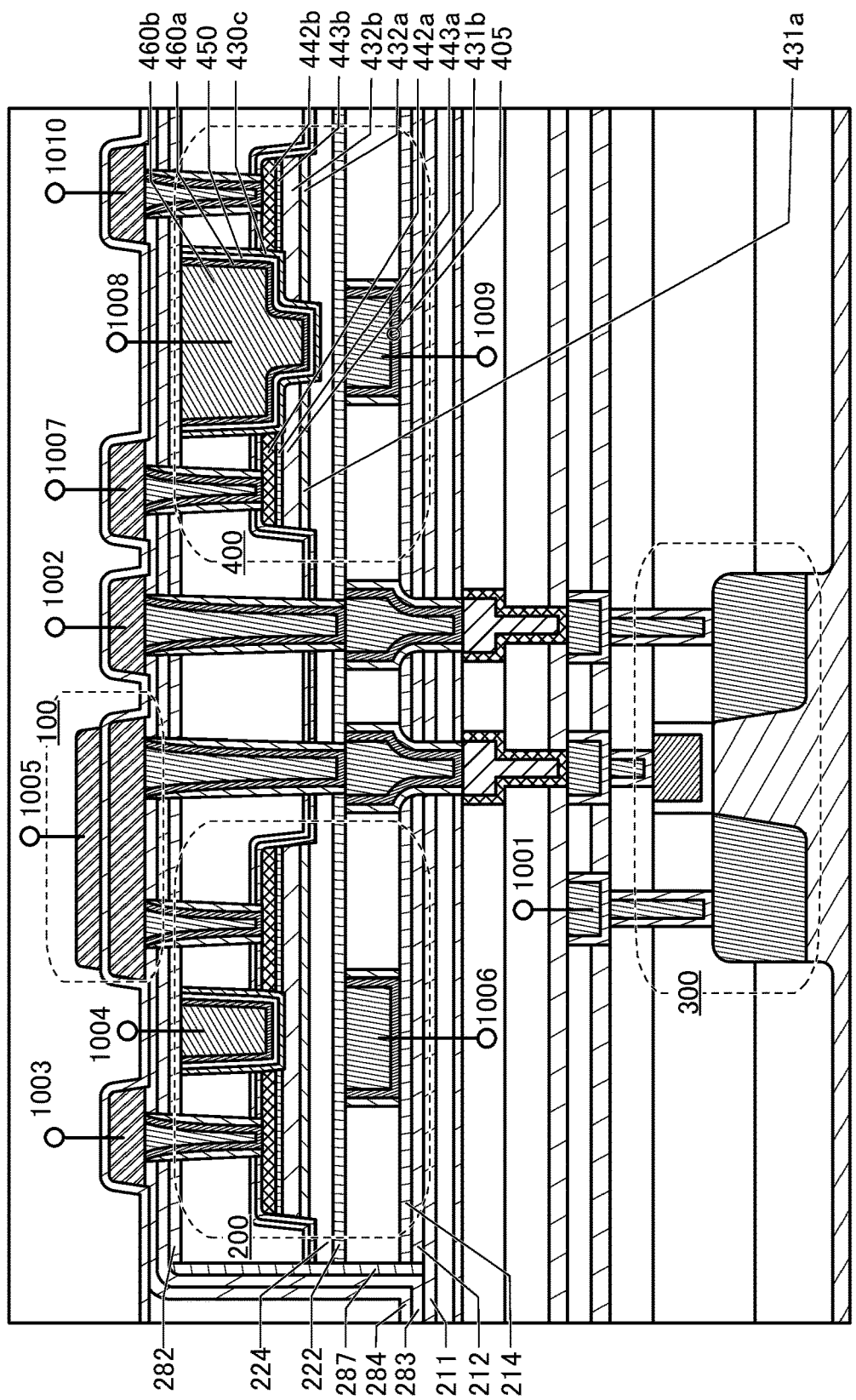
FIG. 33 is a cross-sectional view illustrating a structure of a memory device of one embodiment of the present invention.

FIG. 33 illustrates an example of a memory device using the semiconductor device of one embodiment of the present invention. The memory device illustrated in FIG. 33 includes a transistor 400 in addition to the semiconductor device that includes the transistor 200, the transistor 300, and the capacitor 100 in FIG. 30.

The transistor 400 can control a second gate voltage of the transistor 200. For example, a first gate and a second gate of the transistor 400 are diode-connected to a source of the transistor 400, and the source of the transistor 400 is connected to the second gate of the transistor 200. When a negative potential of the second gate of the transistor 200 is held in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

Thus, in FIG. 33, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the gate of the transistor 200. The wiring 1006 is electrically connected to a back gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a gate of the transistor 400. A wiring 1009 is electrically connected to a back gate of the transistor 400. A wiring 1010 is electrically connected to the drain of the transistor 400. Here, the wiring 1006, the wiring 1007, the wiring 1008, and the wiring 1009 are electrically connected to each other.

When the memory devices in FIG. 33 are arranged in a matrix like the memory devices illustrated in FIG. 30, a memory cell array can be formed. Note that one transistor 400 can control second gate voltages of the plurality of transistors 200. For this reason, the number of the transistors 400 is preferably smaller than that of the transistors 200. As in the memory device illustrated in FIG. 30, the transistor 200 and the transistor 400 in the memory device illustrated in FIG. 33 can be sealed with the insulator 211, the insulator 212, the insulator 214, the insulator 287, the insulator 282, the insulator 283, and the insulator 284.

<Transistor 400>

The transistor 400 and the transistors 200 are formed in the same layer and thus can be fabricated in parallel. The transistor 400 includes a conductor 460 (a conductor 460a and a conductor 460b) functioning as a first gate, a conductor 405 functioning as a second gate, the insulator 222, the insulator 224, and an insulator 450 functioning as gate insulating layers, an oxide 430c including a channel formation region, a conductor 442a, an oxide 443a, an oxide 431a, and an oxide 431b functioning as a source, and a conductor 442b, an oxide 443b, an oxide 432a, and an oxide 432b functioning as a drain. As in the transistor 200, conductors serving as plugs are provided in contact with the conductor 442a and the conductor 442b.

In the transistor 400, the conductor 405 is in the same layer as the conductor 205. The oxide 431a and the oxide 432a are in the same layer as the oxide 230a, and the oxide 431b and the oxide 432b are in the same layer as the oxide 230b. The conductor 442 is in the same layer as the conductor 242. The oxide 443 is in the same layer as the oxide 243. The oxide 430c is in the same layer as the oxide 230c. The insulator 450 is in the same layer as the insulator 250. The conductor 460 is in the same layer as the conductor 260.

Note that the structure bodies in the same layer can be formed at the same time. For example, the oxide 430c can be formed by processing an oxide film to be the oxide 230c.

In the oxide 430c functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

The structures, methods, and the like described in this embodiment can be appropriately combined with structures, configurations, methods, and the like described in the other embodiments and the like.

Embodiment 5

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), is described with reference to FIG. 34 and FIG. 35. The OS memory device is a memory device that includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 34A:
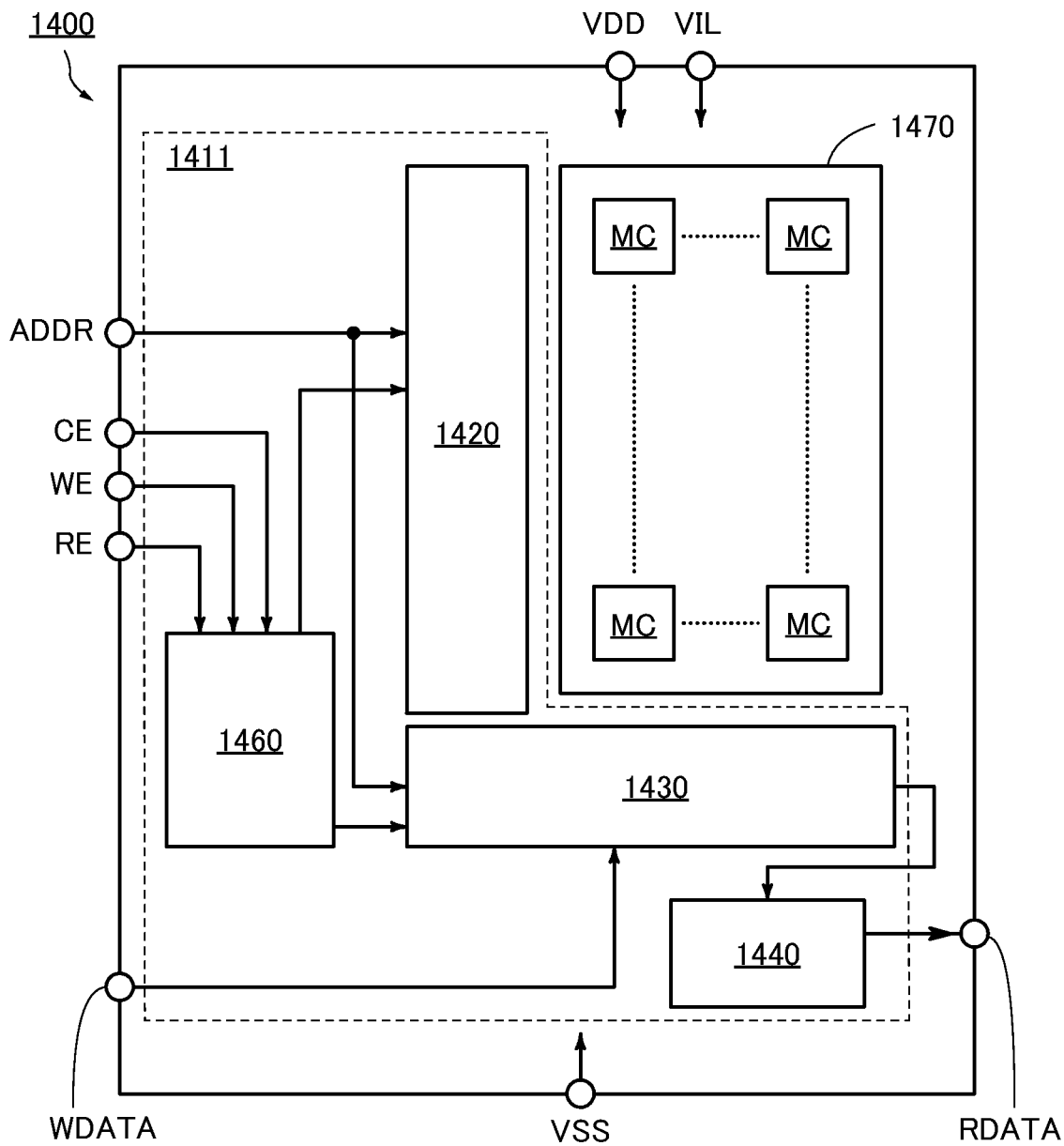
FIG. 34A is a block diagram illustrating a structure example of a memory device of one embodiment of the present invention.

FIG. 34A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VS S), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. The signal CE is a chip enable signal, the signal WE is a write enable signal, and the signal RE is a read enable signal. Signals processed by the control logic circuit 1460 are not limited thereto, and other control signals may be input as necessary.

The memory cell array 1470 includes a plurality of memory cells MC arranged in a matrix and a plurality of wirings. Note that the number of the wirings that connect the memory cell array 1470 to the row circuit 1420 depends on the configuration of the memory cell MC, the number of the memory cells MC in a column, and the like. The number of the wirings that connect the memory cell array 1470 to the column circuit 1430 depends on the configuration of the memory cell MC, the number of the memory cells MC in a row, and the like.

Figure 34B:
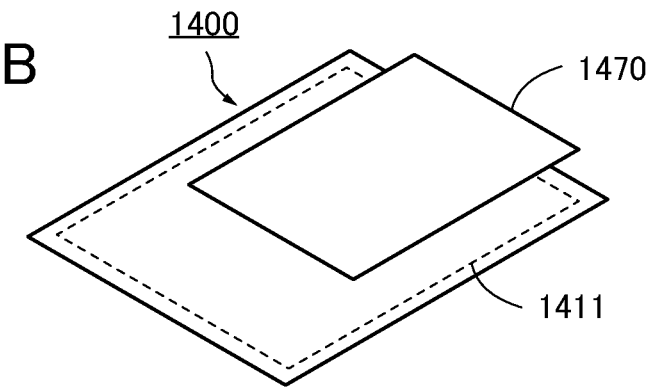
FIG. 34B is a schematic view illustrating a structure example of a memory device of one embodiment of the present invention.

Note that FIG. 34A illustrates an example in which the peripheral circuit 1411 and the memory cell array 1470 are formed on the same plane; however, this embodiment is not limited thereto. For example, as illustrated in FIG. 34B, the memory cell array 1470 may be provided over the peripheral circuit 1411 to partly overlap with the peripheral circuit 1411. For example, the sense amplifier may be provided below the memory cell array 1470 so that they overlap with each other.

FIG. 35 illustrates configuration examples of a memory cell applicable to the memory cell MC.

[DOSRAM]

Figure 35A:
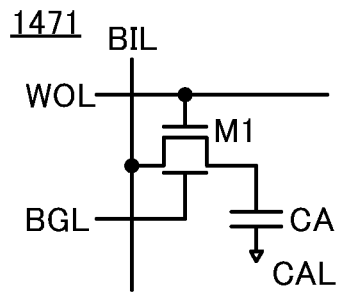
FIG. 35A to FIG. 35H are circuit diagrams illustrating structure examples of a memory device of one embodiment of the present invention.
Figure 35B:
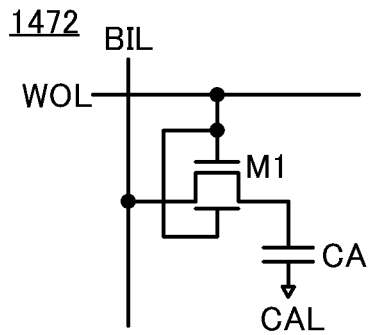
Figure 35C:
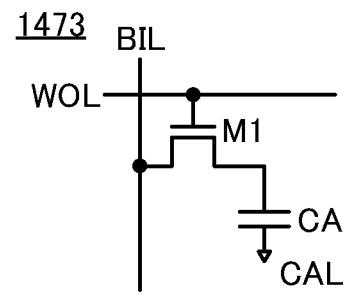
Figure 35D:
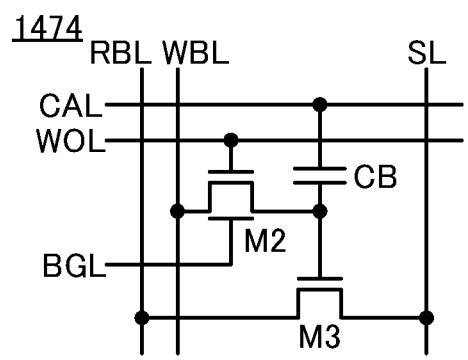
Figure 35E:
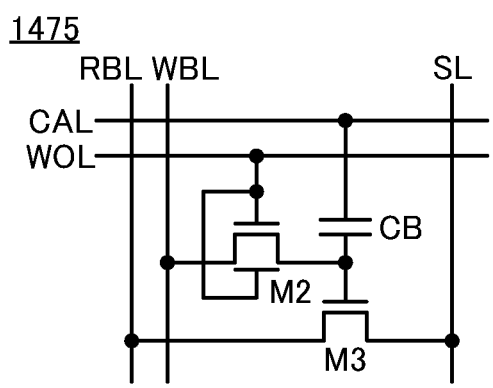
Figure 35F:
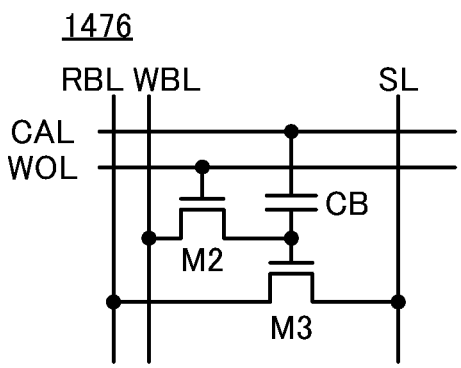
Figure 35G:
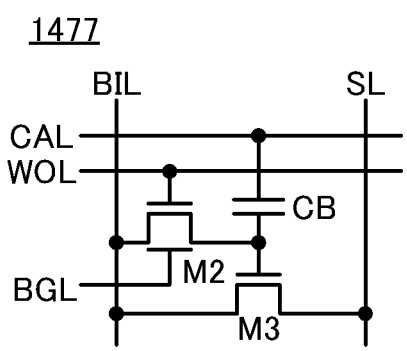

FIG. 35A to FIG. 35C illustrate circuit configuration examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 35A includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. When a given potential is applied to the wiring BGL, the threshold voltage of the transistor M1 can be changed.

The circuit configuration of the memory cell MC is not limited to that of the memory cell 1471, and the circuit configuration can be changed. For example, as in a memory cell 1472 illustrated in FIG. 35B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 35C.

In the case where the semiconductor device described in any of the above embodiments is used in the memory cell 1471 and the like, the transistor 200 can be used as the transistor M1, and the capacitor 100 can be used as the capacitor CA. The transistor and the capacitor device 292 of the memory device 290 described in the above embodiment with reference to FIG. 1 and FIG. 2 may be provided as the transistor M1 and the capacitor CA, respectively. When an OS transistor is used as the transistor M1, the leakage current of the transistor M1 can be extremely low. That is, with the use of the transistor M1, written data can be retained for a long time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. A shorter bit line results in smaller bit line capacitance, which allows the storage capacitance of the memory cell to be reduced.

Figure 36A:
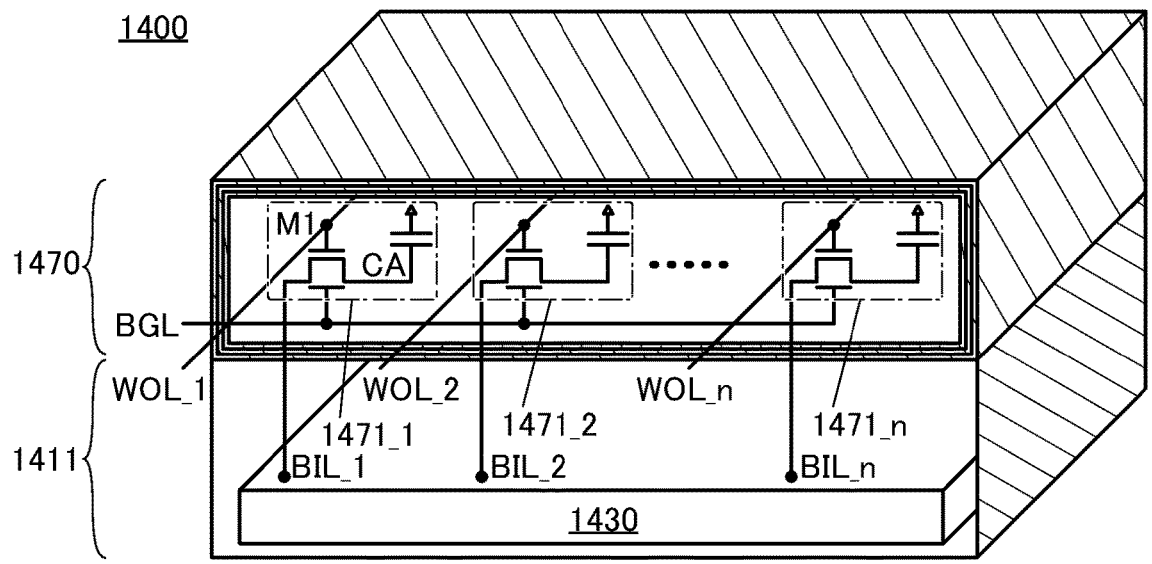
FIG. 36A and FIG. 36B are circuit diagrams illustrating structure examples of a memory device of one embodiment of the present invention.

Here, FIG. 36A illustrates an example of the memory device 1400 in which the memory cell array 1470 is provided over the peripheral circuit 1411 and a plurality of the memory cells 1471 are provided in the memory cell array 1470.

The plurality of memory cells 1471 are arranged in rows and columns in the memory cell array 1470, and the wiring WOL, the wiring BGL, and the like also extend in the row direction and the column direction in the memory cell array 1470. The wiring BIL is connected to the column circuit 1430 provided in the peripheral circuit 1411, and the memory cell array 1470 is electrically connected to a sense amplifier or the like through the wiring BIL.

The memory cell array 1470 includes OS transistors, and is preferably sealed by the insulator 211, the insulator 212, the insulator 214, the insulator 287, the insulator 282, the insulator 283, and the insulator 284 as described in the above embodiment. For example, as illustrated in FIG. 27, a top surface, a side surface, and a bottom surface of the memory cell array 1470 are preferably sealed by the insulator 211, the insulator 212, the insulator 214, the insulator 287, the insulator 282, the insulator 283, and the insulator 284.

Figure 36B:
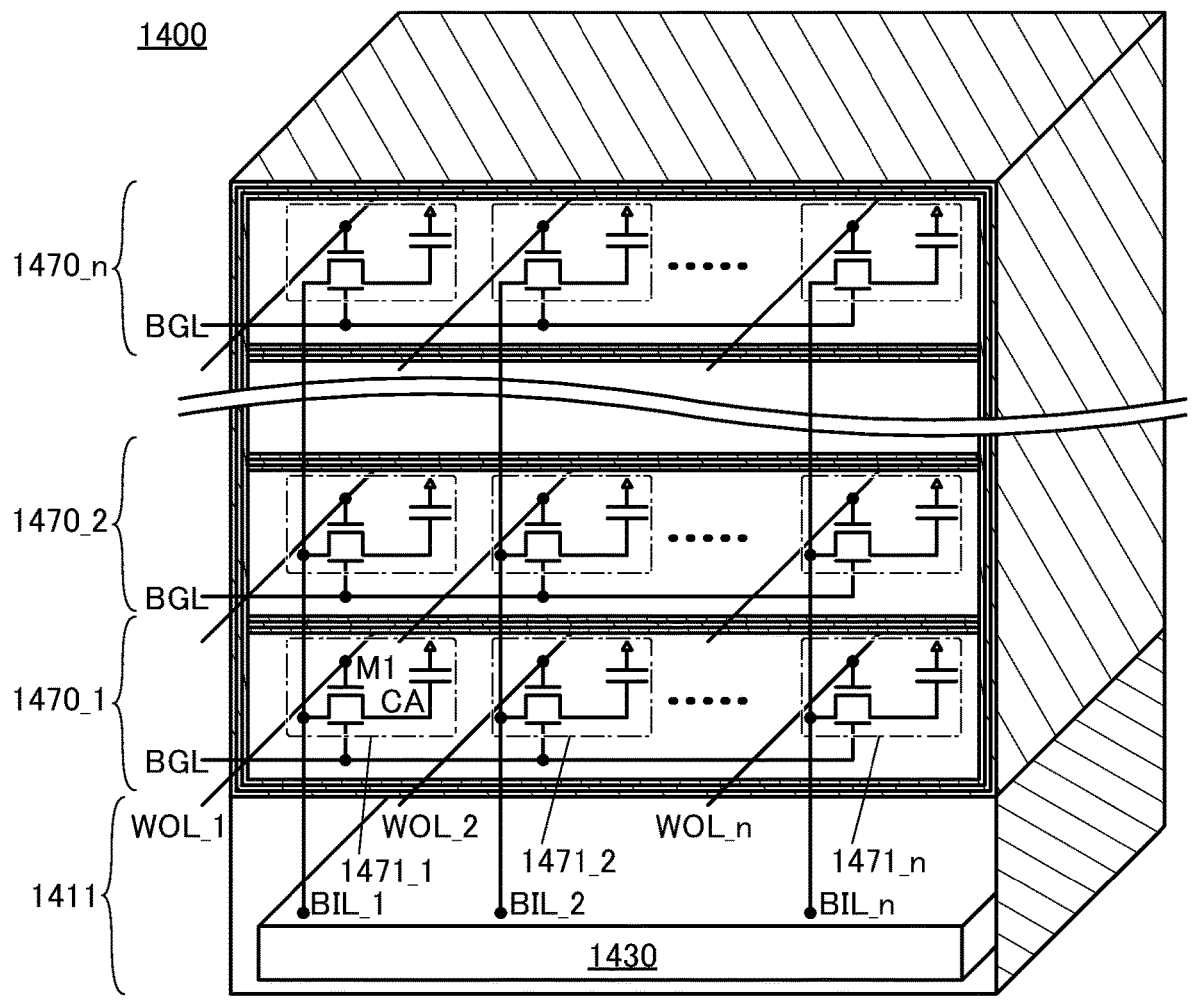

As illustrated in FIG. 36B, a plurality of memory cell arrays 1470_1 to 1470_n (n is a natural number of two or more), may be stacked. The structure of each memory cell array 1470 is almost the same as that illustrated in FIG. 36A, except that the wirings BIL connect the column circuit 1430 to the memory cells 1471 of the memory cell arrays 1470. In addition, the wiring BIL may be one or more conductors 240 penetrating the memory cell array 1470_1 to the memory cell array 1470_n as illustrated in FIG. 32.

The plurality of memory cell arrays 1470 include OS transistors, and are preferably collectively sealed by the insulator 211, the insulator 212, the insulator 214, the insulator 287, the insulator 282, the insulator 283, and the insulator 284 as described in the above embodiment. For example, as illustrated in FIG. 5, FIG. 6, or FIG. 32, top surfaces, side surfaces, and bottom surfaces of the plurality of memory cell arrays 1470 are preferably sealed by the insulator 211, the insulator 212, the insulator 214, the insulator 287, the insulator 282, the insulator 283, and the insulator 284. Furthermore, as illustrated in FIG. 5 and FIG. 6, the insulator 282, the insulator 296, the insulator 298, and the insulator 214 are preferably stacked at the boundaries between the memory cell arrays 1470.

[NOSRAM]

FIG. 35D to FIG. 35H each illustrate a circuit configuration example of a gain-cell memory cell including two transistors and one capacitor. A memory cell 1474 illustrated in FIG. 35D includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a predetermined potential to the back gate of the transistor M2. The threshold voltage of the transistor M2 can be increased or decreased by supplying a given potential to the wiring BGL.

The circuit configuration of the memory cell MC is not limited to that of the memory cell 1474, and the circuit configuration can be changed as appropriate. For example, as in a memory cell 1475 illustrated in FIG. 35E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 35F. For example, the memory cell MC may have a structure in which the wiring WBL and the wiring RBL are combined into one wiring BIL as in a memory cell 1477 illustrated in FIG. 35G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. The transistor and the capacitor device 292 of the memory device 290 described in the above embodiment with reference to FIG. 1 and FIG. 2 may be provided as the transistor M2 and the capacitor CB, respectively. When an OS transistor is used as the transistor M2, the leakage current of the transistor M2 can be extremely low. That is, with the use of the transistor M2, written data can be retained for a long time, and thus the frequency of the refresh operation for the memory cell can be decreased. In addition, refresh operation for the memory cell can be omitted. In addition, since the transistor M2 has an extremely low leakage current, multi-level data and analog data can be retained in the memory cell 1474. The same applies to the memory cells 1475 to 1477.

Note that the transistor M3 may be a transistor containing silicon in a channel formation region (hereinafter, also referred to as a Si transistor in some cases). The Si transistor may be either an n-channel transistor or a p-channel transistor. The Si transistor has higher field-effect mobility than the OS transistor in some cases. Therefore, a Si transistor may be used as the transistor M3 functioning as a reading transistor. Furthermore, the transistor M2 can be formed over the transistor M3 when a Si transistor is used as the transistor M3, in which case the area of the memory cell can be reduced, leading to high integration of the memory device.

Alternatively, the transistor M3 may be an OS transistor. When an OS transistor is used as each of the transistors M2 and M3, the memory cell array 1470 can be formed using only n-channel transistors.

Figure 35H:
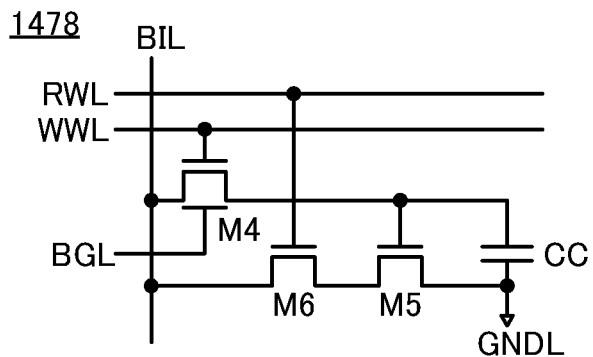

FIG. 35H illustrates an example of a gain-cell memory cell including three transistors and one capacitor. A memory cell 1478 illustrated in FIG. 35H includes transistors M4 to M6 and a capacitor CC. The capacitor CC is provided as appropriate. The memory cell 1478 is electrically connected to the wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor with a back gate that is electrically connected to the wiring BGL. Note that the back gate and the gate of the transistor M4 may be electrically connected to each other. Alternatively, the transistor M4 may not include the back gate.

Note that each of the transistors M5 and M6 may be an n-channel Si transistor or a p-channel Si transistor. Alternatively, the transistors M4 to M6 may be OS transistors, in which case the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistors M5 and M6, and the capacitor 100 can be used as the capacitor CC. When an OS transistor is used as the transistor M4, the leakage current of the transistor M4 can be extremely low. The transistor and the capacitor device 292 of the memory device 290 described in the above embodiment with reference to FIG. 1 and FIG. 2 may be provided as the transistor M4 and the capacitor CC, respectively.

Note that the configurations of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structures, methods, and the like described in this embodiment can be appropriately combined with structures, configurations, methods, and the like described in the other embodiments and the like.

Embodiment 6

In this embodiment, an example of a chip 1200 on which the semiconductor device of the present invention is mounted is described with reference to FIG. 37. A plurality of circuits (systems) are mounted on the chip 1200. The technique for integrating a plurality of circuits (systems) on one chip as described above is referred to as system on chip (SoC) in some cases.

Figure 37A:
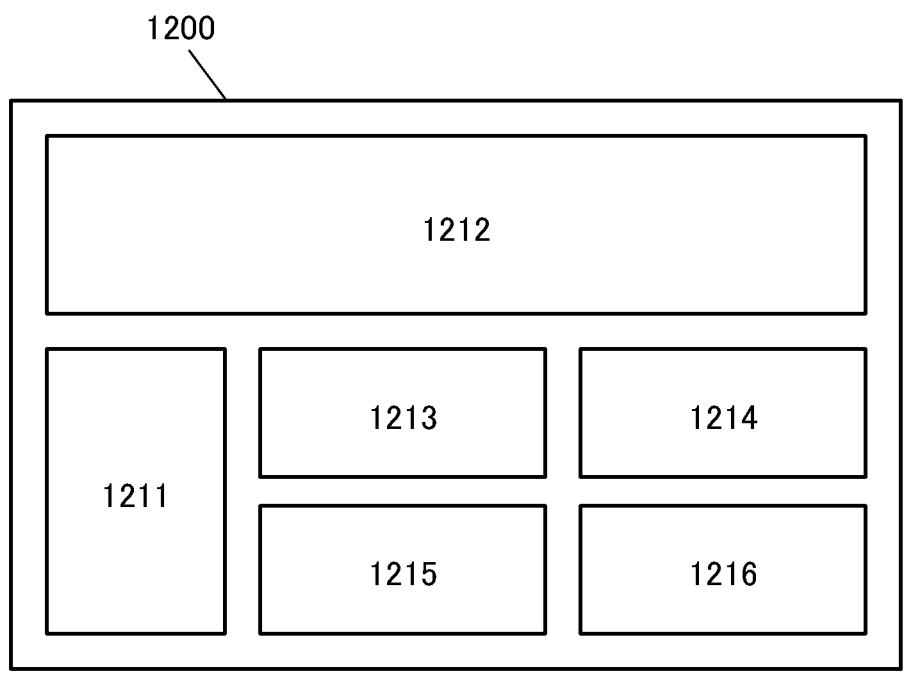
FIG. 37A and FIG. 37B are schematic views of a semiconductor device of one embodiment of the present invention.

As illustrated in FIG. 37A, the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 37B:
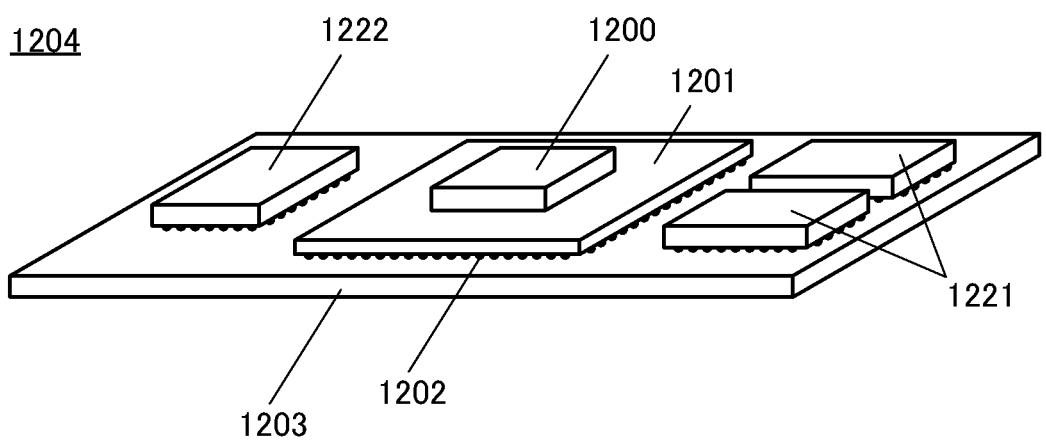

A bump (not illustrated) is provided on the chip 1200, and as illustrated in FIG. 37B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement an arithmetic operation such as a deep neural network (DNN), a convolutional neural network (CNN), a recurrent neural network (RNN), an autoencoder, a deep Boltzmann machine (DBM), or a deep belief network (DBN); thus, the chip 1200 can be used as an AI chip or the GPU module 1204 can be used as an AI system module.

The structures, methods, and the like described in this embodiment can be used in combination as appropriate with the structures, configurations, methods, and the like described in the other embodiments and the like.

Embodiment 7

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 38 schematically illustrates some structure examples of removable memory devices. The semiconductor device described in the above embodiment is processed into a packaged memory chip and used in a variety of memory devices and removable memories, for example.

Figure 38A:
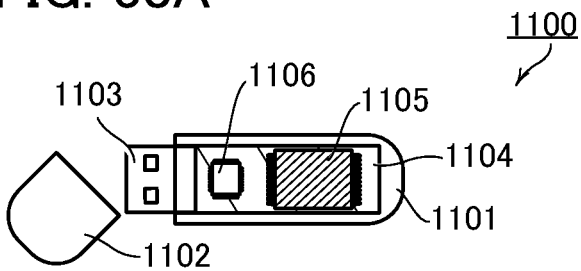
FIG. 38A to FIG. 38E are schematic views of a memory device of one embodiment of the present invention.

FIG. 38A is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like on the substrate 1104.

Figures 38B, 38C:
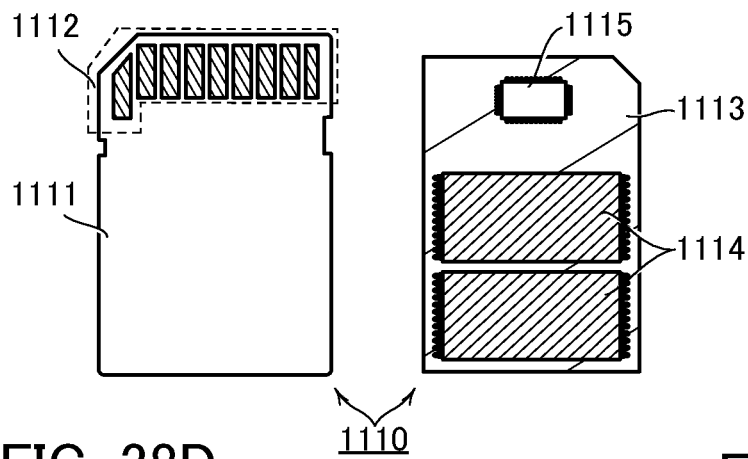

FIG. 38B is a schematic external view of an SD card, and FIG. 38C is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

Figures 38D, 38E:
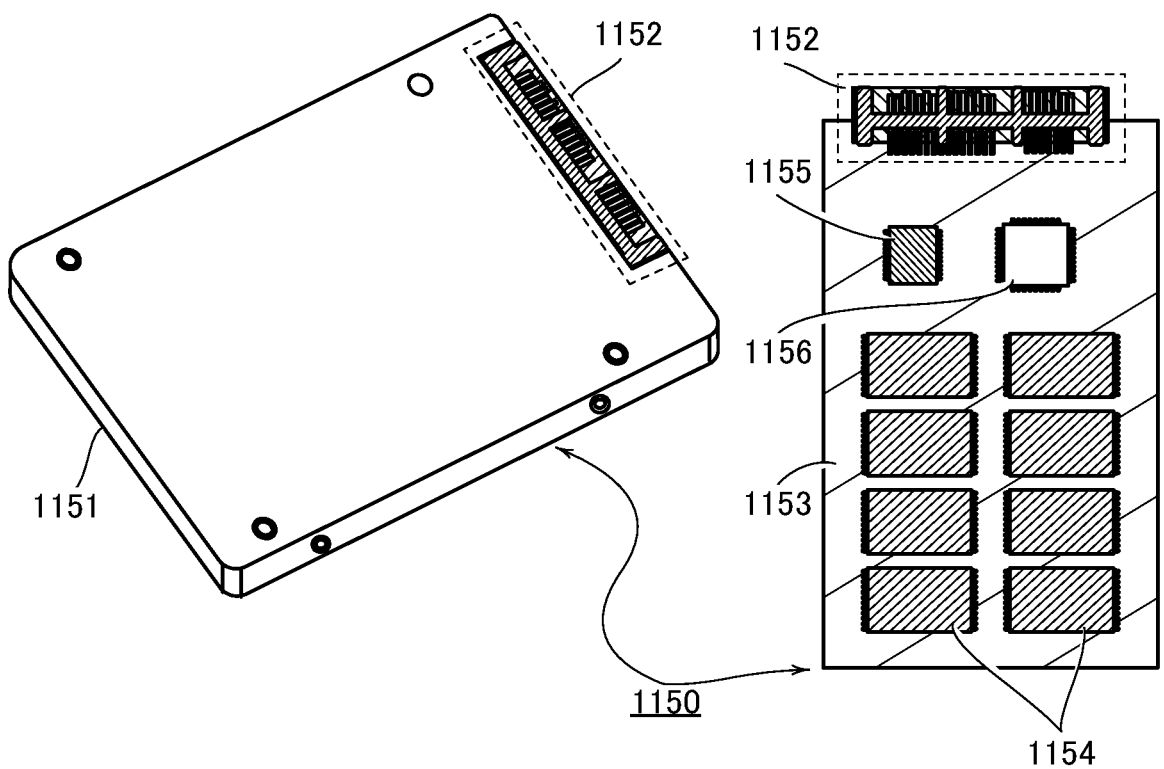

FIG. 38D is a schematic external view of an SSD, and FIG. 38E is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like on the substrate 1153.

The structures, methods, and the like described in this embodiment can be used in combination as appropriate with the structures, configurations, methods, and the like described in the other embodiments and the like.

Embodiment 8

In this embodiment, an FPGA (field-programmable gate array) is described as an example of a semiconductor device of one embodiment of the present invention in which an OS transistor and a capacitor are used, with reference to FIG. 39 to FIG. 42. In the FPGA of this embodiment, an OS memory is used for a configuration memory and a register. Here, such an FPGA is referred to as an "OS-FPGA".

<<OS-FPGA>>

Figure 39A:
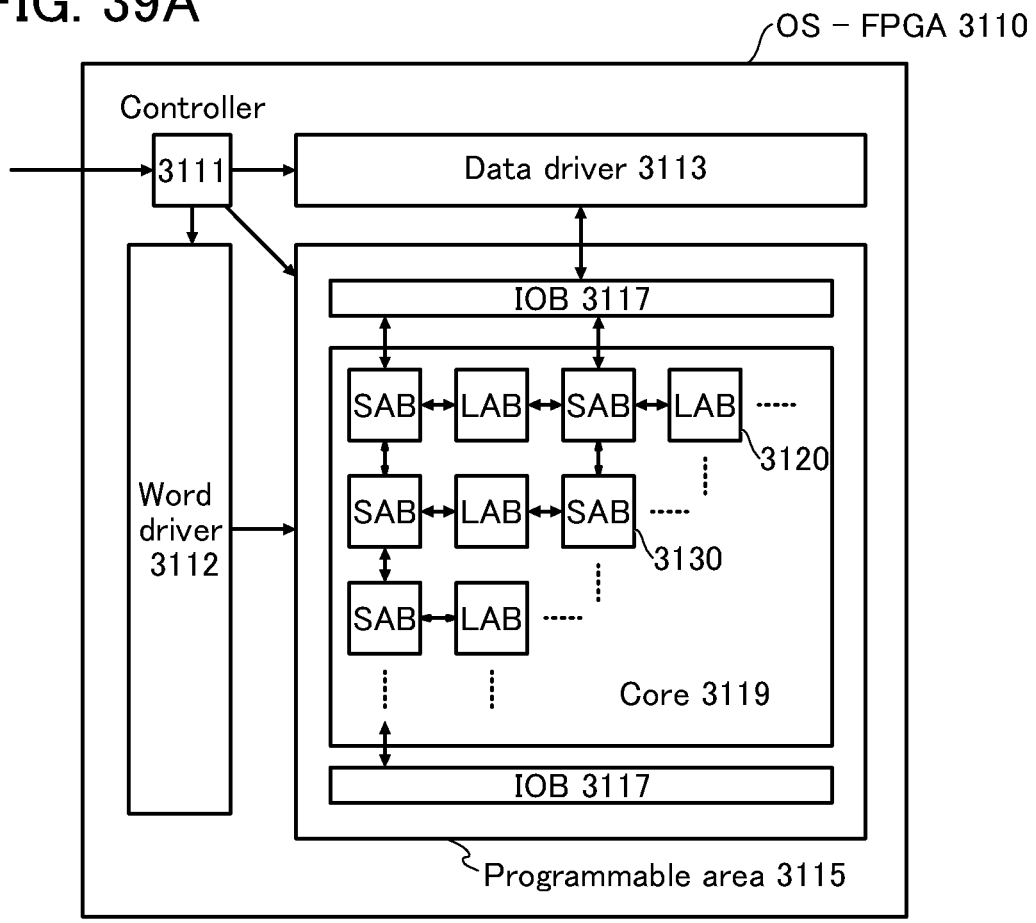
FIG. 39A to FIG. 39C are block diagrams illustrating a configuration example of a semiconductor device of one embodiment of the present invention.

FIG. 39A illustrates a configuration example of an OS-FPGA. An OS-FPGA 3110 illustrated in FIG. 39A is capable of NOFF (normally-off) computing that executes context switching by a multi-context configuration and fine-grained power gating in each PLE. The OS-FPGA 3110 includes a controller 3111, a word driver 3112, a data driver 3113, and a programmable area 3115.

Figure 39B:
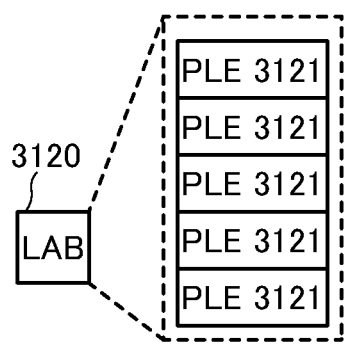
Figure 39C:
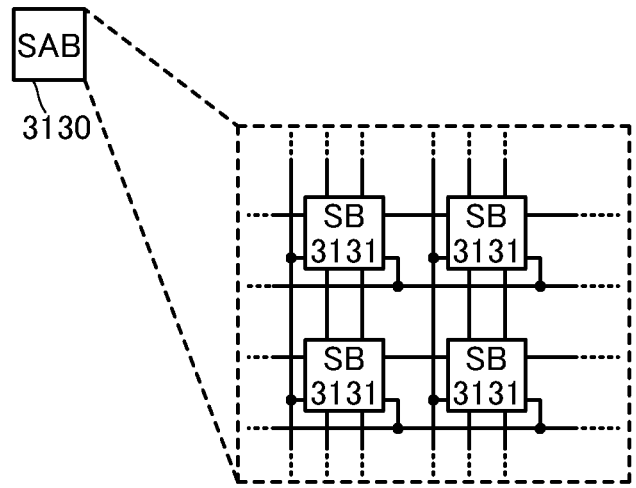

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 39B illustrates an example in which the LAB 3120 includes five PLEs 3121. As illustrated in FIG. 39C, the SAB 3130 includes a plurality of switch blocks (SBs) 3131 arranged in an array. The LAB 3120 is connected to the LABs 3120 in four directions (on the left, right, top, and bottom sides) through its input terminals and the SABs 3130.

Figure 40A:
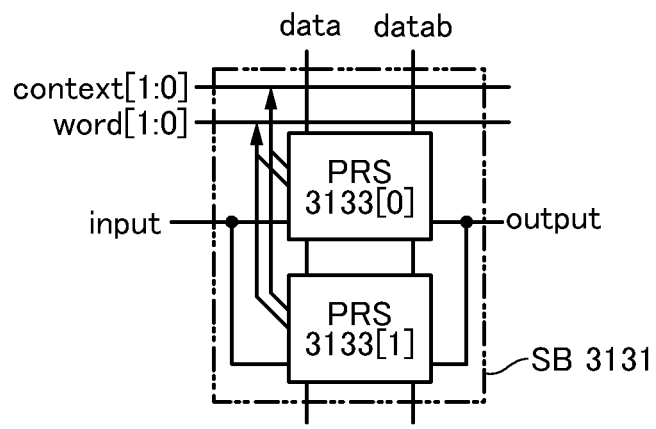
FIG. 40A is a block diagram illustrating a configuration example of a semiconductor device of one embodiment of the present invention.

The SB 3131 is described with reference to FIG. 40A to FIG. 40C. To the SB 3131 illustrated in FIG. 40A, data, datab, and signals context[1:0] and word[1:0] are input. The data and the datab are configuration data, and the logics of the data and the datab have a complementary relationship. The number of contexts in the OS-FPGA 3110 is two, and the signals context[1:0] are context selection signals. The signals word[1:0] are word line selection signals, and wirings to which the signals word[1:0] are input are each a word line. Note that "input" shown in FIG. 40A corresponds to an input terminal of the SB 3131, and "output" shown in FIG. 40A corresponds to an output terminal of the SB 3131.

The SB 3131 includes PRSs (programmable routing switches) 3133[0] and 3133[1]. The PRSs 3133[0] and 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 40B:
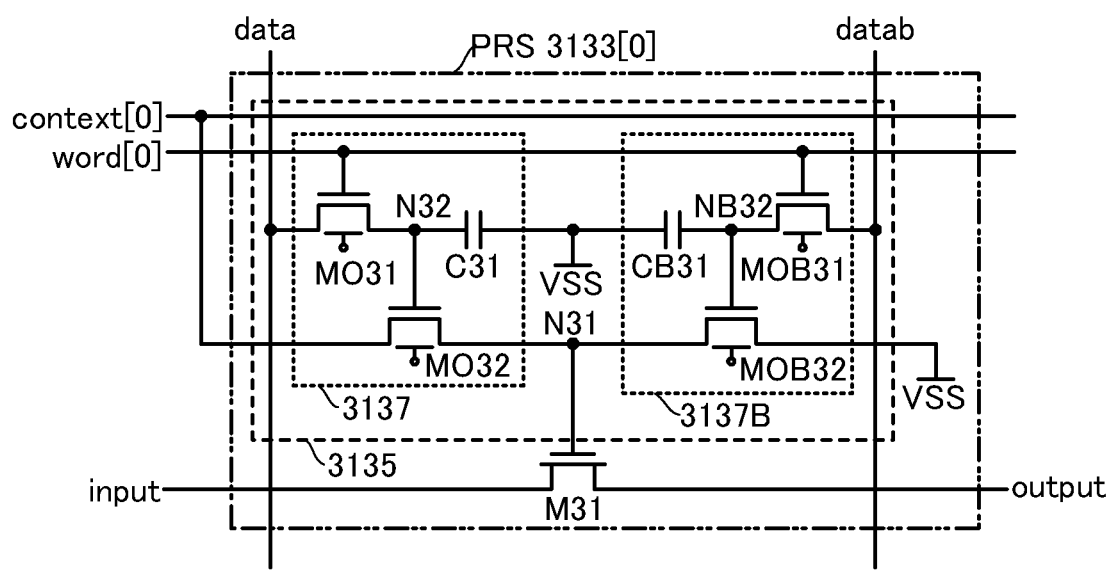
FIG. 40B is a circuit diagram illustrating a configuration example of a semiconductor device of one embodiment of the present invention.
Figure 40C:
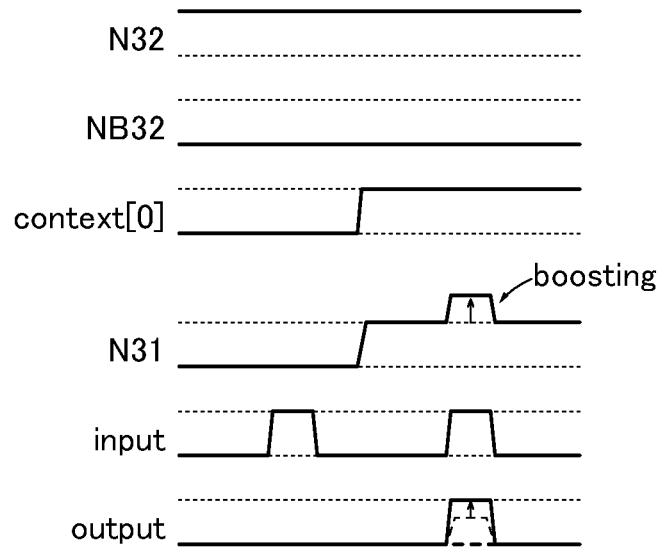
FIG. 40C is a timing chart showing an operation example of the semiconductor device of one embodiment of the present invention.

FIG. 40B illustrates a circuit configuration example of the PRS 3133[0]. The PRS 3133 [0] and the PRS 3133[1] have the same circuit configuration. The PRS 3133 [0] and the PRS 3133[1] are different from each other in a context selection signal and a word line selection signal that are input. The signal context[0] and the signal word[0] are input to the PRS 3133[0], and the signals context[1] and word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes memory circuits 3137 and 3137B. The memory circuits 3137 and 3137B have the same circuit configuration. The memory circuit 3137 includes a capacitor C31 and OS transistors M031 and M032. The memory circuit 3137B includes a capacitor CB31 and OS transistors MOB31 and MOB32.

In the case where the semiconductor device described in any of the above embodiments is used in the SAB 3130, the transistor described in the above embodiment can be used as each of the OS transistors M031 and MOB31. Accordingly, the off-state current of the OS transistors M031 and MOB31 can be reduced; thus, configuration data can be retained for a long time. Moreover, the area occupied by each set consisting of one transistor and one capacitor in the top view can be reduced; accordingly, the semiconductor device of this embodiment can be highly integrated.

The OS transistors M031, M032, MOB31, and MOB32 include a back gate, and each of these back gates is electrically connected to a power supply line that supplies a fixed voltage.

A gate of the Si transistor M31 corresponds to a node N31, a gate of the OS transistor MO32 corresponds to a node N32, and a gate of the OS transistor MOB32 corresponds to a node NB32. The nodes N32 and NB32 are charge retention nodes of the CM 3135. The OS transistor M032 controls electrical continuity between the node N31 and a signal line for the signal context[0]. The OS transistor MOB32 controls electrical continuity between the node N31 and a low-potential power supply line VSS.

The data retained at the memory circuits 3137 and 3137B have a complementary relationship. Thus, either the OS transistor M032 or MOB32 is turned on.

The operation example of the PRS 3133[0] is described with reference to FIG. 40C. In the PRS 3133[0], to which configuration data has already been written, the node N32 is at "H" and the node NB32 is at "L".

The PRS 3133[0] is inactive while the signal context[0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is active while the signal context[0] is at "H". When the signal context[0] is transferred to "H", the gate of the Si transistor M31 is transferred to "H" by the configuration data stored in the CM 3135.

When the input terminal is transferred to "H" during the period when the PRS 3133[0] is active, the gate voltage of the Si transistor M31 is increased by boosting because the OS transistor MO32 of the memory circuit 3137 is a source follower. As a result, the OS transistor M032 of the memory circuit 3137 loses the driving capability, and the gate of the Si transistor M31 is brought into a floating state.

In the PRS 3133 with a multi-context function, the CM 3135 also functions as a multiplexer.

Figure 41:
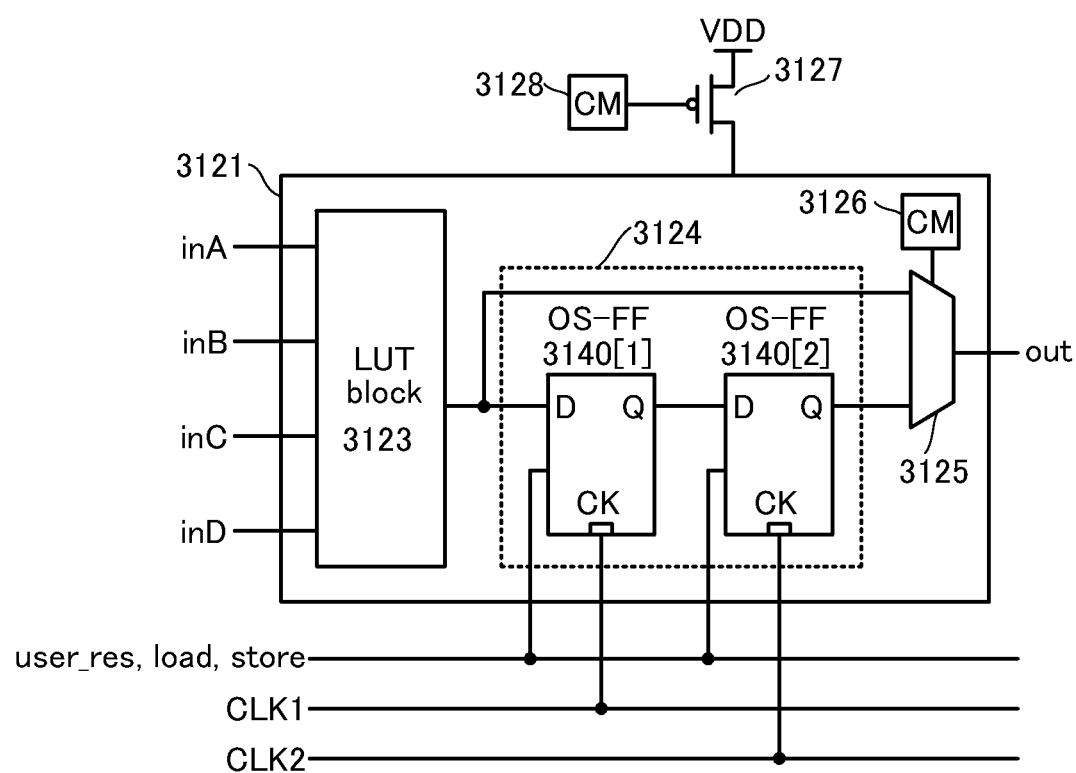
FIG. 41 is a block diagrams illustrating a configuration example of a semiconductor device of one embodiment of the present invention.

FIG. 41 illustrates a configuration example of the PLE 3121. The PLE 3121 includes an LUT (lookup table) block 3123, a register block 3124, a selector 3125, and a CM 3126. The LUT block 3123 is configured to select and output inside data in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with the configuration data stored in a CM 3128. Providing the power switch 3127 for each PLE 3121 enables fine-grained power gating. The PLE 3121 that is not used after context switching can be power gated owing to the fine-grained power gating function; thus, standby power can be effectively reduced.

The register block 3124 is formed of nonvolatile registers to achieve NOFF computing. The nonvolatile registers in the PLE 3121 are flip-flops provided with an OS memory (hereinafter referred to as an [OS-FF]).

Figure 42A:
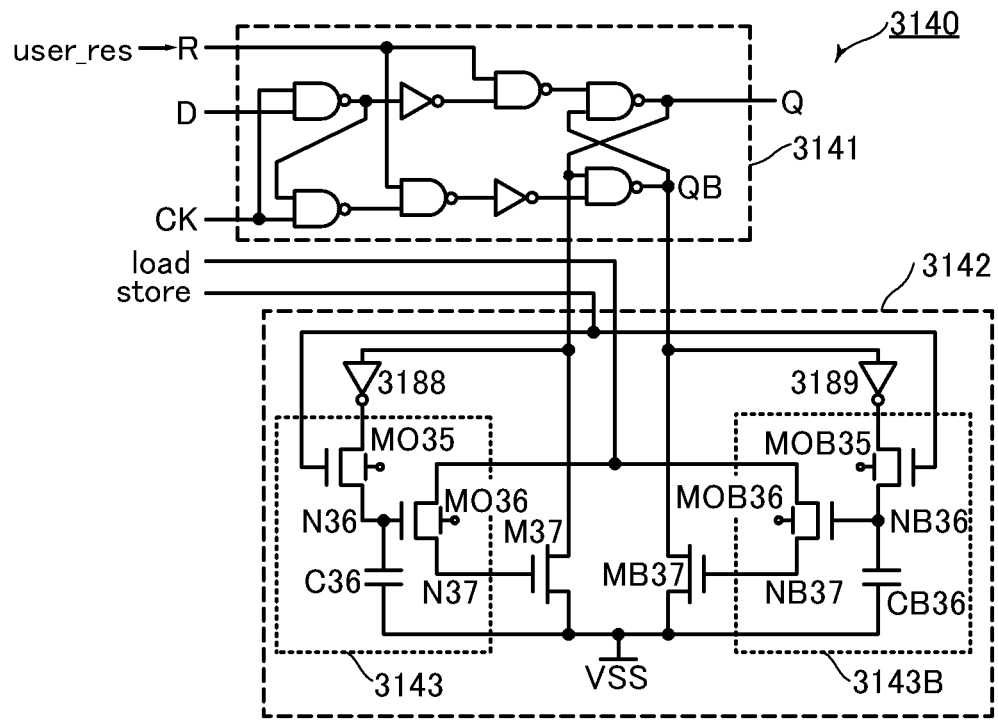
FIG. 42A is a circuit diagram illustrating a configuration example of a semiconductor device of one embodiment of the present invention.

The register block 3124 includes OS-FFs 3140[1] and 3140[2]. Signals user_res, load, and store are input to the OS-FFs 3140[1] and 3140[2]. A clock signal CLK1 is input to the OS-FF 3140[1] and a clock signal CLK2 is input to the OS-FF 3140[2]. FIG. 42A illustrates a configuration example of the OS-FF 3140.

The OS-FF 3140 includes an FF 3141 and a shadow register 3142. The FF 3141 includes nodes CK, R, D, Q, and QB. A clock signal is input to the node CK. The signal user_res is input to the node R. The signal user_res is a reset signal. The node D is a data input node, and the node Q is a data output node. The logics of the node Q and the node QB have a complementary relationship.

The shadow register 3142 functions as a backup circuit of the FF 3141. The shadow register 3142 backs up data of the nodes Q and QB in response to the signal store and writes back the backed up data to the nodes Q and QB in response to the signal load.

The shadow register 3142 includes inverter circuits 3188 and 3189, Si transistors M37 and MB37, and memory circuits 3143 and 3143B. The memory circuits 3143 and 3143B have the same circuit configuration as the memory circuit 3137 of the PRS 3133. The memory circuit 3143 includes a capacitor C36 and OS transistors M035 and M036. The memory circuit 3143B includes a capacitor CB36 and an OS transistor MOB35 and an OS transistor MOB36. Nodes N36 and NB36 correspond to a gate of the OS transistor M036 and a gate of the OS transistor MOB36, respectively, and are each a charge retention node. Nodes N37 and NB37 correspond to a gate of the Si transistor M37 and a gate of the Si transistor MB37, respectively.

In the case where the semiconductor device described in any of the above embodiments is used in the LAB 3120, the transistor described in the above embodiment can be used as each of the OS transistors M035 and MOB35. Accordingly, the off-state current of the OS transistors M035 and MOB35 can be reduced; thus, backed up data in the OS-FF can be retained for a long time. Moreover, the area occupied by each set consisting of one transistor and one capacitor in the top view can be reduced; accordingly, the semiconductor device of this embodiment can be highly integrated.

The OS transistors M035, M036, MOB35, and MOB36 include a back gate, and each of these back gates is electrically connected to a power supply line that supplies a fixed voltage.

Figure 42B:
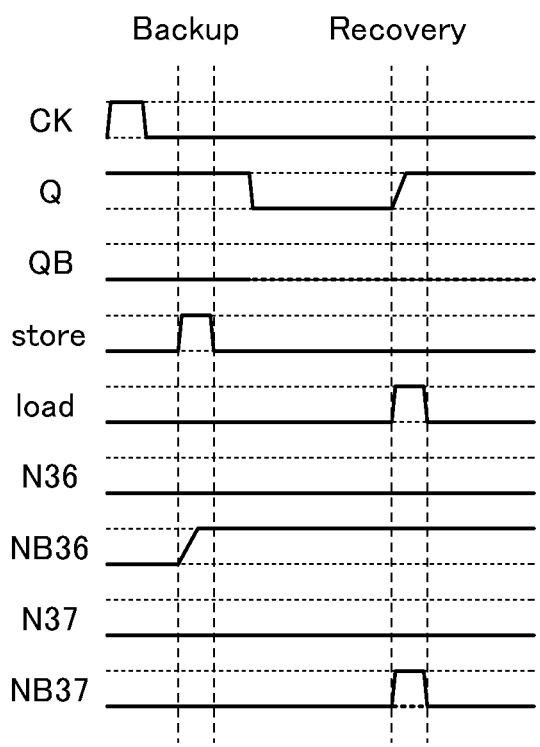
FIG. 42B is a timing chart showing an operation example of the semiconductor device of one embodiment of the present invention.

An example of an operation method of the OS-FF 3140 is described with reference to FIG. 42B.

(Backup)

When the signal store at "H" is input to the OS-FF 3140, the shadow register 3142 backs up the data of the FF 3141. The node N36 becomes "L" when the data of the node Q is written thereto, and the node NB36 becomes "H" when the data of the node QB is written thereto. After that, power gating is performed and the power switch 3127 is turned off Although the data of the nodes Q and QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is recovered to a state at the backup operation.

A combination of the fine-grained power gating and backup/recovery operation of the OS-FF 3140 allows power consumption of the OS-FPGA 3110 to be effectively reduced.

As an error that might occur in a memory circuit, a soft error due to entry of radiation is given. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. An OS memory using an OS transistor has a high soft-error tolerance. Therefore, the OS-FPGA 3110 with high reliability can be provided when an OS memory is included therein.

The structure described in this embodiment can be used in combination with the structures described in the other embodiments, as appropriate.

Embodiment 9

In this embodiment, an example of a CPU including the semiconductor device of one embodiment of the present invention, such as the above-described memory device, is described.

<Configuration of CPU>

Figure 43:
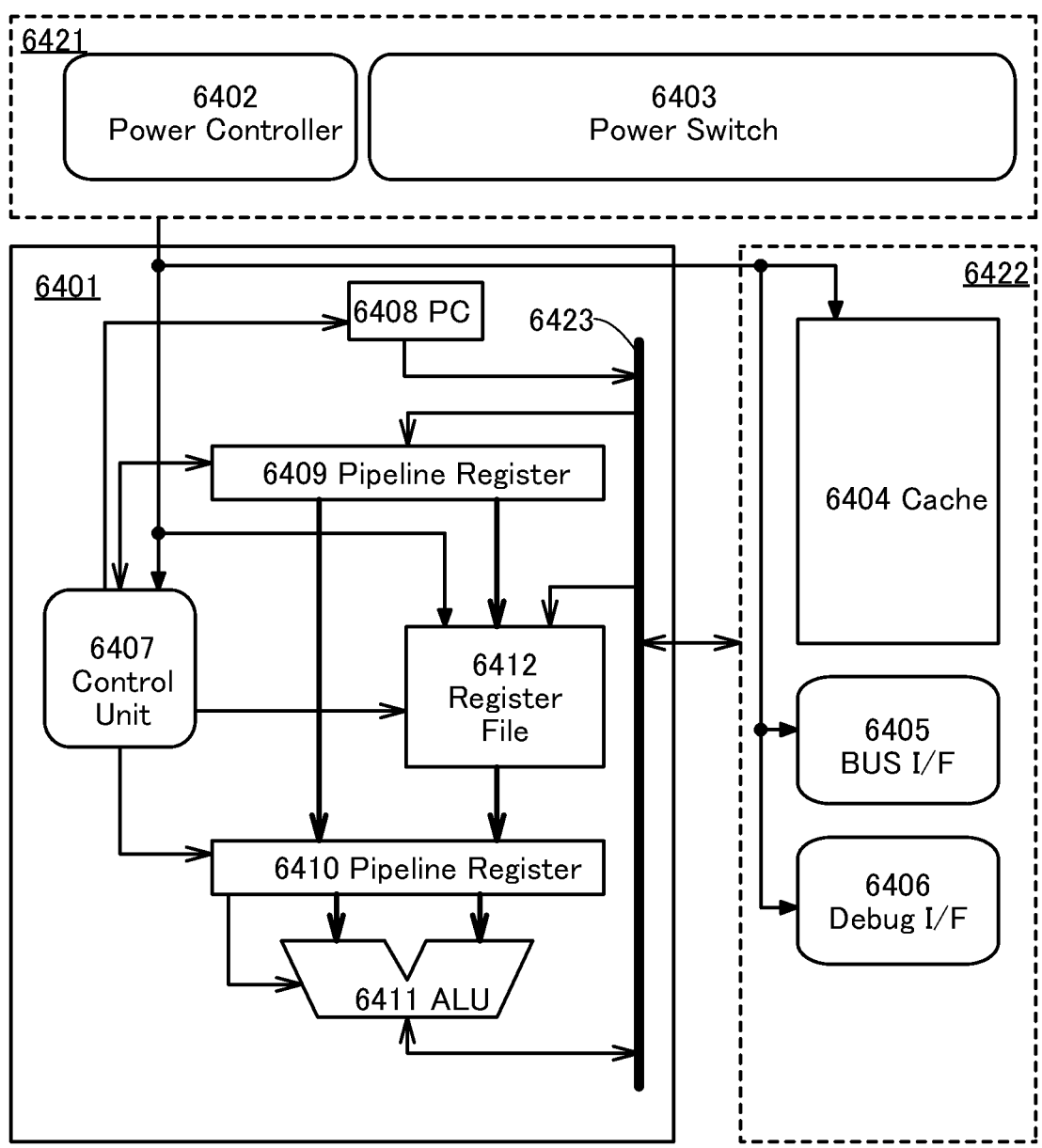
FIG. 43 is a block diagram of a semiconductor device of one embodiment of the present invention.

A semiconductor device 6400 shown in FIG. 43 includes a CPU core 6401, a power management unit 6421, and a peripheral circuit 6422. The power management unit 6421 includes a power controller 6402 and a power switch 6403. The peripheral circuit 6422 includes a cache 6404 including cache memory, a bus interface (BUS I/F) 6405, and a debug interface (Debug I/F) 6406. The CPU core 6401 includes a data bus 6423, a control unit 6407, a PC (program counter) 6408, a pipeline register 6409, a pipeline register 6410, an ALU (Arithmetic logic unit) 6411, and a register file 6412. Data is transmitted between the CPU core 6401 and the peripheral circuit 6422 such as the cache 6404 via the data bus 6423.

The semiconductor device described in any of the above embodiments can be used for many logic circuits typified by the power controller 6402 and the control unit 6407. Accordingly, the semiconductor device 6400 can have reduced power consumption. The semiconductor device 6400 can have a higher operating speed. The semiconductor device 6400 can have a smaller power supply voltage variation.

The semiconductor device 6400 preferably includes a p-channel Si transistor and a transistor including the oxide semiconductor described in the above embodiment in a channel formation region. Accordingly, the semiconductor device 6400 can be small. The semiconductor device 6400 can have reduced power consumption. The semiconductor device 6400 can have a higher operating speed. Particularly when the Si transistors are only p-channel ones, the manufacturing costs of the semiconductor device can be reduced.

The control unit 6407 has functions of decoding and executing instructions contained in a program such as input applications by controlling the overall operations of the PC 6408, the pipeline register 6409, the pipeline register 6410, the ALU 6411, the register file 6412, the cache 6404, the bus interface 6405, the debug interface 6406, and the power controller 6402.

The ALU 6411 has a function of performing a variety of arithmetic operations such as four arithmetic operations and logic operations.

The cache 6404 has a function of temporarily storing frequently used data. The PC 6408 is a register having a function of storing an address of an instruction to be executed next. Note that although not shown in FIG. 43, the cache 6404 is provided with a cache controller for controlling the operation of the cache memory.

The pipeline register 6409 has a function of temporarily storing instruction data.

The register file 6412 includes a plurality of registers including a general-purpose register and can store data that is read from the main memory, data obtained as a result of arithmetic operations in the ALU 6411, or the like.

The pipeline register 6410 has a function of temporarily storing data used for arithmetic operations in the ALU 6411, data obtained as a result of arithmetic operations in the ALU 6411, or the like.

The bus interface 6405 functions as a path for data between the semiconductor device 6400 and various devices outside the semiconductor device 6400. The debug interface 6406 functions as a path of a signal for inputting an instruction to control debugging to the semiconductor device 6400.

The power switch 6403 has a function of controlling supply of a power supply voltage to various circuits included in the semiconductor device 6400 other than the power controller 6402. The above various circuits belong to several different power domains. The power switch 6403 controls whether the power supply voltage is supplied to the various circuits in the same power domain. In addition, the power controller 6402 has a function of controlling the operation of the power switch 6403.

The semiconductor device 6400 having the above structure can perform power gating. An example of the power gating operation sequence is described.

First, by the CPU core 6401, timing for stopping the supply of the power supply voltage is set in a register of the power controller 6402. Then, an instruction of starting power gating is sent from the CPU core 6401 to the power controller 6402. Then, various registers and the cache 6404 included in the semiconductor device 6400 start data saving. Then, the power switch 6403 stops the supply of the power supply voltage to the various circuits included in the semiconductor device 6400 other than the power controller 6402. Then, an interrupt signal is input to the power controller 6402, whereby the supply of the power supply voltage to the various circuits included in the semiconductor device 6400 is started. Note that a counter may be provided in the power controller 6402 to be used to determine the timing of starting the supply of the power supply voltage regardless of input of an interrupt signal. Next, the various registers and the cache 6404 start data restoration. Then, execution of an instruction is resumed in the control unit 6407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data retained by the CPU core 6401 or the peripheral circuit 6422 is preferably saved in a short time. In that case, the power can be turned on or off in a short time, and an effect of saving power becomes significant.

In order that the data retained by the CPU core 6401 or the peripheral circuit 6422 be saved in a short time, the data is preferably saved in a flip-flop circuit itself (referred to as a flip-flop circuit capable of backup operation). Furthermore, the data is preferably saved in an SRAM circuit itself (referred to as an SRAM circuit capable of backup operation). The flip-flop circuit and SRAM circuit that are capable of backup operation preferably include transistors including an oxide semiconductor (preferably an oxide containing In, Ga, and Zn) in a channel formation region. Consequently, the transistor has a low off-state current; thus, the flip-flop circuit and SRAM circuit that are capable of backup operation can retain data for a long time without power supply. When the transistor has a high switching speed, the flip-flop circuit and SRAM circuit that are capable of backup operation can save and restore data in a short time in some cases.

An example of the flip-flop circuit capable of backup operation is described with reference to FIG. 44.

Figure 44:
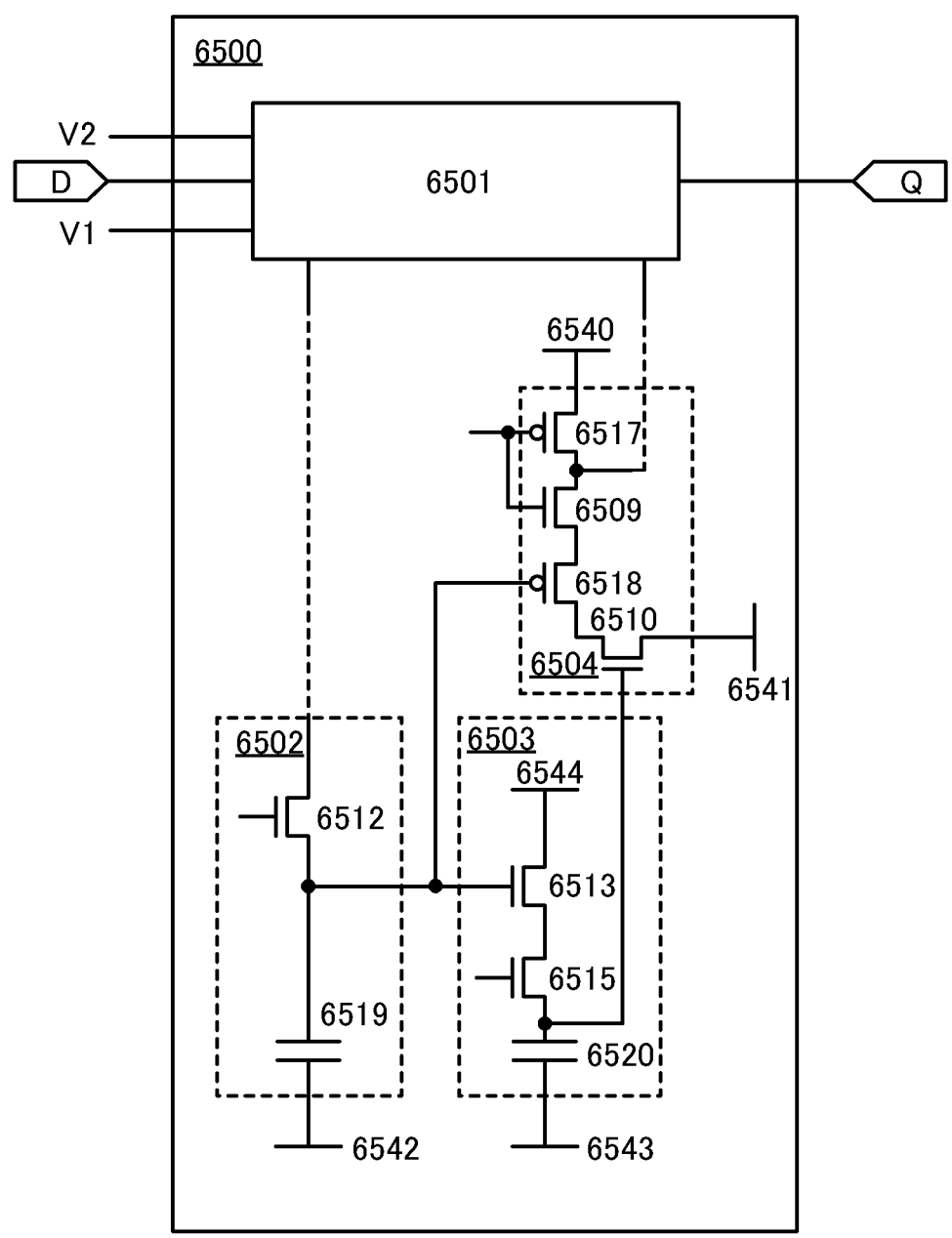
FIG. 44 is a circuit diagram of a semiconductor device of one embodiment of the present invention.

A semiconductor device 6500 shown in FIG. 44 is an example of the flip-flop circuit capable of backup operation. The semiconductor device 6500 includes a first memory circuit 6501, a second memory circuit 6502, a third memory circuit 6503, and a read circuit 6504. As a power supply voltage, a potential difference between a potential V1 and a potential V2 is supplied to the semiconductor device 6500. One of the potential V1 and the potential V2 is at a high level, and the other is at a low level. An example of the structure of the semiconductor device 6500 when the potential V1 is at a low level and the potential V2 is at a high level is described below.

The first memory circuit 6501 has a function of retaining data when a signal D including the data is input in a period during which the power supply voltage is supplied to the semiconductor device 6500. Furthermore, the first memory circuit 6501 outputs a signal Q including the retained data in the period during which the power supply voltage is supplied to the semiconductor device 6500. On the other hand, the first memory circuit 6501 cannot retain data in a period during which the power supply voltage is not supplied to the semiconductor device 6500. That is, the first memory circuit 6501 can be referred to as a volatile memory circuit.

The second memory circuit 6502 has a function of reading the data retained in the first memory circuit 6501 to store (or save) it. The third memory circuit 6503 has a function of reading the data retained in the second memory circuit 6502 to store (or save) it. The read circuit 6504 has a function of reading the data retained in the second memory circuit 6502 or the third memory circuit 6503 to store (or restore) it in the first memory circuit 6501.

In particular, the third memory circuit 6503 has a function of reading the data retained in the second memory circuit 6502 to store (or save) it even in the period during which the power supply voltage is not supplied to the semiconductor device 6500.

As shown in FIG. 44, the second memory circuit 6502 includes a transistor 6512 and a capacitor 6519. The third memory circuit 6503 includes a transistor 6513, a transistor 6515, and a capacitor 6520. The read circuit 6504 includes a transistor 6510, a transistor 6518, a transistor 6509, and a transistor 6517.

The transistor 6512 has a function of charging and discharging the capacitor 6519 in accordance with data retained in the first memory circuit 6501. The transistor 6512 is desirably capable of charging and discharging the capacitor 6519 at a high speed in accordance with data retained in the first memory circuit 6501. Specifically, the transistor 6512 desirably contains crystalline silicon (preferably polycrystalline silicon, further preferably single crystal silicon) in a channel formation region.

The conduction state or the non-conduction state of the transistor 6513 is determined in accordance with the charge retained in the capacitor 6519. The transistor 6515 has a function of charging and discharging the capacitor 6520 in accordance with the potential of a wiring 6544 when the transistor 6513 is in a conduction state. It is desirable that the off-state current of the transistor 6515 be extremely low. Specifically, the transistor 6515 desirably contains an oxide semiconductor (preferably an oxide containing In, Ga, and Zn) in a channel formation region.

Specific connection relations between the elements are described. One of a source and a drain of the transistor 6512 is connected to the first memory circuit 6501. The other of the source and the drain of the transistor 6512 is connected to one electrode of the capacitor 6519, a gate of the transistor 6513, and a gate of the transistor 6518. The other electrode of the capacitor 6519 is connected to a wiring 6542. One of a source and a drain of the transistor 6513 is connected to the wiring 6544. The other of the source and the drain of the transistor 6513 is connected to one of a source and a drain of the transistor 6515. The other of the source and the drain of the transistor 6515 is connected to one electrode of the capacitor 6520 and a gate of the transistor 6510. The other electrode of the capacitor 6520 is connected to a wiring 6543. One of a source and a drain of the transistor 6510 is connected to a wiring 6541. The other of the source and the drain of the transistor 6510 is connected to one of a source and a drain of the transistor 6518. The other of the source and the drain of the transistor 6518 is connected to one of a source and a drain of the transistor 6509. The other of the source and the drain of the transistor 6509 is connected to one of a source and a drain of the transistor 6517 and the first memory circuit 6501. The other of the source and the drain of the transistor 6517 is connected to a wiring 6540. Although a gate of the transistor 6509 is connected to a gate of the transistor 6517 in FIG. 44, the gate of the transistor 6509 is not necessarily connected to the gate of the transistor 6517.

The transistor described in the above embodiment as an example can be used as the transistor 6515. Because of the low off-state current of the transistor 6515, the semiconductor device 6500 can retain data for a long time without power supply. The favorable switching characteristics of the transistor 6515 allow the semiconductor device 6500 to perform high-speed backup and recovery.

The structure described in this embodiment can be used in appropriate combination with any of the structures described in the other embodiments.

Embodiment 10

In this embodiment, examples of an electronic component and an electronic device that include the memory device of any of the above embodiments are described.

<Electronic Component>

First, examples of an electronic component including the memory device in any of the above embodiments are described with reference to FIG. 45A and FIG. 45B.

Figure 45A:
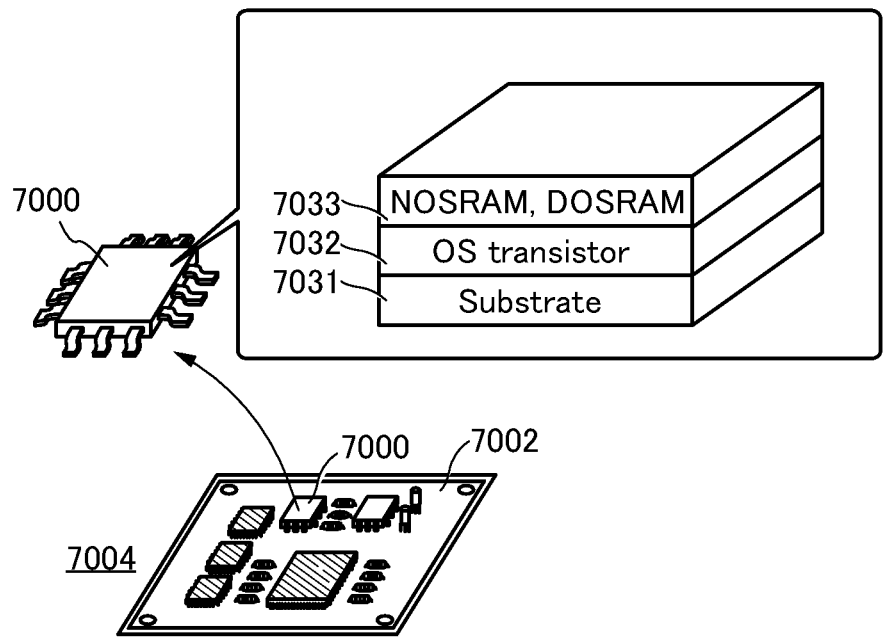
FIG. 45A is a schematic view illustrating an example of an electronic component of one embodiment of the present invention.

An electronic component 7000 illustrated in FIG. 45A is an IC chip including a lead and a circuit portion. The electronic component 7000 is mounted on a printed circuit board 7002, for example. A plurality of such IC chips are combined and electrically connected to each other on the printed circuit board 7002; thus, a substrate on which electronic components are mounted (a circuit board 7004) is formed.

The circuit portion of the electronic component 7000 is a stack including a substrate 7031, a layer 7032, and a layer 7033.

A material that can be used for the substrate described in any of the above embodiments may be used for the substrate 7031. In the case where a semiconductor substrate using silicon or the like as a material is used as the substrate 7031, an integrated circuit may be formed on the substrate 7031, and the layer 7032 including an OS transistor may be formed thereover.

The layer 7032 includes the OS transistor described in any of the above embodiments. For example, a control circuit such as a CPU can be provided in the layer 7032.

The layer 7033 includes a memory. As the memory, for example, a memory including an OS transistor (hereinafter, referred to as OS memory), such as NOSRAM or DOSRAM (registered trademark), can be used. As the NOSRAM, the memory device described in any of the above embodiments can be used.

An OS memory can be stacked over other semiconductor elements, and thus the electronic component 7000 can be reduced in size. In addition, the OS memory can rewrite data with low power, which reduces the power consumption of the electronic component 7000.

The OS memory can be provided not in the layer 7033 but in the layer 7032. In that case, the manufacturing process of the IC chip can be shortened.

Besides the OS memory, a memory such as a ReRAM (Resistive Random Access Memory), an MRAM (Magnetoresistive Random Access Memory), a PRAM (Phase change RAM), or a FeRAM (Ferroelectric RAM) may be provided in the layer 7033.

Although a QFP (Quad Flat Package) is used as the package of the electronic component 7000 in FIG. 45A, the package is not limited thereto.

Figure 45B:
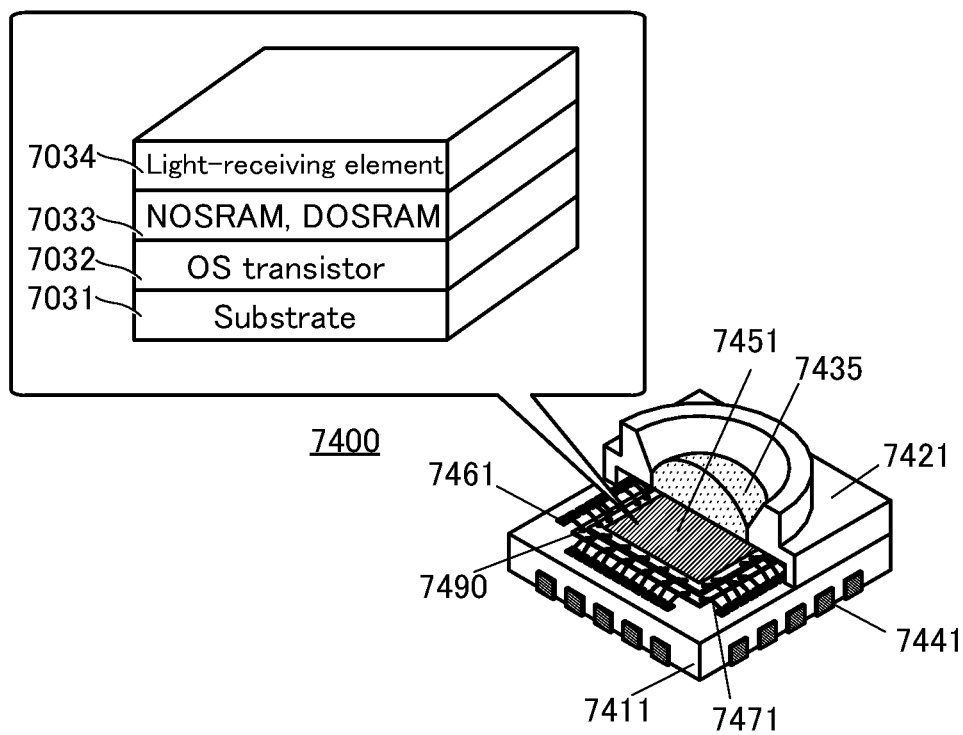
FIG. 45B is a schematic view illustrating an example of an electronic component of one embodiment of the present invention.

FIG. 45B is a schematic view of an electronic component 7400. The electronic component 7400 is a camera module including an image sensor chip 7451. The electronic component 7400 includes a package substrate 7411 to which the image sensor chip 7451 is fixed, a lens cover 7421, a lens 7435, and the like. Furthermore, an IC chip 7490 functioning as a driver circuit, a signal conversion circuit, and the like of an imaging device is provided between the package substrate 7411 and the image sensor chip 7451. Thus, a SiP (System in package) is formed. Lands 7441 are electrically connected to electrode pads 7461. The electrode pads 7461 are electrically connected to the image sensor chip 7451 or the IC chip 7490 through wires 7471. Parts of the lens cover 7421 and the lens 7435 are not illustrated in FIG. 45B to illustrate the inside of the electronic component 7400.

The circuit portion of the image sensor chip 7451 is a stack including the substrate 7031, the layer 7032, the layer 7033, and a layer 7034.

Refer to the description of the electronic component 7000 for the details of the substrate 7031, the layer 7032, and the layer 7033.

The layer 7034 includes a light-receiving element. As the light-receiving element, for example, a pn-j unction photodiode including a selenium-based material in a photoelectric conversion layer can be used. A photoelectric conversion element including a selenium-based material has high external quantum efficiency for visible light; thus, a highly sensitive optical sensor can be obtained.

A selenium-based material can be used as a p-type semiconductor. As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor in the pn-j unction photodiode is preferably formed using a material with a wide band gap and a visible-light-transmitting property. For example, zinc oxide, gallium oxide, indium oxide, tin oxide, or mixed oxide thereof can be used.

As the light-receiving element in the layer 7034, a pn-junction photodiode including a p-type silicon semiconductor and an n-type silicon semiconductor may be used. Alternatively, a pin-junction photodiode in which an i-type silicon semiconductor layer is provided between a p-type silicon semiconductor and an n-type silicon semiconductor may be used.

The photodiode using silicon can be formed using single crystal silicon. In that case, the layer 7033 is preferably electrically connected to the layer 7034 through a bonding step. The photodiode using silicon can also be formed using a thin film of amorphous silicon, microcrystalline silicon, or polycrystalline silicon, for example.

Embodiment 11

In this embodiment, specific examples of electronic devices to which the semiconductor device of one embodiment of the present invention can be applied are described with reference to FIG. 46.

More specifically, the semiconductor device of one embodiment of the present invention can be used for a processor such as a CPU and a GPU or a chip. FIG. 46 illustrates specific examples of electronic devices including a processor such as a CPU and a GPU or a chip of one embodiment of the present invention.

<Electronic Devices and Systems>

The GPU or the chip of one embodiment of the present invention can be mounted on a variety of electronic devices. Examples of electronic devices include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the chip of one embodiment of the present invention is provided in the electronic device, the electronic device can include artificial intelligence.

The electronic device of one embodiment of the present invention may include an antenna. When a signal is received by the antenna, a video, data, or the like can be displayed on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 46 illustrates examples of the electronic device.

[Mobile Phone]

FIG. 46A illustrates a mobile phone (smartphone), which is a type of information terminal. An information terminal 5500 includes a housing 5510 and a display portion 5511, and as input interfaces, a touch panel is provided in the display portion 5511 and a button is provided in the housing 5510.

The information terminal 5500 can execute an application utilizing artificial intelligence with the use of the chip of one embodiment of the present invention. Examples of the application utilizing artificial intelligence include an application for interpreting a conversation and displaying its content on the display portion 5511; an application for recognizing letters, diagrams, and the like input to the touch panel of the display portion 5511 by a user and displaying them on the display portion 5511; and an application for biometric authentication using fingerprints, voice prints, or the like.

[Information Terminal 1]

FIG. 46B illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the chip of one embodiment of the present invention as the information terminal 5500 described above. Examples of the application utilizing artificial intelligence include design-support software, text correction software, and software for automatic menu generation. Furthermore, with the use of the desktop information terminal 5300, novel artificial intelligence can be developed.

Note that in the above description, although the smartphone and the desktop information terminal are respectively illustrated in FIG. 46A and FIG. 46B as examples of the electronic device, one embodiment of the present invention can also be applied to an information terminal other than the smartphone and the desktop information terminal. Examples of an information terminal other than a smartphone and a desktop information terminal include a PDA (Personal Digital Assistant), a laptop information terminal, and a workstation.

[Use in Space]

The semiconductor device of one embodiment of the present invention can also be used for a device used in space. For example, FIG. 46C illustrates an artificial satellite 5800. The artificial satellite 5800 includes a body 5801 and a solar panel 5802. The semiconductor device of one embodiment of the present invention can be used in the body 5801 of the artificial satellite 5800. Note that even in a situation where power supplied from the solar panel 5802 is small (for example, a solar panel is not exposed to sun), the semiconductor device of one embodiment of the present invention can be driven in some cases owing to its low power consumption. Furthermore, in outer space, in a region exposed to sunlight, an electronic device, a semiconductor device, or the like provided in the body 5801 is exposed in a high temperature environment of 200° C. or higher in some cases. The semiconductor device of one embodiment of the present invention has high reliability even in a high temperature environment and thus is preferably used.

[Game Console]

FIG. 46D illustrates a portable game console 5200 that is an example of a game console. The portable game console includes a housing 5201, a display portion 5202, a button 5203, and the like.

With the use of the GPU or the chip of one embodiment of the present invention in the portable game console 5200, the portable game console 5200 with low power consumption can be obtained. Furthermore, heat generation from a circuit can be reduced owing to low power consumption; thus, the influence of heat generation on the circuit itself, the peripheral circuit, and the module can be reduced.

Moreover, with the use of the GPU or the chip of one embodiment of the present invention in the portable game console 5200, the portable game console 5200 including artificial intelligence can be obtained.

In general, the progress of a game, the actions and words of game characters, and expressions of a phenomenon and the like in the game are programed in the game; however, the use of artificial intelligence in the portable game console 5200 enables expressions not limited by the game program. For example, questions posed by the player, the progress of the game, time, and actions and words of game characters can be changed for various expressions.

When a game requiring a plurality of players is played on the portable game console 5200, the artificial intelligence can create a virtual game player; thus, the game can be played alone with the game player created by the artificial intelligence as an opponent.

Although the portable game console is illustrated in FIG. 46D as an example of a game machine, the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), a throwing machine for batting practice installed in sports facilities, and the like.

[Moving Vehicle]

The GPU or the chip of one embodiment of the present invention can be used in an automobile, which is a moving vehicle, and around a driver's seat in the automobile.

FIG. 46E1 illustrates an automobile 5700 which is an example of a moving vehicle, and FIG. 46E2 illustrates the periphery of a windshield inside the automobile. FIG. 46E2 illustrates a display panel 5701, a display panel 5702, and a display panel 5703 that are attached to a dashboard and a display panel 5704 that is attached to a pillar.

The display panel 5701 to the display panel 5703 can display a variety of kinds of information by displaying a speedometer, a tachometer, a mileage, a fuel meter, a gear-shift indicator, air-condition setting, and the like. The content, layout, or the like of the display on the display panels can be changed appropriately to suit the user's preferences, so that the design can be improved. The display panel 5701 to the display panel 5703 can also be used as lighting devices.

The display panel 5704 displays an image taken by an imaging device (not illustrated) provided for the automobile 5700, whereby the view obstructed by the pillar (blind areas) can be complemented. That is, display of an image taken by an imaging device provided on the outside of the automobile 5700 can fill in blind areas and improve safety. In addition, display of an image that complements the area that cannot be seen makes it possible to confirm safety more naturally and comfortably. The display panel 5704 can also be used as a lighting device.

Because the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation, risk prediction, and the like.

Although an automobile is described above as an example of a moving vehicle, moving vehicles are not limited to an automobile. Examples of a moving vehicle include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 46F schematically illustrates data transmission in a broadcasting system. Specifically, FIG. 46F illustrates a path in which a radio wave (a broadcasting signal) transmitted from a broadcast station 5680 reaches a television receiver (TV) 5600 of each household. The TV 5600 includes a receiving device (not illustrated), and the broadcast signal received by an antenna 5650 is transmitted to the TV 5600 through the receiving device.

Although an UHF (Ultra High Frequency) antenna is illustrated as the antenna 5650 in FIG. 46F, a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 46F and may be satellite broadcasting using an artificial satellite, data broadcasting using an optical line, or the like.

The above-described broadcasting system may be a broadcasting system utilizing artificial intelligence by including the chip of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. As another example, when the broadcast data with low resolution is received and the broadcast data is displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence can learn the user's preference, so that TV programs that suit the user's preference can be recorded automatically in the recording device.

The electronic device and the functions of the electronic device, the application example of the artificial intelligence and its effects, and the like described in this embodiment can be combined as appropriate with the description of another electronic device.

The structures, methods, and the like described in this embodiment can be used in combination as appropriate with the structures, configurations, methods, and the like described in the other embodiments and the like.

(Notes on Description of this Specification and the Like)

The description of the above embodiments and each structure in the embodiments are noted below.

One embodiment of the present invention can be constituted by combining, as appropriate, the structure described in each embodiment with the structures described in the other embodiments and the like. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in the specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, fluctuation in signal, voltage, or current due to noise, fluctuation in signal, voltage, or current due to difference in timing, or the like can be included.

The positional relation between components illustrated in the drawings and the like is relative. Therefore, when the components are described with reference to drawings, terms for describing the positional relation, such as "over" and "under", may be used for convenience. The positional relation of the components is not limited to that described in this specification and can be explained with other terms as appropriate depending on the situation.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

In the drawings, the size, the layer thickness, or the region is exaggerated for clarity in some cases. Therefore, the size, the layer thickness, or the region is not necessarily limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which each component is described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that in this specification and the like, depending on the transistor structure, a channel width in a region where a channel is actually formed (channel formation region) (hereinafter also referred to as an "effective channel width") is different from a channel width shown in a top view of a transistor (hereinafter also referred to as an "apparent channel width") in some cases. For example, when a gate covers a side surface of a semiconductor, an effective channel width is greater than an apparent channel width, and its influence cannot be ignored in some cases. For example, in a miniaturized transistor having a gate covering a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed in some cases by entry of impurities, for example. Furthermore, when the semiconductor is silicon, examples of an impurity that changes characteristics of the semiconductor include oxygen, Group 1 elements except hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included.

Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification and the like, a barrier film means a film having a function of inhibiting transmission of oxygen and impurities such as water and hydrogen, and the barrier film having conductivity is sometimes referred to as a conductive barrier film.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET or an OS transistor can also be referred to as a transistor including an oxide or an oxide semiconductor.

In this specification and the like, "normally off" means that a current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

REFERENCE NUMERALS

200: transistor, 200_*n*: transistor, 200_1: transistor, 205: conductor, 205*a*: conductor, 205*b*: conductor, 210: insulator, 211: insulator, 212: insulator, 214: insulator, 216: insulator, 217: insulator, 218: conductor, 222: insulator, 224: insulator, 230: oxide, 230*a*: oxide, 230A: oxide film, 230*b*: oxide, 230B: oxide film, 230*c*: oxide, 230*c*1: oxide, 230*c*2: oxide, 230C: oxide film, 240: conductor, 240_*n*: conductor, 240_1: conductor, 240*a*: conductor, 240*b*: conductor, 241: insulator, 241*a*: insulator, 241*b*: insulator, 242: conductor, 242*a*: conductor, 242A: conductive film, 242*b*: conductor, 242B: conductor layer, 243: oxide, 243*a*: oxide, 243A: oxide film, 243*b*: oxide, 243B: oxide layer, 246: conductor, 246*a*: conductor, 246*b*: conductor, 250: insulator, 250A: insulating film, 260: conductor, 260*a*: conductor, 260A: conductive film, 260Aa: conductive film, 260Ab: conductive film, 260*b*: conductor, 265: sealing portion, 265*a*: sealing portion, 265*b*: sealing portion, 272: insulator, 273: insulator, 274: insulator, 280: insulator, 282: insulator, 283: insulator, 284: insulator, 286: insulator, 287: insulator, 287A: insulating film, 290: memory device, 290_*n*: memory device, 290_1: memory device, 290_2: memory device, 292: capacitor device, 294: conductor, 296: insulator, 298: insulator

The invention claimed is:

1. A memory device comprising a transistor and a capacitor,
   wherein the transistor comprises:
   a first oxide semiconductor;
   a first conductor and a second conductor provided over a top surface of the first oxide semiconductor;
   a second oxide semiconductor that is formed over the first oxide semiconductor and is provided between the first conductor and the second conductor;
   a first insulator provided in contact with the second oxide semiconductor; and
   a third conductor provided in contact with the first insulator,
   wherein the capacitor comprises:
   the second conductor;
   a second insulator over the second conductor; and
   a fourth conductor over the second insulator,
   wherein the first oxide semiconductor has a groove deeper than a thickness of each of the first conductor and the second conductor, and
   wherein a bottom surface of the second oxide semiconductor is in contact with a surface of the groove of the first oxide semiconductor.

2. The memory device according to claim 1,
   wherein the first oxide semiconductor and the second oxide semiconductor each contain indium, an element M, and zinc, and
   wherein the element M is gallium, yttrium, or tin.

3. The memory device according to claim 1,
   wherein the first oxide semiconductor comprises a region having a higher atomic ratio of the indium than the second oxide semiconductor.

4. The memory device according to claim 1,
   wherein the first oxide semiconductor and the second oxide semiconductor each have crystallinity.

5. A semiconductor device comprising:
   the memory device according to claim 1; and
   a device containing silicon,
   wherein the memory device and the device containing silicon are electrically connected to each other.

6. A semiconductor device comprising the memory device according to claim 1,
   wherein the memory device is a first memory device,
   wherein the semiconductor device comprises:
   the first memory device;
   an n-th memory device over the first memory device; and
   a device containing silicon which is electrically connected to the first memory device and the n-th memory device, wherein the device containing silicon, the first memory device, and the n-th memory device are stacked in this order, and wherein n is a natural number of 2 or more.

7. The semiconductor device according to claim 6, wherein the n-th memory device comprises an oxide semiconductor.

8. A memory device comprising a transistor and a capacitor, wherein the transistor comprises:
- a first oxide semiconductor;
- a first conductor and a second conductor provided over a top surface of the first oxide semiconductor;
- a second oxide semiconductor that is formed over the first oxide semiconductor and is provided between the first conductor and the second conductor;
- a first insulator provided in contact with the second oxide semiconductor; and
- a third conductor provided in contact with the first insulator, wherein the capacitor comprises:
- the second conductor;
- a second insulator over the second conductor; and
- a fourth conductor over the second insulator, wherein the first oxide semiconductor has a groove deeper than a thickness of each of the first conductor and the second conductor, wherein the second oxide semiconductor, the first insulator, and the third conductor are embedded in the groove, wherein the second oxide semiconductor has a curvature, and wherein a bottom surface of the second oxide semiconductor is in contact with a surface of the groove of the first oxide semiconductor.

* * * * *